US008790860B2

(12) United States Patent
Koshijima et al.

(10) Patent No.: US 8,790,860 B2
(45) Date of Patent: Jul. 29, 2014

(54) ACTINIC RAY-SENSITIVE OR RADIATION-SENSITIVE RESIN COMPOSITION, AND RESIST FILM, PATTERN FORMING METHOD, METHOD FOR PREPARING ELECTRONIC DEVICE, AND ELECTRONIC DEVICE, EACH USING THE SAME

(75) Inventors: Kosuke Koshijima, Haibara-gun (JP); Hidenori Takahashi, Haibara-gun (JP); Shuhei Yamaguchi, Haibara-gun (JP); Kei Yamamoto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/610,271

(22) Filed: Sep. 11, 2012

(65) Prior Publication Data

US 2013/0078426 A1 Mar. 28, 2013

(30) Foreign Application Priority Data

Sep. 22, 2011 (JP) ................................ 2011-207016

(51) Int. Cl.

| | |
|---|---|
| ***G03F 7/038*** | (2006.01) |
| ***G03F 7/039*** | (2006.01) |
| ***G03F 7/20*** | (2006.01) |
| ***G03F 7/30*** | (2006.01) |
| ***G03F 7/32*** | (2006.01) |

(52) U.S. Cl.

USPC ........ 430/270.1; 430/311; 430/325; 430/331; 430/907; 430/910; 430/919; 430/921; 430/925

(58) Field of Classification Search

None

See application file for complete search history.

(56) References Cited

U.S. PATENT DOCUMENTS

| | | | | |
|---|---|---|---|---|
| 2006/0216639 | A1 | 9/2006 | Tashiro | |
| 2011/0008731 | A1* | 1/2011 | Yamaguchi et al. | 430/270.1 |
| 2012/0129100 | A1 | 5/2012 | Shibuya et al. | |
| 2012/0282548 | A1* | 11/2012 | Enomoto et al. | 430/284.1 |

FOREIGN PATENT DOCUMENTS

| | | | |
|---|---|---|---|
| JP | 2003-140349 | * | 5/2003 |
| JP | 2003-140349 | A | 5/2003 |
| JP | 2003-156848 | A | 5/2003 |
| JP | 2006-267294 | A | 10/2006 |
| JP | 2008-241870 | A | 10/2008 |
| JP | 2011-070162 | A | 4/2011 |
| JP | 2011-141491 | A | 7/2011 |
| JP | 2011-141494 | A | 7/2011 |
| WO | WO 2011/083872 | A1 * | 7/2011 |

OTHER PUBLICATIONS

Machine-assisted English translation of JP2003-140349, provided by JPO (2003).*

Office Action dated Aug. 20, 2013 in Japanese Application No. 2011-207016.

Office Action dated Dec. 24, 2013 in Japanese Application No. 2011-207016.

* cited by examiner

*Primary Examiner* — Sin J. Lee

(74) *Attorney, Agent, or Firm* — Sughrue Mion, PLLC

(57) ABSTRACT

An actinic ray-sensitive or radiation-sensitive resin composition capable of forming a hole pattern which has an ultrafine pore diameter (for example, 60 nm or less) and has an excellent cross-sectional shape with excellent local pattern dimensional uniformity; and a resist film, a pattern forming method, a method for preparing an electronic device, and an electronic device, each using the same, are provided.

The actinic ray-sensitive or radiation-sensitive resin composition includes (P) a resin containing 30 mol % or more of a repeating unit (a) represented by the following general formula (I) based on all the repeating units; (B) a compound capable of generating an acid upon irradiation of actinic rays or radiation; and (G) a compound having at least one of a fluorine atom and a silicon atom, and further having basicity or being capable of increasing the basicity by an action of an acid:

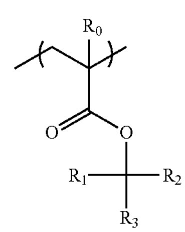

(I)

19 Claims, No Drawings

ACTINIC RAY-SENSITIVE OR RADIATION-SENSITIVE RESIN COMPOSITION, AND RESIST FILM, PATTERN FORMING METHOD, METHOD FOR PREPARING ELECTRONIC DEVICE, AND ELECTRONIC DEVICE, EACH USING THE SAME

BACKGROUND OF THE INVENTION

1. Field of the Invention

The present invention relates to a pattern forming method, an actinic ray-sensitive or radiation-sensitive resin composition, and a resist film. More specifically, the invention relates to a pattern forming method, an actinic ray-sensitive or radiation-sensitive resin composition, and a resist film, each of which is suitably used in a process for preparing semiconductors such as ICs, a process for preparing liquid crystals or circuit boards for a thermal head, and lithographic processes in other photo-fabrication. Particularly, the invention relates to a pattern forming method, an actinic ray-sensitive or radiation-sensitive resin composition, and a resist film, each of which is suitably used in exposure by an ArF exposure apparatus, an ArF immersion-type projection exposure apparatus, or an EUV exposure apparatus, each using a light source that emits far ultraviolet light at a wavelength of 300 nm or less.

2. Description of the Related Art

Since the development of a resist for a KrF excimer laser (248 nm), an image forming method called chemical amplification has been used as an image forming method for a resist so as to compensate for sensitivity reduction caused by light absorption. By way of an example, the image forming method by positive chemical amplification is an image forming method of decomposing an acid generator in the exposed area upon exposure to produce an acid, converting an alkali-insoluble group into an alkali-soluble group by using the generated acid as a reaction catalyst in the baking after exposure (PEB: Post Exposure Bake), and removing the exposed area with alkali development (see JP2003-156848A and JP2008-241870A). A positive type image forming method using such a chemical amplification mechanism has become currently mainstream.

However, in the positive type image forming method, isolated lines or dot patterns can be favorably formed, but in the case of forming the isolated space or fine hole patterns, it is easy for the shape of the patterns to deteriorate.

In recent years, with a demand for finer patterns, recently technology has become known for resolution of a resist film obtained by not only a chemical amplification resist composition of a positive type that is currently mainstream but a chemical amplification resist composition of a negative type, by using an organic developer. As the technology, there has been known, for example, use of a combination of a resin having a decreased solubility in a developer containing an organic solvent through the action of an acid and having at least one of a fluorine atom and a silicon atom with a compound having basicity or being capable of increasing the basicity by the action of an acid, and thus, it has been considered that the focus margin is wide, the ray width irregularity is low, the pattern shape is excellent, and the bridge defects are reduced (see, for example, JP2011-141491A).

However, more recently, there has been a drastically increasing demand for finer contact holes. Correspondingly, it is required that in the case of forming hole patterns, particularly, having ultrafine pore diameters (for example, 60 nm or less) in the resist film, it is required to improve local pattern dimensional uniformity and the hole pattern shapes.

The invention has been made in consideration of the-above described problems, and it has an object to provide an actinic ray-sensitive or radiation-sensitive resin composition which is capable of forming hole patterns having ultrafine pore diameters (for example, 60 nm or less) and excellent cross-sectional shapes with excellent local pattern dimensional uniformity; and a resist film, a pattern forming method, a method for preparing an electronic device, and an electronic device, each using the same.

SUMMARY OF THE INVENTION

The invention has the configurations below, thereby accomplishing the above-described objects of the invention.

The actinic ray-sensitive or radiation-sensitive resin composition of the invention comprises (P) a resin containing 30 mol % or more of a repeating unit (a) represented by the following general formula (I) based on all the repeating units, (B) a compound capable of generating an acid upon irradiation of actinic rays or radiation, and (G) a non-photosensitive compound having at least one of a fluorine atom and a silicon atom, and further having basicity or being capable of increasing the basicity by an action of an acid.

(I)

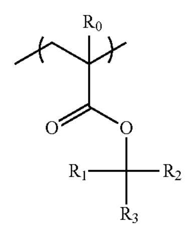

In the general formula (I), $R_0$ represents a hydrogen atom or a methyl group; and each of $R_1$, $R_2$, and $R_3$ independently represents a linear or branched alkyl group.

Preferably, the linear or branched alkyl group for $R_1$, $R_2$, and $R_3$ is an alkyl group having 1 to 4 carbon atoms.

Also, the compound (B) is preferably a compound capable of generating an acid represented by the following general formula (II) or (III).

(II)

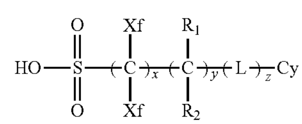

(III)

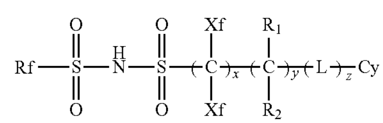

In the general formulae, each of Xf's independently represents a fluorine atom, or an alkyl group substituted with at least one fluorine atom;

each of $R_1$ and $R_2$ independently represents a hydrogen atom, a fluorine atom, or an alkyl group, and in the case of each of $y \geq 2$, each of $R_1$'s and $R_2$'s independently represents a hydrogen atom, a fluorine atom, or an alkyl group;

L represents a divalent linking group, and in the case of z≥2, each of L's independently represents a divalent linking group;

Cy represents a cyclic organic group;

Rf represents a group containing a fluorine atom;

x represents an integer of 1 to 20;

y represents an integer of 0 to 10; and z represents an integer of 0 to 10.

Also, the actinic ray-sensitive or radiation-sensitive resin composition preferably further comprises a basic compound or ammonium salt compound (C) capable of decreasing the basicity upon irradiation with actinic rays or radiation.

Also, the compound (G) is preferably a nitrogen-containing compound.

Also, the content of the compound (G) is preperably from 0.01 to 10% by mass based on the total solid content of the actinic ray-sensitive or radiation-sensitive resin composition.

Also, the actinic ray-sensitive or radiation-sensitive resin composition preferably further comprises a hydrophobic resin containing at least one of a fluorine atom and a silicon atom (E).

A resist film of the present invention is preferably formed by the actinic ray-sensitive or radiation-sensitive resin composition of the present invention.

A pattern forming method of the present invention preferably comprises exposing the resist film of the present invention; and developing the resist film after exposure by using a developer including an organic solvent to form a negative type pattern.

Preferably, the content of the organic solvent in the developer including the organic solvent is from 90% by mass to 100% by mass based on the total mass of the developer.

Also, the developer is preferably a developer containing at least one organic solvent selected from a group consisting of a ketone-based solvent, an ester-based solvent, an alcohol-based solvent, an amide-based solvent, and an ether-based solvent.

Also, the pattern forming method preferably further comprises washing with a rinsing liquid including an organic solvent.

A method for preparing an electronic device of the present invention preferably comprises the pattern forming method of the present invention.

An electronic device of the present invention is preferably prepared by the method for preparing an electronic device of the present invention.

The invention further preferably includes the following configuration.

For the actinic ray-sensitive or radiation-sensitive resin composition of the present invention, the resin (P) is a resin further having a repeating unit having a hydroxyadamantyl group or a dihydroxyadamantyl group.

Also, the resin (P) further has a repeating unit having a lactone structure or a sultone structure.

Also, the actinic ray-sensitive or radiation-sensitive resin composition is a chemical amplification resist composition for development with an organic solvent.

In addition, the actinic ray-sensitive or radiation-sensitive resin composition is for liquid-immersion exposure.

In the pattern forming method of the present invention, the exposure in exposing the resist film is liquid-immersion exposure.

According to the invention, an actinic ray-sensitive or radiation-sensitive resin composition is capable of forming a hole pattern having an ultrafine pore diameter (for example, 60 nm or less) and an excellent cross-sectional shape with excellent local pattern dimensional uniformity; and a resist film, a pattern forming method, a method for preparing an electronic device, and an electronic device, each using the same can be provided.

DESCRIPTION OF THE PREFERRED EMBODIMENTS

Hereinbelow, the embodiments of the invention will be described in detail.

In the description of a group (atomic group) in the present specification, when the group (atomic group) is described without specifying whether substituted or unsubstituted, the group includes both a group (atomic group) having no substituent and a group (atomic group) having a substituent. For example, the term "alkyl group" includes not only an alkyl group having no substituent (unsubstituted alkyl group) but also an alkyl group having a substituent (substituted alkyl group).

In the description, the term "actinic rays" or "radiation" refers to, for example, a bright line spectrum of a mercury lamp, far ultraviolet rays typified by an excimer laser, extreme-ultraviolet rays (EUV light), X rays, an electron beam (EB), or the like. Further, the light in the invention means actinic rays or radiation.

Furthermore, unless otherwise specifically indicated, the term "exposure" in the present description includes not only exposure to a mercury lamp, far ultraviolet rays typified by an excimer laser, X-rays, EUV light, or the like but also lithography with a particle beam such as an electron beam and an ion beam. In the present invention, a description of "(from) X to Y" representing a numerical range has a same meaning as "greater than or equal to X and less than or equal to Y".

The actinic ray-sensitive or radiation-sensitive resin composition of the invention (hereinafter also referred to as "the composition of the invention") is an actinic ray-sensitive or radiation-sensitive resin composition including (P) a resin containing 30 mol % or more of a repeating unit (a) represented by the following general formula (I) based on all the repeating units, (B) a compound capable of generating an acid upon irradiation of actinic rays or radiation, and (G) a non-photosensitive compound having at least one of a fluorine atom and a silicon atom, and further having basicity or being capable of increasing the basicity by the action of an acid.

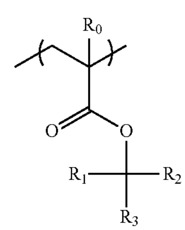

(I)

In the general formula (I), $R_0$ represents a hydrogen atom or a methyl group; and each of $R_1$, $R_2$, and $R_3$ independently represents a linear or branched alkyl group.

By the actinic ray-sensitive or radiation-sensitive resin composition, even in the case where a hole pattern having an ultrafine pore diameter (for example, 60 nm or less) is formed on the resist film formed from the composition, a hole pattern having an excellent cross-sectional shape can be formed with excellent local pattern dimensional uniformity. The reason therefor is not clear, but is presumed as follows.

First, the compound (B) (hereinafter also referred to as an "acid generator") is dispersed in a resist film obtained from the actinic ray-sensitive or radiation-sensitive resin composition. Further, in a method for forming a negative type pattern by developing the resist film after exposure using a developer including an organic solvent (hereinafter also referred to as "an organic solvent-based developer" or "an organic developer"), exposure is conducted in the area other than an area in which the hole pattern of the resist film is formed.

In the exposed area of the resist film, the acid generated from the acid generator (B) is reacted with the ester moiety of the repeating unit (a) represented by the general formula (I) in the resin (P) to cause the repeating unit (a) to generate a carboxyl group, and as a result, the polarity of the resin (P) increases, and thus, the solubility in developer including an organic solvent decreases.

In this way, subsequently, by developing the resist film using a developer including an organic solvent, the non-exposed area is removed and a hole pattern is formed.

Herein, the resin (P) in the actinic ray-sensitive or radiation-sensitive resin composition of the invention has the repeating unit (a) represented by the general formula (I), and is thought to have increased dissolution contrast in a chemical structure represented by the general formula (I) before and after the deprotection, as compared with, for example, the chemical structure of the general formula (I) in which $R_1$ and $R_2$ are bonded to each other to form a ring. By this, it is thought that since patterns highly faithful to an optical image are formed, local pattern dimensional uniformity of the obtained hole pattern is excellent.

On the other hand, when exposure is carried out using a resist film formed using the actinic ray-sensitive or radiation-sensitive resin composition including the acid generator (B), the outermost portion of the resist film is exposed to a higher degree and has a higher concentration of the acid generated, as compared with the inside, and thus, the reaction of the acid with the resin (P) tends to further proceed. Further, when the exposed film is subjected to development using a developer including an organic solvent, the cross-section of the area for image formation with the hole pattern (that is, the exposed area) tends to have a reversely tapered shape or a T-top shape. Particularly, in the case of using the resin (P) having the repeating unit (a) represented by the general formula (I), since patterns highly faithful to an optical image are formed, the above-described tendency becomes actualized.

However, the actinic ray-sensitive or radiation-sensitive resin composition of the invention contains a non-photosensitive compound (G) having at least one of a fluorine atom and a silicon atom, and further having basicity or being capable of increasing the basicity by the action of an acid.

Since the compound (G) has at least one of a fluorine atom and a silicon atom, it has low surface free energy and is easily unevenly distributed on the outermost portion of the resist film, as compared with a case where it does not have such an atom.

Accordingly, when the resist film including such a compound (G) is exposed, a compound having basicity or a compound capable of increasing the basicity by the action of an acid are present at high concentrations in the outermost portion of the resist film. Therefore, the excess acid generated in the surface layer of the exposed area can be captured. That is, the acid concentration distribution in the direction of the thickness of the exposed area of the resist film can be adjusted to be uniform. In this way, a reduced solubilization or insolubilization reaction in a developer including an organic solvent of the resist film using an acid as a catalyst can be more uniformly carried out in the thickness direction of the resist film, and therefore, the generation of a reversely tapered shape or a T-top shape in the cross-section of the area for image formation with the hole pattern can be inhibited.

Furthermore, it is thought that improvement of the cross-sectional shape in the hole pattern contributes to further improvement of the local pattern dimensional uniformity of the hole pattern.

As described above, according to the actinic ray-sensitive or radiation-sensitive resin composition of the invention, a hole pattern having an excellent cross-sectional shape can be formed with excellent local pattern dimensional uniformity.

Incidentally, in the case where an ultrafine hole pattern is formed by a positive type image forming method as described above, the shape of the pattern is easily deteriorated and it is substantially impossible to form an ultrafine hole pattern (for example, having a pore diameter of 60 nm or less). The reason therefor is that in the case where a hole pattern is formed by a positive type image forming method, the area on which the hole pattern is formed becomes an exposed area, but it is substantially impossible to resolve the highly fine exposed area by exposure optically.

Therefore, in the case where the actinic ray-sensitive or radiation-sensitive resin composition according to the invention is used for negative type development (development in which during exposure, the solubility of the composition in a developer decreases, and thus, the exposed area remains as a pattern and the non-exposed area is removed), particularly in the case of a hole pattern having an ultrafine pore diameter (for example, 60 nm or less) on a resist film. That is, the actinic ray-sensitive or radiation-sensitive resin composition according to the invention can be used as an actinic ray-sensitive or radiation-sensitive resin composition for organic solvent development using a developer including an organic solvent. Herein, the use for organic solvent development means a use for at least development using a developer including an organic solvent.

Generally, the negative type image forming method using a developer including an organic solvent has smaller dissolution contrast in a developer for the non-exposed area and the exposed area, as compared with the positive type image forming method using an alkali developer. Thus, for the above-described reasons, in order to form a hole pattern having an ultrafine pore diameter, it is necessary to employ the negative type image forming method. However, the effect of unbalance in the acid concentration in the thickness direction of the exposed area of the resist film (that is, presence of an excess amount of an acid in the outermost portion of the exposed area) is larger than that of the positive type image forming method having a high dissolution contrast developer for the non-exposed area and the exposed area.

Therefore, the invention is of a high technical value since a problem of the cross-sectional shape of the pattern easily visualized (that is, a problem of generation of a reversely tapered shape or a T-top shape) in the negative type image forming method can be solved, and as a result, a hole pattern having an ultrafine hole diameter but having an excellent cross-sectional shape can be formed.

The actinic ray-sensitive or radiation-sensitive resin composition of the invention is typically a resist composition, and particularly preferably a negative type resist composition (that is, resist composition for organic solvent development) from the viewpoint that a superior effect can be obtained. Further, the composition according to the invention is typically a chemical amplification resist composition.

[1] (P) Resin Having the Repeating Unit (a) Represented by the Following General Formula (I)

(I)

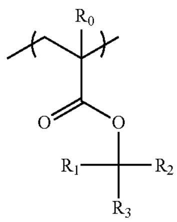

In the general formula (I), $R_0$ represents a hydrogen atom or a methyl group, and each of $R_1$, $R_2$, and $R_3$ independently represents a linear or branched alkyl group.

As the linear or branched alkyl group for $R_1$, $R_2$, and $R_3$, an alkyl group having 1 to 4 carbon atoms is preferred, and examples thereof include a methyl group, an ethyl group, an n-propyl group, an isopropyl group, an n-butyl group, an isobutyl group, and a tert-butyl group.

As $R_1$, a methyl group, an ethyl group, an n-propyl group, and an n-butyl group are preferred, a methyl group and an ethyl group are more preferred, and a methyl group is particularly preferred.

As $R_2$, a methyl group, an ethyl group, an n-propyl group, an isopropyl group, and an n-butyl group are preferred, a methyl group and an ethyl group are more preferred, and a methyl group is particularly preferred.

As $R_3$, a methyl group, an ethyl group, an n-propyl group, an isopropyl group, an n-butyl group, an isobutyl group, and a tert-butyl group are preferred, a methyl group, an ethyl group, an isopropyl group, and an isobutyl group are more preferred, and a methyl group, an ethyl group, and an isopropyl group are particularly preferred.

The repeating unit (a) represented by the general formula (I) is a repeating unit having a group that decomposes by the action of an acid to generate a polar group (carboxyl group) (hereinafter also referred to as an "acid-decomposable group").

The resin having the repeating unit (a) represented by the general formula (I) used in the actinic ray-sensitive or radiation-sensitive resin composition according to the invention (hereinafter also referred to as a "resin (P)") is a resin having an acid-decomposable group (hereinafter also referred to as an "acid-decomposable resin"), having an increased polarity by the action of an acid and a decreased solubility in a developer including an organic solvent.

Furthermore, the resin (P) is a resin having an increased polarity by the action of an acid, and thus, having an increased solubility in an alkali developer.

In the resin (P) in the invention, the content of the repeating unit (a) represented by the general formula (I) (the total content in the case of including plural kinds of the repeating units) is 30 mol % or more, and preferably 40 mol % or more, based on all the repeating units in the resin (P). From the viewpoint of improvement of a dissolution contrast, it is more preferably 50 mol % or more, and particularly preferably 55 mol % or more. Further, from the view point of forming the excellent pattern, the upper limit is preferably 90 mol % or less, more preferably 80 mol % or less, and particularly preferably 70 mol % or less.

By adjusting the content of the repeating unit (a) represented by the general formula (I) in all the repeating units of the resin (P) to 30 mol % or more, formation of a hole pattern having an ultrafine pore diameter (for example, 60 nm or less) with excellent local pattern dimensional uniformity is particularly secured. Specific examples of the repeating unit (a) represented by the general formula (I) are shown below, but the invention is not limited thereto.

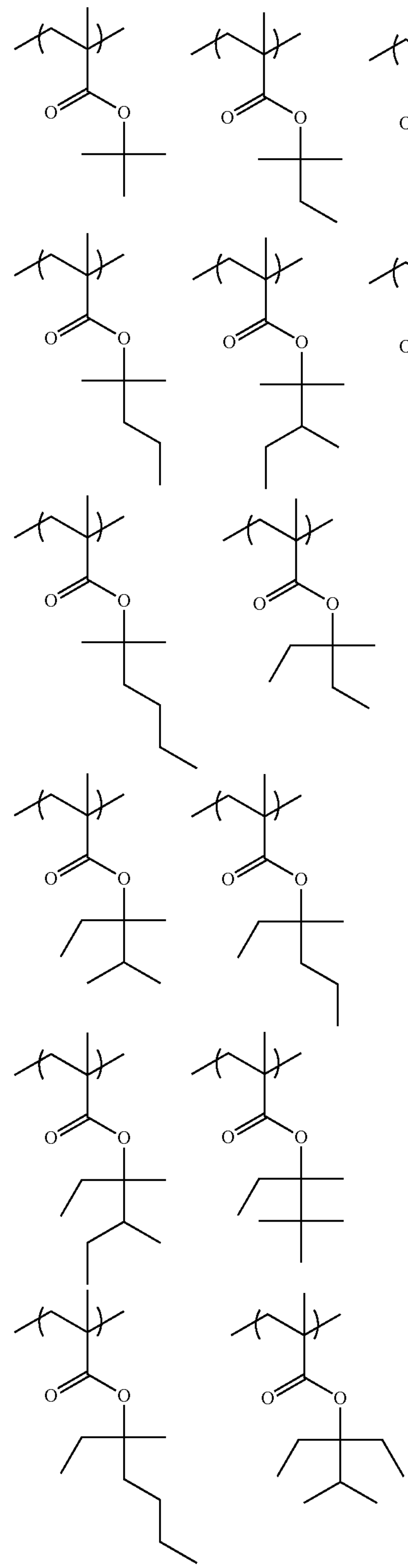

-continued

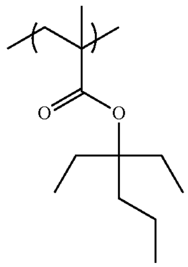

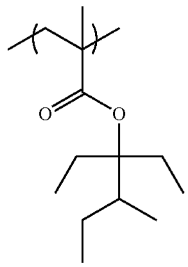

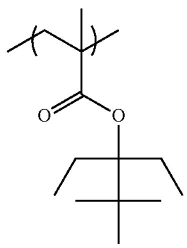

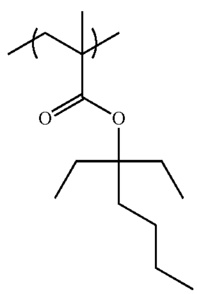

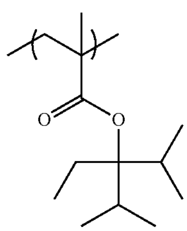

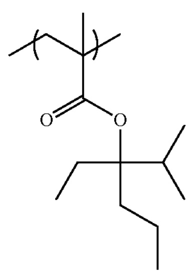

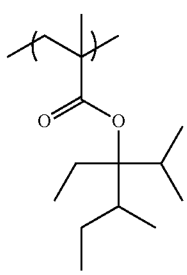

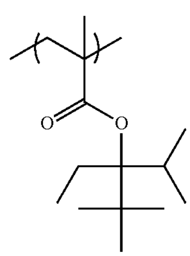

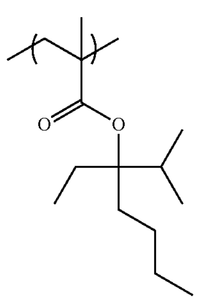

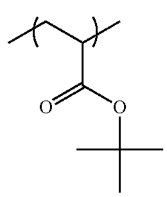

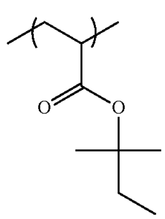

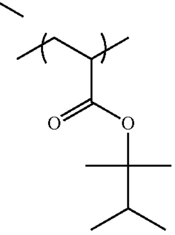

-continued

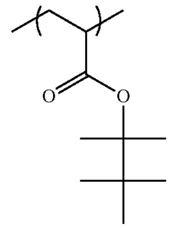

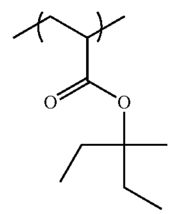

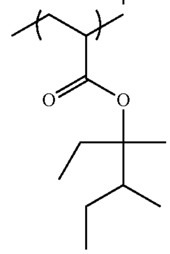

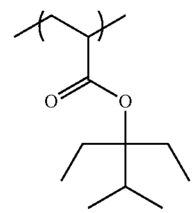

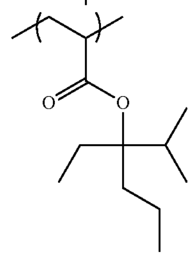

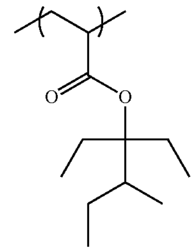

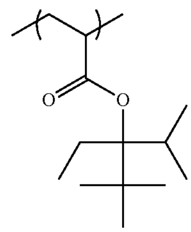

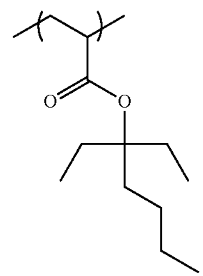

In the invention, the resin (P) may have a repeating unit (b) having an acid-decomposable group other than that of the repeating unit (a).

The acid-decomposable group other than that of the repeating unit (a) preferably has a polar group having a structure protected with a group that decomposes and eliminates by the action of an acid.

The polar group is not particularly limited as long as it is a group that is sparingly soluble or insoluble in a developer including an organic solvent, but examples thereof include acidic groups such as a carboxyl group and a sulfonic acid group (groups that are dissociated in a 2.38%-by-mass aqueous tetramethylammonium hydroxide solution used as a developer for a resist), and an alcoholic hydroxyl group.

Herein, the alcoholic hydroxyl group refers to a hydroxyl group other than a hydroxyl group directly bonded to an aromatic ring as a hydroxyl group bonded to a hydrocarbon skeleton (phenolic hydroxyl group), excluding an aliphatic alcohol having the α-position substituted with an electron-withdrawing group such as a fluorine atom (for example, a fluorinated alcohol group (a hexafluoroisopropanol group or the like)). As the alcoholic hydroxyl group, a hydroxyl group having a pKa of 12 to 20 is preferred.

The acid-decomposable group is preferably a group formed by substituting a group which eliminates by the action of an acid for a hydrogen atom of the above-described group.

Examples of the group which eliminates by the action of an acid include —C($R_{36}$)($R_{37}$)($R_{38}$), —C($R_{36}$)($R_{37}$)($OR_{39}$), and —C($R_{01}$)($R_{02}$)($OR_{39}$).

In the general formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

The alkyl group of $R_{36}$ to $R_{39}$, $R_{01}$, and $R_{02}$ is preferably an alkyl group having 1 to 8 carbon atoms, and examples thereof include a methyl group, an ethyl group, a propyl group, an n-butyl group, a sec-butyl group, a hexyl group, and an octyl group.

The cycloalkyl group of $R_{36}$ to $R_{39}$, $R_{01}$, and $R_{02}$ may be either monocyclic or polycyclic. The monocyclic cycloalkyl group is preferably a cycloalkyl group having 3 to 8 carbon atoms, and examples thereof include a cyclopropyl group, a cyclobutyl group, a cyclopentyl group, a cyclohexyl group, and a cyclooctyl group. The polycyclic cycloalkyl group is preferably a cycloalkyl group having 6 to 20 carbon atoms, and examples thereof include an adamantyl, a norbornyl group, an isobornyl group, a camphanyl group, a dicyclopentyl group, an α-pinel group, a tricyclodecanyl group, a tetracyclododecyl group, and an androstanyl group. Further, at least one carbon atom in the cycloalkyl group may be substituted with a heteroatom such as an oxygen atom.

The aryl group of $R_{36}$ to $R_{39}$, $R_{01}$, and $R_{02}$ is preferably an aryl group having 6 to 10 carbon atoms, and examples thereof include a phenyl group, a naphthyl group, and an anthryl group.

The aralkyl group of $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

The alkenyl group of $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

The ring formed by the mutual bonding of $R_{36}$ and $R_{37}$ is preferably a cycloalkyl group (monocyclic or polycyclic). The cycloalkyl group is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group. A monocyclic cycloalkyl group having 5 or 6 carbon atoms is more preferred, and a monocyclic cycloalkyl group having 5 carbon atoms is particularly preferred.

The repeating unit (b) having an acid-decomposable group other than that of the repeating unit (a), which may be contained in the resin (P) is preferably a repeating unit represented by the following general formula (AI).

(AI)

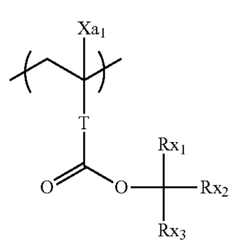

In the general formula (AI), $Xa_1$ represents a hydrogen atom, a methyl group which may have a substituent, or a group represented by —$CH_2$—$R_9$. $R_9$ represents a hydroxyl group or a monovalent organic group. Examples of the monovalent organic group include an alkyl group having 5 or less carbon atoms and an acyl group having 5 or less carbon atoms. Among these, an alkyl group having 3 or less carbon atoms is preferred, and a methyl group is more preferred. $Xa_1$ is preferably a hydrogen atom, a methyl group, a trifluoromethyl group, or a hydroxymethyl group.

T represents a single bond or a divalent linking group.

$Rx_1$ to $Rx_3$ each independently represent an alkyl group (linear or branched) or a cycloalkyl group (monocyclic or polycyclic).

Two members out of $Rx_1$ to $Rx_3$ may be bonded to each other to form a cycloalkyl group (monocyclic or polycyclic).

However, in the case where T represents a single bond, all of $Rx_1$ to $Rx_3$ do not represent alkyl groups.

Examples of the divalent linking group of T include an alkylene group, a —COO-Rt- group, a —O-Rt- group, and a phenylene group. In the formulae, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

The alkyl group of $Rx_1$ to $Rx_3$ is preferably an alkyl group having 1 to 4 carbon atoms, such as a methyl group, an ethyl group, an n-propyl group, an isopropyl group, an n-butyl group, an isobutyl group, and a t-butyl group.

The cycloalkyl group of $Rx_1$ to $Rx_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group.

The cycloalkyl group formed by the combination of at least two members of $Rx_1$ to $Rx_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group, and particularly preferably a monocyclic cycloalkyl group having 5 to 6 carbon atoms.

An embodiment where $Rx_1$ is a methyl group or an ethyl group, and $Rx_2$ and $Rx_3$ are bonded to each other to form the above-described cycloalkyl group is preferred.

Each of the groups above may have a substituent, and examples of the substituent include an alkyl group (having 1 to 4 carbon atoms), a cycloalkyl group (having 3 to 8 carbon atoms), a halogen atom, an alkoxy group (having 1 to 4 carbon atoms), a carboxyl group, and an alkoxycarbonyl group (having 2 to 6 carbon atoms), and the substituent preferably has 8 or less carbon atoms. Among those, from the viewpoint of improvement of a dissolution contrast in a developer containing an organic solvent before and after acid decomposition, a substituent having no hetero atom such as an oxygen atom, a nitrogen atom, and a sulfur atom is more preferred (for example, more preferably, it is not an alkyl or the like substituted with a hydroxyl group), a group consisting of only a hydrogen atom and a carbon atom is still more preferred, a linear or branched alkyl group, or a cycloalkyl group is particularly preferred.

Specific preferred examples of the repeating unit (b) having an acid-decomposable group other than that of the repeating unit (a) are shown below, but the invention is not limited thereto.

In the specific examples, Rx and $Xa_1$ each represent a hydrogen atom, $CH_3$, $CF_3$, or $CH_2OH$, and Rxa and Rxb each represent an alkyl group having 1 to 4 carbon atoms. Z represents a substituent, and when a plurality of Z's are present, they may be the same as or different from each other. p represents 0 or a positive integer. Specific examples and preferred examples of Z are the same as specific examples and preferred examples of the substituent that each of $Rx_1$ to $Rx_a$ and the like may have.

1

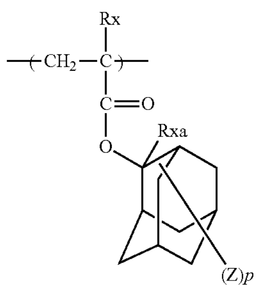

2

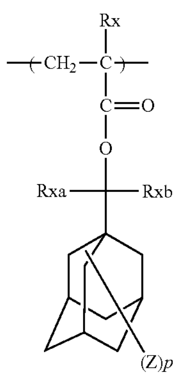

3

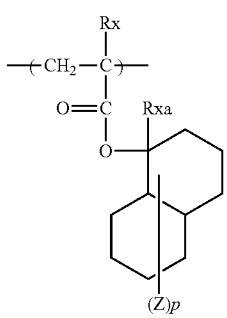

4

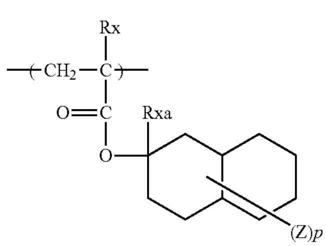

-continued

5

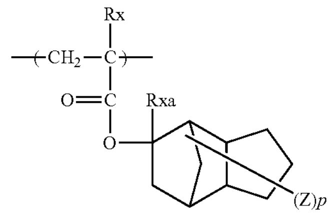

6

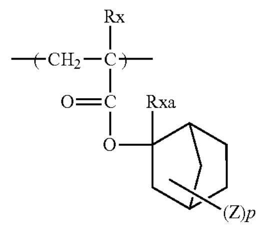

7

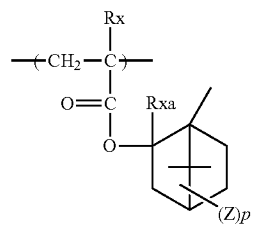

8

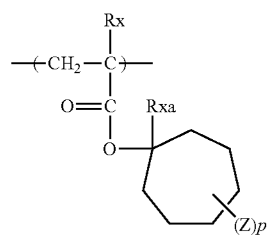

9

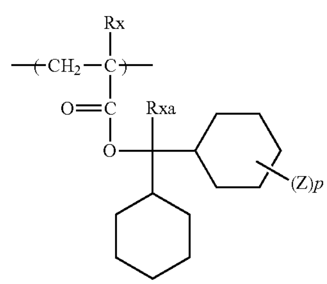

10

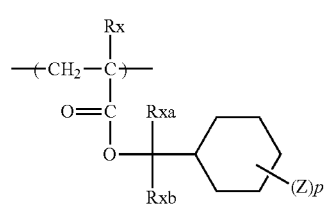

11

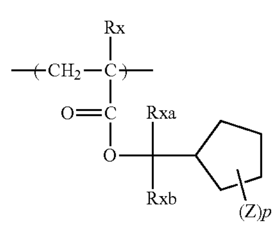

-continued
12
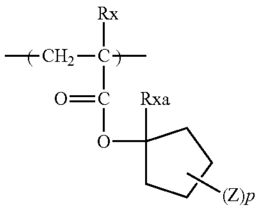
13
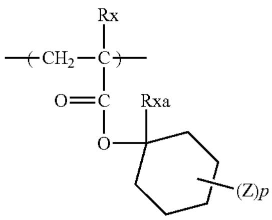
14
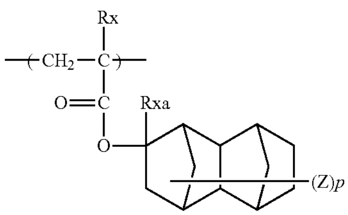
17
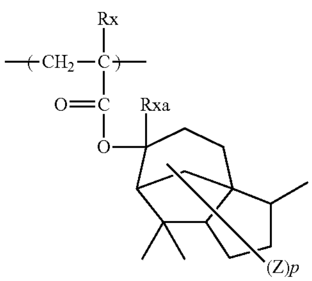
18
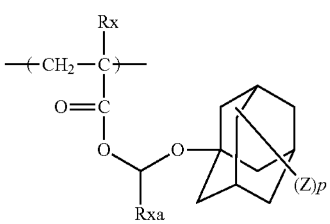
19
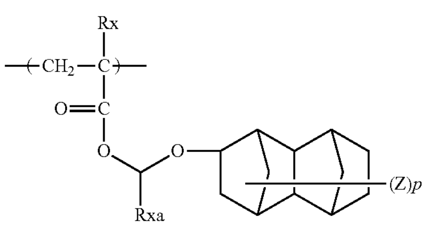
20
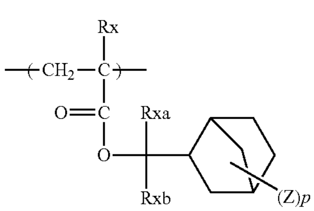
-continued
21
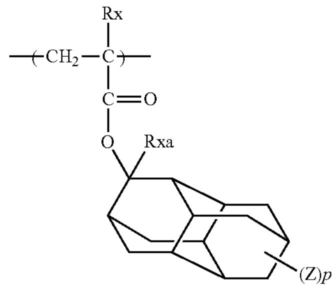
22
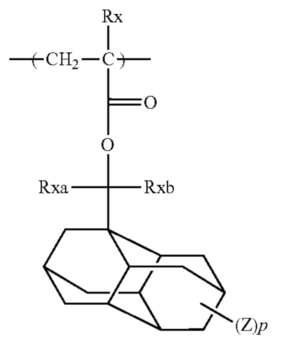
23
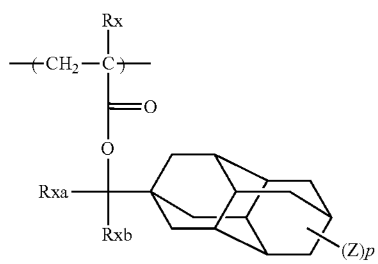
24
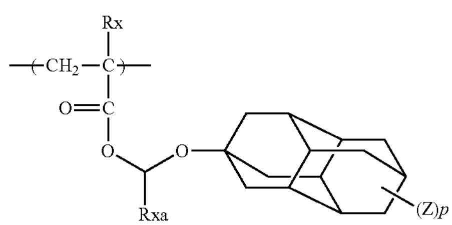
25
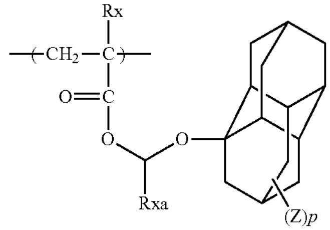

-continued
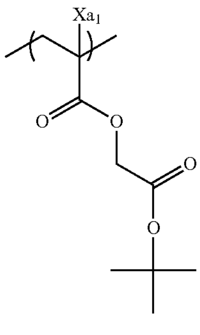
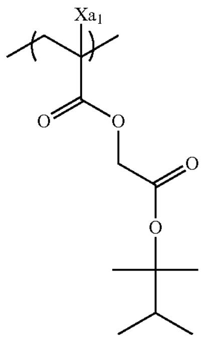
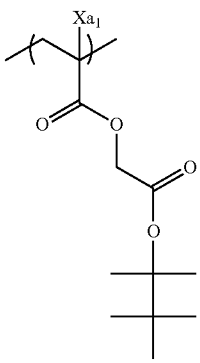
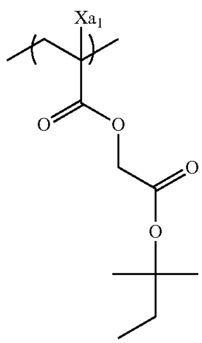
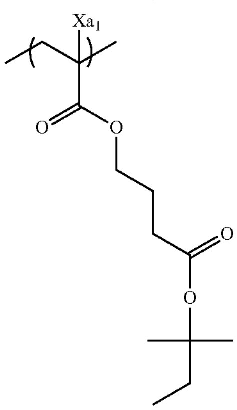
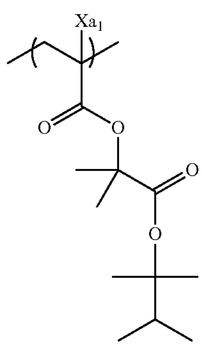
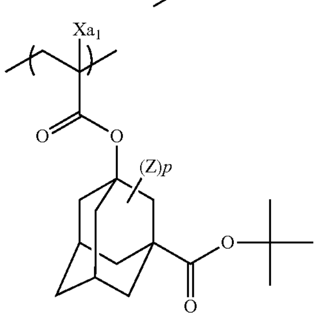
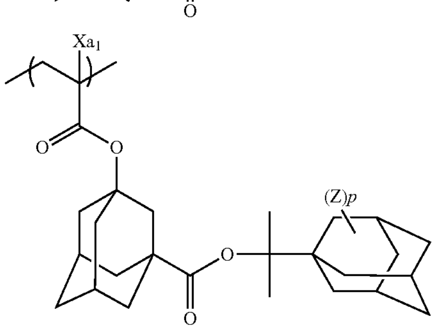
-continued
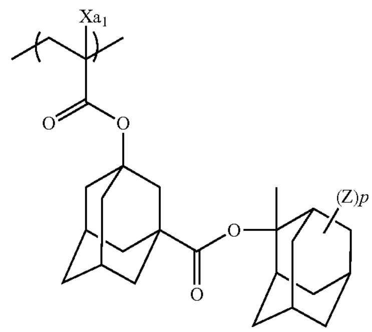
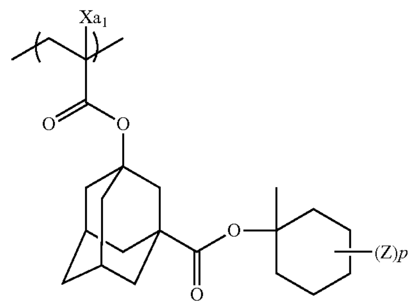
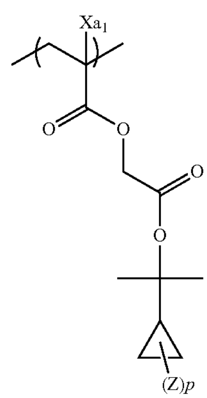
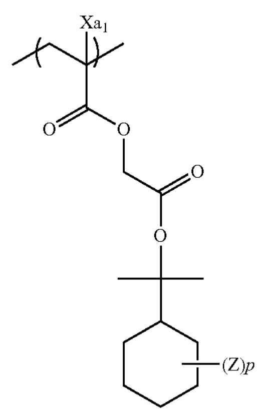
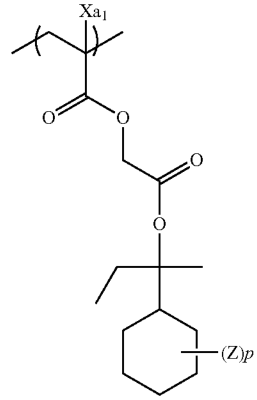
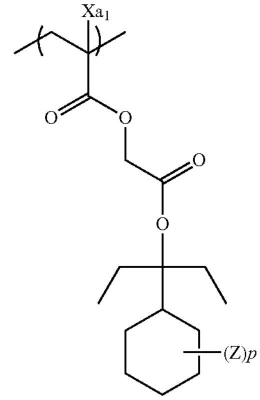

-continued
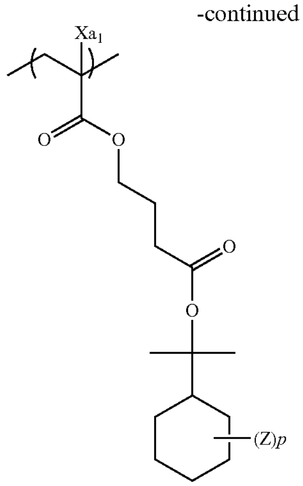
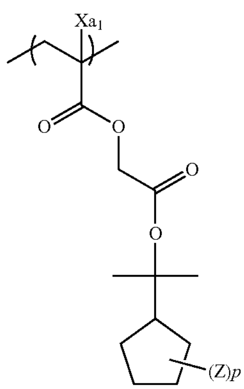
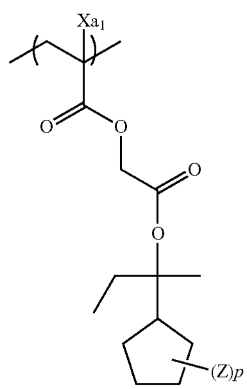
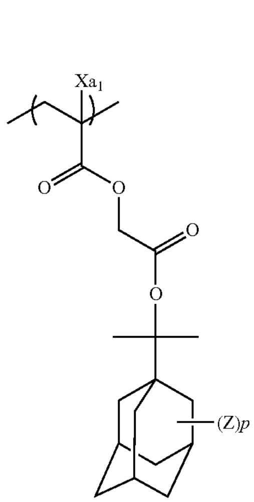
-continued
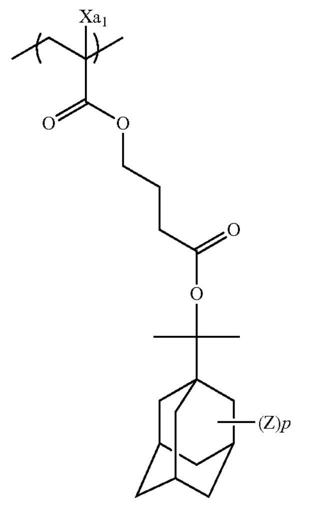
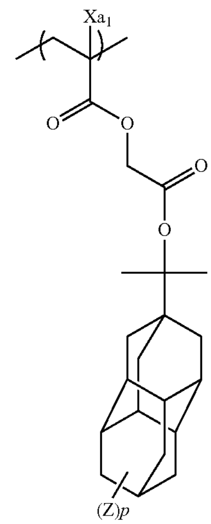
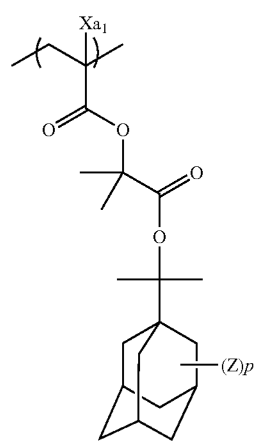
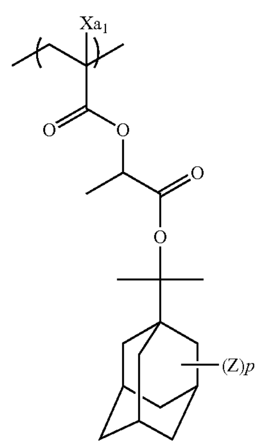
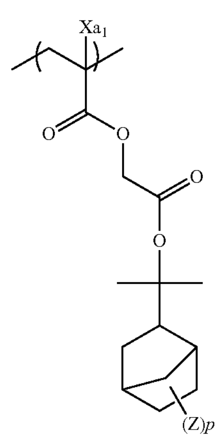
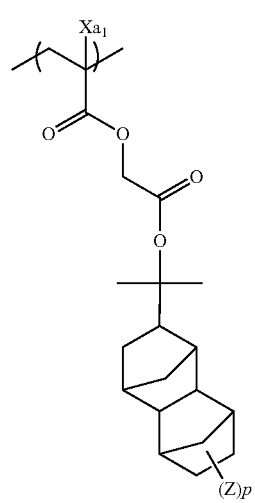

-continued
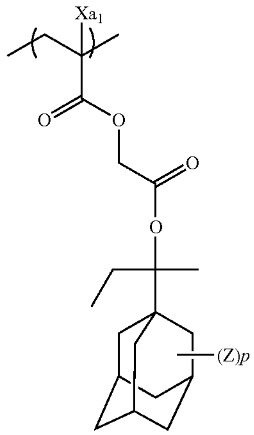
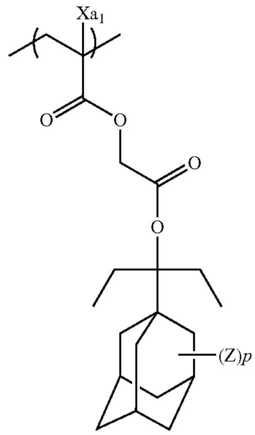
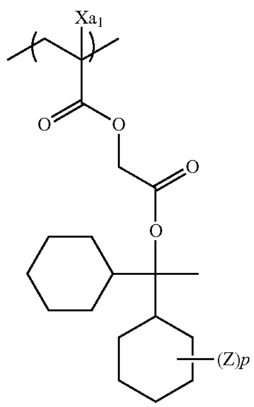
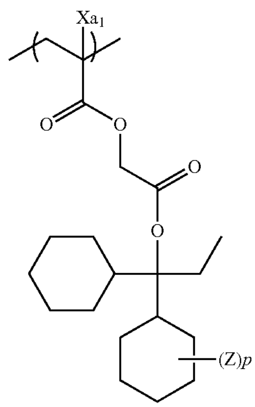
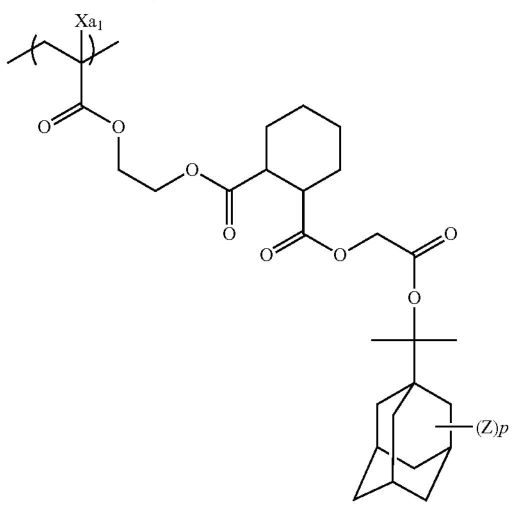
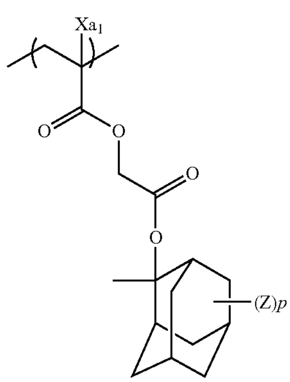
-continued
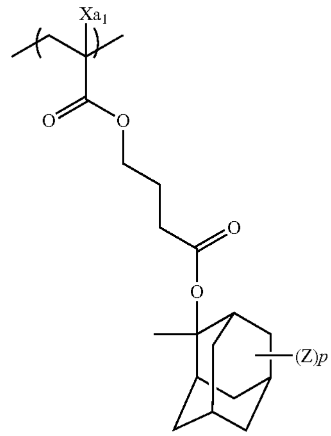
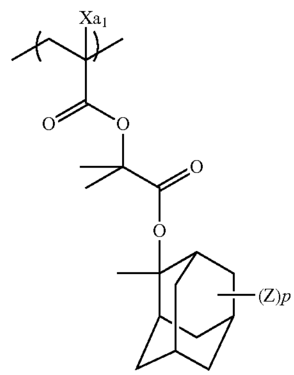
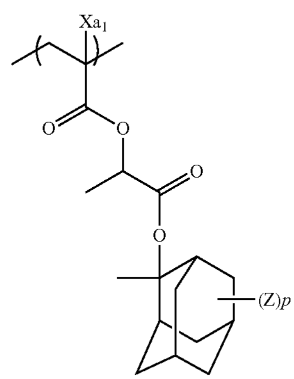
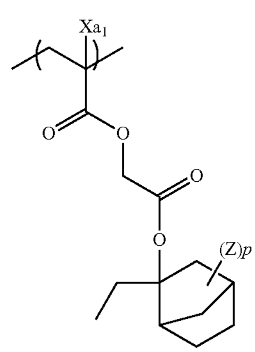

-continued
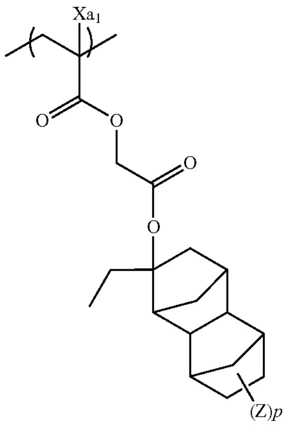
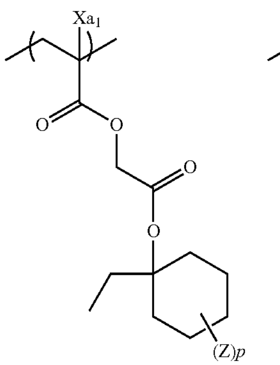
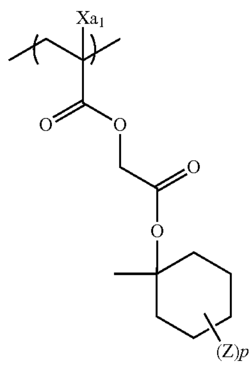
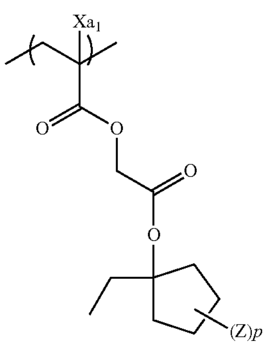
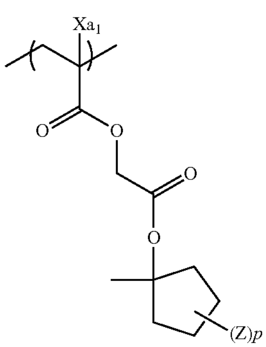
-continued
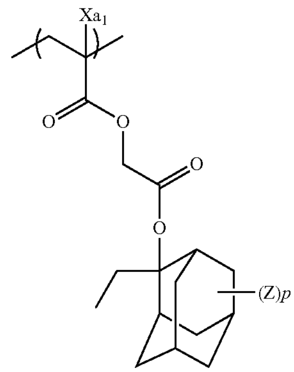
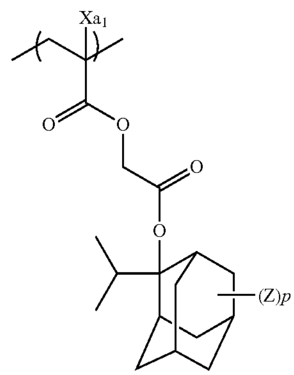
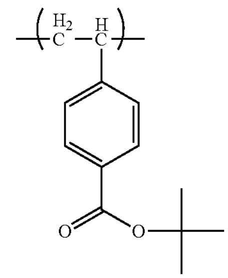
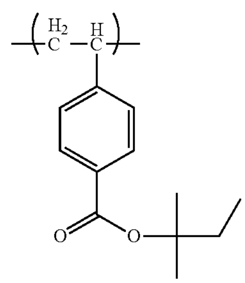
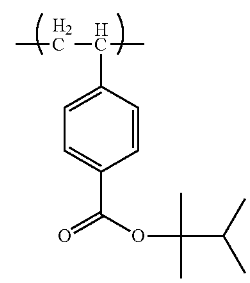
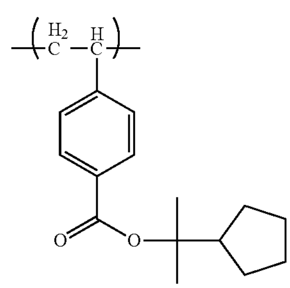
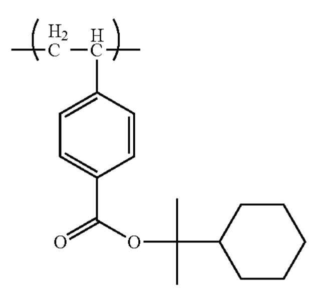

-continued
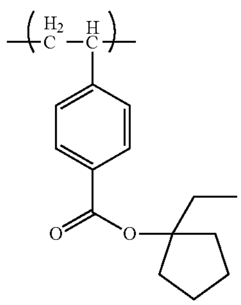
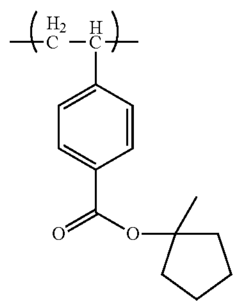
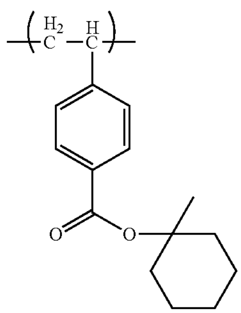
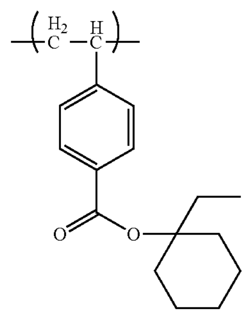
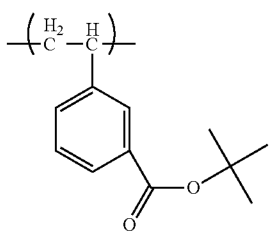
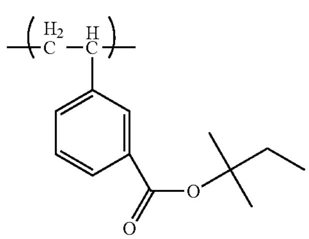
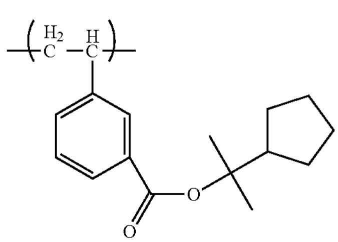
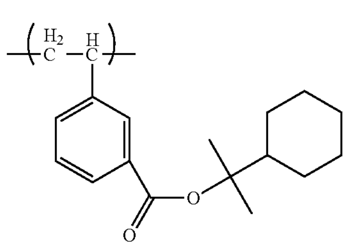
-continued
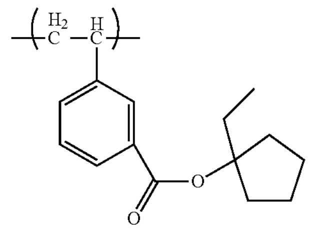
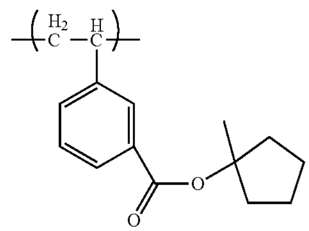
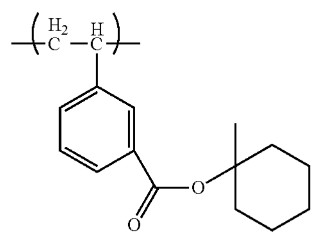
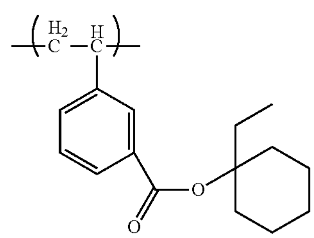
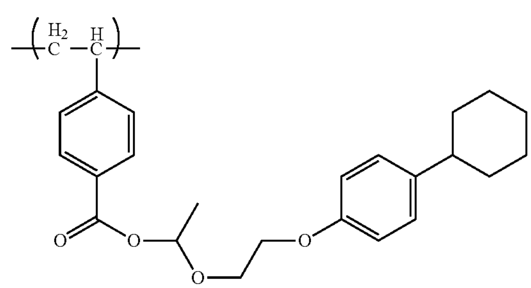
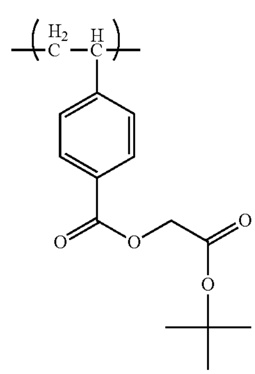

-continued
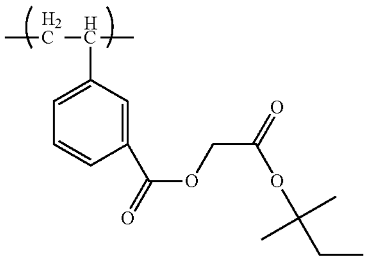
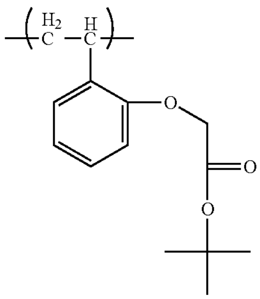
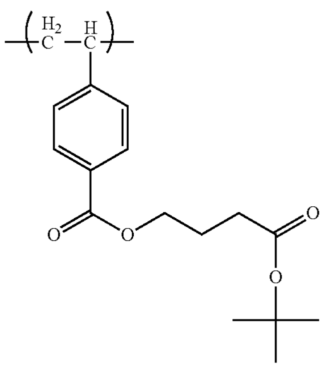
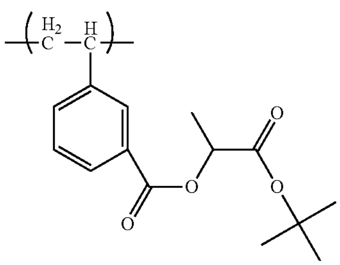
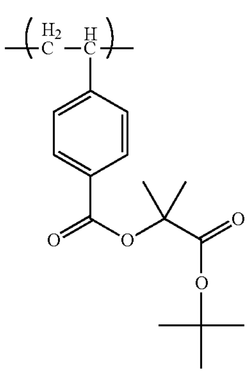
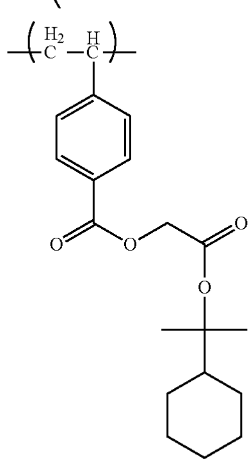
-continued
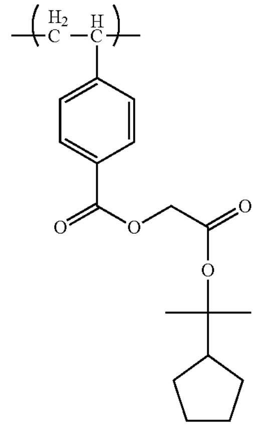
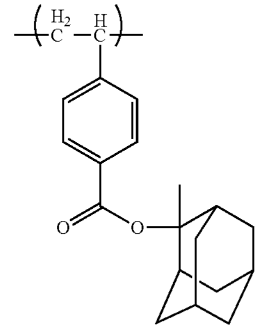
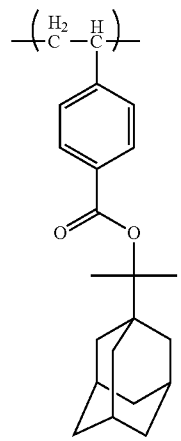
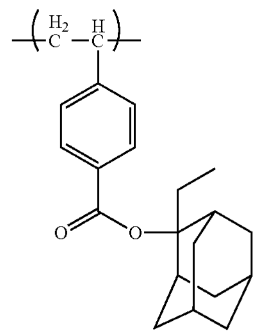
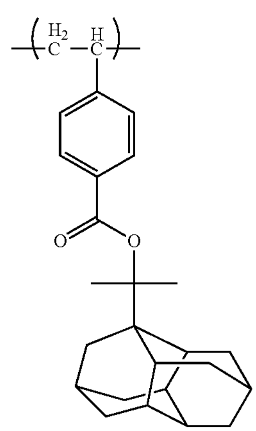
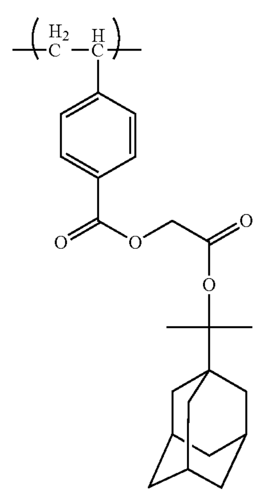

-continued
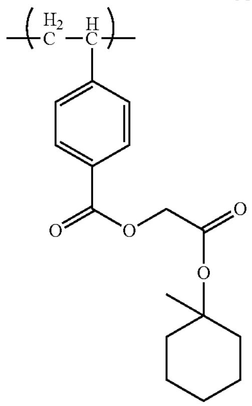
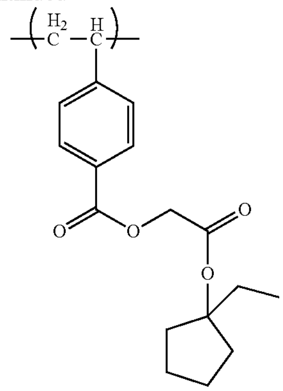
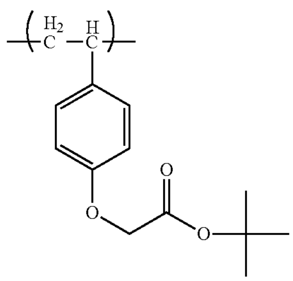
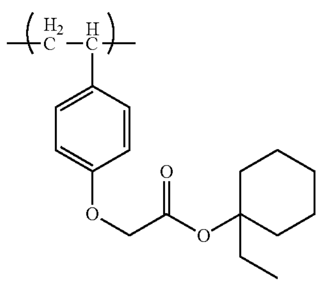
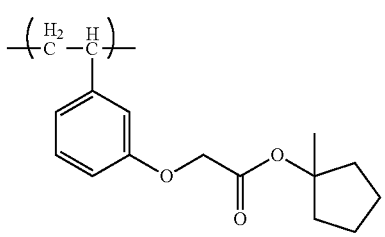
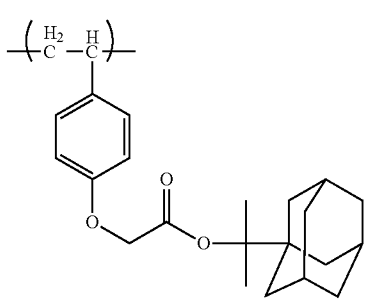
-continued
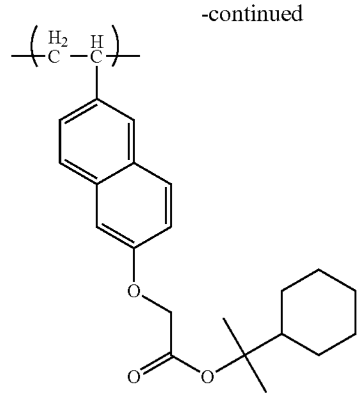
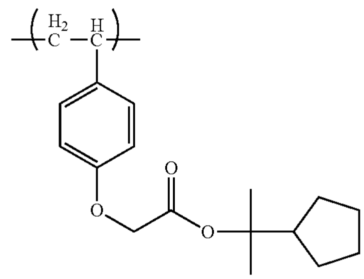
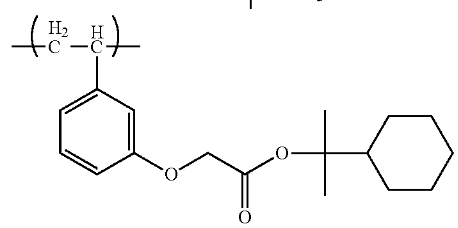
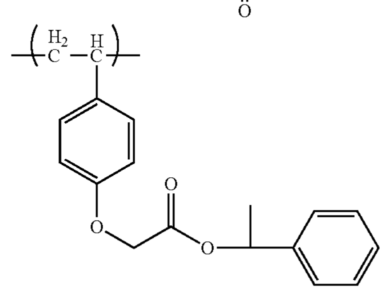
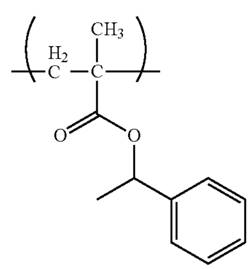
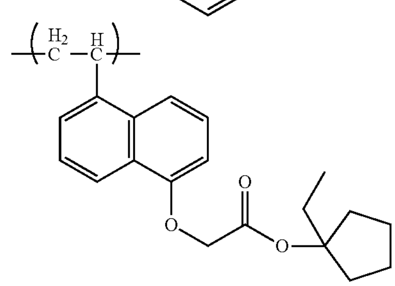
Furthermore, the resin (P) may include a repeating unit represented by the following general formula (VI) as the repeating unit (b), which is particularly preferred for exposure with KrF, an electron beam, or EUV.

(VI)

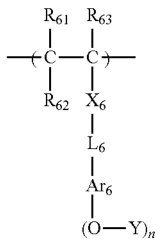

In the general formula (VI), $R_{61}$, $R_{62}$, and $R_{63}$ each independently represent a hydrogen atom, an alkyl group, a cycloalkyl group, a halogen atom, a cyano group, or an alkoxycarbonyl group. $R_{62}$ may be bonded to $Ar_6$ to form a ring (preferably, a 5- or 6-membered ring), and in this case, $R_{62}$ is an alkylene group.

$X_6$ represents a single bond, —COO—, —$CONR_{64}$— ($R_{64}$ represents a hydrogen atom or an alkyl group). $L_6$ represents a single bond or an alkylene group. $Ar_6$ represents a divalent aromatic ring group. In the case where plural Y's are present, they each independently represent a hydrogen atom or a group which eliminates by the action of an acid, provided that at least one of Y's is a group which eliminates by the action of an acid. n represents an integer of 1 to 4.

As the repeating unit (b), a repeating unit represented by the following general formula (1) or a repeating unit represented by the following general formula (2) is preferred.

(1)

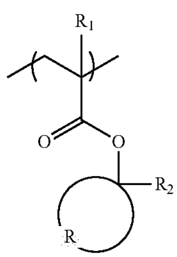

(2)

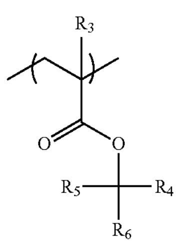

In the general formula (1) and (2), $R_1$ and $R_3$ each independently represent a hydrogen atom, a methyl group which may have a substituent, or a group represented by —$CH_2$—$R_9$. $R_9$ represents a hydroxyl group or a monovalent organic group;

$R_2$ represents an alkyl group or a cycloalkyl group;

$R_4$, $R_5$, and $R_6$ each independently represent an alkyl group or a cycloalkyl group, and at least one of $R_4$, $R_5$, and $R_6$ represents a cycloalkyl group; and R represents an atomic group necessary for forming an alicyclic structure together with the carbon atom.

$R_1$ and $R_3$ each preferably represent a hydrogen atom, a methyl group, a trifluoromethyl group, or a hydroxymethyl group. Specific examples and preferred examples of the monovalent organic group in $R_9$ are the same as those described for $R_9$ in the general formula (AI).

The alkyl group in $R_2$ may be linear or branched and may have a substituent.

The cycloalkyl group in $R_2$ may be monocyclic or polycyclic, and may have a substituent.

$R_2$ is preferably an alkyl group, more preferably an alkyl group having 1 to 10 carbon atoms, and still more preferably an alkyl group having 1 to 5 carbon atoms, and examples thereof include a methyl group and an ethyl group.

R represents an atomic group necessary for forming an alicyclic structure together with the carbon atom. The alicyclic structure formed by R in combination with the carbon atom is preferably a monocyclic alicyclic structure, and preferably has 3 to 7 carbon atoms, more preferably 5 or 6 carbon atoms.

The alkyl group in $R_4$, $R_5$, and $R_6$ may be linear or branched and may have a substituent. The alkyl-group is preferably an alkyl group having 1 to 4 carbon atoms, such as a methyl group, an ethyl group, an n-propyl group, an isopropyl group, an n-butyl group, an isobutyl group, and a t-butyl group.

The cycloalkyl group in $R_4$, $R_5$, and $R_6$ may be monocyclic or polycyclic and may have a substituent. The cycloalkyl group is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group.

Furthermore, other embodiments having the repeating unit (b) other than the repeating unit as exemplified above may be embodiments of the repeating unit which generates the alcoholic hydroxyl group as shown below.

In the specific examples, $X_1$ represents a hydrogen atom, $CH_3$, $CF_3$, or $CH_2OH$.

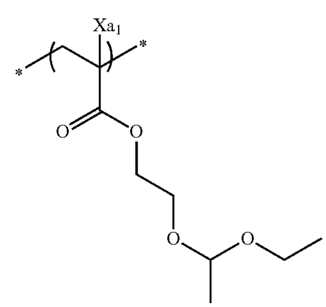

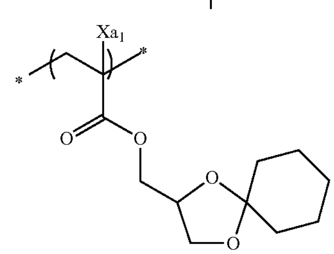

-continued
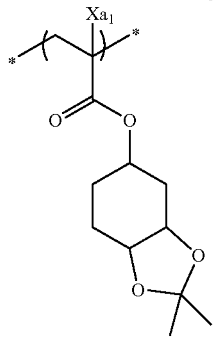
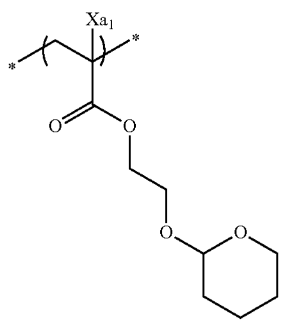
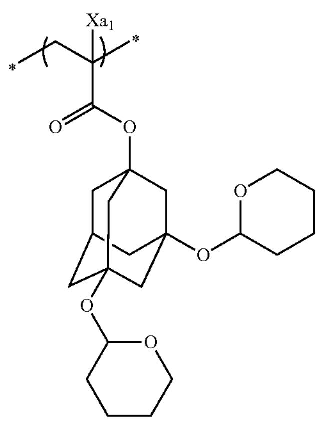
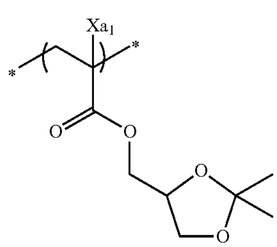
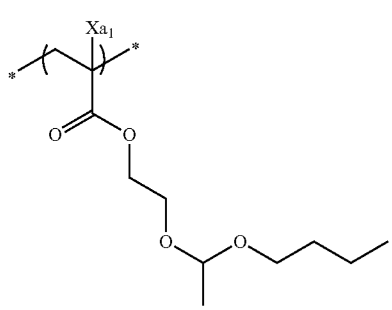
-continued
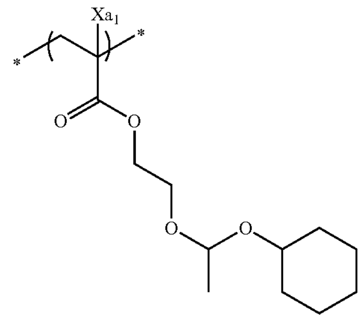
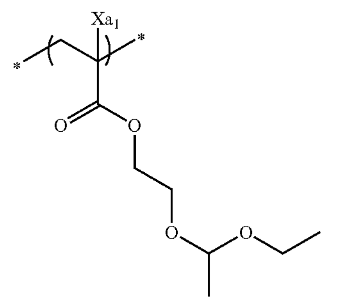
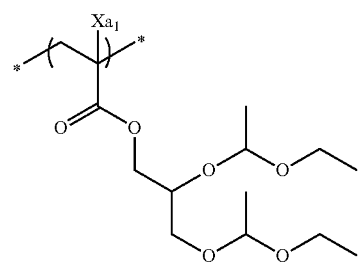
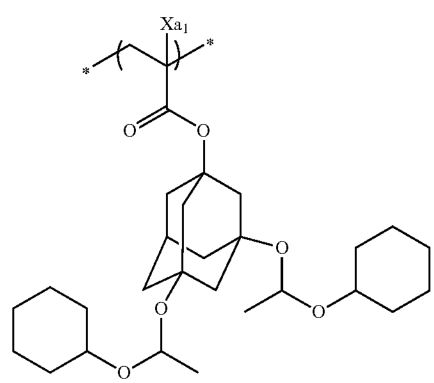
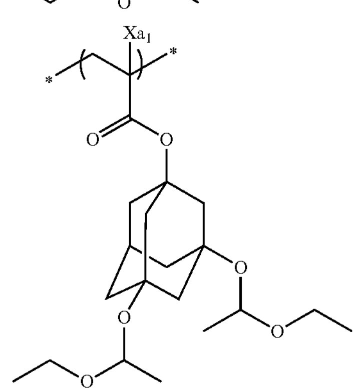

-continued

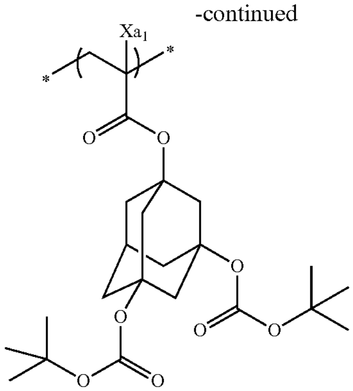

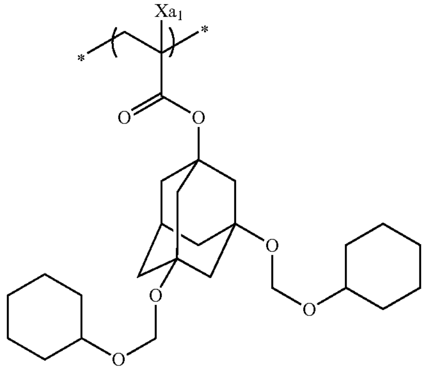

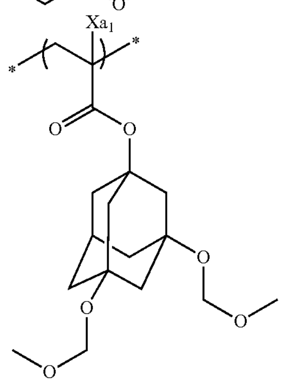

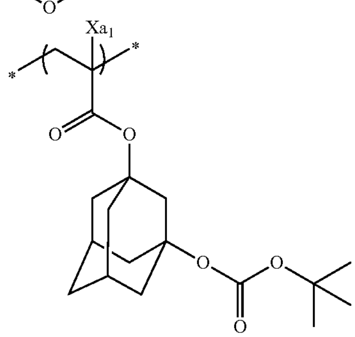

The resin (P) may contain the repeating unit (b) having an acid-decomposable group other than that of the repeating unit (a), but in the case where the resin (P) contains the repeating unit (b), the content of the repeating unit (b) is preferably from 1 to 30 mol %, more preferably from 1 to 20 mol %, and still more preferably from 1 to 15 mol %, based on all the repeating units in the resin (P). In the invention, the molecular weight of the elimination products by the decomposition of the acid-decomposable group in the repeating unit (a) or (b) (a weight average value in the case where plural kinds of the elimination products are generated (hereinafter also referred to as a molar average value)) is preferably 140 or less. In this way, particularly in the case of forming a negative type image, the exposed area remains as a pattern, and therefore, reduction of the film thickness in the pattern portion can be prevented by reducing the molecular weight of the elimination product.

In the invention, the "elimination product that is generated by the decomposition of the acid-decomposable group" refers to a product that decomposes by the action of an acid corresponding to a group that decomposes and eliminates by the action of an acid, and leaves. For example, in the case where $R_1$ to $R_3$ in the general formula (I) of the repeating unit (a) are all methyl groups, thus to form a t-butyl group, they refer to an alkene ($H_2C{=}C(CH_3)_2$) that is generated by the decomposition of the t-butyl moiety.

The resin (P) preferably has a repeating unit having a polar group. By virtue of containing the repeating unit having a polar group, the dissolution speed of the resin (composition) in the developer including an organic solvent is easily controlled to a suitable range.

The repeating unit having a polar group is not particularly limited, but specific examples thereof include a repeating unit having a lactone structure or a sultone structure (c), a repeating unit having an acid group (d), and a repeating unit having a hydroxyl group or a cyano group (e), as described later.

As the repeating unit having a lactone structure or a sultone structure (c), a repeating unit represented by the following general formula (AII) is more preferred.

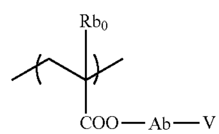

(AII)

In the general formula (AII), $Rb_0$ represents a hydrogen atom, a halogen atom, or an alkyl group (having 1 to 4 carbon atoms), which may have a substituent.

Preferred examples of the substituent which the alkyl group of $Rb_0$ may have include a hydroxyl group and a halogen atom. Examples of the halogen atom of $Rb_0$ include a fluorine atom, a chlorine atom, a bromine atom, and an iodine atom. $Rb_0$ is preferably a hydrogen atom, a methyl group, a hydroxymethyl group, or a trifluoromethyl group, and particularly preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by combination thereof, and is preferably a single bond or a divalent linking group represented by $-Ab_1-CO_2-$.

$Ab_1$ is a linear or branched alkylene group or a monocyclic or polycyclic cycloalkylene group, and is preferably a methylene group, an ethylene group, a cyclohexylene group, an adamantylene group, or a norbornylene group.

V represents a group having a lactone structure or a sultone structure.

Any group having a lactone structure or a sultone structure may be used as long as it has a lactone structure or a sultone structure, but a 5- to 7-membered ring lactone structure is preferred, and a 5- to 7-membered ring lactone structure to which another ring structure is fused to form a bicyclo structure or a spiro structure is preferred. It is more preferred to include a repeating unit having a lactone structure represented by any of the following general formulae (LC1-1) to (LCI-17) and a sultone structure represented by any of the following general formulae (SL1-1) to (SL1-3). Further, the lactone structure or the sultone structure may be bonded directly to the main chain. Preferred examples of the lactone structure include (LC1-1), (LC1-4), (LC1-5), (LC1-6), (LC1-8), (LC1-13), and (LC1-14).

LC1-1

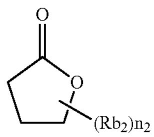

LC1-2

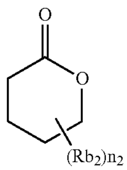

LC1-3

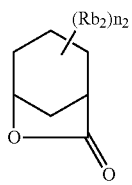

LC1-4

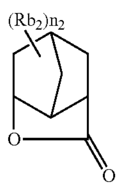

LC1-5

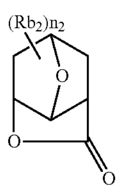

LC1-6

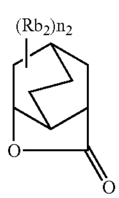

LC1-7

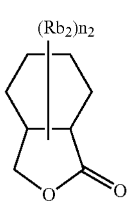

-continued

LC1-8

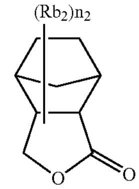

LC1-9

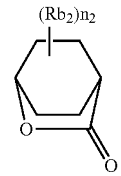

LC1-10

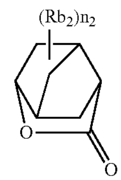

LC1-11

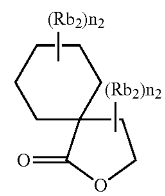

LC1-12

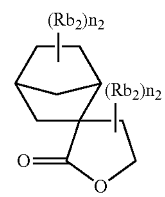

LC1-13

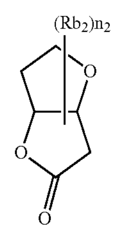

LC1-14

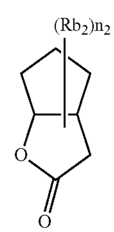

LC1-15

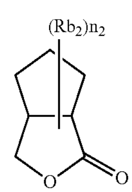

-continued

LC1-16

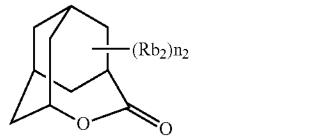

LC1-17

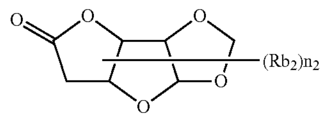

SL1-1

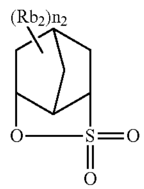

SL1-2

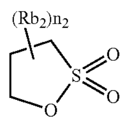

SL1-3

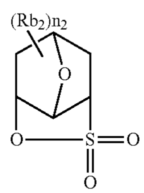

The lactone structure or sultone structure moiety may or may not have a substituent ($Rb_2$). Preferred examples of the substituent ($Rb_2$) include an alkyl group having 1 to 8 carbon atoms, a monovalent cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group and an acid-decomposable group are more preferred. $n_2$ represents an integer of 0 to 4. When $n_2$ is an integer of 2 or more, the substituents ($Rb_2$) may be the same as or different from each other, and the plurality of substituents ($Rb_2$) may be bonded to each other to form a ring.

The repeating unit having a lactone structure or a sultone structure usually has an optical isomer, but any optical isomer may be used. One optical isomer may be used singly or a mixture of a plurality of optical isomers may be used. In the case of mainly using one optical isomer, the optical purity (ee) thereof is preferably 90% or more, and more preferably 95% or more.

In the case where the resin (P) includes a repeating unit (c), the content of the repeating unit (c) in the resin (P) is preferably in the range of 0.5 to 80 mol %, more preferably 1 to 65 mol %, and still more preferably 3 to 50 mol %, based on all the repeating units. The repeating unit (c) can be used singly or in combination of two or more kinds thereof. By using a specific lactone structure, the local pattern dimensional uniformity and the cross-sectional shape of the pattern are improved.

Specific examples of the repeating unit (c) of the resin (P) will be shown below, but the invention is not limited thereto.

(in the formulae, Rx represents H, $CH_3$, $CH_2OH$, or $CF_3$)

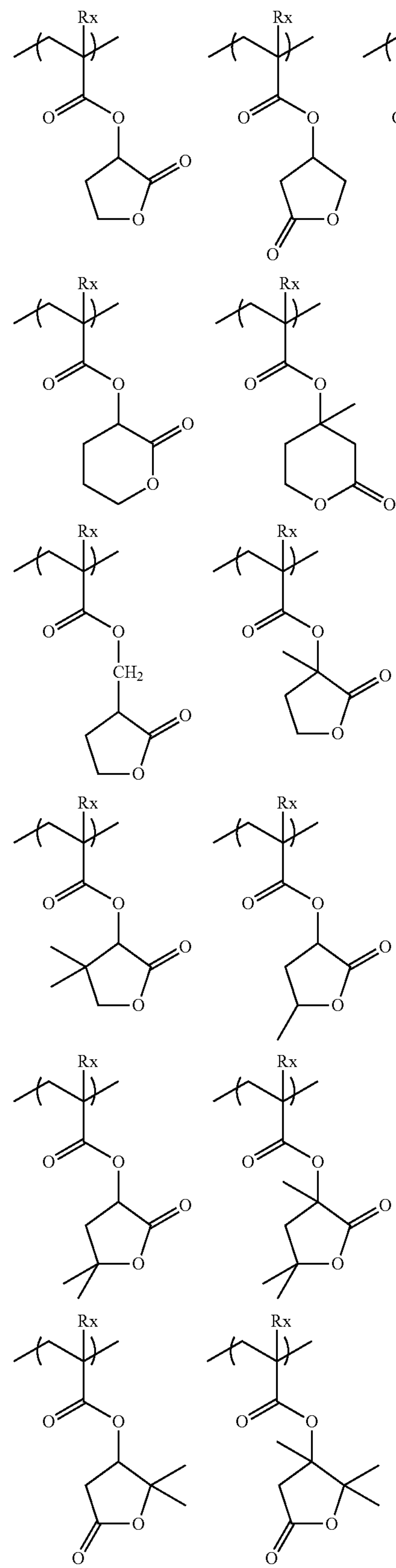

-continued
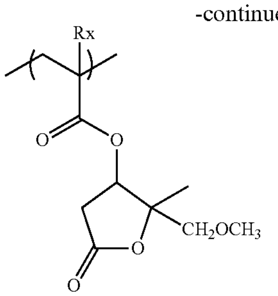
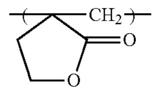
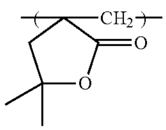
(in the formulae, Rx represents H, $CH_3$, $CH_2OH$, or $CF_3$)
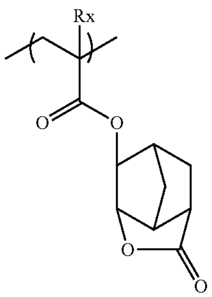
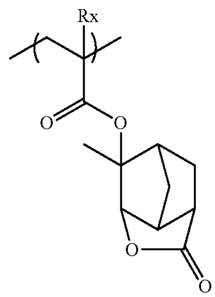
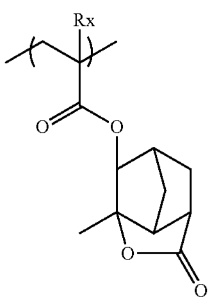
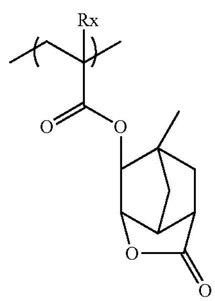
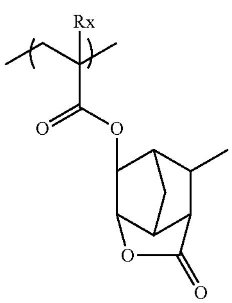
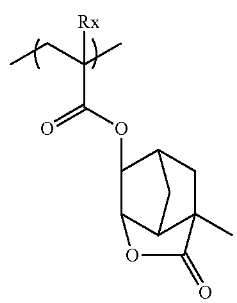
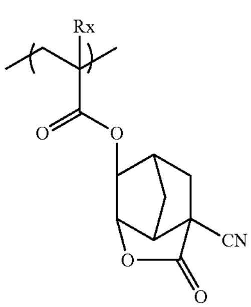
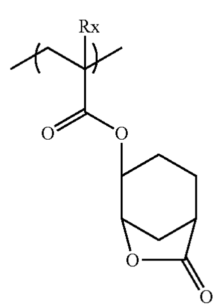
-continued
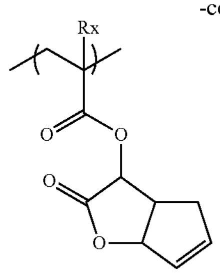
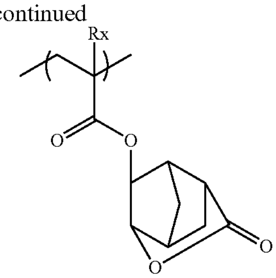
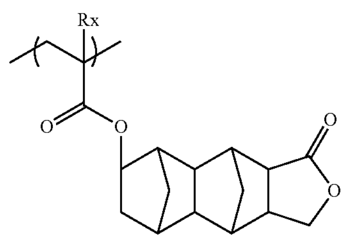
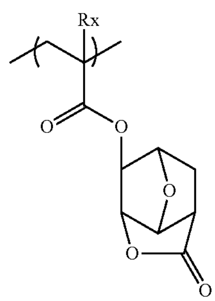
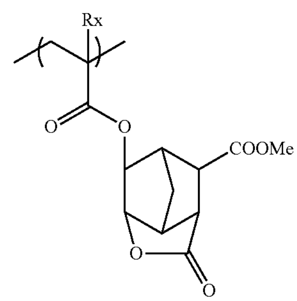
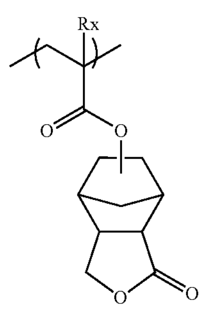
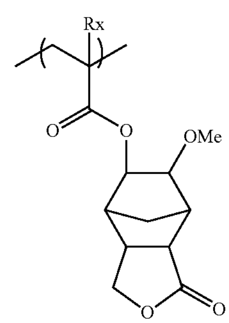
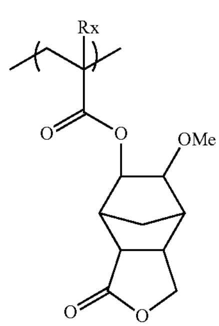
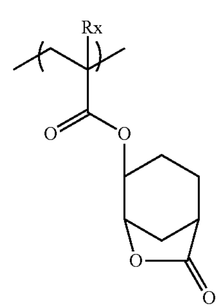

-continued
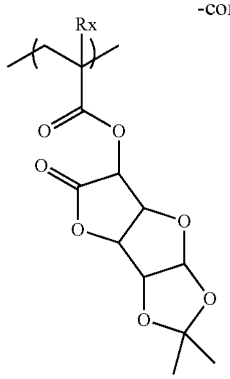
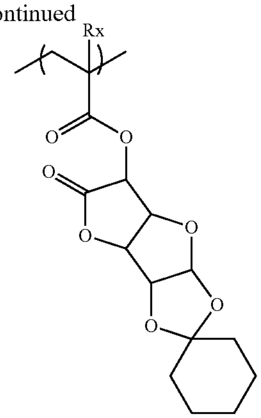
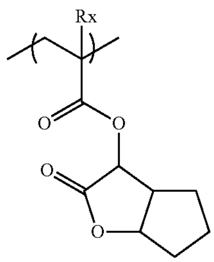
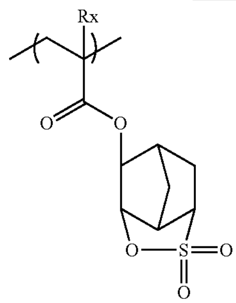
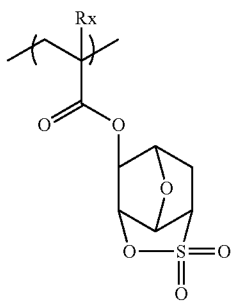
(in the formulae, Rx represents H, $CH_3$, $CH_2OH$, or $CF_3$)
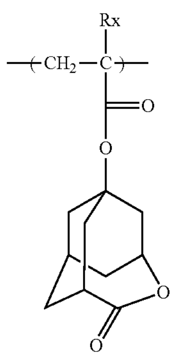
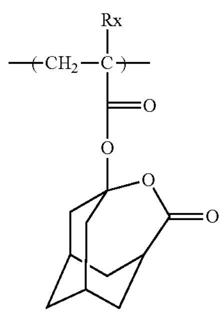
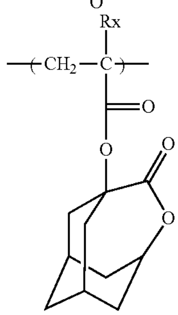
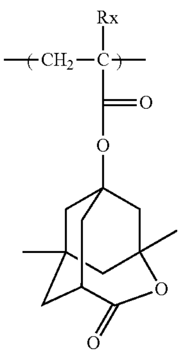
-continued
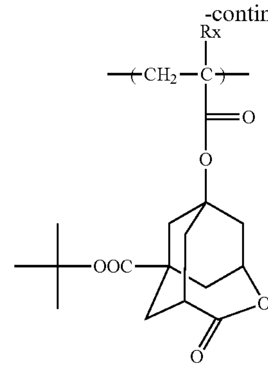
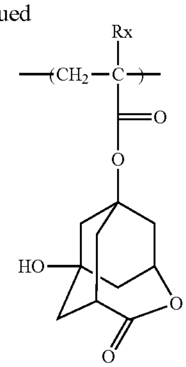
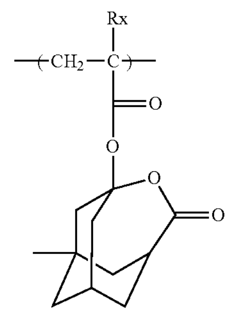
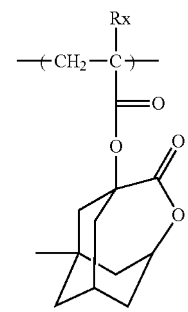
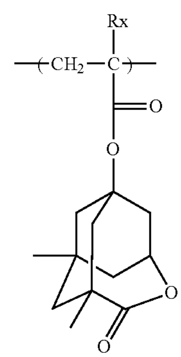
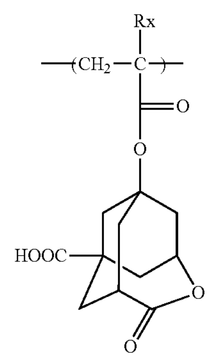
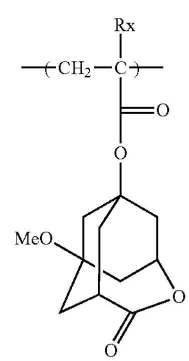
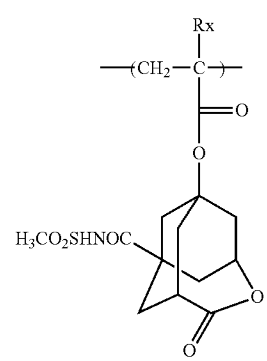
In the following specific examples, R represents a hydrogen atom, an alkyl group which may have a substituent, or a halogen atom, and preferably a hydrogen atom, a methyl group, a hydroxymethyl group, or an acetoxymethyl group.

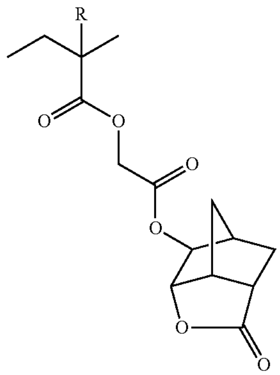
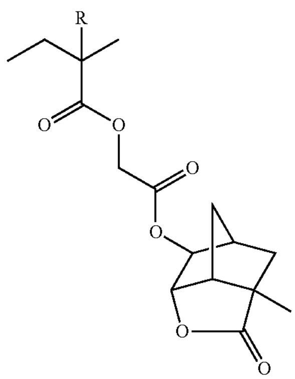
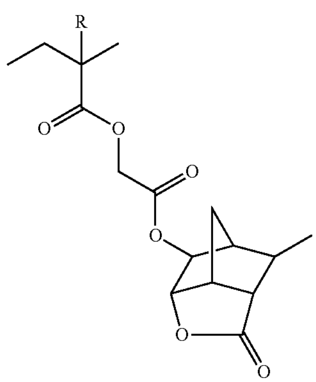
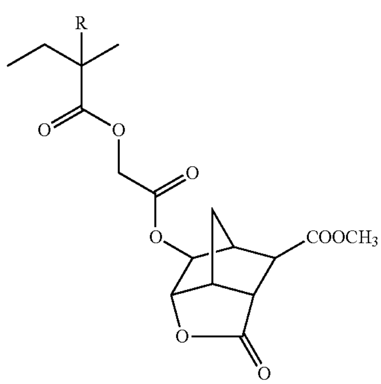
-continued
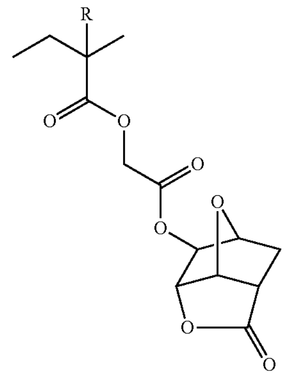
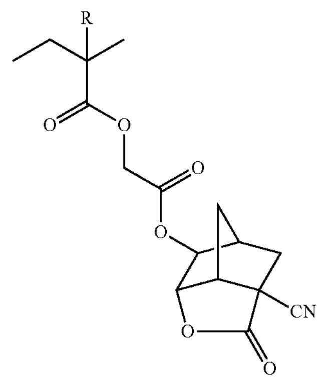
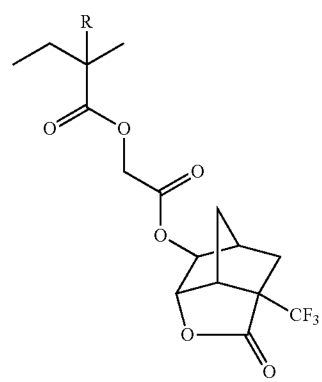
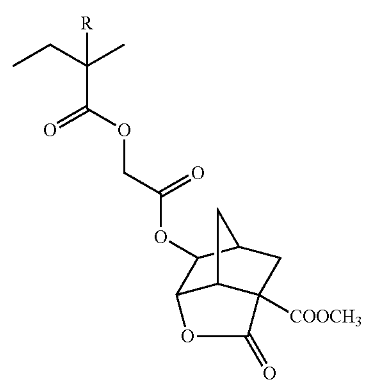

-continued
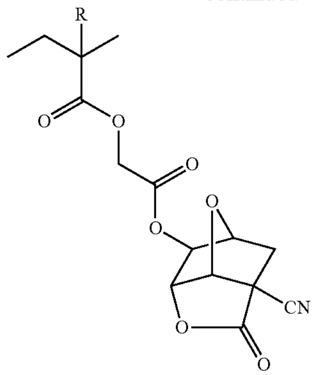
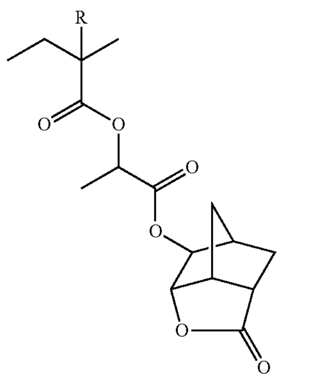
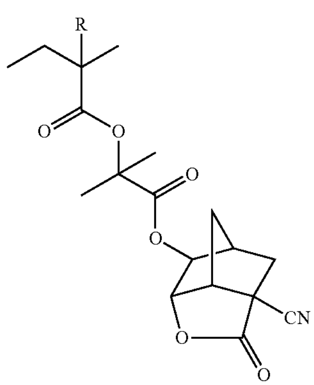
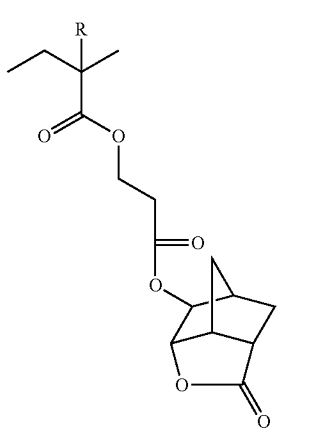
-continued
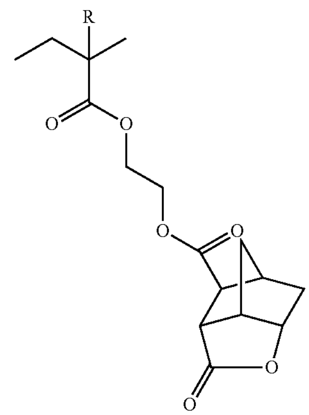
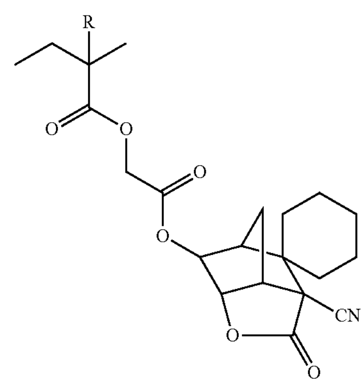
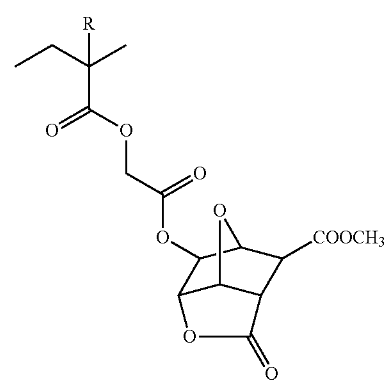
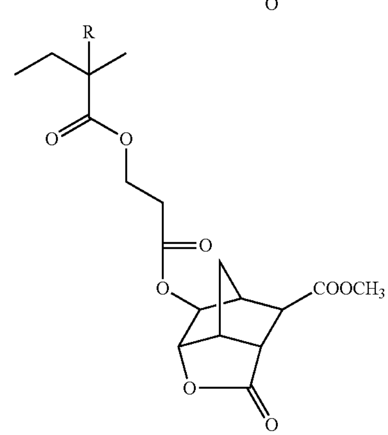

-continued

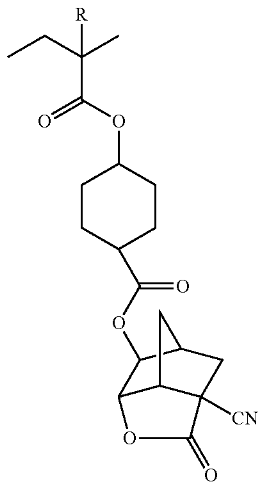

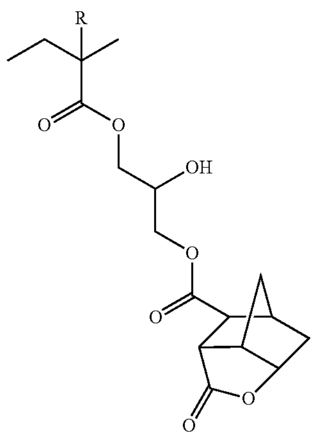

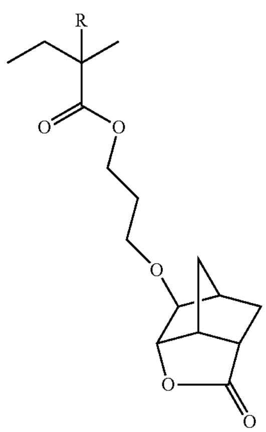

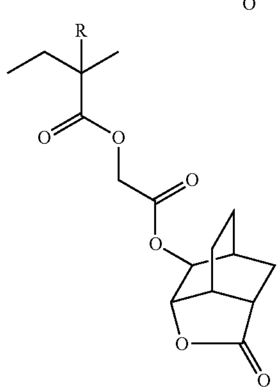

-continued

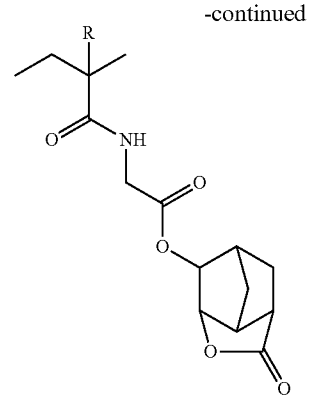

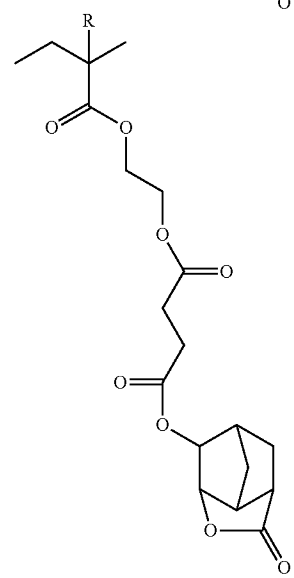

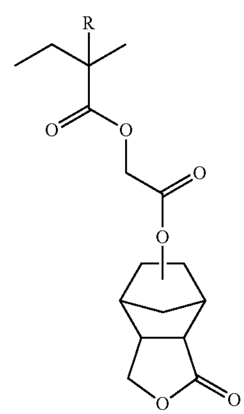

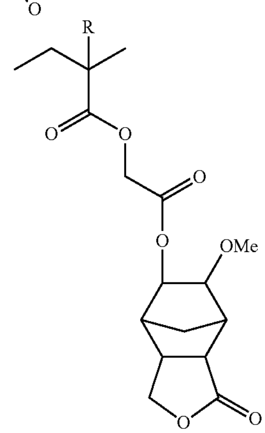

Examples of the acid group in the repeating unit having an acid group (d) include a carboxyl group, a sulfonic acid group, a sulfonamide group, a sulfonylimide group, a bissulfonylimide group, and an aliphatic alcoholic hydroxyl group substituted with an electron-withdrawing group at the α-position (for example, a hexafluoroisopropanol group), with repeating units having a carboxyl group being more preferred.

By virtue of containing the repeating units having an acid group in the resin (P), the resolution increases in the usage of forming contact holes. As for the repeating units having an acid group, all of a repeating unit in which an acid group is directly bonded to the main chain of the resin, such as a repeating unit of an acrylic acid or methacrylic acid, a repeating unit in which an acid group is bonded to the main chain of the resin through a linking group, and a repeating unit in which an acid group is introduced into the polymer chain terminal by using an alkali-soluble group-containing polymerization initiator or chain transfer agent during the polymerization, are preferred. The linking group may have a monocyclic or polycyclic cyclic hydrocarbon structure. In particular, a repeating unit of an acrylic acid or a methacrylic acid is preferred.

The repeating unit having an acid group (d) is preferably a repeating unit (d1) represented by following general formula (II).

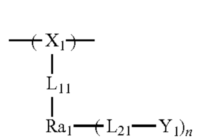

(II)

In the general formula (II), $X_1$'s each independently represent a polymerization unit structure constituting the polymer main chain;

$Ra_1$ represents an (n+1)-valent alicyclic hydrocarbon group;

$L_{11}$ and $L_{21}$ each independently represent a single bond or a divalent linking group;

n represents an integer of 1 or more; and $Y_1$ represents an acid group.

Examples of the acid group of $Y_1$ in the general formula (II) include a carboxyl group, a sulfonic acid group, an alcoholic hydroxyl group substituted with an electron-withdrawing group at the α-position (for example hexafluoroisopropanol group), with a carboxyl group being preferred.

The (n+1)-valent alicyclic hydrocarbon group $Ra_1$ may be a monocyclic hydrocarbon ring group such as a cyclopentane ring group and a cyclohexane ring group, and the polycyclic hydrocarbon group is preferred and the polycyclic hydrocarbon having 7 or more carbon atoms (preferably 7 to 30 carbon atoms) are more preferred.

Examples of the monocyclic hydrocarbon ring group for the alicyclic hydrocarbon group $Ra_1$ include groups formed by removal of any (n+1) hydrogen atoms from the monocyclic hydrocarbon ring.

The polycyclic hydrocarbon ring group for the alicyclic hydrocarbon group $Ra_1$ includes a ring system hydrocarbon ring group and a crosslinked cyclic hydrocarbon ring group, and examples thereof include groups formed by removal of any (n+1) hydrogen atoms from the ring system hydrocarbon ring, and groups formed by removal of any (n+1) hydrogen atoms from the crosslinked cyclic hydrocarbon ring.

Examples of the ring system hydrocarbon group include a bicyclohexyl group and a perhydronaphthalenyl group. Examples of the crosslinked cyclic hydrocarbon ring group include a bicyclic hydrocarbon group such as a pinane ring group, a bornane ring group, a norpinane ring group, a norbornane ring group, and a bicyclooctane ring group (for example, a bicyclo[2.2.2]octane ring group and a bicyclo[3.2.1]octane ring) group, a tricyclic hydrocarbon group such as a homobrendane ring group, an adamantane ring group, a tricyclo[5.2.1.0$^{2,6}$]decane ring group, and a tricyclo[4.3.1.1$^{2,5}$]undecane ring group, and a tetracyclic hydrocarbon ring group such as a tetracyclo[4.4.0.1$^{2,5}$.1$^{7,10}$]dodecane ring group and a perhydro-1,4-methano-5,8-methanonaphthalene ring group. The crosslinked cyclic hydrocarbon ring group also includes a condensed cyclic hydrocarbon ring group, for example, a condensed ring group formed by fusing a plurality of 5- to 8-membered cycloalkane ring groups, such as a perhydronaphthalene (decalin) ring group, a perhydroanthracene ring group, a perhydrophenanthrene ring group, a perhydroacenaphthene ring group, a perhydrofluorene ring group, a perhydroindene ring group, and a perhydrophenalene ring group.

Preferred examples of the crosslinked cyclic hydrocarbon ring group include a norbornyl group, an adamantyl group, a bicyclooctanyl group, and a tricyclo[5.2.1.0$^{2,6}$]decanyl group. More preferred examples of the crosslinked cyclic hydrocarbon ring group include a norbornyl group and an adamantyl group.

The alicyclic hydrocarbon group $Ra_1$ may have a substituent. Examples of the substituent which $Ra_1$ may have include an alkyl group and a cycloalkyl group.

The alkyl group and the cycloalkyl group as the substituent which $Ra_1$ may have optionally further have a substituent, and examples of the substituent include a halogen atom (preferably a fluorine atom).

The carbon constituting the alicycle in the alicyclic hydrocarbon group $Ra_1$ (carbon contributing to ring formation) may be carbonyl carbon. Further, the polycycle may have a hetero atom such as an oxygen atom and a sulfur atom in the ring, as described above. However, $Ra_1$ does not contain an ester bond as an atomic group constituting the alicycle.

Examples of the linking group represented by $L_{11}$ and $L_{21}$ include —COO—, —OCO—, —CONH—, —NHCO—, —CO—, —O—, —S—, —SO—, —$SO_2$—, an alkylene group (preferably 1 to 6 carbon atoms), a cycloalkylene group (preferably 3 to 10 carbon atoms), an alkenylene group (preferably 2 to 6 carbon atoms) or a linking group formed by these plural groups, with a linking group having a total number of carbon atoms of 12 or less being preferred. The alkylene group, the cycloalkylene group, or the alkenylene group, and the alkylene group, the cycloalkylene group, or the alkenylene group in the linking group may have a substituent, and examples of the substituent include an alkyl group (preferably having 1 to 4 carbon atoms).

$L_{11}$ is preferably a single bond, an alkylene group, —COO—, —OCO—, —CONH—, —NHCO—, -alkylene group-COO—, -alkylene group-OCO—, -alkylene group-CONH—, -alkylene group-NHCO—, —CO—, —O—, —$SO_2$—, and -alkylene group-O—, and more preferably a single bond, an alkylene group, -alkylene group-COO—, or -alkylene group-O—.

$L_{21}$ is preferably a single bond, an alkylene group, —COO—, —OCO—, —CONH—, —NHCO—, —COO-alkylene group-, —OCO-alkylene group-, —CONH-alkylene group-, —NHCO-alkylene group-, —CO—, —O—, —$SO_2$—, —O-alkylene group-, or —O-cycloalkylene group-, and more preferably a single bond, an alkylene group, —COO-alkylene group-, —O-alkylene group-, or —O-cycloalkylene group-.

In the method described above, the bond "—" on the left side means a bond to $X_1$ on the side of the main chain in $L_{11}$, or a bond to $Ra_1$ in $L_{21}$, and the bond "—" on the right side means a bond to $Ra_1$ on the side of the main chain in $L_{11}$, or a bond to $Y_1$ in $L_{21}$ Incidentally, $L_{11}$ may be bonded to the same atom as the atom constituting the alicycle in $Ra_1$.

n is preferably an integer of 1 to 3, more preferably 1 or 2, and still more preferably 1.

The polymerization unit structure constituting the polymer main chain for $X_1$ is preferably a repeating unit derived from the polymerizable monomer. Examples of the polymerization unit structure $X_1$ constituting the polymer main chain include a polymerization unit structure represented by the following general formula (a), derived from a (meth)acrylate, a polymerization unit structure represented by the following general formula (b), derived from a styrene monomer, and a polymerization unit structure represented by the following general formula (c), derived from a vinyl monomer.

(a)

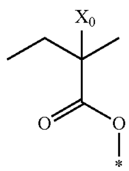

(b)

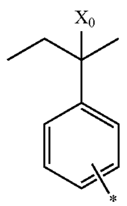

(c)

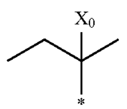

In the general formula, * represents the position bonded with $L_{11}$ in the general formula (II).

$X_0$ represents a hydrogen atom, an alkyl group, a cyano group, or a halogen atom.

The alkyl group of $X_0$ may have a substituent, and examples of the substituent include a hydroxyl group and a halogen atom (preferably, a fluorine atom).

The alkyl group of $X_0$ preferably has 1 to 4 carbon atoms, and examples thereof include a methyl group, an ethyl group, a propyl group, a hydroxymethyl group, and a trifluoromethyl group, with a methyl group being preferred.

$X_0$ is preferably a hydrogen atom or a methyl group.

In the invention, $X_1$ in the general formula (II) is preferably a polymerization unit structure derived from a (meth)acrylate. In the case where $X_1$ is a polymerization unit structure derived from a (meth)acrylate, the repeating unit (d1) represented by the general formula (II) may be represented by the following general formula (II').

(II')

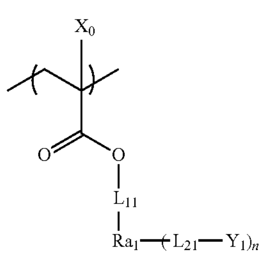

In the general formula (II'), $X_0$ has the same definition as $X_0$ in the general formula (a).

$Ra_1$, $L_{11}$, $L_{21}$, n, and $Y_1$ have the same definitions as $Ra_1$, $L_{11}$, $L_{21}$, n, and $Y_1$ in the general formula (II), respectively.

Specific examples of the repeating unit having an acid group (d) are shown below, but the invention is not limited thereto.

In the specific examples, Rx represents H, $CH_3$, $CH_2OH$, or $CF_3$. Xa represents a hydrogen atom, $CH_3$, $CF_3$, or $CH_2OH$.

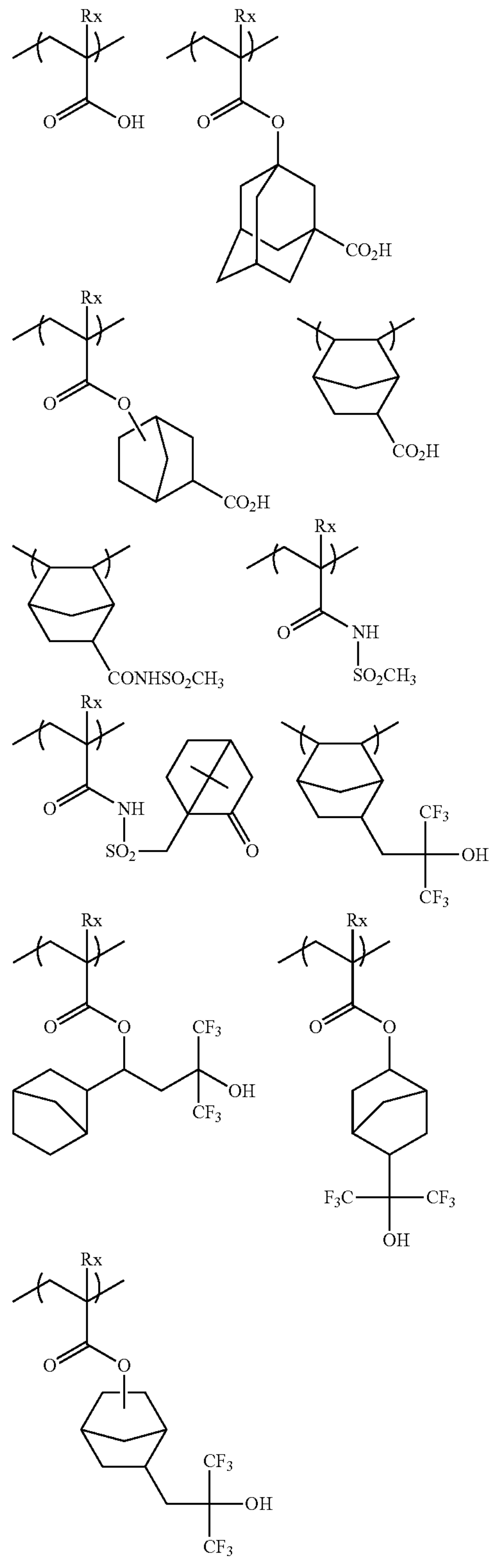

-continued
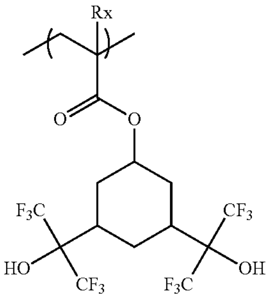
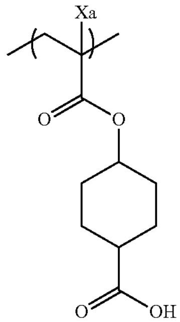
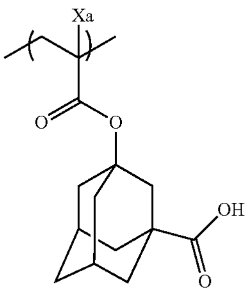
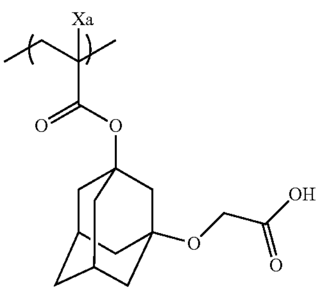
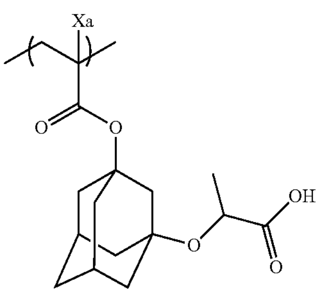
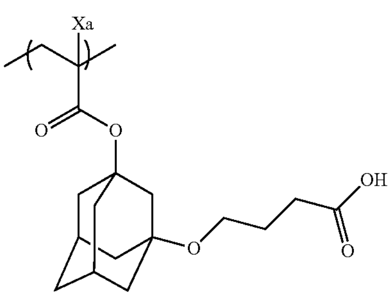
-continued
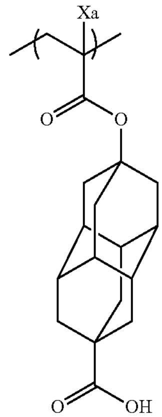
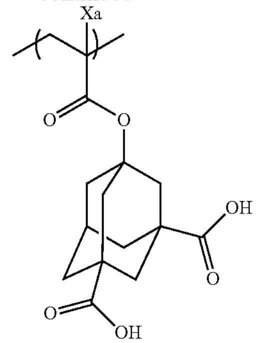
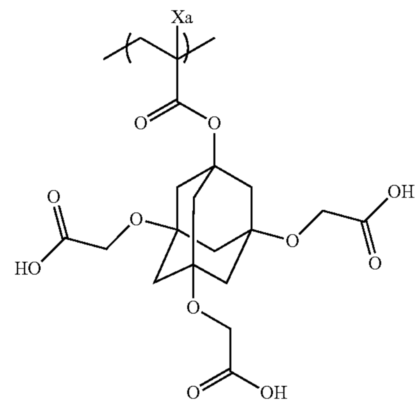
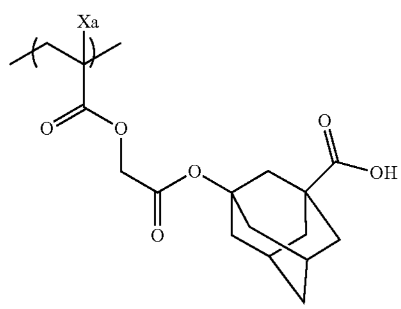
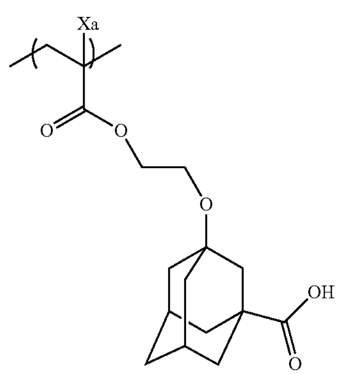

-continued
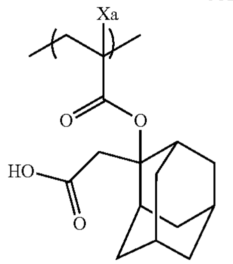
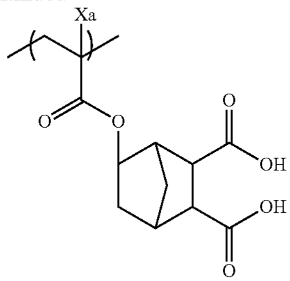
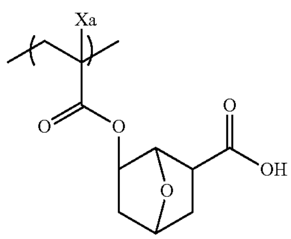
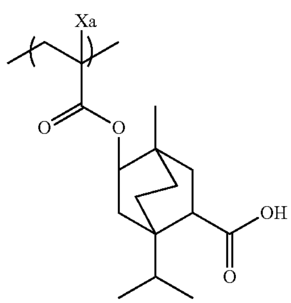
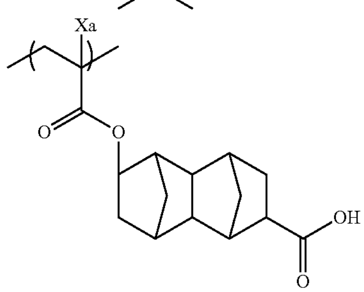
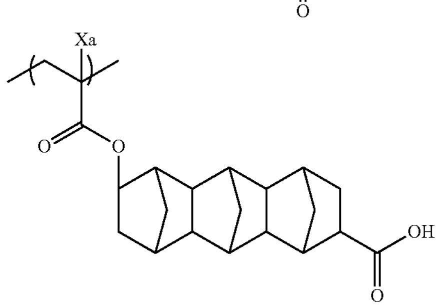
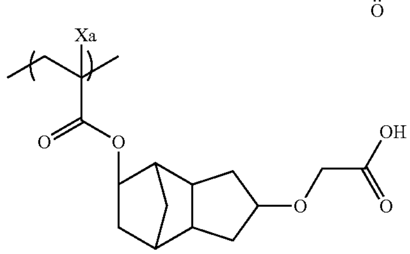
-continued
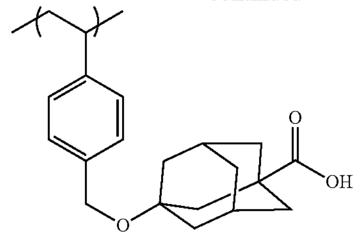
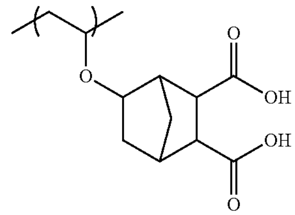
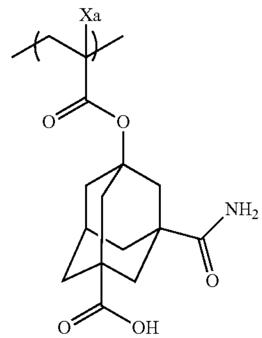
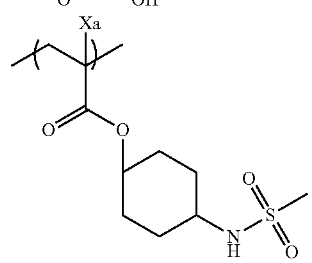
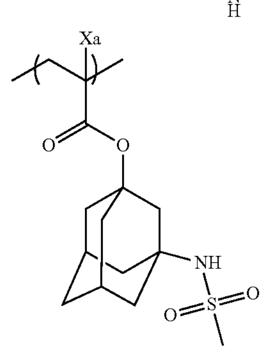
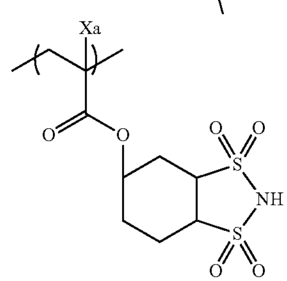
In the case of exposing the repeating unit having an acid group (d) to a KrF excimer laser beam, an electron beam, X rays or high-energy beam of wavelength 50 nm or less (EUV or the like), the repeating unit having an acid group (d) is preferably an acid group having an aromatic ring group.

The repeating unit having an acid group may be used singly or in combination of two or more kinds thereof.

The resin (P) may or may not contain the repeating unit having an acid group (d), but in the case where the resin (P) contains the repeating unit (d), the content of the repeating unit having an acid group (d) is preferably from 1 to 50 mol %, more preferably from 3 to 50 mol %, still more preferably from 3 to 45 mol %, and particularly preferably from 5 to 45 mol %, based on all the repeating units in the resin (P).

The resin (P) may further contain a repeating unit having a hydroxyl group or a cyano group (e), other than the above-described repeating units. This repeating unit can improve adhesion to a substrate and affinity for a developer. The repeating unit having a hydroxyl group or a cyano group is preferably a repeating unit having an alicyclic hydrocarbon structure substituted with a hydroxyl group or a cyano group and preferably has no acid-decomposable group. The alicyclic hydrocarbon structure in the alicyclic hydrocarbon structure substituted with a hydroxyl group or a cyano group is preferably an adamantyl group, a diadamantyl group, or a norbornane group, and more preferably an adamantyl group. Further, the alicyclic hydrocarbon structure substituted with a hydroxyl group is preferred, and the alicyclic hydrocarbon structure having a repeating unit having an adamantyl group substituted with at least one hydroxyl group is more preferred.

Particularly, it is most preferable that the resin (P) contain a repeating unit having a hydroxyadamantyl group or a dihydroxyadamantyl group from the viewpoint of inhibition of diffusion of the generated acids. As the alicyclic hydrocarbon structure substituted with a hydroxyl group or a cyano group, a partial structure represented by any of the following general formulae (VIIa) to (VIId) is preferred, and a partial structure represented by the following general formula (VIIa) is more preferred.

(VIIa)

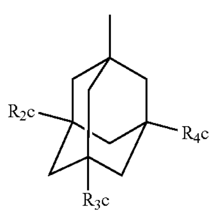

(VIIb)

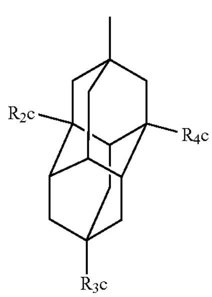

-continued (VIIc)

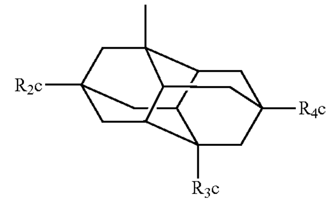

(VIId)

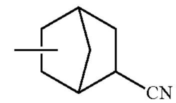

In the general formulae (VIIa) to (VIIc), $R_2c$ to $R_4c$ each independently represent a hydrogen atom, a hydroxyl group or a cyano group, provided that at least one of $R_2c$ to $R_4c$ represents a hydroxyl group or a cyano group. A structure where one or two members out of $R_2c$ to $R_4c$ are hydroxyl groups with the remaining being a hydrogen atom is preferred. In the general formula (VIIa), it is more preferable that two members out of $R_2c$ to $R_4c$ be hydroxyl groups and the remaining be a hydrogen atom.

The repeating unit having a partial structure represented by the general formulae (VIIa) to (VIId) includes repeating units represented by the following general formulae (AIIa) to (AIId).

(AIIa)

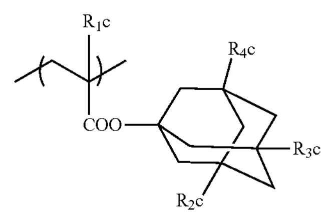

(AIIb)

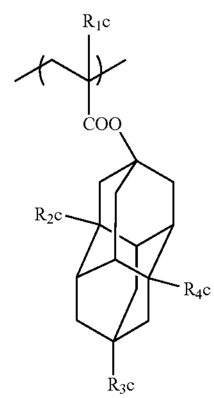

(AIIc)

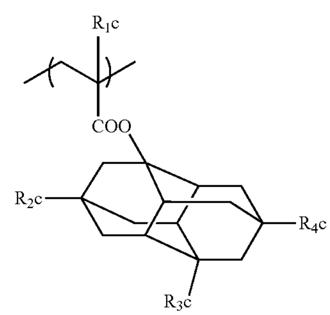

(AIId)

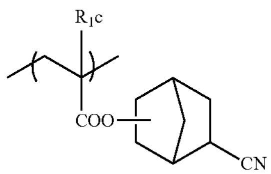

In the general formulae (AIIa) to (AIId), $R_1c$ represents a hydrogen atom, a methyl group, a trifluoromethyl group or a hydroxymethyl group; and $R_2c$ to $R_4c$ have the same meanings as $R_2c$ to $R_4c$ in the general formulae (VIIa) to (VIIc).

Specific examples of the repeating unit having a hydroxyl group or a cyano group (e) are shown below, but the invention is not limited thereto.

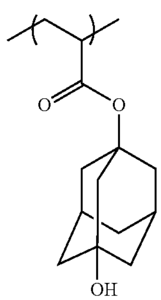

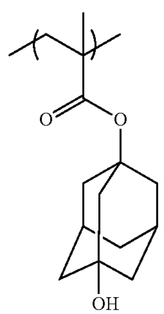

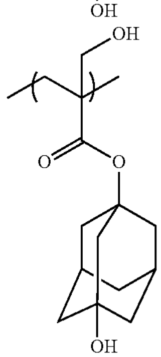

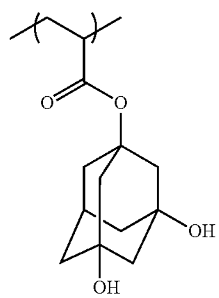

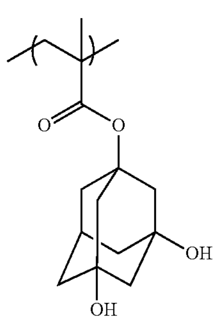

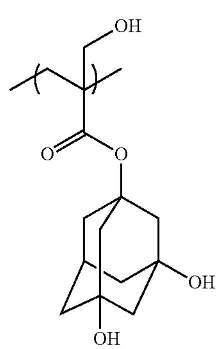

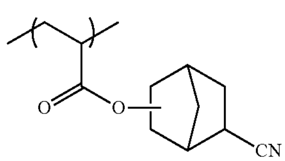

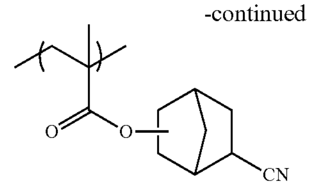

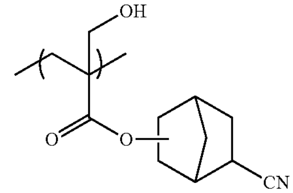

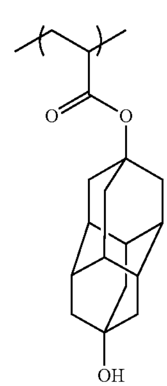

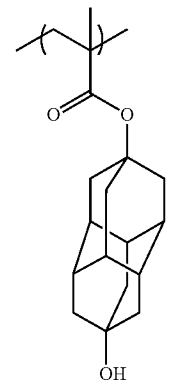

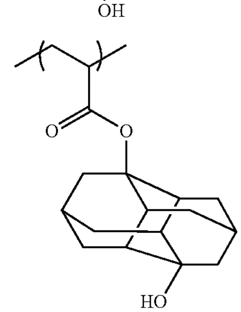

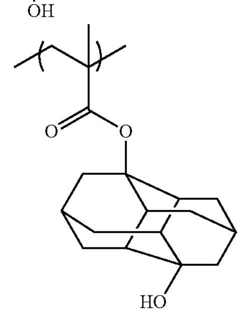

The resin (P) in the invention may or may not contain the repeating unit having a hydroxyl group or a cyano group, but in the case where the resin (P) contains the repeating unit (e), the content of the repeating unit having a hydroxyl group or a cyano group (e) is preferably from 1 to 50 mol %, more preferably from 3 to 50 mol %, still more preferably from 3 to 45 mol %, and particularly preferably from 5 to 45 mol %, based on all the repeating units in the resin (P).

The resin (P) in the invention may further contain a repeating unit having an alicyclic hydrocarbon structure free from a polar group (for example, the above-described acid group, a hydroxyl group, or a cyano group) and not exhibiting acid decomposability. In this way, elution of the low molecular components from the resist film to the immersion liquid during liquid-immersion exposure can be reduced, and the dissolution properties of the resin during development using a developer including an organic solvent can be appropriately adjusted. Examples of the repeating unit include a repeating unit represented by the general formula (IV).

(IV)

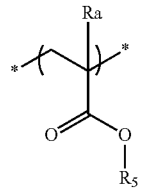

In the general formula (IV), $R_5$ represents a hydrocarbon group having at least one cyclic structure and having no polar group; and Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group, or a trifluoromethyl group, and particularly preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having 3 to 12 carbon atoms, such as a cyclopentyl group, a cyclohexyl group, a cycloheptyl group or a cyclooctyl group, and a cycloalkenyl group having 3 to 12 carbon atoms, such as a cyclohexenyl group. The monocyclic hydrocarbon group is preferably a monocyclic hydrocarbon group having 3 to 7 carbon atoms, and more preferably a cyclopentyl group or a cyclohexyl group.

The polycyclic hydrocarbon group includes a ring system hydrocarbon group and a crosslinked cyclic hydrocarbon group. Examples of the ring system hydrocarbon group include a bicyclohexyl group and a perhydronaphthalenyl group. Examples of the crosslinked cyclic hydrocarbon ring include a bicyclic hydrocarbon ring such as a pinane ring, a bornane ring, a norpinane ring, a norbornane ring or a bicyclooctane ring (for example, a bicyclo[2.2.2]octane ring, or a bicyclo[3.2.1]octane ring), a tricyclic hydrocarbon ring such as a homobledane ring, an adamantane ring, a tricyclo[5.2.1.$0^{2,6}$]decane ring or a tricyclo[4.3.1.$1^{2,5}$]undecane ring, and a tetracyclic hydrocarbon ring such as a tetracyclo[4.4.0.$1^{2,5}$.$1^{7,10}$]dodecane ring and a perhydro-1,4-methano-5,8-methanonaphthalene ring. Further, the crosslinked cyclic hydrocarbon ring also includes a condensed cyclic hydrocarbon ring, for example, a condensed ring formed by fusing a plurality of 5- to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring and a perhydrophenalene ring.

Preferred examples of the crosslinked cyclic hydrocarbon ring include a norbornyl group, an adamantyl group, a bicyclooctanyl group and a tricyclo[5.2.1.$0^{2,6}$]decanyl group. More preferred examples of the crosslinked cyclic hydrocarbon ring include a norbornyl group and an adamantyl group.

These alicyclic hydrocarbon groups may have a substituent, and preferred examples of the substituent include a halogen atom, an alkyl group, a hydroxyl group substituted with a hydrogen atom, and an amino group substituted with a hydrogen atom. The halogen atom is preferably a bromine atom, a chlorine atom, or a fluorine atom, and the alkyl group is preferably a methyl group, an ethyl group, a butyl group, or a t-butyl group. The alkyl group may further have a substituent, and the substituent which the alkyl group may further have includes a halogen atom, an alkyl group, a hydroxyl group substituted with a hydrogen atom, and an amino group substituted with a hydrogen atom.

Examples of the substituent for the hydrogen atom include an alkyl group, a cycloalkyl group, an aralkyl group, a substituted methyl group, a substituted ethyl group, an alkoxycarbonyl group, and an aralkyloxycarbonyl group. The alkyl group is preferably an alkyl group having 1 to 4 carbon atoms; the substituted methyl group is preferably a methoxymethyl group, a methoxythiomethyl group, a benzyloxymethyl group, a t-butoxymethyl group, or a 2-methoxyethoxymethyl group; the substituted ethyl group is preferably a 1-ethoxyethyl group or a 1-methyl-1-methoxyethyl group; the acyl group is preferably an aliphatic acyl group having 1 to 6 carbon atoms, such as a formyl group, an acetyl group, a propionyl group, a butyryl group, an isobutyryl group, a valeryl group, and a pivaloyl group; and the alkoxycarbonyl group is preferably an alkoxycarbonyl group having 1 to 4 carbon atoms.

The resin (P) may or may not contain a repeating unit having an alicyclic hydrocarbon structure free from a polar group and not exhibiting acid decomposability, but in the case where the resin (P) contains the repeating unit having an alicyclic hydrocarbon structure free from a polar group and not exhibiting acid decomposability (f), the content of the repeating unit (f) is preferably from 1 to 40 mol %, and more preferably from 1 to 20 mol %, based on all the repeating units in the resin (P).

Specific examples of the repeating unit (f) are shown below, but the invention is not limited thereto. In the formulae, Ra represents H, $CH_3$, $CH_2OH$, or $CF_3$.

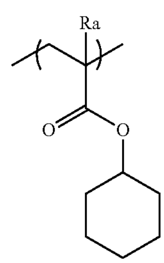

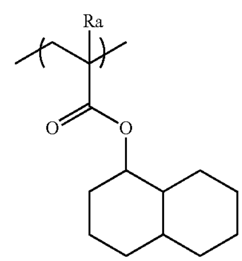

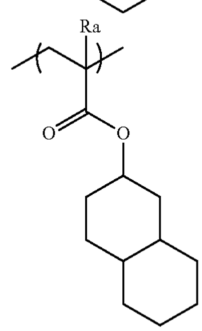

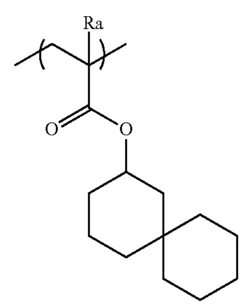

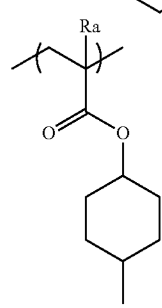

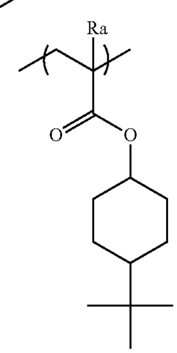

-continued
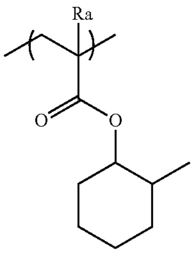
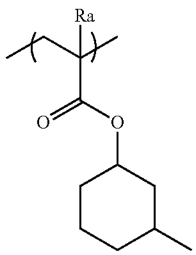
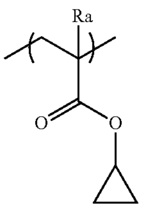
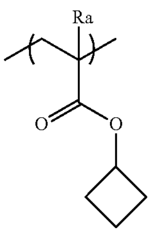
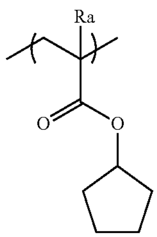
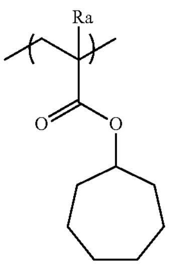
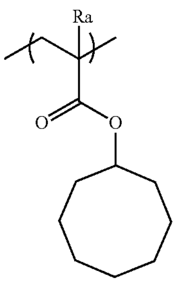
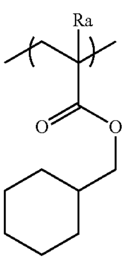
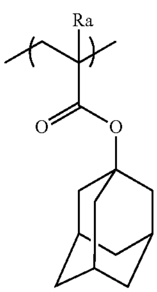
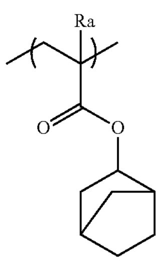
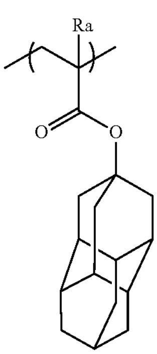
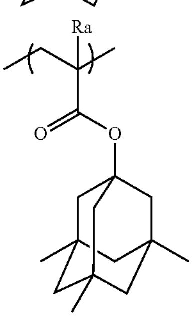
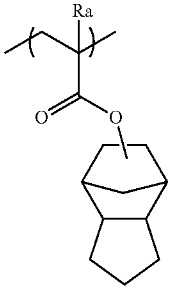
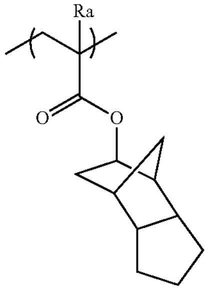
-continued
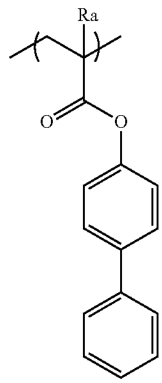
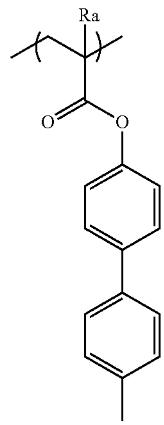
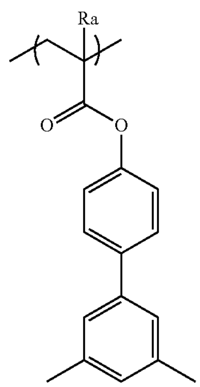
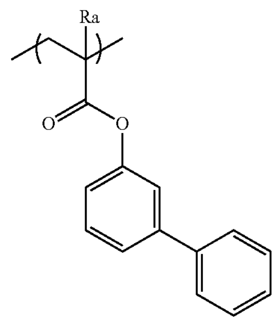
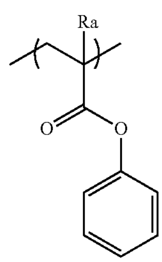
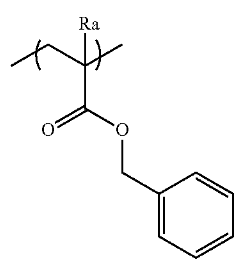
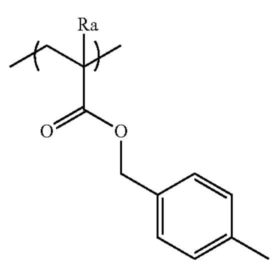
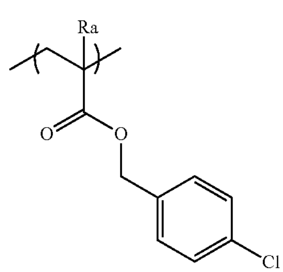

-continued

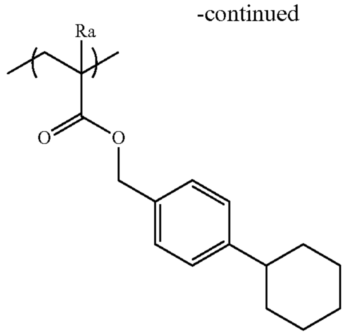

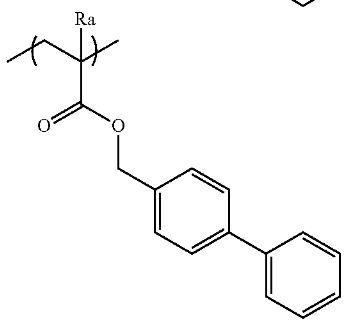

The resin (P) used in the composition of the invention may contain, in addition to the above-described repeating structural units, various repeating structural units for the purpose of controlling the dry etching resistance, suitability for standard developer, adhesion to a substrate, a resist profile, and characteristic generally required for an actinic ray-sensitive or radiation-sensitive resin composition, such as resolution, heat resistance, and sensitivity.

Examples of such a repeating structural unit include, but are not limited to, repeating structural units corresponding to the monomers described below.

The use of such a repeating structural unit enables the fine regulation of the performance required of the resin used in the composition of the invention, particularly (1) solubility in a coating solvent, (2) a film-forming property (glass transition point), (3) alkaline developability, (4) film loss (selection of hydrophilic, hydrophobic, or alkali-soluble group), (5) adhesion of an unexposed area to a substrate, (6) dry etching resistance, and the like.

Examples of the monomer include a compound having one addition-polymerizable unsaturated bond selected from acrylic acid esters, methacrylic acid esters, acrylamides, methacrylamides, allyl compounds, vinyl ethers, and vinyl esters.

Among these, an addition-polymerizable unsaturated compound copolymerizable with the monomers corresponding to the above-described various repeating structural units may be copolymerized.

In the resin (P) used in the composition of the invention, the molar ratio of the respective repeating structural units included in the resin, are appropriately set for the purpose of controlling the dry etching resistance or suitability for a standard developer of an actinic ray-sensitive or radiation-sensitive resin composition, adhesion to a substrate, resist profile, and properties generally required for a resist, such as resolution, heat resistance, and sensitivity.

The type of the resin (P) in the invention may be any one of a random type, a block type, a comb type, and a star type. The resin (P) can be synthesized by, for example, radical, cationic, or anionic polymerization of unsaturated monomers corresponding to the respective structures. Further, it is also possible that polymerization be carried out using unsaturated monomers corresponding to the precursors of the respective structures, and then a polymer reaction be carried out, thereby obtaining a desired resin.

In the case where the composition of the invention is used for ArF exposure, in view of transparency to ArF light, the resin (P) used in the composition of the invention preferably has substantially no aromatic group (specifically, the ratio of an aromatic group-containing repeating unit in the resin is preferably 5 mol % or less, more preferably 3 mol % or less, and ideally 0 mol %, that is, the resin does not have an aromatic group).

Furthermore, the resin (P) preferably has an alicyclic hydrocarbon structure. The alicyclic hydrocarbon structure may be either monocyclic or polycyclic, and the alicyclic hydrocarbon structure may be included in any places of the resin (P). For example, the alicyclic hydrocarbon structure may be included in the above-described several repeating units (excluding the repeating unit (a) represented by the general formula (I)), or may be included as an additional repeating unit.

Furthermore, in the case where the composition of the invention contains a resin (E) as described later, it is preferable that the resin (P) contain neither a fluorine atom nor a silicon atom from the viewpoint of compatibility with the resin (E).

Furthermore, the resin (P) preferably has neither a fluorine atom nor a silicon atom, or if any, a small amount of the atom. Specifically, the content of repeating unit having a fluorine atom or a silicon atom is preferably from 0 to 20 mol %, more preferably from 0 to 10 mol %, and particularly preferably from 0 to 5 mol %, based on all the repeating units of the resin (P), and ideally, it contains no repeating unit having a fluorine atom or a silicon atom. By this, such a content is preferable from the viewpoint of accomplishment of a suitable solubility of the resin (P) in a developer containing an organic solvent, or compatibility in the case where the composition of the invention contains the hydrophobic resin as described later.

The resin (P) preferably has a (meth)acrylate-based repeating unit as a main repeating unit. Specifically, the content of the (meth)acrylate-based repeating unit in all the repeating units of the resin (P) is preferably 50 mol % or more, more preferably 70 mol % or more, and still more preferably 90 mol % or more, and particularly preferably, all the repeating units are (meth)acrylate-based repeating units.

The resin (P) used in the invention is preferably a resin where all the repeating units are composed of a (meth)acrylate-based repeating unit. In this case, all the repeating units may be a methacrylate-based repeating unit, all the repeating units may be an acrylate-based repeating unit, or all the repeating units may be composed of a methacrylate-based repeating unit and an acrylate-based repeating unit, but the content of the acrylate-based repeating unit in the resin (B) is preferably 50 mol % or less based on all the repeating units. A copolymerized polymer containing from 20 to 50 mol % of an acid decomposable group-containing (meth)acrylate-based repeating unit, from 20 to 50 mol % of a lactone group-containing (meth)acrylate-based repeating unit, from 5 to 30 mol % of a (meth)acrylate-based repeating unit having an alicyclic hydrocarbon structure substituted with a hydroxyl group or a cyano group, and from 0 to 20 mol % of other (meth)acrylate-based repeating units is also preferred.

In the case where the composition of the invention is irradiated with KrF excimer laser light, an electron beam, X rays, or high-energy beam at a wavelength of 50 nm or less (for example, EUV), the resin (P) preferably further contains a hydroxystyrene-based repeating unit, more preferably a hydroxystyrene-based repeating unit, a hydroxystyrene-based repeating unit protected by an acid-decomposable group, and an acid-decomposable repeating unit such as a tertiary alkyl (meth)acrylate.

Preferred examples of the hydroxystyrene-based repeating unit having an acid-decomposable group include a repeating unit composed of a t-butoxycarbonyloxystyrene, a 1-alkoxyethoxystyrene or a tertiary alkyl (meth)acrylate. A repeating unit composed of a 2-alkyl-2-adamantyl (meth)acrylate or a dialkyl(1-adamantyl)methyl (meth)acrylate is more preferred.

The resin (P) of the invention may be commercially available if marketed or may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvents capable of dissolving the composition of the invention, such as propylene glycol monomethyl ether acetate, propylene glycol monomethyl ether, and cyclohexanone. The polymerization is more preferably carried out using the same solvent as the solvent used in the actinic ray-sensitive or radiation-sensitive resin composition of the invention. By the use of the same solvent, generation of particles during storage may be inhibited.

The polymerization reaction is preferably carried out in an inert gas atmosphere such as nitrogen and argon. Regarding the polymerization initiator, the polymerization is started using a commercially available radical initiator (for example, an azo-based initiator, or peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction solution is poured into a solvent, and the desired polymer is collected by powder or solid recovery, or other methods. The concentration during the reaction is in the range of 5 to 50% by mass, preferably 10 to 30% by mass, and the reaction temperature is usually in the range of 10 to 150° C., preferably 30 to 120° C., more preferably 60 to 100° C.

After the completion of reaction, the reaction solution is allowed to cool to room temperature and purified. The purification may be carried out by a normal method, for example, a liquid-liquid extraction method of applying water washing or combining appropriate solvents to remove residual monomers or oligomer components; a purification method in a solution state, such as ultrafiltration of extracting and removing only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (a precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing these solvents, and the like, according to the kind of the polymer.

The amount of the precipitation or reprecipitation solvent used may be appropriately selected by taking into consideration the efficiency, yield and the like, but in general, the amount used is from 100 to 10000 parts by mass, preferably from 200 to 2000 parts by mass, and more preferably from 300 to 1000 parts by mass, based on 100 parts by mass of the polymer solution.

The temperature during the precipitation or reprecipitation may be appropriately selected by taking into consideration the efficiency or operability but is usually on the order of 0 to 50° C., and preferably in the vicinity of room temperature (for example, approximately from 20 to 35° C.). The precipitation or reprecipitation operation may be carried out using a commonly employed mixing vessel such as stirring tank by a known method such as a batch system or a continuous system.

The precipitated or reprecipitated polymer is usually subjected to commonly employed solid-liquid separation such as filtration and centrifugation, then dried and used. The filtration is carried out using a solvent-resistant filter element preferably under pressure. The drying is carried out under atmospheric pressure or reduced pressure (preferably under reduced pressure) at a temperature of approximately from 30 to 100° C., preferably on the order of 30 to 50° C.

Incidentally, after the resin is once precipitated and separated, the resin may be dissolved again in a solvent and then put into contact with a solvent in which the resin is sparingly soluble or insoluble. That is, there may be used a method including, after the completion of radical polymerization reaction, bringing the polymer into contact with a solvent in which the polymer is sparingly soluble or insoluble, to precipitate a resin (step a), separating the resin from the solution (step b), dissolving the resin again in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

Moreover, in order to inhibit the aggregation or the like of the resin after preparation of the composition, for example, as described in JP2009-037108A, a step of dissolving the synthesized resin in a solvent and heating the resulting solution at a temperature of about 30° C. to 90° C. for about 30 minutes to 4 hours may be added.

The weight average molecular weight of the resin (P) used in the composition of the invention is preferably from 1,000 to 200,000, more preferably from 2,000 to 100,000, still more preferably from 3,000 to 70,000, and particularly preferably from 5,000 to 50,000, in terms of polystyrene by a GPC method. When the weight average molecular weight is from 1,000 to 200,000, the deterioration of heat resistance and dry etching resistance, and the deterioration of developability or a film forming property due to an increase in viscosity may be prevented.

Furthermore, by tightly controlling the weight average molecular weight, the dissolution property of the resin (P) in an organic developer is controlled, and thus, the local pattern dimensional uniformity, the cross-sectional shape of the pattern, and the like may be improved. The weight average molecular weight is most preferably 14,000 or more from the viewpoint of improvement of the local pattern dimensional uniformity and the cross-sectional shape of the pattern, as described above. The upper limit of the weight average molecular weight is preferably 50000 or less, more preferably 40,000 or less, and still more preferably 30,000 or less.

The dispersity (molecular weight distribution, Mw/Mn) is usually in the range of 1.0 to 3.0, preferably 1.0 to 2.6, more preferably 1.1 to 2.5, still more preferably 1.2 to 2.4, even still more preferably from 1.3 to 2.2, and particularly preferably 1.4 to 2.0. When the molecular weight distribution is within the above-described ranges, the resolution and the resist shape are superior, the side wall of the resist pattern is smoother, and the roughness is more improved.

In the present specification, the weight average molecular weight (Mw) and the number average molecular weight (Mn) of the resin (P) may be calculated by using, for example, an HLC-8120 (manufactured by Tosoh Corporation) using TSK gel Multipore HXL-M columns (manufactured by Tosoh Corporation, 7.8 mm ID×30.0 cm) and THF (tetrahydrofuran) as an eluent.

In the actinic ray-sensitive or radiation-sensitive resin composition in the invention, the content of the resin (P) in the entire composition is preferably from 30 to 99% by mass, and more preferably from 60 to 95% by mass, based on the total solid content.

In addition, in the invention, the resin (P) may be used singly or in combination of a plurality of kinds thereof.

Further, the actinic ray-sensitive or radiation-sensitive resin composition in the invention may further contain the resin (P) as well as acid-decomposable resins (a resin which has increased polarity by the action of an acid and has reduced solubility in a developer including an organic solvent) other than resin (P). The acid-decomposable resin other than the resin (P) is an acid-decomposable resin including the same repeating units as those that may be included in the resin (P), and the preferred ranges or content in the resin of the repeating units are the same as described for the resin (P).

In the case where the acid-decomposable resin other than the resin (P) is included, the content of the acid-decomposable resin in the composition according to the invention may satisfy the condition that the total content of the resin (P) and the acid-decomposable resin other than the resin (P) is within the above-described ranges. The mass ratio of the resin (P) to the acid-decomposable resin other than the resin (P) can be suitably adjusted to a range in which a good effect of the invention is exhibited, but the range of [resin (P)/acid-decomposable resin other than the resin (P)] is preferably from 99.9/0.1 to 10/90, and more preferably from 99. 9/0.1 to 60/40.

It is preferable that the actinic ray-sensitive or radiation-sensitive resin composition in the invention contain the resin (P) alone as the acid-decomposable resin, from the viewpoint of improvement local pattern dimensional uniformity and the cross-sectional shape of the pattern.

Specific examples of the resin (P) used in the invention are shown below, but the invention is not limited thereto.

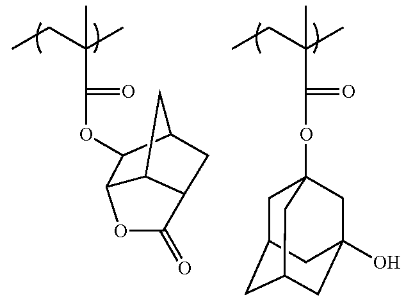

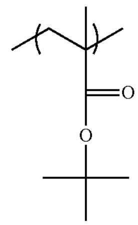

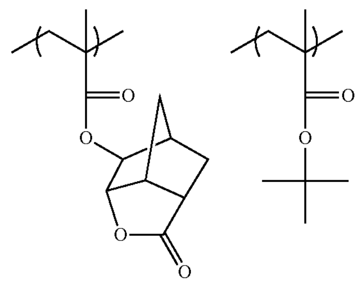

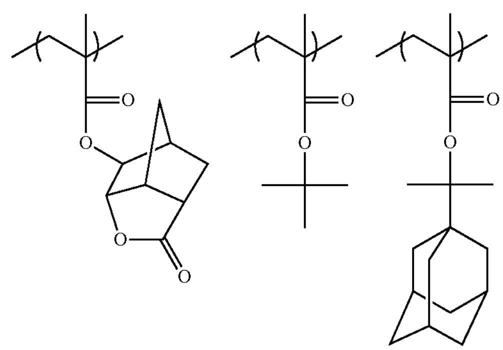

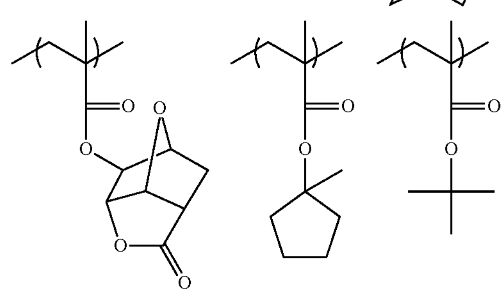

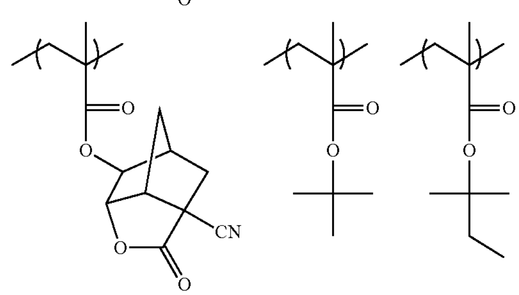

-continued
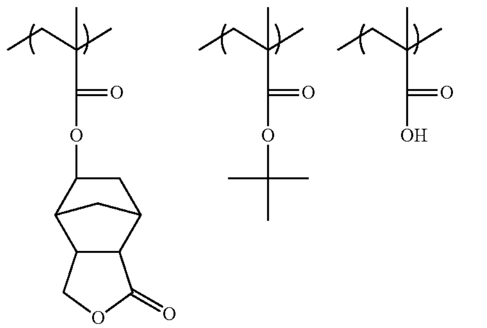
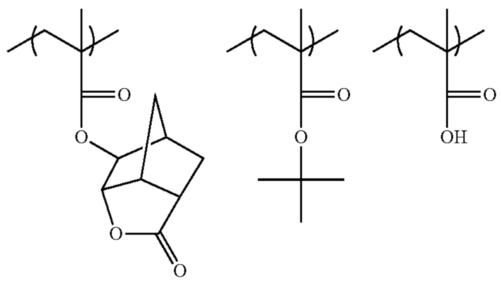
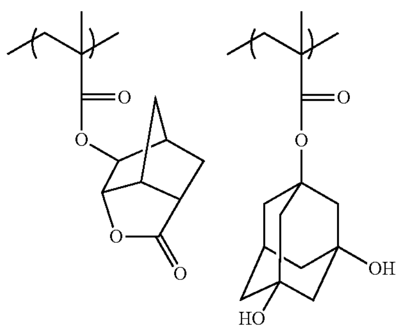
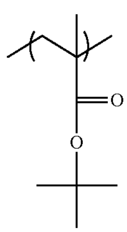
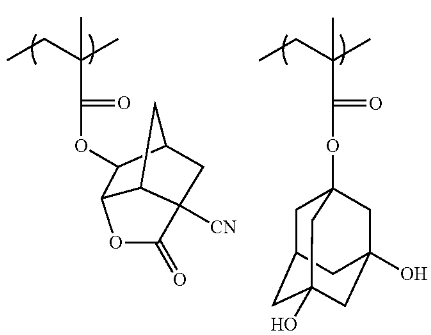
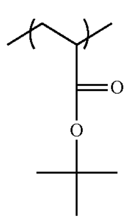
-continued
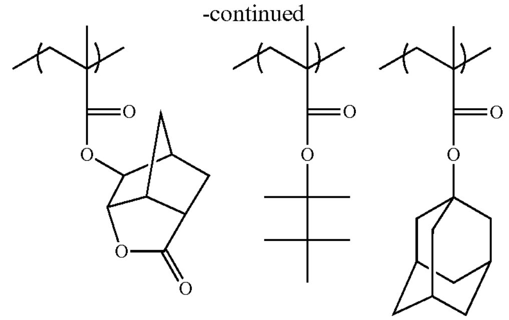
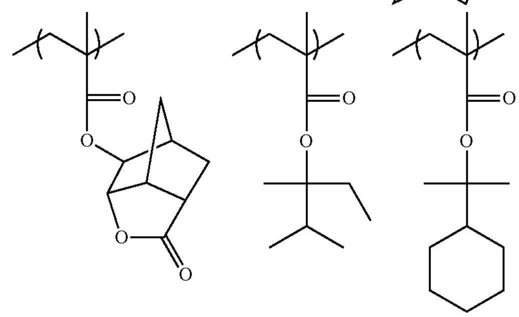
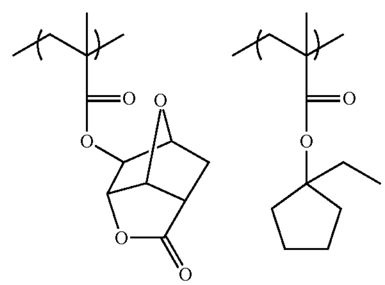
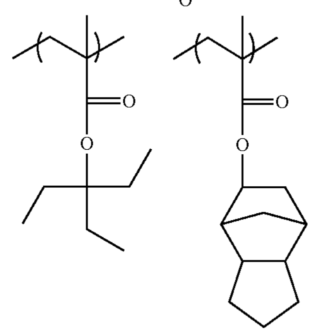
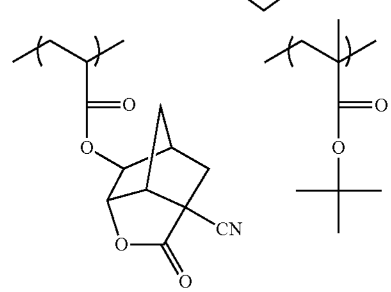
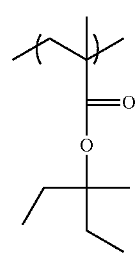

-continued
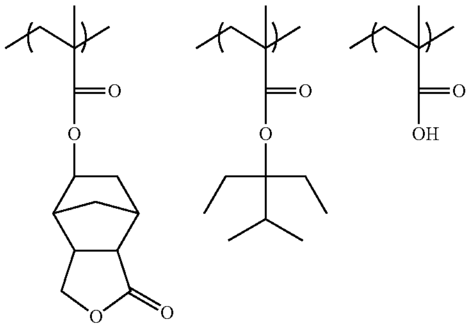
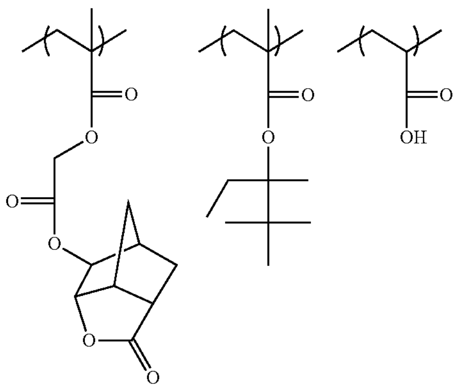
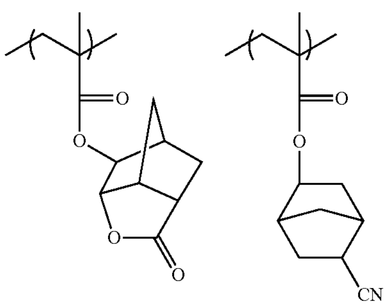
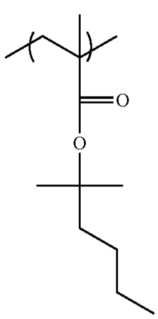
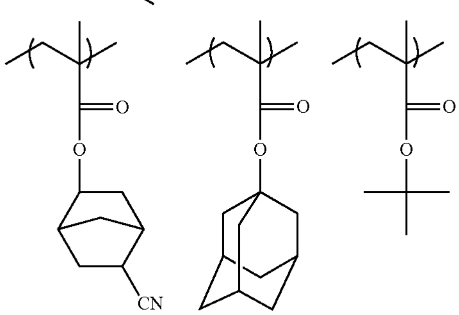
-continued
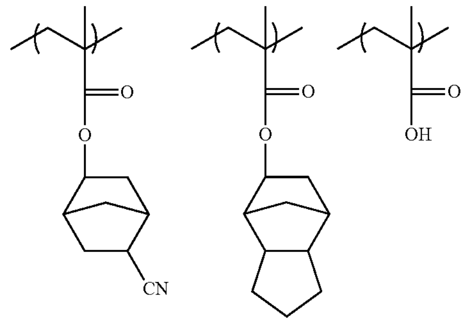
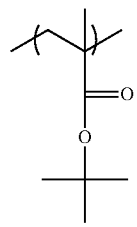
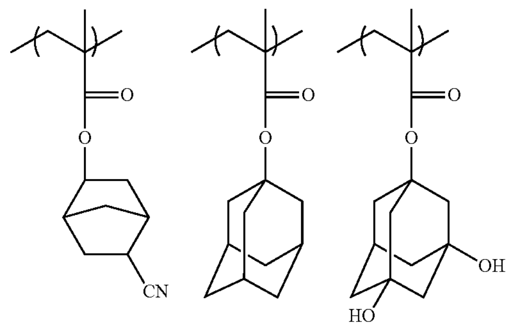
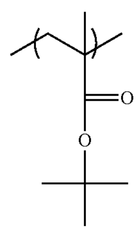
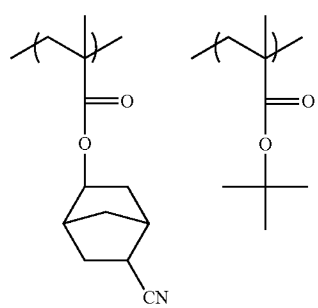
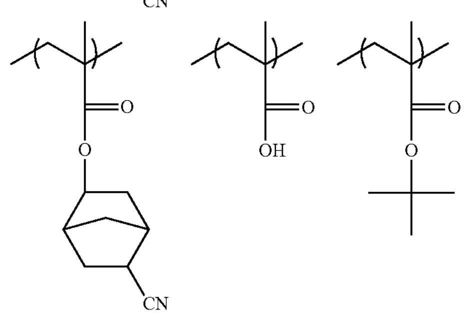

-continued
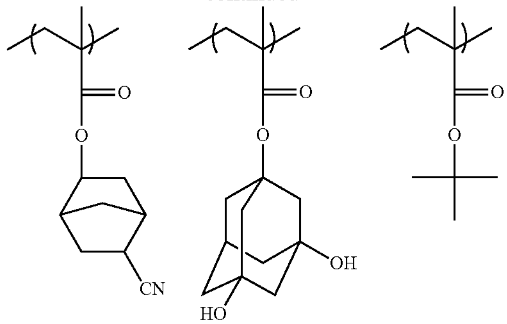
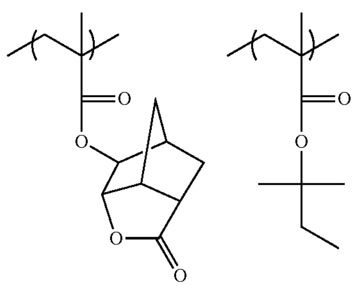
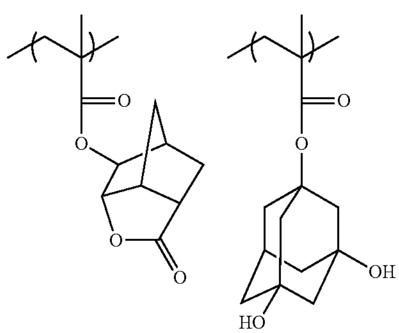
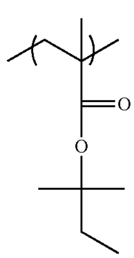
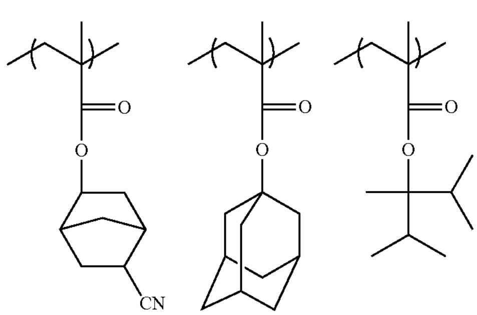
-continued
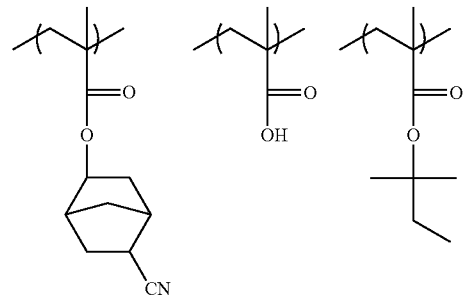
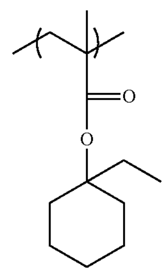
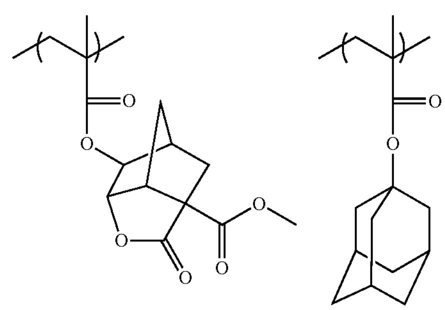
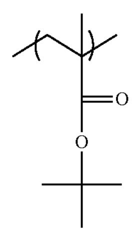
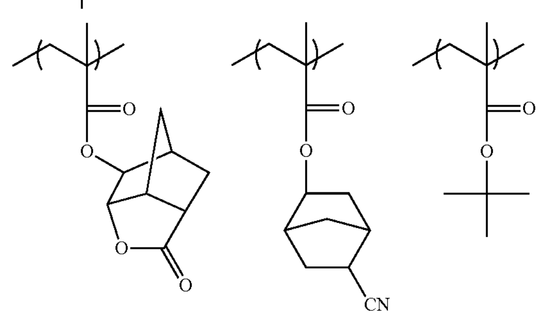
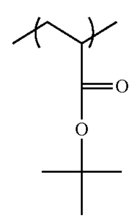

-continued
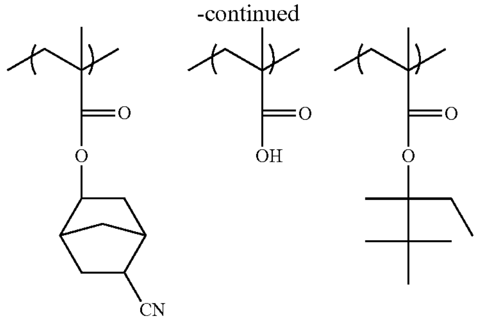
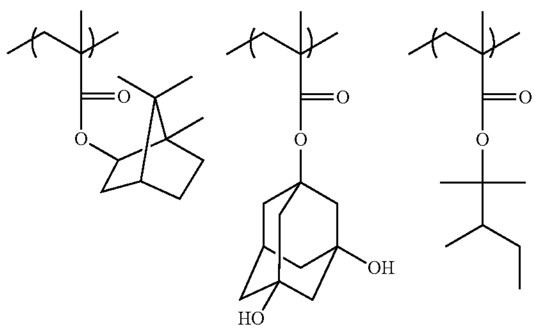
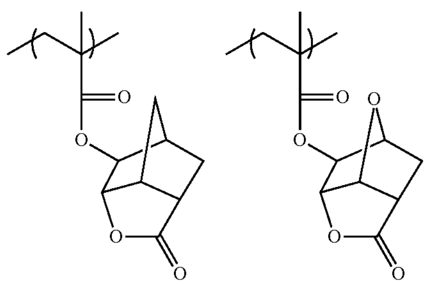
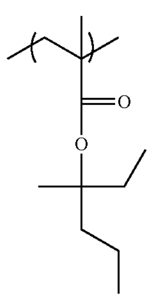
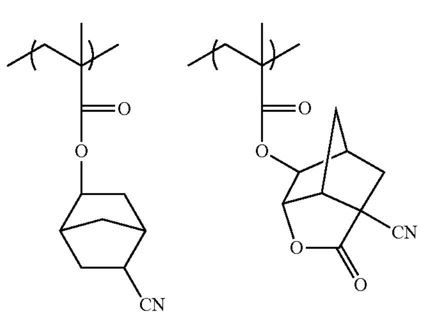
-continued
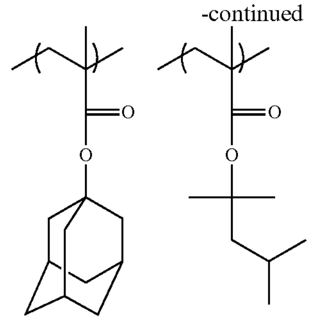
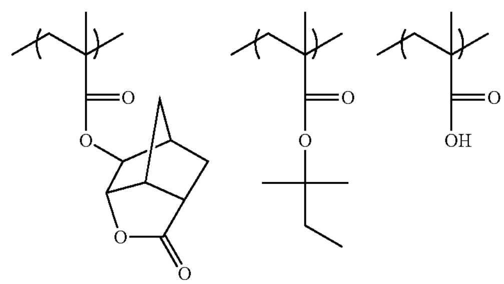
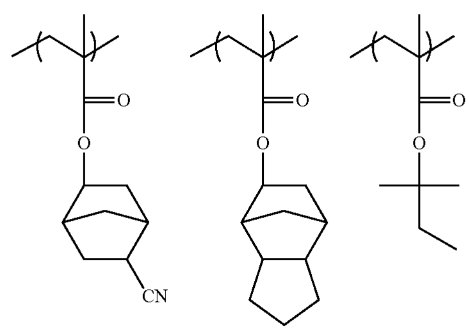
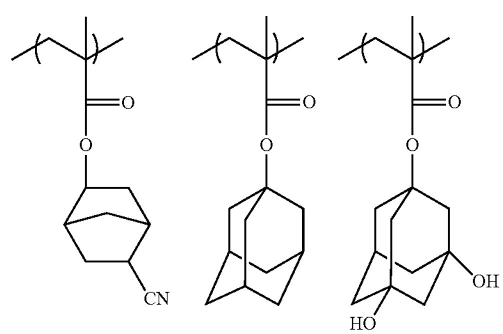
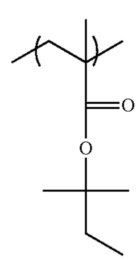

-continued
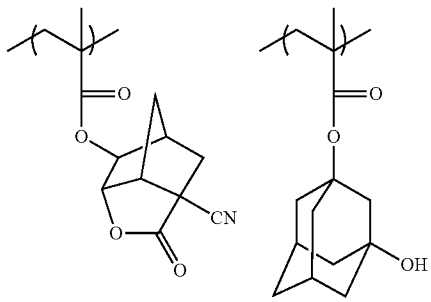
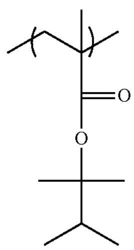
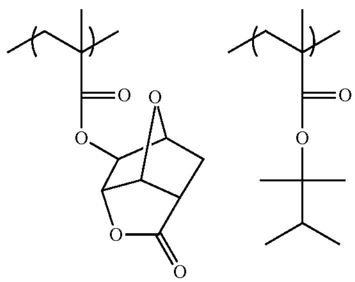
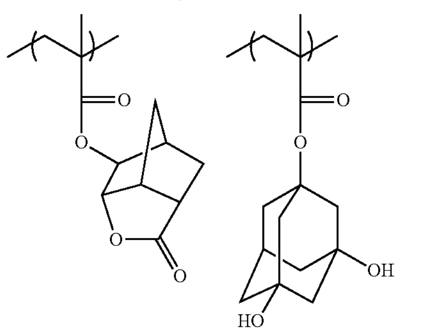
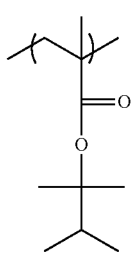
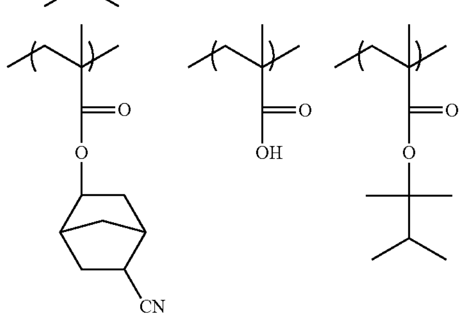
-continued
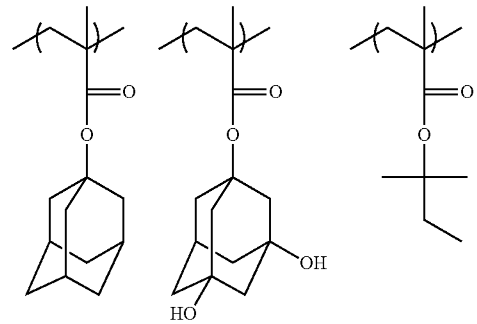
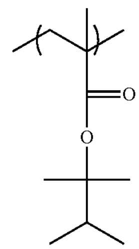
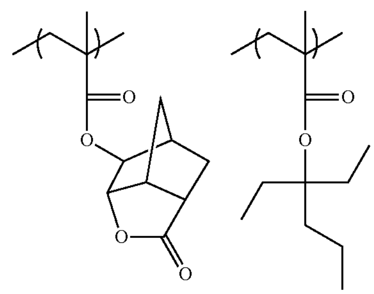
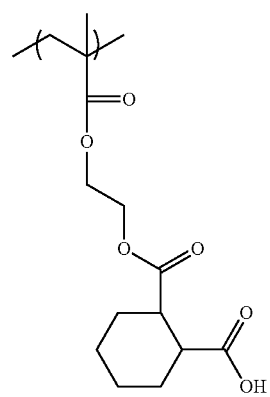
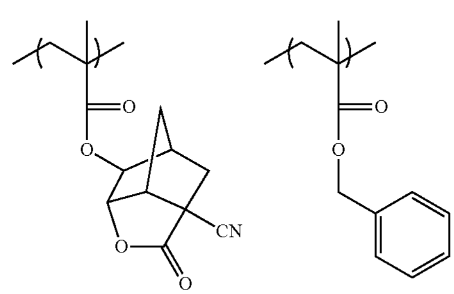

-continued
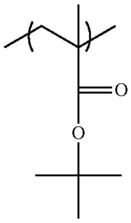
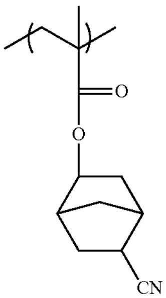
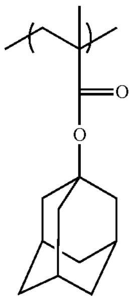
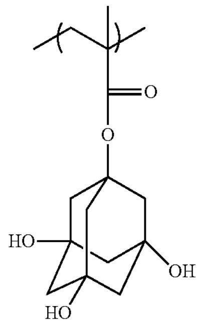
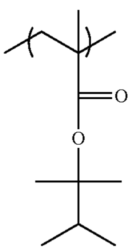
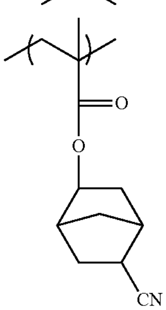
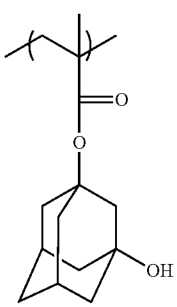
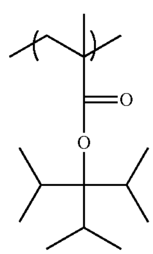
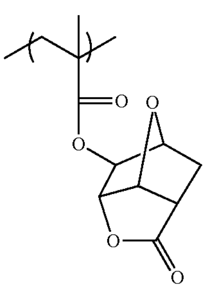
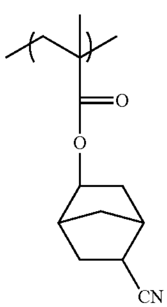
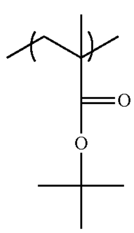
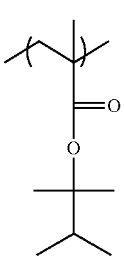
-continued
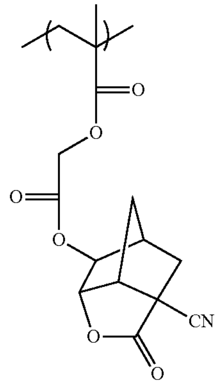
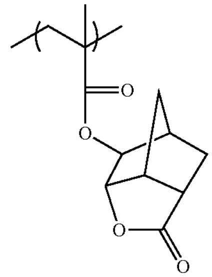
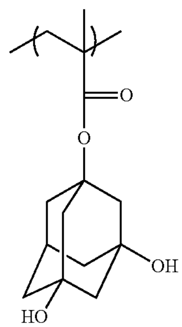
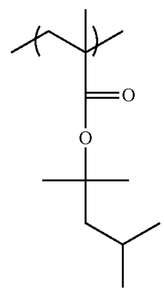
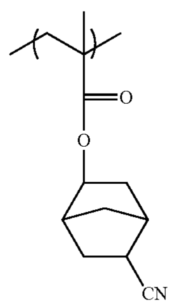
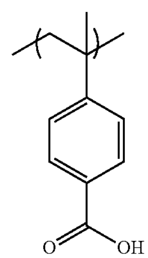
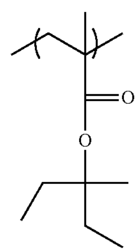
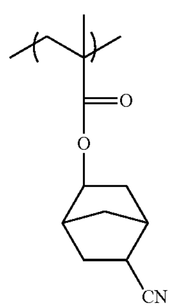
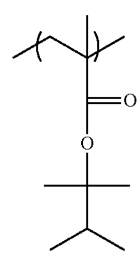
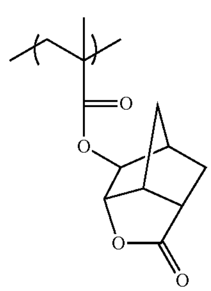
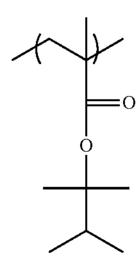

-continued
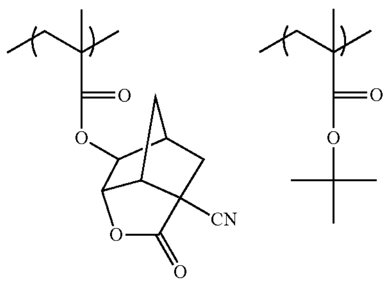
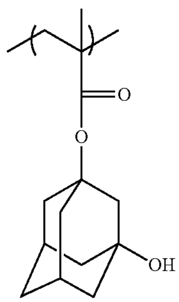
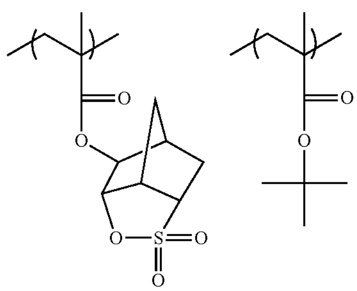
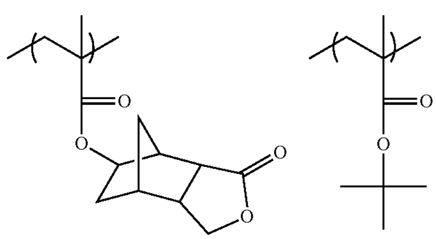
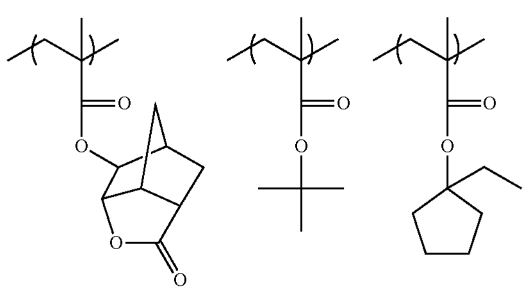
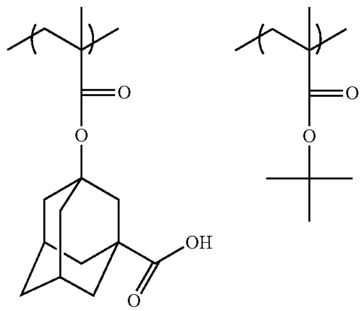
-continued
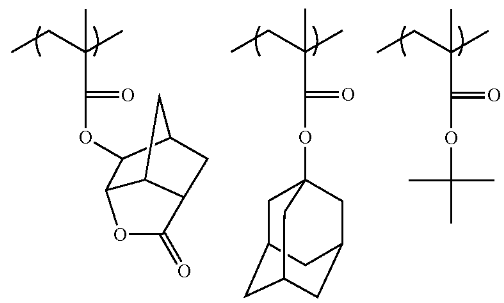
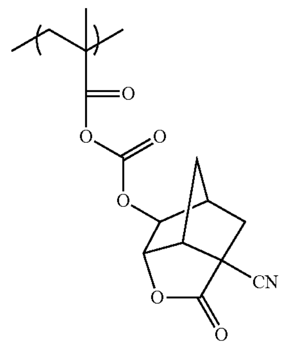
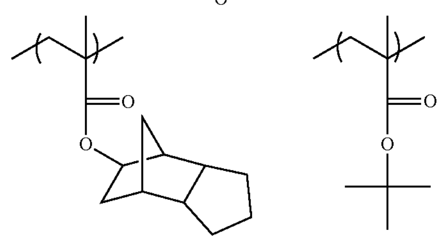
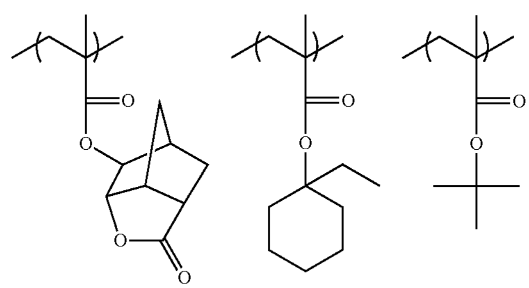
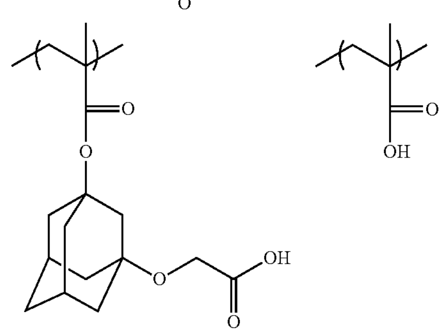
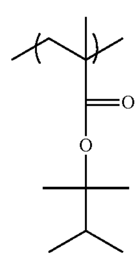

-continued

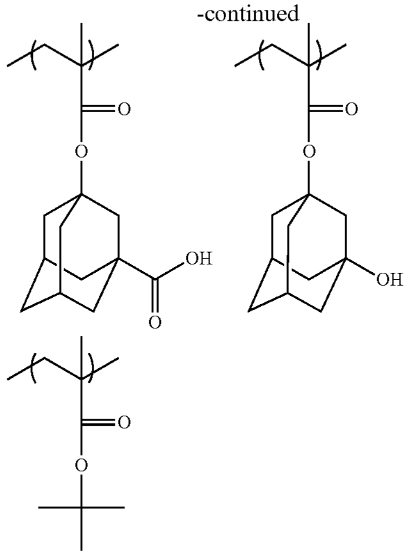

[2] Compound Capable of Generating Acid Upon Irradiation of Actinic Rays or Radiation (B)

The composition in the invention further contains a compound capable of generating an acid by irradiation with actinic rays or radiation (B) (an acid generator).

As such an acid generator (B), photoinitiators for photocation polymerization, photoinitiators for photo-radical polymerization, photodecoloring agents of dyes, photo-discoloring agents, known compounds that generate an acid by irradiation with actinic rays or radiation, which are used in microresists, or the like, and mixtures thereof may be suitably selected and used.

Examples of the acid generator include diazonium salts, phosphonium salts, sulfonium salts, iodonium salts, imide sulfonates, oxime sulfonates, diazodisulfone, disulfone, and o-nitrobenzyl sulfonate.

Examples of the preferred compounds among the acid generators (B) include the compounds represented by the following general formulae (ZI), (ZII), and (ZIII).

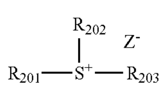

(ZI)

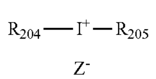

(ZII)

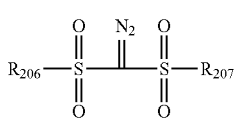

(ZIII)

In the general formula (ZI), $R_{201}$, $R_{202}$, and $R_{203}$ each independently represent an organic group.

The organic group as $R_{201}$, $R_{202}$, and $R_{203}$ generally has 1 to 30 carbon atoms, and preferably 1 to 20 carbon atoms.

Further, two members of $R_{201}$ to $R_{203}$ may be bonded to each other to form a ring structure, and the ring may contain an oxygen atom, a sulfur atom, an ester bond, an amide bond or a carbonyl group. Examples of the group formed by the combination of two members of $R_{201}$ to $R_{203}$ include an alkylene group (for example, a butylene group and a pentylene group).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl) imide anion, and a tris(alkylsulfonyl)methide anion.

The non-nucleophilic anion is an anion having an exceedingly low ability of causing a nucleophilic reaction, and is also an anion capable of suppressing the decomposition with aging by the nucleophilic reaction in the molecule, which thus leads to improvement of the stability with aging of the resist composition.

Examples of the sulfonate anion include an aliphatic sulfonate anion, an aromatic sulfonate anion, and a camphor sulfonate anion.

Examples of the carboxylate anion include an aliphatic carboxylate anion, an aromatic carboxylate anion, and an aralkylcarboxylate anion.

The aliphatic moiety in the aliphatic sulfonate anion and the aliphatic carboxylate anion may be an alkyl group or a cycloalkyl group. It is preferably an alkyl group having 1 to 30 carbon atoms and a cycloalkyl group having 3 to 30 carbon atoms, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbonyl group, and a bornyl group.

The aromatic group in the aromatic sulfonate anion and the aromatic carboxylate anion is preferably an aryl group having 6 to 14 carbon atoms, and examples thereof include a phenyl group, a tolyl group, and a naphthyl group.

Examples of the substituent of the alkyl group, the cycloalkyl group, and the aryl group of the aliphatic sulfonate anion and the aromatic sulfonate anion include a nitro group, a halogen atom (fluorine atom, chlorine atom, bromine atom or iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). The aryl group or ring structure of these groups may further have an alkyl group (preferably having 1 to 15 carbon atoms) and a cycloalkyl group (preferably having 3 to 15 carbon atoms) as its substituent.

The aralkyl group in the aralkylcarboxylate anion is preferably an aralkyl group having 7 to 12 carbon atoms, and examples thereof include a benzyl group, a phenethyl group, a naphthylmethyl group, a naphthylethyl group, and a naphthylbutyl group.

The alkyl group, the cycloalkyl group, the aryl group, and the aralkyl group in the aliphatic carboxylate anion, the aromatic carboxylate anion, and the aralkylcarboxylate anion may have a substituent. Examples of the substituent include halogen atoms, alkyl groups, cycloalkyl groups, alkoxy groups, and alkylthio groups as described for the aromatic sulfonic acid anion.

Examples of the sulfonylimide anion include a saccharin anion.

The alkyl group in the bis(alkylsulfonyl) imide anion and the tris(alkylsulfonyl)methide anion is preferably an alkyl group having 1 to 5 carbon atoms, and examples thereof include a methyl group, an ethyl group, a propyl group, an isopropyl group, an n-butyl group, an isobutyl group, a sec-butyl group, a pentyl group, and a neopentyl group. Examples of the substituent for the alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group, and an alkyl group substituted with a fluorine atom is preferred.

Examples of other non-nucleophilic anions include fluorophosphates, fluoroborates, and fluoroantimonates.

The non-nucleophilic anion for $Z^-$ is preferably an aliphatic sulfonate anion substituted at its α-position of sulfonic acid with a fluorine atom, an aromatic sulfonate anion substituted with a fluorine atom, or a group having a fluorine atom, a bis(alkylsulfonyl)imido anion in which an alkyl group is substituted with a fluorine atom, or a tris(alkylsulfonyl)methide anion in which an alkyl group is substituted with a fluorine atom. The normucleophilic anion is more preferably a perfluorinated aliphatic sulfonate anion (more preferably having 4 to 8 carbon atoms) or a benzene sulfonate anion having a fluorine atom, and still more preferably a nonafluorobutane sulfonate anion, a perfluorooctane sulfonate anion, a pentafluorobenzene sulfonate anion, or a 3,5-bis(trifluoromethyl)benzene sulfonate anion.

The acid generator (B) is preferably a compound capable of generating an acid represented by the following general formula (II) or (III). When the acid generator is the compound capable of generating an acid represented by the following general formula (II) or (III), it has a cyclic organic group, and therefore, resolution and roughness performance can be further improved.

The non-nucleophilic anion may be an anion capable of generating an acid represented by the following general formula (II) or (III).

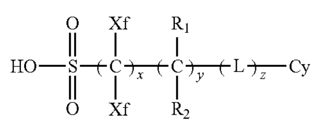

(II)

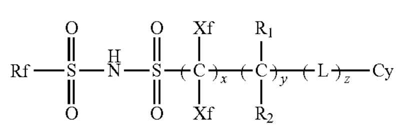

(III)

In the general formula, each of Xf's independently represents a fluorine atom, or an alkyl group substituted with at least one fluorine atom;

each of $R_1$ and $R_2$ independently represents a hydrogen atom, a fluorine atom, or an alkyl group, and in the case of y≥2, each of $R_1$'s and $R_2$'s independently represents a hydrogen atom, a fluorine atom, or an alkyl group;

L represents a divalent linking group, and in the case of z≥2, each of L's independently represents a divalent linking group;

Cy represents a cyclic organic group;

Rf represents a group containing a fluorine atom;

x represents an integer of 1 to 20;

y represents an integer of 0 to 10; and z represents an integer of 0 to 10.

Xf represents a fluorine atom, or an alkyl group substituted with at least one fluorine atom. The alkyl group preferably contains 1 to 10 carbon atoms, and more preferably 1 to 4 carbon atoms. Further, the alkyl group substituted with at least one fluorine atom is preferably a perfluoroalkyl group.

Xf is preferably a fluorine atom or a perfluoroalkyl group having 1 to 4 carbon atoms. Specific preferred examples of Xf include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, a fluorine atom and $CF_3$ are preferred. It is particularly preferable that both Xf's be fluorine atoms.

Each of $R_1$ and $R_2$ independently represents a hydrogen atom, a fluorine atom, or an alkyl group. The alkyl group may have a substituent (preferably a fluorine atom), and preferably contains 1 to 4 carbon atoms. A perfluoroalkyl group having 1 to 4 carbon atoms is more preferred. Specific examples of the alkyl group having a substituent for $R_1$ and $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferred.

L is a divalent linking group. Examples of the divalent linking group include —COO—, —OCO—, —CONH—, —NHCO—, —CO—, —O—, —S—, —SO—, —$SO_2$—, an alkylene group (preferably having 1 to 6 carbon atoms), a cycloalkylene group (preferably having 3 to 10 carbon atoms), an alkenylene group (preferably having 2 to 6 carbon atoms), and a linking group formed by a plurality of these groups. Among these, —COO—, —OCO—, —CONH—, —NHCO—, —CO—, —O—, —$SO_2$—, —COO-alkylene group-, —OCO-alkylene group-, —CONH-alkylene group-, or —NHCO-alkylene group- is preferred, and —COO—, —OCO—, —CONH—, —$SO_2$—, —COO-alkylene group-, or —OCO-alkylene group- is more preferred.

Cy represents a cyclic organic group. Examples of the cyclic organic group include an alicyclic group, an aryl group, and a heterocyclic group.

The alicyclic group may be monocyclic or polycyclic, and is preferably a monocyclic cycloalkyl group such as a cyclopentyl group, a cyclohexyl group, and a cyclooctyl group, or a polycyclic cycloalkyl group such as a norbornyl group, a tricyclodecanyl group, a tetracyclodecanyl group, a tetracyclododecanyl group, and an adamantyl group. Among these, an alicyclic group having a bulky structure containing 7 or more carbon atoms, such as a norbornyl group, a tricyclodecanyl group, a tetracyclodecanyl group, a tetracyclododecanyl group, and an adamantyl group, is preferred since diffusion of counter anions into a film during a post-exposure baking (PEB) step is inhibited and a MEEF (Mask Error Enhancement Factor) is improved.

The aryl group may be monocyclic or polycyclic. Examples of the aryl group include a phenyl group, a naphthyl group, a phenanthryl group, and an anthryl group. Among these, a naphthyl group with a relatively low light absorbance at 193 nm is preferred.

The heterocyclic group may be monocyclic or polycyclic, and the polycyclic heterocyclic group can inhibit the diffusion of an acid. Further, the heterocyclic group may be aromatic or non-aromatic. Examples of the aromatic heterocycle include a furan ring, a thiophene ring, a benzofuran ring, a benzothiophene ring, a dibenzofuran ring, a dibenzothiophene ring, and a pyridine ring. Examples of the non-aromatic heterocycle include a tetrahydropyran ring, a lactone ring, and a decahydroisoquinoline ring. As the heterocycle in the heterocyclic group, a furan ring, a thiophene ring, a pyridine ring, or a decahydroisoquinoline ring are particularly preferred. Further, examples of the lactone ring include the lactone structures exemplified in the above-described resin (P).

The cyclic organic group may have a substituent. Examples of the substituent include an alkyl group (may be linear, branched, or cyclic, preferably having 1 to 12 carbon atoms), a cycloalkyl group (may be monocyclic, polycyclic or spirocyclic, preferably having 3 to 20 carbon atoms), an aryl group (preferably having 6 to 14 carbon atoms), a hydroxyl group, an alkoxy group, an ester group, an amide group, a urethane group, a ureido group, a thioether group, a sulfonamide group, and a sulfonic acid ester group. Incidentally, the carbon constituting the cyclic organic group (carbon contributing to ring formation) may be carbonyl carbon.

x is preferably from 1 to 8, more preferably from 1 to 4, and particularly preferably 1. y is preferably from 0 to 4, and more preferably 0. z is preferably from 0 to 8, and more preferably from 0 to 4.

Examples of the group containing a fluorine atom as Rf include an alkyl group having at least one fluorine atom, a cycloalkyl group having at least one fluorine atom, and an aryl group having at least one fluorine atom.

These alkyl group, cycloalkyl group, and aryl group may be substituted with fluorine atoms, or with the substituents containing fluorine atoms. In the case where Rf is a cycloalkyl group having at least one fluorine atom or an aryl group having at least one fluorine atom, examples of the other substituent containing a fluorine atom include an alkyl group substituted with at least one fluorine atom.

Furthermore, these alkyl group, cycloalkyl group, and aryl group may be further substituted with substituents containing no fluorine atoms. Examples of the substituent include those containing no fluorine atoms, among those described above for Cy.

Examples of the alkyl group having at least one fluorine atom represented by Rf include those described above for the alkyl group substituted with at least one fluorine atom represented by Xf. Examples of the cycloalkyl group having at least one fluorine atom represented by Rf include a perfluorocyclopentyl group and a perfluorocyclohexyl group. Examples of the aryl group having at least one fluorine atom represented by Rf include a perfluorophenyl group.

Examples of the organic group represented by $R_{201}$, $R_{202}$, and $R_{203}$ include the corresponding groups in the compounds (ZI-1), (ZI-2), (ZI-3), and (ZI-4) as described later.

Moreover, the compound may be a compound having a plurality of structures represented by the general formula (ZI). For example, the compound may be a compound having a structure where at least one of $R_{201}$ to $R_{203}$ in the compound represented by the general formula (ZI) is bonded to at least one of $R_{201}$ to $R_{203}$ in another compound represented by the general formula (ZI) through a single bond or a linking group.

More preferred examples of the component (ZI) include the compounds (ZI-1), (ZI-2), (ZI-3), and (ZI-4) as described below.

The compound (ZI-1) is an arylsulfonium compound where at least one of $R_{201}$ to $R_{203}$ in the general formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group, with the remaining ones being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, and more preferably a phenyl group. The aryl group may be an aryl group having a heterocyclic structure containing an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In the case where the arylsulfonium compound has two or more aryl groups, these two or more aryl groups may be the same as or different from each other.

The alkyl group or the cycloalkyl group which is present, if desired, in the arylsulfonium compound is preferably a linear or branched alkyl group having 1 to 15 carbon atoms or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of $R_{201}$ to $R_{203}$ may have, as the substituent, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group or a phenylthio group. The substituent is preferably a linear or branched alkyl group having 1 to 12 carbon atoms, a cycloalkyl group having 3 to 12 carbon atoms, or a linear, branched, or cyclic alkoxy group having 1 to 12 carbon atoms, more preferably an alkyl group having 1 to 4 carbon atoms, or an alkoxy group having 1 to 4 carbon atoms. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

Next, the compound (ZI-2) will be described.

The compound (ZI-2) is a compound in which $R_{201}$ to $R_{203}$ in the formula (ZI) each independently represent an organic group having no aromatic ring. Here, the aromatic ring also includes an aromatic ring containing a heteroatom.

The organic group containing no aromatic ring as $R_{201}$ to $R_{203}$ generally contains 1 to 30 carbon atoms, and preferably 1 to 20 carbon atoms.

$R_{201}$ to $R_{203}$ each independently preferably represent an alkyl group, a cycloalkyl group, an allyl group, or a vinyl group, still more preferably a linear or branched 2-oxoalkyl group, a 2-oxocycloalkyl group, or an alkoxycarbonylmethyl group, and particularly preferably a linear or branched 2-oxoalkyl group.

Preferable examples of the alkyl group and the cycloalkyl group of $R_{201}$ to $R_{203}$ include a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group). More preferable examples of the alkyl group include a 2-oxoalkyl group and an alkoxycarbonylmethyl group, and more preferable examples of the cycloalkyl group include a 2-oxocycloalkyl group.

The 2-oxoalkyl group may be either linear or branched, and examples thereof include a group containing >C═O at the 2-position of the alkyl group.

The 2-oxocycloalkyl group is preferably the group containing >C═O at the 2-position of the cycloalkyl group.

Examples of the alkoxy group in the alkoxycarbonylmethyl group preferably include an alkoxy group having 1 to 5 carbon atoms (a methoxy group, an ethoxy group, a propoxy group, a butoxy group, and a pentoxy group).

$R_{201}$ to $R_{203}$ may be further substituted with a halogen atom, an alkoxyl group (for example, having 1 to 5 carbon atoms), a hydroxyl group, a cyano group, or a nitro group.

Next, the compound (ZI-3) will be described.

The compound (ZI-3) is a compound represented by the following general formula (ZI-3), which is a compound having a phenacylsulfonium structure.

(ZI-3)

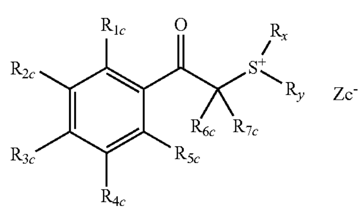

In the general formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group;

$R_{6c}$ and $R_{7c}$ each independently represent a hydrogen atom, an alkyl group, a cycloalkyl group, a halogen atom, a cyano group, or an aryl group; and $R_x$ and $R_y$ each independently represent an alkyl group, a cycloalkyl group, a 2-oxoalkyl group, a 2-oxocycloalkyl group, an alkoxycarbonylalkyl group, an allyl group, or vinyl group.

Any two or more members of $R_{1c}$ to $R_{5c}$, $R_{5c}$ and $R_{6c}$, $R_{6c}$ and $R_{7c}$, $R_{5c}$ and $R_x$, and $R_x$ and $R_y$ may be bonded to each other to form a ring structure, and this ring structure may contain an oxygen atom, a sulfur atom, a ketone group, an ester bond, or an amide bond.

The ring structure includes an aromatic or non-aromatic hydrocarbon ring, an aromatic or non-aromatic heterocyclic ring, and a polycyclic condensed ring formed by combination of two or more of these rings. The ring structure includes a 3- to 10-membered ring, and is preferably a 4- to 8-membered ring, and more preferably a 5- or 6-membered ring.

Examples of the group formed by the mutual bonding of any two or more members of $R_{1c}$ to $R_{5c}$, $R_{6c}$ and $R_{7c}$ and $R_x$ and $R_y$ include a butylene group and a pentylene group.

The group formed by the mutual bonding of $R_{5c}$ and $R_{6c}$, and $R_{5c}$ and $R_x$ is preferably a single bond or an alkylene group, and examples of the alkylene group include a methylene group and an ethylene group.

$Zc^-$ represents a non-nucleophilic anion, and examples thereof include the same non-nucleophilic anions as mentioned above as examples of $Z^-$ in the general formula (ZI).

The alkyl group as $R_{1c}$ to $R_{7c}$ may be either linear or branched, and examples thereof include an alkyl group having 1 to 20 carbon atoms, and preferably a linear or branched alkyl group having 1 to 12 carbon atoms (for example, a methyl group, an ethyl group, a linear or branched propyl group, a linear or branched butyl group, and a linear or branched pentyl group), and examples of the cycloalkyl group include a cycloalkyl group having 3 to 10 carbon atoms (for example, a cyclopentyl group and a cyclohexyl group).

The aryl group as $R_{1c}$ to $R_{5c}$ preferably has 5 to 15 carbon atoms, and examples thereof include a phenyl group and a naphthyl group.

The alkoxy group as $R_{1c}$ to $R_{5c}$ may be any of linear, branched, and cyclic, and examples thereof include an alkoxy group having 1 to 10 carbon atoms, preferably a linear and branched alkoxy group having 1 to 5 carbon atoms (for example, a methoxy group, an ethoxy group, a linear or branched propoxy group, a linear or branched butoxy group, and a linear or branched pentoxy group), and a cyclic alkoxy group having 3 to 10 carbon atoms (for example, a cyclopentyloxy group and a cyclohexyloxy group).

Specific examples of the alkoxy group in the alkoxycarbonyl group as $R_{1c}$ to $R_{5c}$ include the same as those of the alkoxy group as $R_{1c}$ to $R_{5c}$.

Specific examples of the alkyl group in the alkylcarbonyloxy group and the alkylthio group as $R_{1c}$ to $R_{5c}$ include the same as those of the alkyl group as $R_{1c}$ to $R_{5c}$.

Specific examples of the cycloalkyl group in the cycloalkylcarbonyloxy group as $R_1$, to $R_{5c}$ include the same as those of the cycloalkyl group as $R_{1c}$ to $R_{5c}$.

Specific examples of the aryl group in the aryloxy group and the arylthio group as $R_1$, to $R_{5c}$ include the same as those of the aryl group as $R_{1c}$ to $R_{5c}$.

Preferably, any one of $R_{1c}$ to $R_{5c}$ is a linear or branched alkyl group, a cycloalkyl group, or a linear, branched, or cyclic alkoxy group, and $R_{1c}$ to $R_{5c}$ more preferably has 2 to 15 carbon atoms, due to which the solvent solubility is more enhanced and production of particles during storage is be inhibited.

The ring structure formed by the mutual bonding of any two or more of $R_{1c}$ to $R_{5c}$ preferably includes a 5- or 6-membered ring, and particularly preferably a 6-membered ring (such as a phenyl ring).

The ring structure formed by the mutual bonding of $R_{5c}$ and $R_{6c}$ preferably includes a 4 or more-membered ring (preferably a 5- or 6-membered ring) formed with the carbonyl carbon atom and carbon atom in the general formula (I) by the mutual bonding of $R_{5c}$ and $R_{6c}$ to constitute a single bond or an alkylene group (a methylene group, an ethylene group, and the like).

The aryl group as any of $R_{6c}$ and $R_{7c}$ is an alkyl group having 5 to 15 carbon atoms, and examples thereof include a phenyl group and a naphthyl group.

In one embodiment of $R_{6c}$ and $R_{7c}$, a case where both of $R_{6c}$ and $R_{7c}$ are alkyl groups is preferred. Particularly, a case where $R_{6c}$ and $R_{7c}$ are each a linear or branched alkyl group having 1 to 4 carbon atoms is preferred, and a case where both of them are methyl groups is particularly preferred.

Furthermore, in the case where $R_{6c}$ and $R_{7c}$ are combined to form a ring, the group formed by the mutual bonding of $R_{6c}$ and $R_{7c}$ is preferably an alkylene group having 2 to 10 carbon atoms, and examples thereof include an ethylene group, a propylene group, a butylene group, a pentylene group, and a hexylene group. Further, the ring formed by the mutual bonding of $R_{6c}$ and $R_{7c}$ may contain a heteroatom such as an oxygen atom in the ring.

Examples of the alkyl group and the cycloalkyl group as $R_x$ and $R_y$ include the same as those of the alkyl group and the cycloalkyl group as in $R_{1c}$ to $R_{7c}$.

Examples of the 2-oxoalkyl group and the 2-oxocycloalkyl group as $R_x$ and $R_y$ include a group containing >C═O at the 2-position of the alkyl group and the cycloalkyl group as $R_1$, to $R_{7c}$.

Examples of the alkoxy group in the alkoxycarbonylalkyl group as $R_x$ and $R_y$ are the same as those of the alkoxy group in $R_{1c}$ to $R_{5c}$. Examples of the alkyl group include an alkyl group having 1 to 12 carbon atoms, and preferably a linear alkyl group having 1 to 5 carbon atoms (for example, a methyl group and an ethyl group).

The allyl group as $R_x$ and $R_y$ is not particularly limited, but is preferably an unsubstituted allyl group or an allyl group substituted with a monocyclic or polycyclic cycloalkyl group (preferably a cycloalkyl group having 3 to 10 carbon atoms).

The vinyl group as $R_x$ and $R_y$ is not particularly limited, but is preferably an unsubstituted vinyl group or a vinyl group substituted with a monocyclic or polycyclic cycloalkyl group (preferably a cycloalkyl group having 3 to 10 carbon atoms).

The ring structure which may be formed by the mutual bonding of $R_{5c}$ and $R_x$ includes a 5-membered or higher ring (particularly preferably a 5-membered ring), formed together with a sulfur atom and a carbonyl carbon atom in the general formula (I) by the mutual bonding of $R_{5c}$ and $R_x$ to constitute a single bond or an alkylene group (a methylene group, an ethylene group, a propylene group, and the like).

The ring structure which may be formed by the mutual bonding of $R_x$ and $R_y$ include a 5- or 6-membered ring, and preferably a 5-membered ring (that is, a tetraydrothiophene ring), formed together with the sulfur atom in the general formula (ZI-3) by divalent $R_x$ and $R_y$ (for example, a methylene group, an ethylene group, and a propylene group).

$R_x$ and $R_y$ are each preferably an alkyl group or cycloalkyl group having 4 or more carbon atoms, more preferably an alkyl group or cycloalkyl group having 6 or more carbon atoms, and still more preferably an alkyl group or cycloalkyl group having 8 or more carbon atoms.

$R_{1c}$ to $R_{7c}$, $R_x$ and $R_y$ may further contain a substituent, and examples of such a substituent include a halogen atom (for example, a fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, and an aryloxycarbonyloxy group.

In the general formula (ZI-3), more preferably, $R_{1c}$, $R_{2c}$, $R_{4c}$, and $R_{5c}$ each independently represent a hydrogen atom, and $R_{3c}$ represents a group other than a hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, Specific examples of the cations of the compounds (ZI-2) or (ZI-3) in the invention will be shown below.

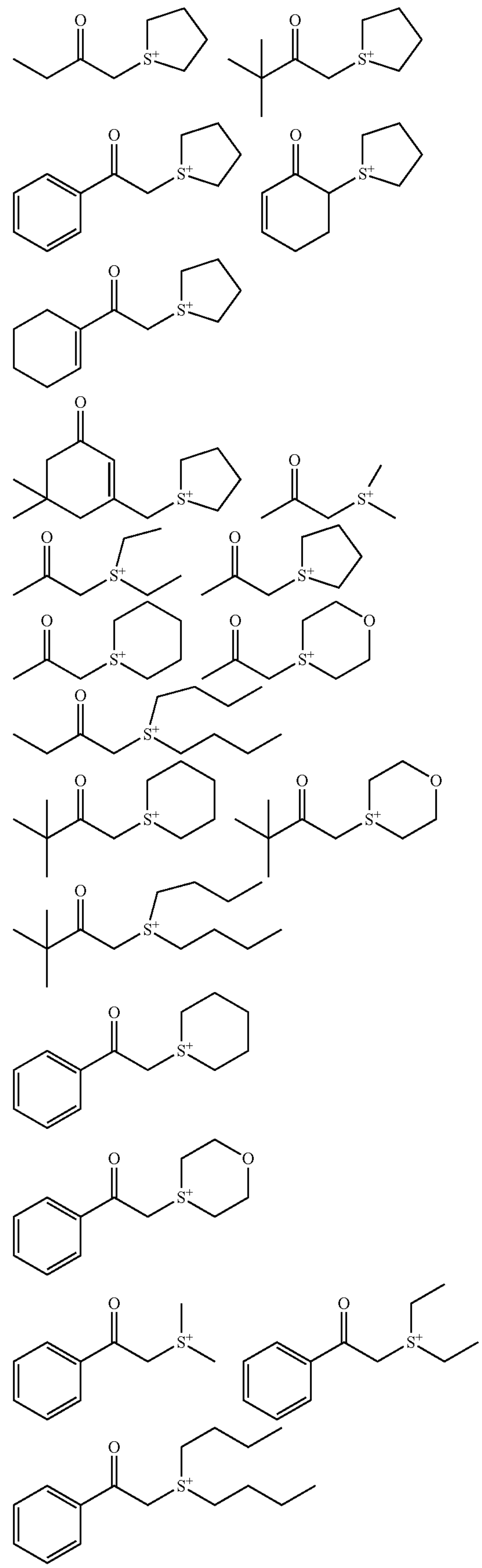

-continued
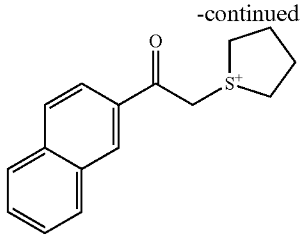
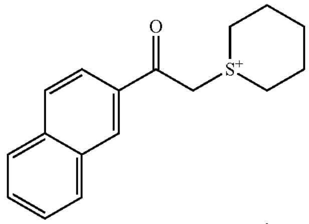
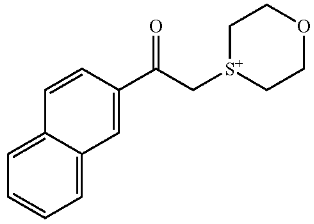
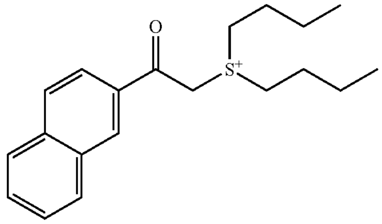
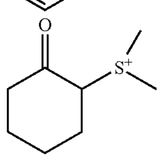
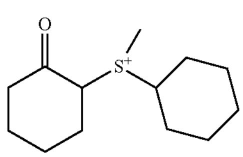
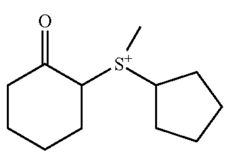
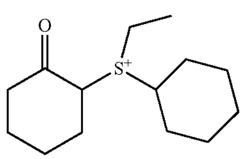
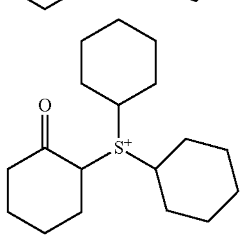
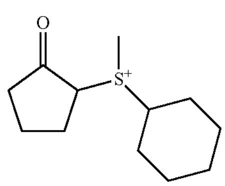
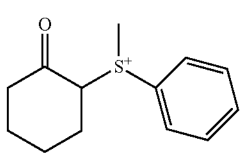
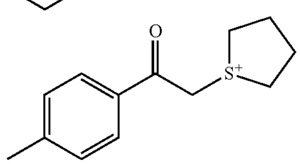
-continued
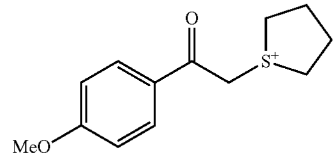
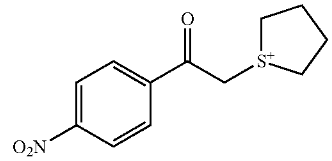
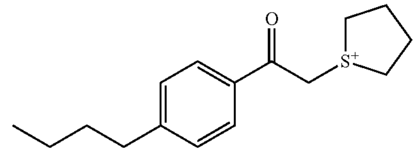
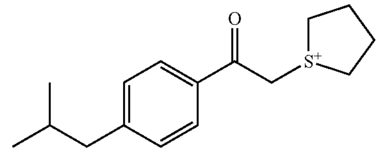
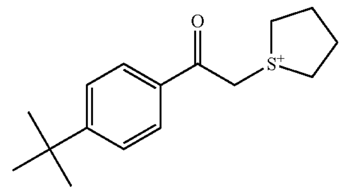
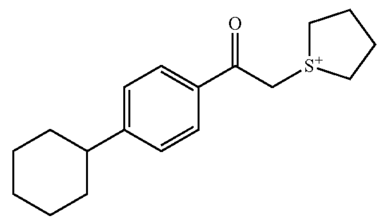
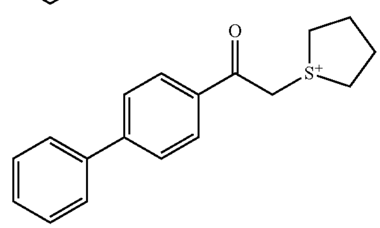
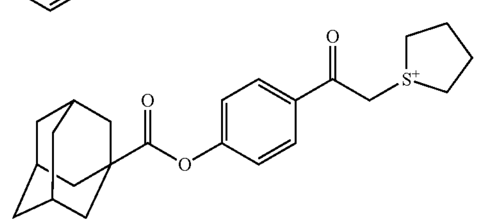
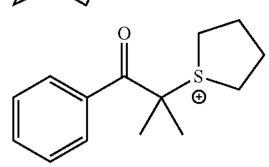

-continued
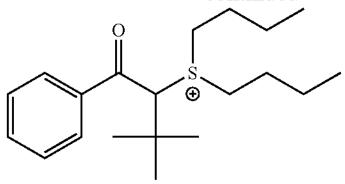
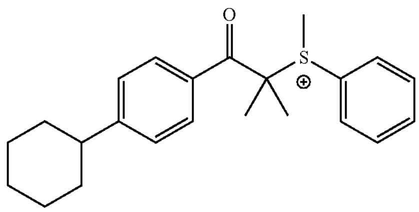
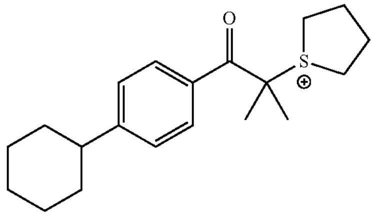
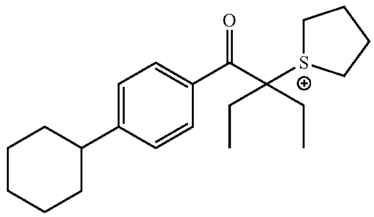
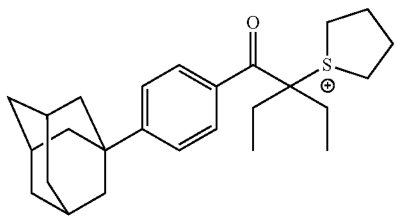
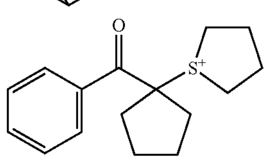
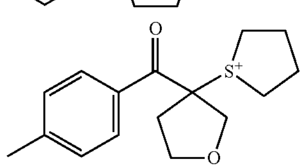
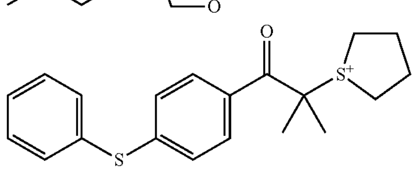
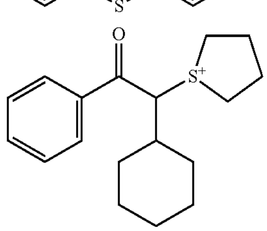
-continued
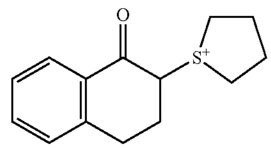
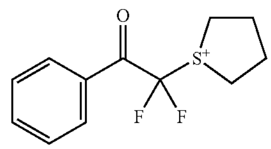
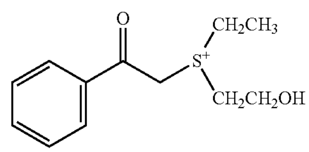
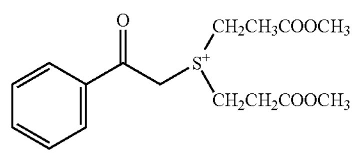
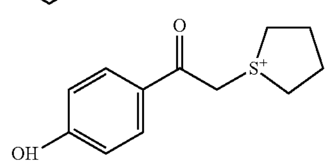
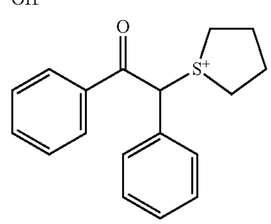
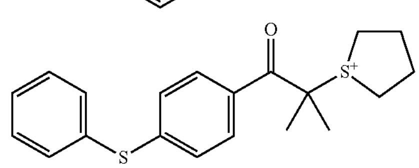
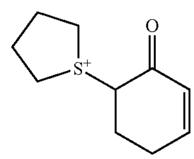
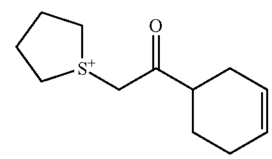
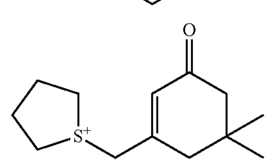
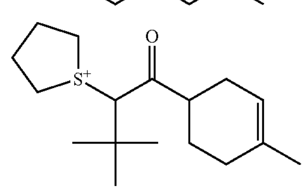

-continued

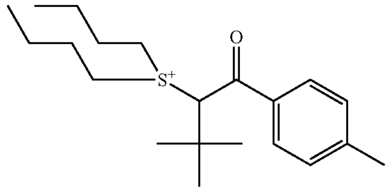

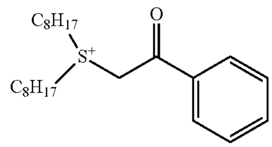

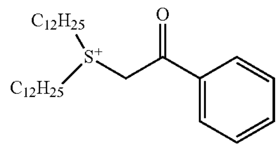

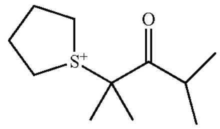

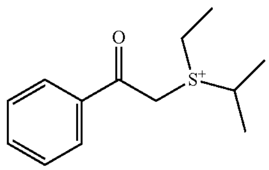

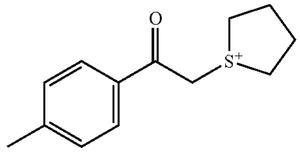

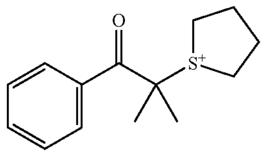

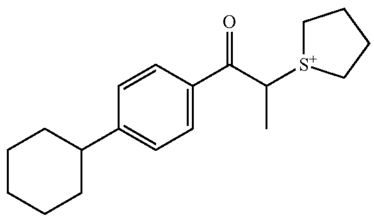

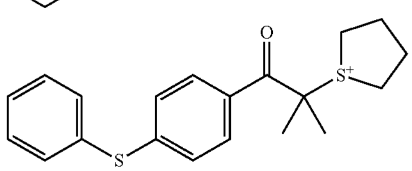

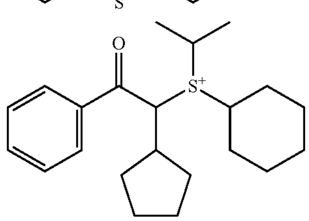

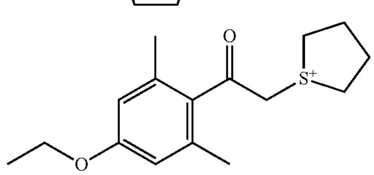

-continued

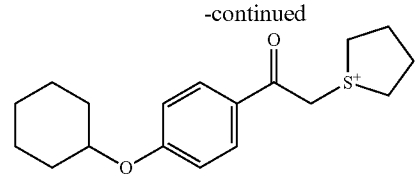

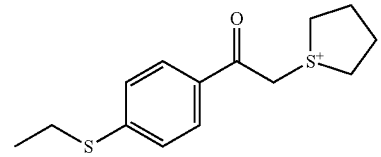

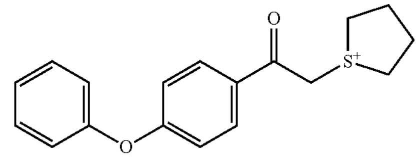

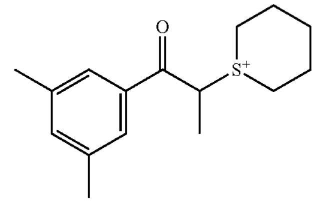

Next, the compound (ZI-4) will be described.

The compound (ZI-4) is represented by the following general formula (ZI-4).

(ZI-4)

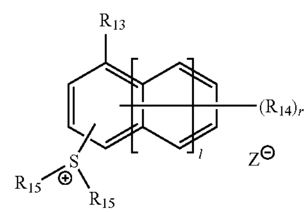

In the general formula (ZI-4), $R_{13}$ represents a group containing a hydrogen atom, a fluorine atom, a hydroxyl group, an alkyl group, a cycloalkyl group, an alkoxy group, an alkoxycarbonyl group, or a cycloalkyl group, and these groups may have a substituent;

when a plurality of $R_{14}$'s are present, they each independently represent a group containing a hydroxyl group, an alkyl group, a cycloalkyl group, an alkoxy group, an alkoxycarbonyl group, an alkylcarbonyl group, an alkylsulfonyl group, a cycloalkylsulfonyl group, or a cycloalkyl group, and these groups may have a substituent;

$R_{15}$'s each independently represent an alkyl group, a cycloalkyl group, or a naphthyl group, or two $R_{15}$'s may be bonded to each other to form a ring, and these groups may have a substituent;

l represents an integer of 0 to 2;

r represents an integer of 0 to 8; and $Z^-$ represents a non-nucleophilic anion, and examples thereof include the same non-nucleophilic anions as mentioned above as examples of $Z^-$ in the general formula (ZI).

In the general formula (ZI-4), the alkyl group of $R_{13}$, $R_{14}$, and $R_{15}$ is linear or branched, preferably has 1 to 10 carbon atoms, and preferred examples thereof include a methyl group, an ethyl group, an n-butyl group, and a t-butyl group.

Examples of the cycloalkyl group of $R_{13}$, $R_{14}$, and $R_{15}$ include a monocyclic or polycyclic cycloalkyl group (preferably a cycloalkyl group having 3 to 20 carbon atoms), and particularly preferred examples thereof include cyclopropyl, cyclopentyl, cyclohexyl, cycloheptyl, and cyclooctyl.

The alkoxy group of $R_{13}$ and $R_{14}$ is linear or branched, preferably has 1 to 10 carbon atoms, and preferred examples thereof include a methoxy group, an ethoxy group, an n-propoxy group, and an n-butoxy group.

The alkoxycarbonyl group of $R_{13}$ and $R_{14}$ is linear or branched, preferably has 2 to 11 carbon atoms, and preferred examples thereof include a methoxycarbonyl group, an ethoxycarbonyl group, and an n-butoxycarbonyl group.

Examples of the group having a cycloalkyl group of $R_{13}$ and $R_{14}$ include a monocyclic or polycyclic cycloalkyloxy group (preferably a cycloalkyl group having of 3 to 20 carbon atoms), and examples thereof include a monocyclic or polycyclic cycloalkyloxy group and an alkoxy group having a monocyclic or polycyclic cycloalkyl group. These groups may further have a substituent.

The monocyclic or polycyclic cycloalkyloxy group of $R_{13}$ and $R_{14}$ preferably has a total number of carbon atoms of 7 or more, more preferably a total number of carbon atoms of 7 to 15, and preferably has a monocyclic cycloalkyl group. The monocyclic cycloalkyloxy group having a total number of carbon atoms of 7 or more indicates a monocyclic cycloalkyloxy group where a cycloalkyloxy group such as a cyclopropyloxy group, a cyclobutyloxy group, a cyclopentyloxy group, a cyclohexyloxy group, a cycloheptyloxy group, a cyclooctyloxy group, and a cyclododecanyloxy group arbitrarily has a substituent such as an alkyl group such as a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group, and an iso-amyl group; a hydroxyl group; a halogen atom (fluorine, chlorine, bromine, and iodine); a nitro group; a cyano group; an amido group; a sulfonamido group; an alkoxy group such as a methoxy group, an ethoxy group, a hydroxyethoxy group, a propoxy group, a hydroxypropoxy group, and a butoxy group; an alkoxycarbonyl group such as a methoxycarbonyl group and an ethoxycarbonyl group; an acyl group such as a formyl group, an acetyl group, and a benzoyl group; and an acyloxy group such as an acetoxy group and a butyryloxy group; and a carboxy group, and where the total number of carbon atoms inclusive of the number of carbon atoms of an arbitrary substituent on the cycloalkyl group is 7 or more.

Furthermore, examples of the polycyclic cycloalkyloxy group having a total number of carbon atoms of 7 or more include a norbornyloxy group, a tricyclodecanyloxy group, a tetracyclodecanyloxy group, and an adamantyloxy group.

The alkoxy group having a monocyclic or polycyclic cycloalkyl group of $R_{13}$ and $R_{14}$ preferably has a total number of carbon atoms of 7 or more, and more preferably a total number of carbon atoms of 7 to 15, and is preferably an alkoxy group having a monocyclic cycloalkyl group. The alkoxy group having a total number of carbon atoms of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy, and iso-amyloxy, in which where the total number of carbon atoms inclusive of the number of carbon atoms of the substituent is 7 or more. Examples thereof include a cyclohexylmethoxy group, a cyclopentylethoxy group, and a cyclohexylethoxy group, with a cyclohexylmethoxy group being preferred.

Furthermore, examples of the alkoxy group having a total number of carbon atoms of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$.

The alkylsulfonyl group or the cycloalkylsulfonyl group of $R_{14}$ is linear, branched, or cyclic, preferably has 1 to 10 carbon atoms, and preferred examples thereof include a methanesulfonyl group, an ethanesulfonyl group, an n-propanesulfonyl group, an n-butanesulfonyl group, a cyclopentanesulfonyl group, and a cyclohexanesulfonyl group.

Examples of the substituent which each of the groups above may have include a halogen atom (for example, a fluorine atom), a hydroxyl group, a carboxyl group, a cyano group, a nitro group, an alkoxy group, an alkoxyalkyl group, an alkoxycarbonyl group, and an alkoxycarbonyloxy group.

Examples of the alkoxy group include a linear, branched, or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of the alkoxyalkyl group include a linear, branched, or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group.

Examples of the alkoxycarbonyl group include a linear, branched, or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl.

Examples of the alkoxycarbonyloxy group include a linear, branched, or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group, and a cyclohexyloxycarbonyloxy group.

Examples of the ring structure which may be formed by the mutual bonding of two $R_{15}$'s include a 5- or 6-membered ring, preferably a 5-membered ring (that is, a tetrahydrothiophene ring), formed together with the sulfur atom in the general formula (ZI-4) by two divalent $R_{15}$'s and may be fused with an aryl group or a cycloalkyl group. The divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group, and an alkoxycarbonyloxy group. As for the substituent on the ring structure, a plurality of substituents may be present, and they may be combined with each other to form a ring (an aromatic or non-aromatic hydrocarbon ring, an aromatic or non-aromatic heterocyclic ring, a polycyclic condensed ring formed by combination of two or more of these rings, or the like).

In the general formula (ZI-4), $R_{15}$ is preferably, for example, a methyl group, an ethyl group, a naphthyl group, or a divalent group for forming a tetrahydrothiophene ring structure together with the sulfur atom when two $R_{15}$'s are bonded to each other, or the like.

The substituent which $R_{13}$ and $R_{14}$ may have is preferably a hydroxyl group, an alkoxy group, an alkoxycarbonyl group, or a halogen atom (particularly a fluorine atom).

l is preferably 0 or 1, and more preferably 1.

r is preferably from 0 to 2.

Specific examples of the cation in the compound represented by the general formula (ZI-4) in the invention will be shown below.

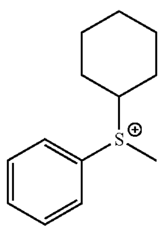
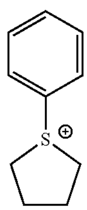
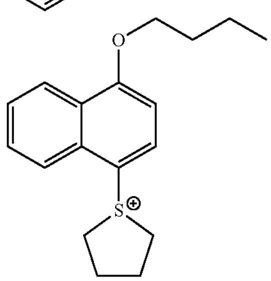

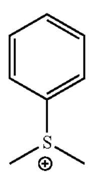
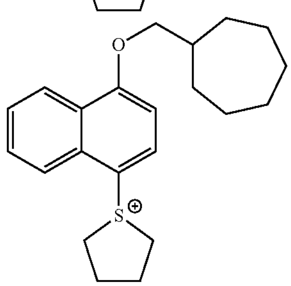

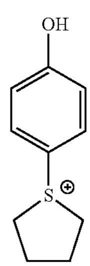

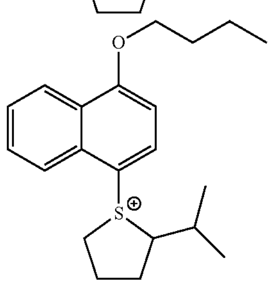

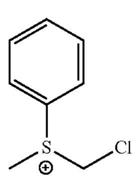

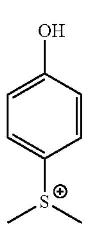

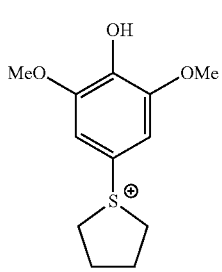

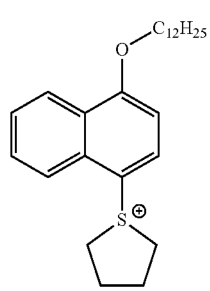

-continued

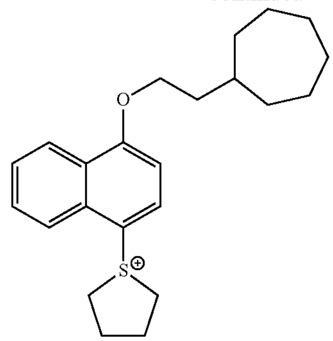

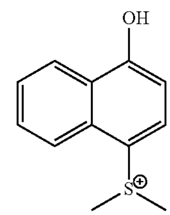

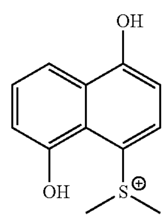

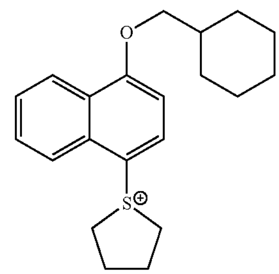

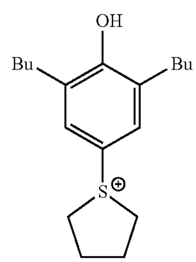

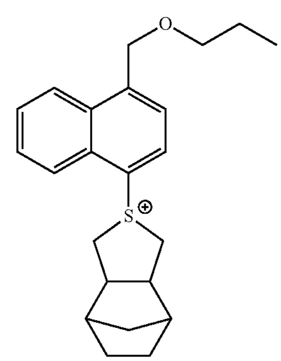

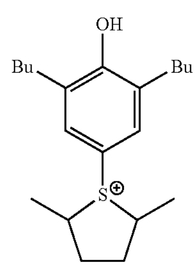

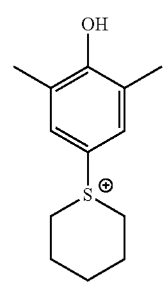

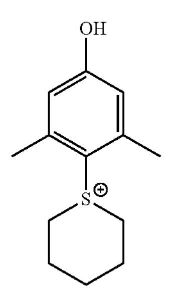

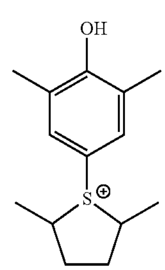

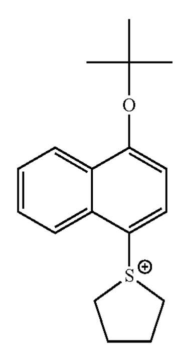

-continued
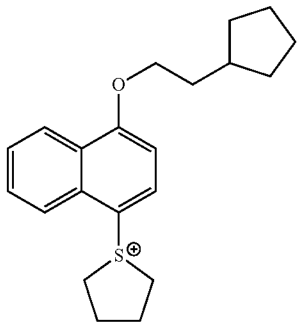
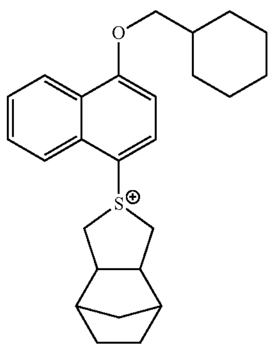
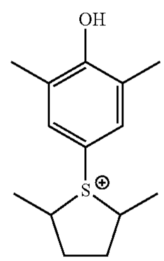
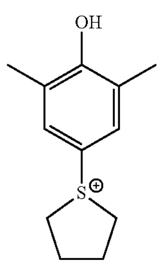
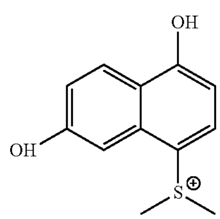
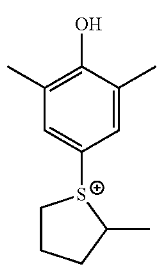
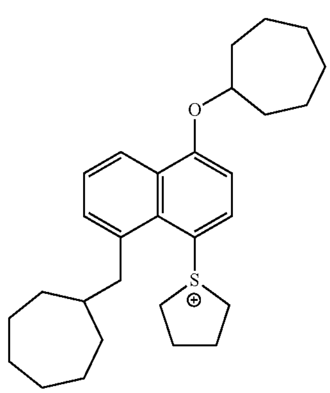
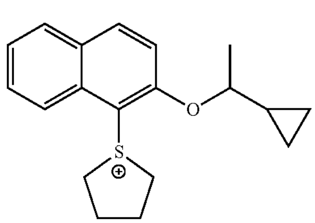
-continued
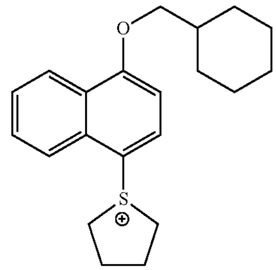
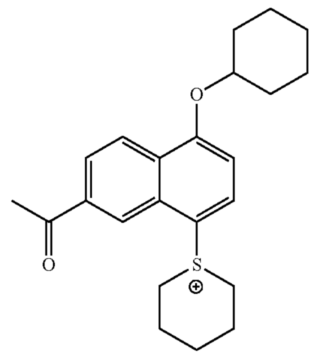
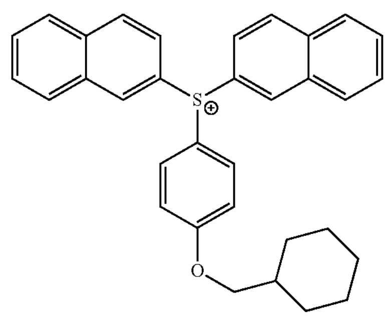
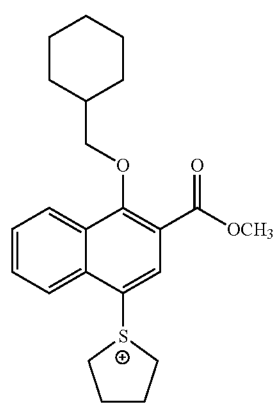
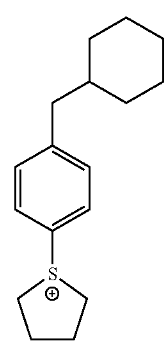
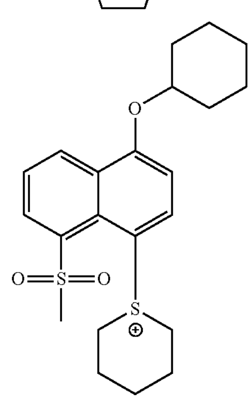

-continued
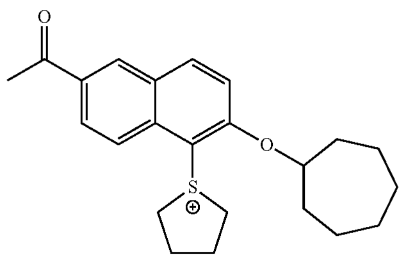
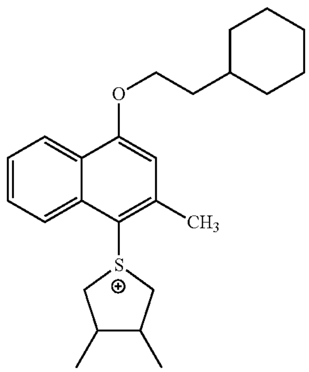
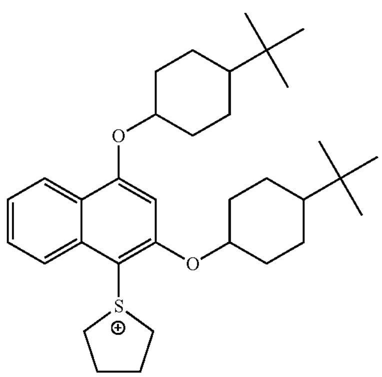
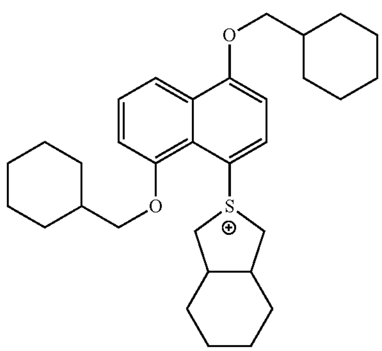
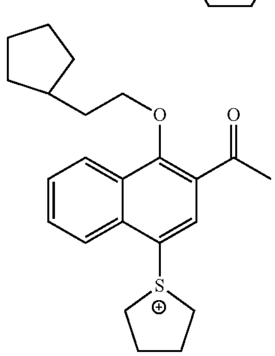
-continued
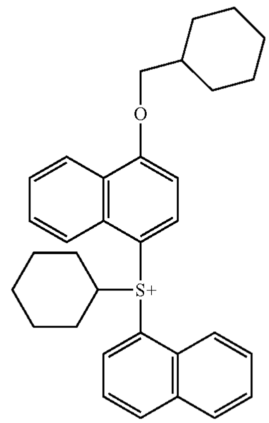
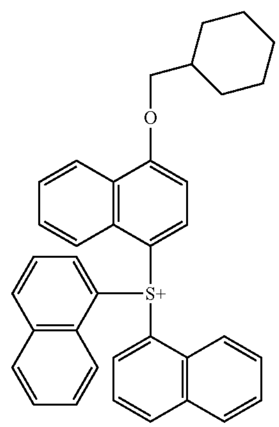
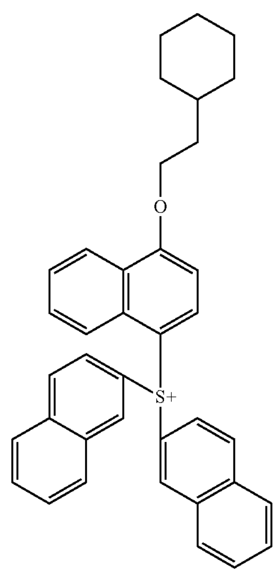
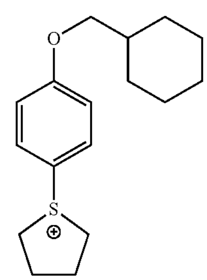
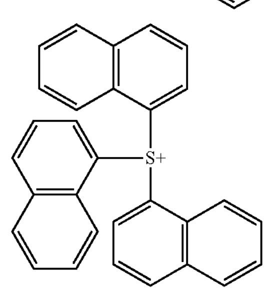

-continued

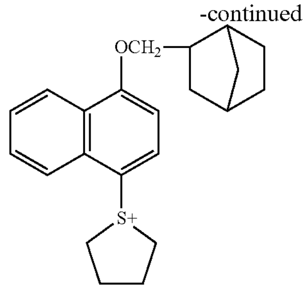

Next, the general formulae (ZII) and (ZIII) will be described.

In the general formulae (ZII) and (ZIII), $R_{204}$ to $R_{207}$ each independently represent an aryl group, an alkyl group, or a cycloalkyl group.

The aryl group of $R_{204}$ to $R_{207}$ is preferably a phenyl group or a naphthyl group, and more preferably a phenyl group. The aryl group of $R_{204}$ to $R_{207}$ may be an aryl group having a heterocyclic structure containing an oxygen atom, a nitrogen atom, a sulfur atom or the like. Examples of the skeleton of the aryl group having a heterocyclic structure include pyrrole, furan, thiophene, indole, benzofuran, and benzothiophene.

Preferred examples of the alkyl group and cycloalkyl group in $R_{204}$ to $R_{207}$ include a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, or a norbonyl group).

The aryl group, the alkyl group, and the cycloalkyl group of $R_{204}$ to $R_{207}$ may have a substituent. Examples of the substituent that the aryl group, the alkyl group, and the cycloalkyl group of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents a non-nucleophilic anion, and examples thereof include the same non-nucleophilic anions as mentioned above as $Z^-$ in the general formula (ZI).

Further examples of the acid generator (B) include compounds represented by the following general formulae (ZIV), (ZV), and (ZVI).

(ZIV)

$$Ar_3—SO_2—SO_2—Ar_4$$

(ZV)

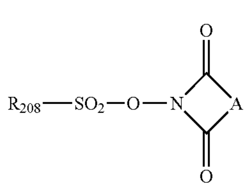

(ZVI)

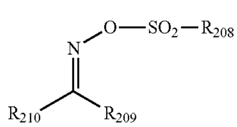

In the general formulae (ZIV) to (ZVI), $Ar_3$ and $Ar_4$ each independently represent an aryl group;

$R_{208}$, $R_{209}$, and $R_{210}$ each independently represent an alkyl group, a cycloalkyl group, or an aryl group; and A represents an alkylene group, an alkenylene group, or an arylene group.

Specific examples of the aryl group of $Ar_3$, $Ar_4$, $R_{208}$, $R_{209}$, and $R_{210}$ are the same as specific examples of the aryl group of $R_{201}$, $R_{202}$, and $R_{203}$ in the general formula (ZI-1).

Specific examples of the alkyl group and cycloalkyl group of $R_{208}$, $R_{209}$, and $R_{210}$ are the same as specific examples of the alkyl group and cycloalkyl group of $R_{201}$, $R_{202}$, and $R_{203}$ in the general formula (ZI-2), respectively.

Examples of the alkylene group of A include an alkylene group having 1 to 12 carbon atoms (for example, a methylene group, an ethylene group, a propylene group, an isopropylene group, a butylene group, and an isobutylene group); examples of the alkenylene group of A include an alkenylene group having 2 to 12 carbon atoms (for example, an ethenylene group, a propenylene group, and a butenylene group); and examples of the arylene group of A include an arylene group having 6 to 10 carbon atoms (for example, a phenylene group, a tolylene group, and a naphthylene group).

Among the acid generators, compounds represented by the general formulae (ZI) to (ZIII) are more preferred.

Furthermore, the acid generator is preferably a compound capable of generating an acid having one sulfonic acid group or imide group, more preferably a compound capable of generating a monovalent perfluoroalkanesulfonic acid, a compound capable of generating an aromatic sulfonic acid substituted with a monovalent fluorine atom or a fluorine atom-containing group, or a compound capable of generating an imide acid substituted with a monovalent fluorine atom or a fluorine atom-containing group, and still more preferably a sulfonium salt of a fluoro-substituted alkanesulfonic acid, fluorine-substituted benzenesulfonic acid, fluorine-substituted imide acid or fluorine-substituted methide acid. The acid generator which can be used is particularly preferably a compound capable of generating a fluoro-substituted alkanesulfonic acid, a fluoro-substituted benzenesulfonic acid, or a fluoro-substituted imide acid, wherein pKa of the acid generated is −1 or less, and in this case, the sensitivity can be enhanced.

Particularly preferred examples of the acid generator (B) are shown below.

(z1)

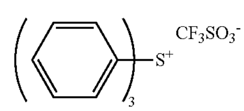

(z2)

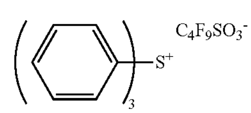

(z3)

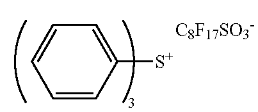

(z4)

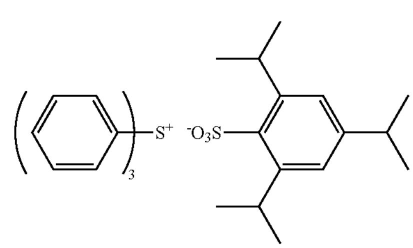

-continued
(z5)
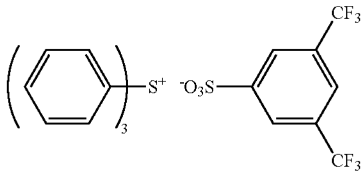
(z6)
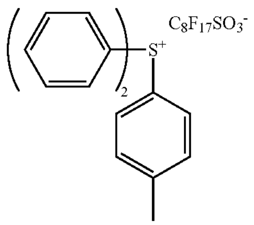
(z7)
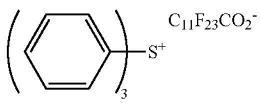
(z8)
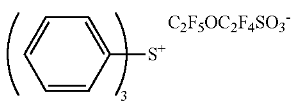
(z9)
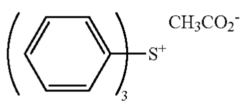
(z10)
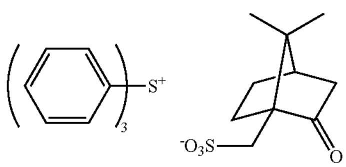
(z11)
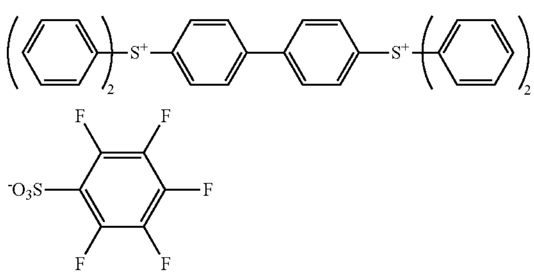
(z12)
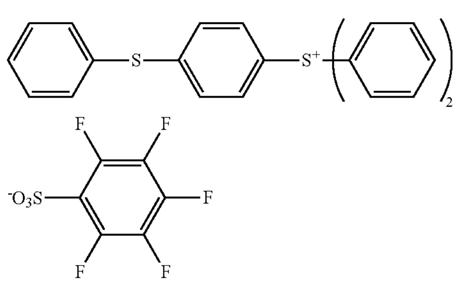
(z13)
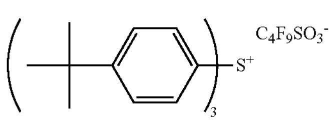
-continued
(z14)
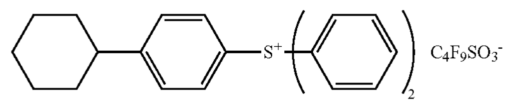
(z15)
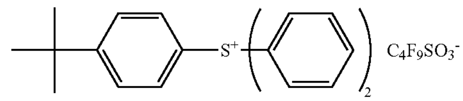
(z16)
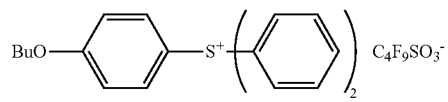
(z17)
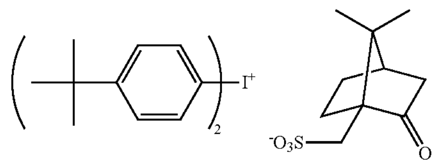
(z18)
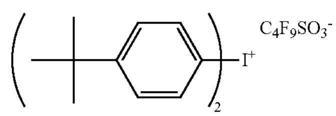
(z19)
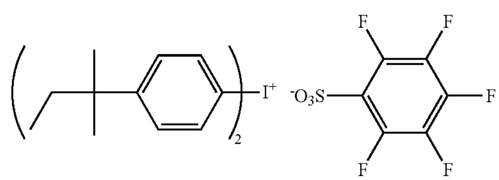
(z20)
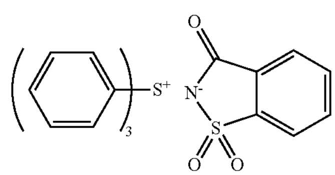
(z21)
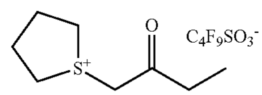
(z22)
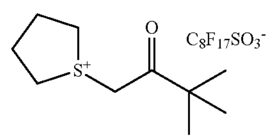
(z23)
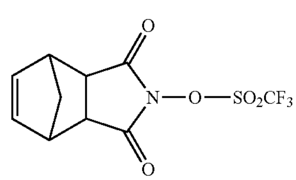
(z24)
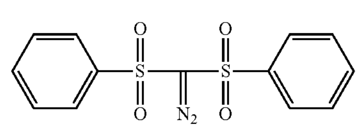

-continued
(z25)
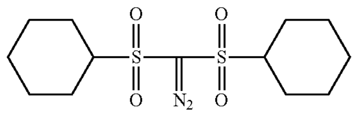
(z26)
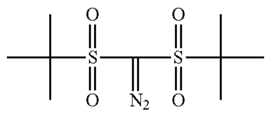
(z27)
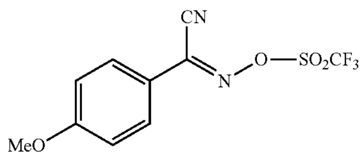
(z28)
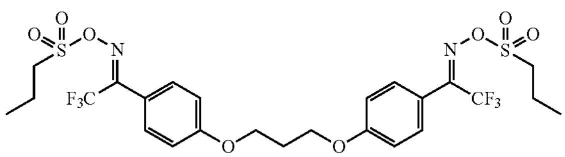
(z29)
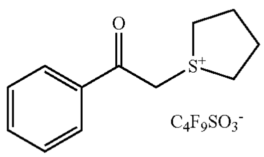
(z30)
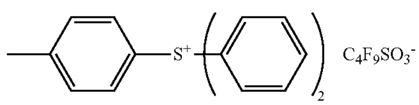
(z31)
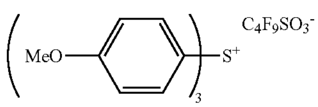
(z32)
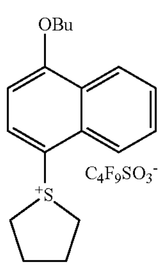
(z33)
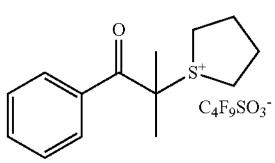
(z34)
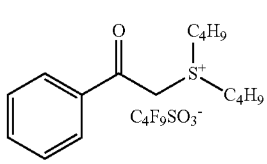
-continued
(z35)
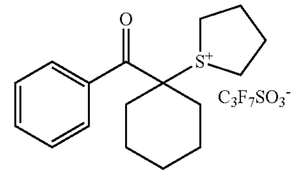
(z36)
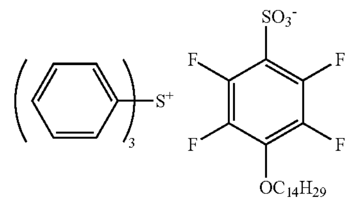
(z37)
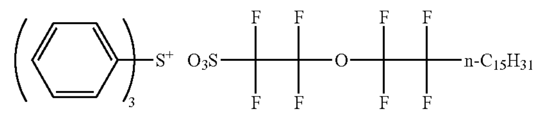
(z38)
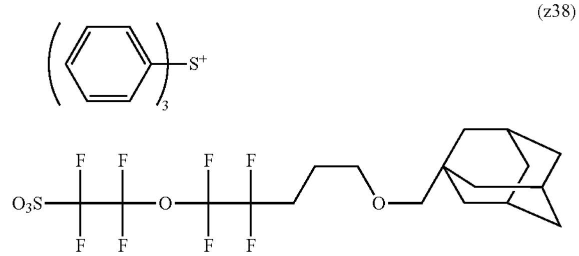
(z39)
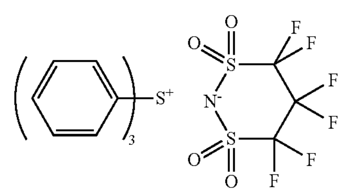
(z40)
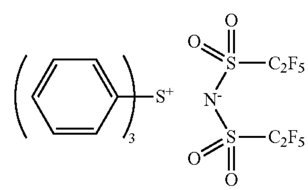
(z41)
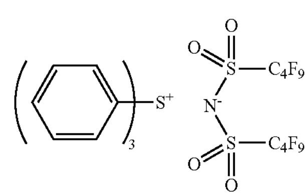
(z42)
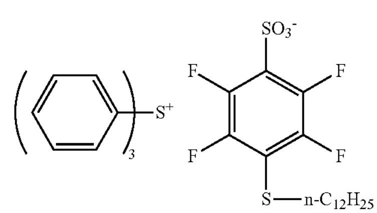

-continued
(z43)
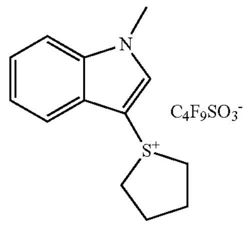
(z44)
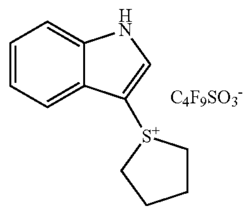
(z45)
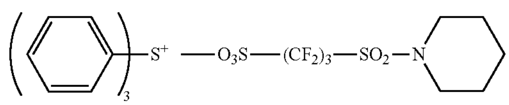
(z46)
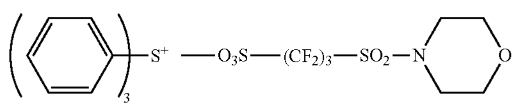
(z47)
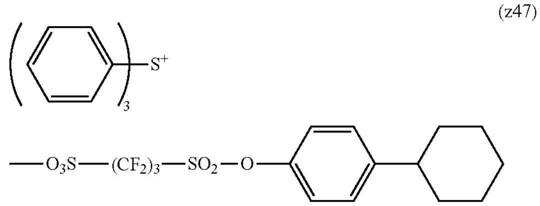
(z48)
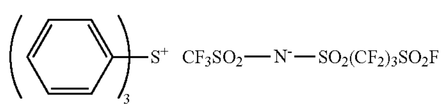
(z49)
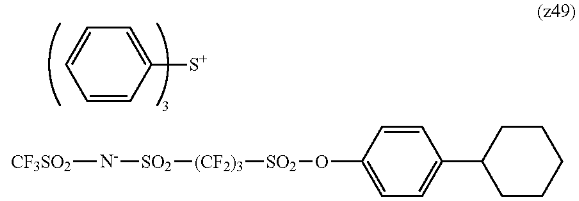
(z50)
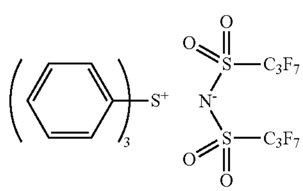
(z51)
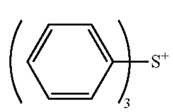
-continued
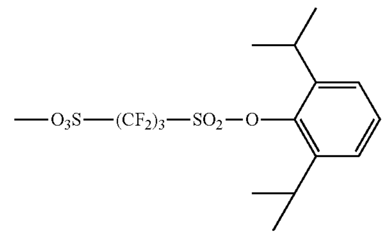
(z52)
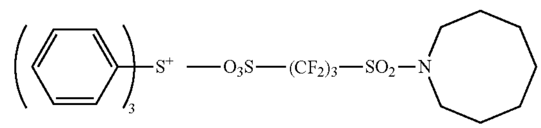
(z53)
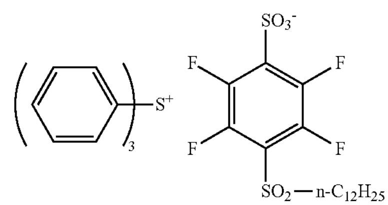
(z54)
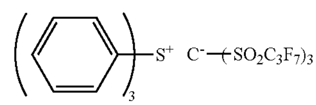
(z55)
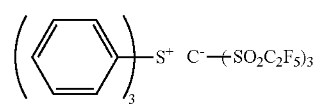
(z56)
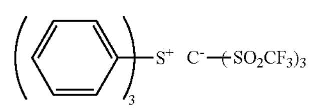
(z57)
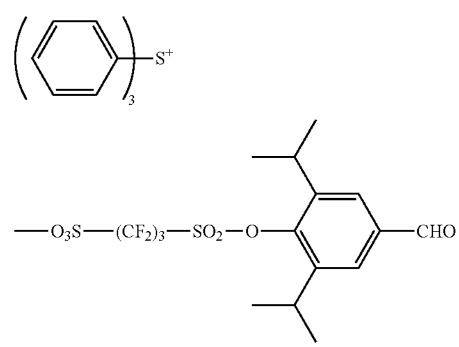
(z58)
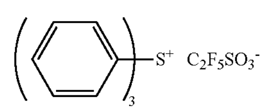
(z59)
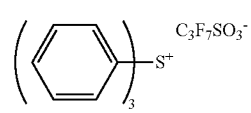
(z60)
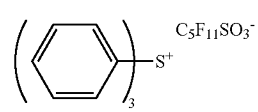

(z61)
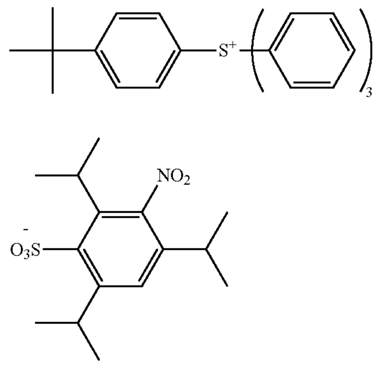
(z62)
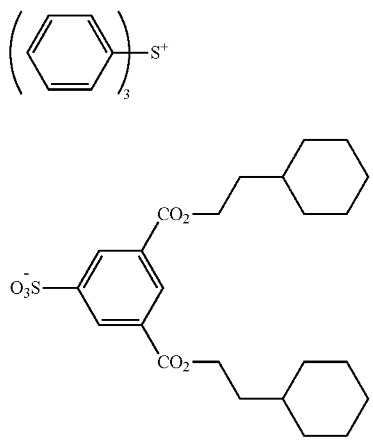
(z63)
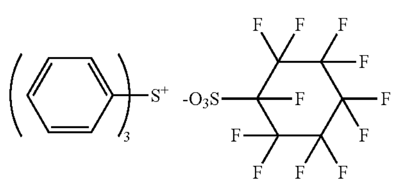
(z64)
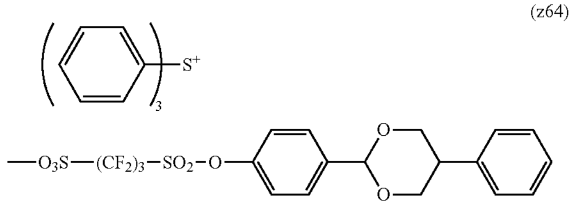
(z65)
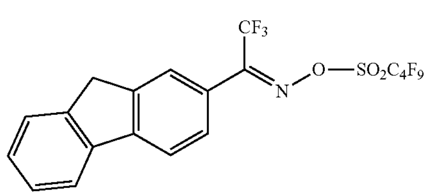
(z66)
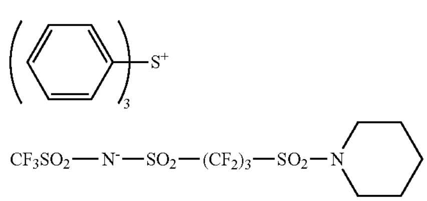
(z67)
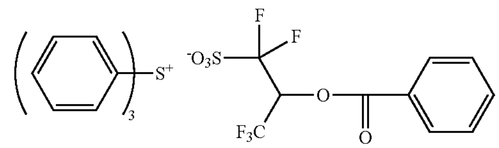
(z68)
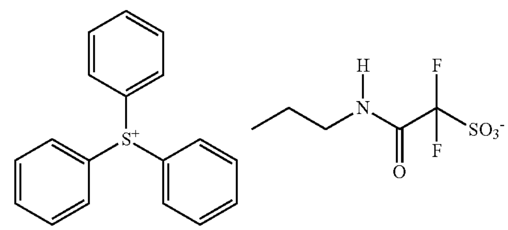
(z69)
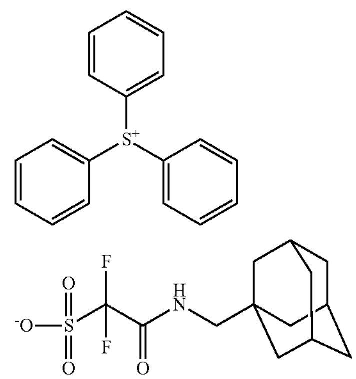
(z70)
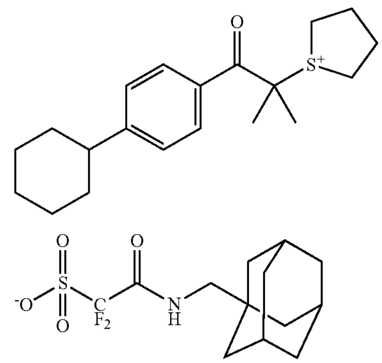
(z71)
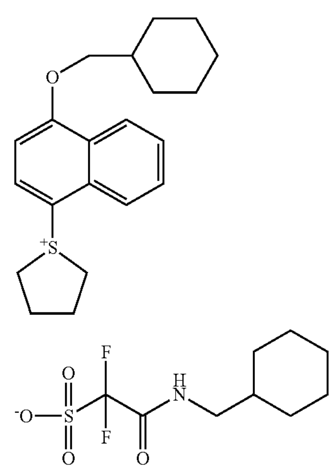

(z72)
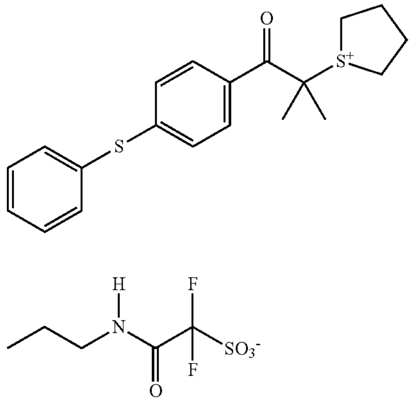
(z73)
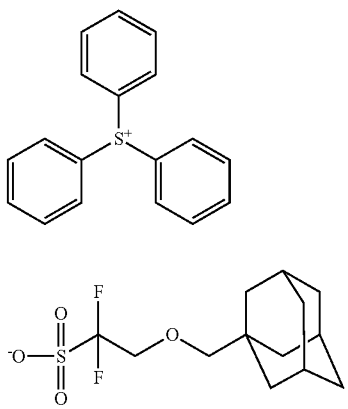
(z74)
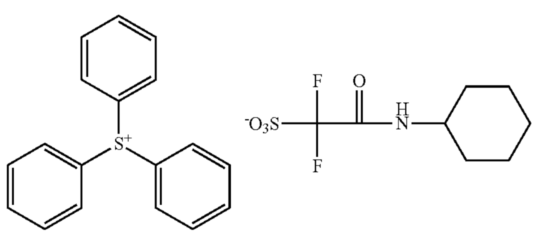
(z75)
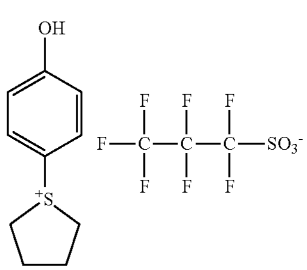
(z76)
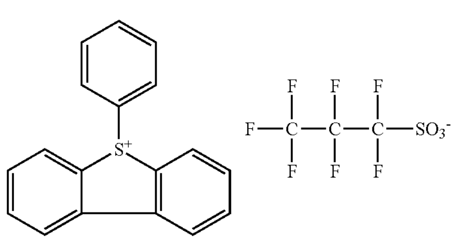
(z77)
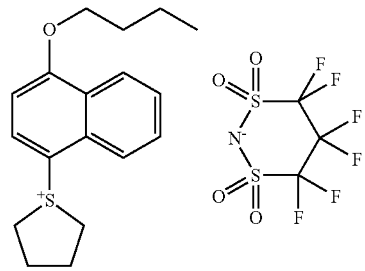
(z78)
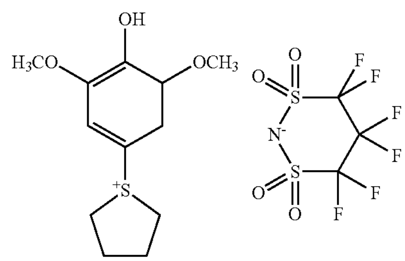
(z79)
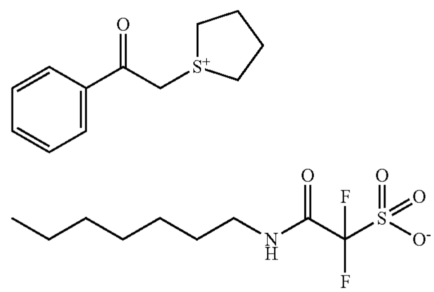
(z80)
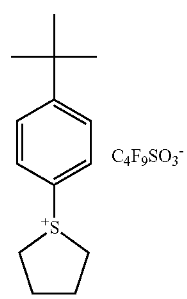
(z81)
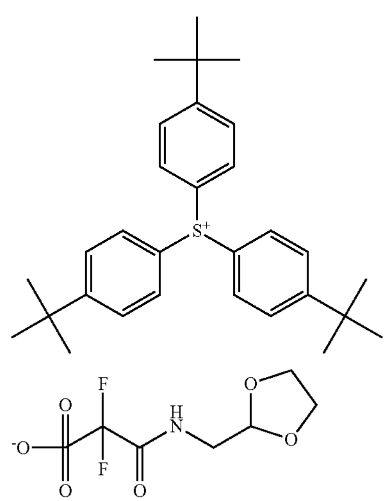

-continued
(z82)
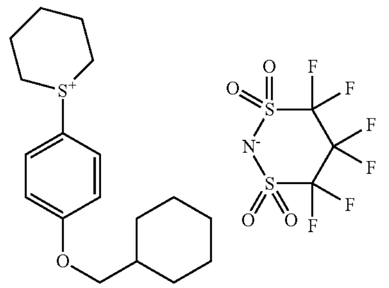
(z83)
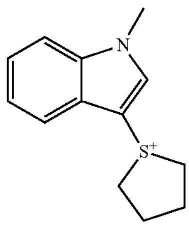
$C_4F_9SO_3^-$
(z84)
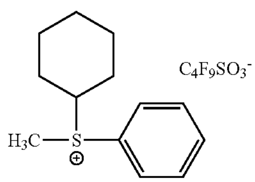
$C_4F_9SO_3^-$
(z85)
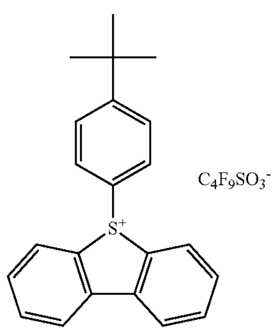
$C_4F_9SO_3^-$
(z86)
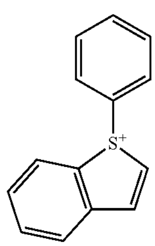
$C_4F_9SO_3^-$
(z87)
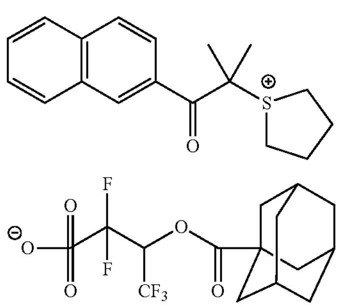
-continued
(z88)
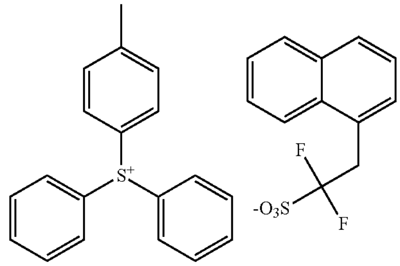
(z89)
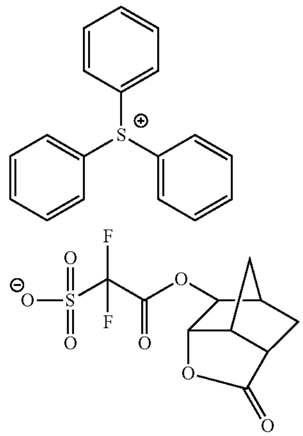
(z90)
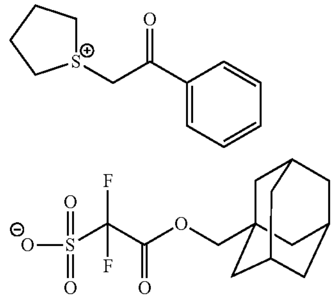
(z91)
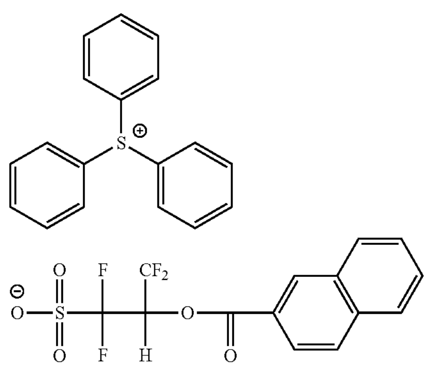
(z92)
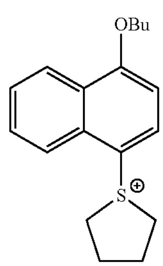

-continued
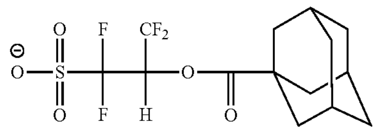
(z93)
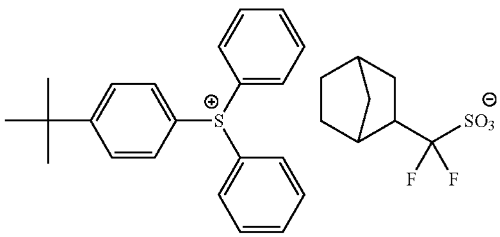
(z94)
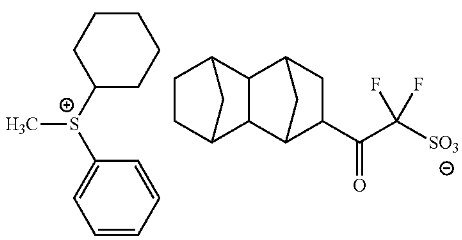
(z95)
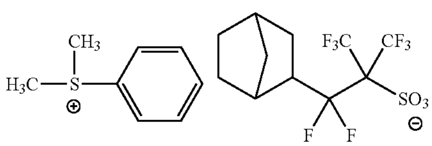
(z96)
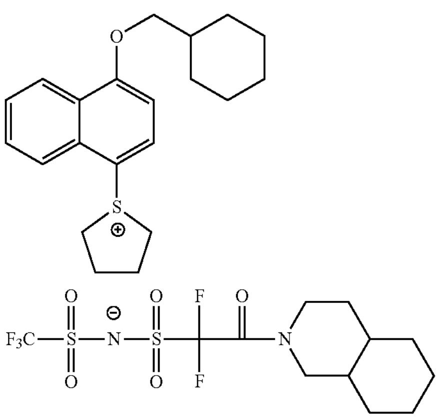
(z97)
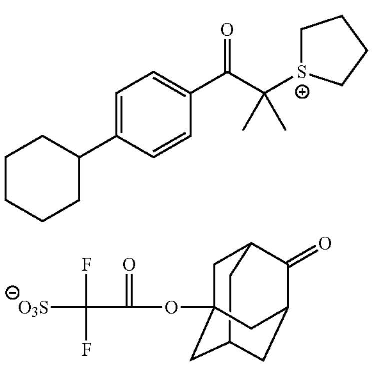
-continued
(z98)
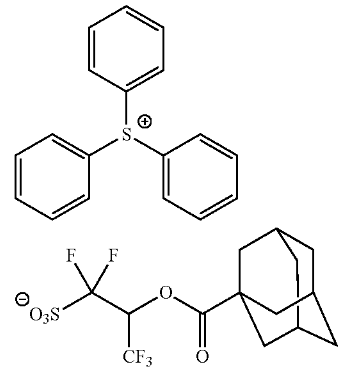
(z99)
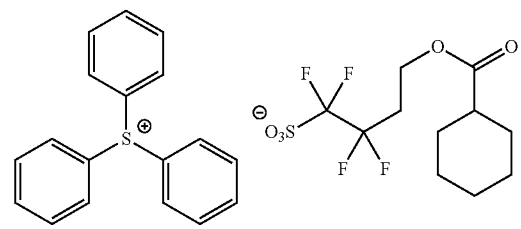
(z100)
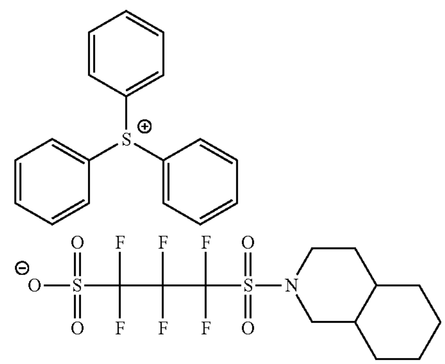
(z101)
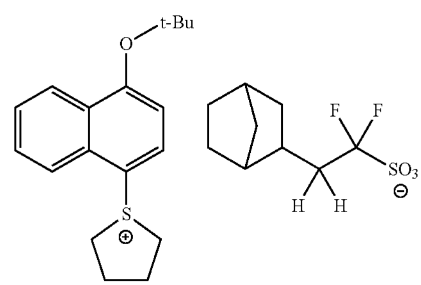
(z102)
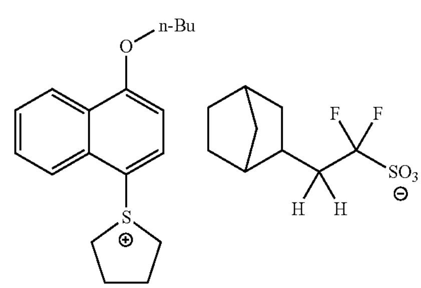
The acid generator (B) can be synthesized by a known method, for example, can be synthesized in accordance with the method described in JP2007-161707A.

As for the acid generator (B), one kind may be used, or two or more kinds may be used in combination.

The content of the compound capable of generating an acid upon irradiation of actinic rays or radiation in the composition is preferably from 0.1 to 30% by mass, more preferably from 0.5 to 25% by mass, still more preferably from 3 to 20% by mass, and particularly preferably from 3 to 15% by mass, based on the total solid contents of the actinic ray-sensitive or radiation-sensitive resin composition.

Furthermore, in the case where the acid generator (B) is represented by the general formula (ZI-3) or (ZI-4), the content thereof is preferably from 5 to 35% by mass, more preferably from 8 to 30% by mass, still more preferably from 10 to 30% by mass, and particularly preferably from 10 to 25% by mass, based on the total solid contents of the composition

[3] Non-Photosensitive Compound Having at Least One of a Fluorine Atom and a Silicon Atom, and Further Having Basicity or being Capable of Increasing the Basicity by the Action of an Acid (G)

The composition in the invention contains a non-photosensitive compound having at least one of a fluorine atom and a silicon atom, and further having basicity or being capable of increasing the basicity by the action of an acid (G).

Considering the compounds (G) by classifying them into "a compound having at least one of a fluorine atom and a silicon atom and having basicity (G-1)" and "a compound having at least one of a fluorine atom and a silicon atom and capable of increasing the basicity by the action of an acid (G-2)", when the compound (G-2) is used, as the concentration of an acid generated in the exposed area is higher, a larger amount of a basic substance is generated in that region and an acid-base neutralization reaction is more accelerated. Accordingly, the acid concentration distribution in the thickness direction in the exposed area of the resist film can be made more uniform when using the compound (G-2) than in the case of using the compound (G-1). In this light, the compound (G-2) is more preferred as the compound (G).

The compound (G) is preferably a nitrogen-containing compound.

Here, in the case where the compound (G) is a compound having at least one of a fluorine atom and a silicon atom and having basicity, in order to let the compound (G) have sufficient basicity, an electron-withdrawing functional group (such as a carbonyl group, a sulfonyl group, a cyano group, and a halogen atom (particularly a fluorine atom)) is preferably not bonded directly to the nitrogen atom, and it is more preferable that all atoms adjacent to the nitrogen atom are a hydrogen atom or a carbon atom.

In addition, in the case where the compound (G) is a compound having at least one of a fluorine atom and a silicon atom and capable of increasing the basicity by the action of an acid, in order to let the compound increased in basicity by the action of an acid have sufficient basicity, an electron-withdrawing functional group (such as carbonyl group, sulfonyl group, cyano group and halogen atom (particularly fluorine atom)) is preferably not bonded directly to the nitrogen atom of the compound increased in basicity by the action of an acid, and it is more preferable that all atoms adjacent to the nitrogen atom are a hydrogen atom or a carbon atom.

Incidentally, in order to unfailingly bring out the above-described action, the compound (G) preferably is accompanied by no unintended change in the chemical structure upon irradiation with actinic rays or radiation. In other words, the compound (G) preferably has no photosensitivity (is nonphotosensitive).

The compound (G) is described below by dividing it into "a compound having at least one of a fluorine atom and a silicon atom and having basicity (G-1)" and "a compound having at least one of a fluorine atom and a silicon atom and capable of increasing the basicity by the action of an acid (G-2)".

[3-1] Compound Having at Least One of Fluorine Atom and Silicon Atom and Having Basicity (G-1)

The compound (G-1) is not particularly limited as long as it is a compound having at least one of a fluorine atom and a silicon atom and having basicity, but examples thereof include a basic compound having at least one of a fluorine atom and a silicon atom and having any of the structures represented by the following general formulae (A) to (E).

(A)

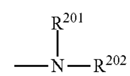

(B)

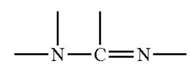

(C)

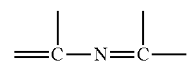

(D)

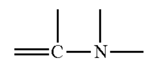

(E)

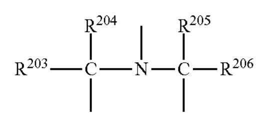

In the general formula (A), $R_{201}$ and $R_{202}$ each independently represent a hydrogen atom, an alkyl group (preferably having a 1 to 20 carbon atoms), a cycloalkyl group (preferably having 3 to 20 carbon atoms), an aryl group (preferably having 6 to 20 carbon atoms), or a heteroaryl group.

In the general formula (E), $R_{203}$, $R_{204}$, $R_{205}$, and $R_{206}$ each independently represent an alkyl group or a cycloalkyl group.

In the structure represented by the general formula (A), $R_{201}$ and $R_{202}$ may be bonded to each other to form a ring.

In the structures represented by the general formulae (B) to (D), two or more out of the bonds from the carbon atom and the bonds from the nitrogen atom may be bonded to each other to form a ring.

In the structure represented by the general formula (E), two or more out of $R_{203}$, $R_{204}$, $R_{205}$, and $R_{206}$, the bonds from the carbon atom and the bonds from the nitrogen atom may be bonded to each other to form a ring.

The alkyl group of $R_{201}$ and $R_{202}$ in the general formula (A) is preferably a linear or branched alkyl group having 1 to 20 carbon atoms, and examples thereof include a methyl group, an ethyl group, an n-propyl group, an n-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an i-propyl group, an i-butyl group, a sec-butyl group, a t-butyl group, and a t-dodecyl group.

The cycloalkyl group of $R_{201}$ and $R_{202}$ is preferably a cycloalkyl group having 3 to 20 carbon atoms, and examples thereof include a cyclobutyl group, a cyclopentyl group and a cyclohexyl group.

Among the alkyl groups and cycloalkyl groups of $R_{201}$ and $R_{202}$, a linear alkyl group having 1 to 10 carbon atoms and a cycloalkyl group having 4 to 8 carbon atoms are preferred.

The aryl group of $R_{201}$ and $R_{202}$ is preferably an aryl group having 6 to 20 carbon atoms, and examples thereof include a phenyl group, a toluoyl group, a benzyl group, a methylbenzyl group, a xylyl group, a mesityl group, a naphthyl group, and an anthryl group.

The heteroaryl group of $R_{201}$ and $R_{202}$ is a group containing one or more heteroatoms such as sulfur atom, oxygen atom and nitrogen atom, in the above-described aryl group, which includes, for example, a pyridyl group, an imidazolyl group, a morpholinyl group, a piperidinyl group, and a pyrrolidinyl group.

The alkyl group, the cycloalkyl group, aryl group, and the heteroaryl group of $R_{201}$ and $R_{202}$ may further have a substituent, and examples of the substituent include a halogen atom, a hydroxyl group, an amino group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkylcarbonyloxy group, an arylcarbonyloxy group, an alkoxycarbonyl group, an aryloxycarbonyl group, an alkoxycarbonyloxy group, and an aryloxycarbonyloxy group.

Examples of the alkyl group as the substituent which $R_{201}$ and $R_{202}$ may further have include a linear or branched alkyl group having 1 to 12 carbon atoms, such as a methyl group, an ethyl group, an n-propyl group, an i-propyl group, an n-butyl group, a 2-methylpropyl group, a 1-methylpropyl group, and a t-butyl group.

Examples of the cycloalkyl group as the substituent which $R_{201}$ and $R_{202}$ may further have include a cycloalkyl group having 3 to 10 carbon atoms, such as a cyclopentyl group and a cyclohexyl group.

Examples of the aryl group as the substituent which $R_{201}$ and $R_{202}$ may further have include an aryl group having 6 to 15 carbon atoms, such as a phenyl group and a naphthyl group.

Examples of the alkoxy group as the substituent which $R_{201}$ and $R_{202}$ may further have include a linear, branched, or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of the aryloxy group as the substituent which $R_{201}$ and $R_{202}$ may further have include an aryloxy group 6 to 10 carbon atoms, such as a phenyloxy group and a naphthyloxy group.

Examples of the acyl group as the substituent which $R_{201}$ and $R_{202}$ may further have include a linear or branched acyl group having 2 to 12 carbon atoms, such as acetyl group, a propionyl group, an n-butanoyl group, an i-butanoyl group, an n-heptanoyl group, a 2-methylbutanoyl group, a 1-methylbutanoyl group, and a t-heptanoyl group.

Examples of the arylcarbonyl group as the substituent which $R_{201}$ and $R_{202}$ may further have include an arylcarbonyl group having 6 to 10 carbon atoms, such as a phenylcarbonyl group and a naphthylcarbonyl group.

Examples of the alkoxyalkyl group as the substituent which $R_{201}$ and $R_{202}$ may further have include a linear, branched, or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group.

Examples of the aryloxyalkyl group as the substituent which $R_{201}$ and $R_{202}$ may further have include an aryloxyalkyl group having 7 to 12 carbon atoms, such as a phenyloxymethyl group, a phenyloxyethyl group, a naphthyloxymethyl group, and a naphthyloxyethyl group.

Examples of the alkylcarbonyloxy group as the substituent which $R_{201}$ and $R_{202}$ may further have include a linear, branched, or cyclic alkylcarbonyloxy group having 2 to 21 carbon atoms, such as a methylcarbonyloxy group, an ethylcarbonyloxy group, an n-propylcarbonyloxy group, an i-propylcarbonyloxy group, an n-butylcarbonyloxy group, a 2-methylpropylcarbonyloxy group, a 1-methylpropylcarbonyloxy group, a t-butylcarbonyloxy group, a cyclopentylcarbonyloxy group, and a cyclohexylcarbonyloxy group.

Examples of the arylcarbonyloxy group as the substituent which $R_{201}$ and $R_{202}$ may further have include an arylcarbonyloxy group having 7 to 11 carbon atoms, such as a phenylcarbonyloxy group and a naphthylcarbonyloxy group.

Examples of the alkoxycarbonyl group as the substituent which $R_{201}$ and $R_{202}$ may further have include a linear, branched, or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl group.

Examples of the aryloxycarbonyl group as the substituent which $R_{201}$ and $R_{202}$ may further have include an aryloxycarbonyl group having 7 to 11 carbon atoms, such as a phenyloxycarbonyl group and a naphthyloxycarbonyl group.

Examples of the alkoxycarbonyloxy group as the substituent which $R_{201}$ and $R_{202}$ may further have include a linear, branched, or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group, and a cyclohexyloxycarbonyloxy group.

Examples of the aryloxycarbonyloxy group as the substituent which $R_{201}$ and $R_{202}$ may further have include an aryloxycarbonyloxy group having 7 to 11 carbon atoms, such as a phenyloxycarbonyloxy group and a naphthyloxycarbonyloxy group.

The compound (G-1) containing a structure represented by the general formula (A) includes:

(A1) a compound containing a structure represented by the general formula (A) (provided that each of $R_{201}$ and $R_{202}$ contains neither a fluorine atom nor a silicon atom) and "a group having at least one of a fluorine atom and a silicon atom", which is located outside the structure represented by the general formula (A);

(A2) a compound containing a structure represented by the general formula (A) (provided that at least one of $R_{201}$ and $R_{202}$ is a group where one or more hydrogen atoms in an alkyl group, a cycloalkyl group, an aryl group or a heteroaryl group, which may have a substituent, is substituted with a fluorine atom or a group having a silicon atom); and (A3) a compound containing a structure represented by the general formula (A) (provided that at least one of $R_{201}$ and $R_{202}$ is a group where one or more hydrogen atoms in an alkyl group, a cycloalkyl group, an aryl group or a heteroaryl group, which may have a substituent, is substituted with a fluorine atom or a group having a silicon atom) and "a group having at least one of a fluorine atom and a silicon atom", which is located outside the structure represented by the general formula (A).

In (A1) and (A3), preferred examples of the "group having at least one of a fluorine atom and a silicon atom", which is located outside the structure represented by the general formula (A), include a group where in specific examples (excluding a halogen atom and a hydroxyl group) described above as the substituent which $R_{201}$ and $R_{202}$ may further have, one or more hydrogen atoms are substituted with a fluorine atom or a group having a silicon atom.

Here, the group having a silicon atom is not particularly limited as long as it is a group containing at least one or more silicon atoms, but examples thereof include a silyl group, a silyloxy group, and a group having a siloxane bond. Also, the group having a silicon atom may be an alkylsilyl structure or a cyclic siloxane structure (for example, a group represented by the general formulae (CS-1) to (CS-3) described later), which the later-described resin (G) may have. These groups may further have a substituent, and specific examples of the substituent are the same as specific examples of the substituent which $R_{201}$ and $R_{202}$ may further have.

Specific examples of the group having a silicon atom include a trimethylsilyl group, a triethylsilyl group, a t-butyldimethylsilyl group, and a triisopropylsilyl group.

The compound (G-1) containing a structure represented by the general formulae (B) to (D) includes a compound containing a structure represented by the general formulae (B) to (D) and a group having at least one of a fluorine atom and a silicon atom (for example, a group where in specific examples (excluding a halogen atom and a hydroxyl group) described above as the substituent which $R_{201}$ and $R_{202}$ may further have, one or more hydrogen atoms are substituted with a fluorine atom or a group having a silicon atom).

Here, specific examples of the group having a silicon atom are the same as those described above.

In the general formula (E), specific examples of the alkyl group and cycloalkyl group of $R_{203}$, $R_{204}$, $R_{205}$, and $R_{206}$ are the same as specific examples of the alkyl group and cycloalkyl group of $R_{201}$ and $R_{202}$.

The alkyl group and cycloalkyl group of $R_{203}$, $R_{204}$, $R_{205}$, and $R_{206}$ may further have a substituent, and specific examples of the substituent are the same as specific examples of the substituent which $R_{201}$ and $R_{202}$ may further have.

The compound (G-1) containing a structure represented by the general formula (E) includes (E1) a compound containing a structure represented by the general formula (E) (provided that each of $R_{203}$, $R_{204}$, $R_{205}$, and $R_{206}$ contains neither a fluorine atom nor a silicon atom) and "a group having at least one of a fluorine atom and a silicon atom", which is located outside the structure represented by the general formula (E); (E2) a compound containing a structure represented by the general formula (E) (provided that at least one of $R_{203}$, $R_{204}$, $R_{205}$, and $R_{206}$ is a group where one or more hydrogen atoms in an alkyl group or a cycloalkyl group, which may have a substituent, is substituted with a fluorine atom or a group having a silicon atom); and (E3) a compound containing a structure represented by the general formula (E) (provided that at least one of $R_{203}$, $R_{204}$, $R_{205}$, and $R_{206}$ is a group where one or more hydrogen atoms in an alkyl group or a cycloalkyl group, which may have a substituent, is substituted with a fluorine atom or a group having a silicon atom) and "a group having at least one of a fluorine atom and a silicon atom", which is located outside the structure represented by the general formula (E).

In (E1) and (E3), preferred examples of the "group having at least one of a fluorine atom and a silicon atom", which is located outside the structure represented by the general formula (E), include a group where in specific examples (excluding a halogen atom and a hydroxyl group) described above as the substituent which $R_{201}$ and $R_{202}$ may further have, one or more hydrogen atoms are substituted with a fluorine atom or a group having a silicon atom.

Specific examples of the group having a silicon atom are the same as those described above.

In the structures represented by the general formulae (A) to (E), the bond from the carbon atom and/or the nitrogen atom is connected to another atom constituting the compound (G).

Also, as described above, in the structure represented by the general formula (A), $R_{201}$ and $R_{202}$ may be bonded to each other to form a ring; in the structures represented by the general formulae (B) to (D), two or more out of the bonds from the carbon atom and the bonds from the nitrogen atom may be bonded to each other to form a ring; and in the structure represented by the general formula (E), two or more out of $R_{203}$, $R_{204}$, $R_{205}$, and $R_{206}$, the bonds from the carbon atom and the bonds from the nitrogen atom may be bonded to each other to form a ring.

The ring above includes an aromatic or non-aromatic nitrogen-containing heterocyclic ring. The nitrogen-containing heterocyclic ring includes a 3- to 10-membered ring and is preferably a 4- to 8-membered ring, more preferably a 5- or 6-membered ring. This ring may further have a substituent, and specific examples thereof are the same as specific examples of the substituent which $R_{201}$ and $R_{202}$ may further have.

In other words, a compound having a nitrogen-containing heterocyclic ring, where the heterocyclic ring is substituted with a fluorine atom or a group containing a fluorine atom or a silicon atom, is also preferred as the compound (G-1). The group containing a fluorine atom or a silicon atom includes a group where in specific examples (excluding a halogen atom and a hydroxyl group) described above as the substituent which $R_{201}$ and $R_{202}$ may further have, one or more hydrogen atoms are substituted with a fluorine atom or a group having a silicon atom.

Suitable examples of the nitrogen-containing heterocyclic ring include a pyrrole ring, a pyridine ring, and a pyrimidine ring.

In the case where the compound (G-1) is a low molecular compound (described in detail below), each bond from the carbon atom and/or nitrogen atom in the structures represented by the general formulae (A) to (E) is preferably connected to a hydrogen atom, an alkyl group, a cycloalkyl group, an aryl group or a heteroaryl group, and specific examples of these groups are the same as those described for $R_{201}$ and $R_{202}$.

Suitable examples of the compound (G-1) include a compound having a nitrogen-containing heterocyclic structure and a fluorine atom, and a compound having an aniline structure and a fluorine atom. As the compound, for example, a compound represented by at least one of the following general formulae (a) to (f) is preferred.

(a)

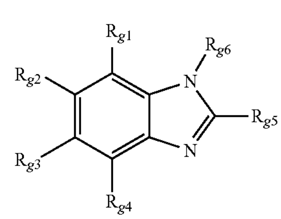

-continued (b)

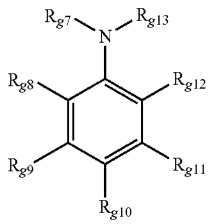

(c)

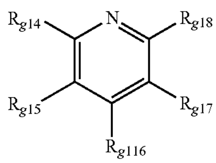

(d)

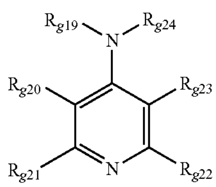

(e)

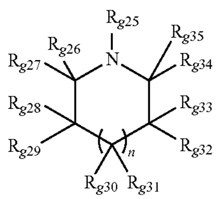

(f)

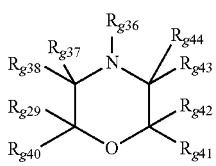

In the general formula, $R_{g1}$ to $R_{g44}$ each independently represent a hydrogen atom, a fluorine atom, or a monovalent organic group, provided that at least one of $R_{g1}$ to $R_{g6}$, at least one of $R_{g7}$ to $R_{g13}$, at least one of $R_{g14}$ to $R_{g18}$, at least one of $R_{g19}$ to $R_{g24}$, at least one of $R_{g25}$ to $R_{g35}$, and at least one of $R_{g36}$ to $R_{g41}$ are each a fluorine atom, or a monovalent organic group containing a fluorine atom.

In the general formula (e), n is 0 or 1.

Specific examples of the monovalent organic group in $R_{g1}$ to $R_{g44}$ include, but are not limited to, an alkyl group, a cycloalkyl group, an alkoxy group, an aryl group, an aryloxy group, an aralkyl group, an alkylcarbonyloxy group, an alkoxycarbonyl group, and an alkylamide group.

Specific examples of the monovalent organic group containing a fluorine atom as $R_{g1}$ to $R_{g44}$ include the same as those of the above-described monovalent organic group having at least one of hydrogen atoms substituted with fluorine atom(s).

[3-2] Compound Having at Least One of Fluorine Atom and Silicon Atom and Capable of Increasing Basicity by Action of Acid (G-2)

The compound (G-2) is not particularly limited as long as it is a compound having at least one of a fluorine atom and a silicon atom and capable of increasing the basicity by the action of an acid, but examples thereof include a compound having at least one of a fluorine atom and a silicon atom and containing a carbamate group having a protective group.

The protective group constituting the carbamate group is preferably a group represented by the following general formula (P) (the group represented by the general formula (P) is bonded to a nitrogen atom at the bonding site indicated by a mark *).

(P)

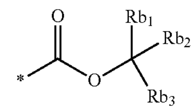

In the general formula (P), $Rb_1$, $Rb_2$, and $Rb_3$ each independently represent a hydrogen atom, an alkyl group, a cycloalkyl group, an aryl group, or an aralkyl group, and two members out of $Rb_1$ to $Rb_3$ may be bonded to each other to form a ring, provided that all of $Rb_1$ to $Rb_3$ are not a hydrogen atom at the same time.

Specific examples of the alkyl group, a cycloalkyl group and aryl group of $Rb_1$, $Rb_2$, and $Rb_3$ are the same as specific examples of the alkyl group, a cycloalkyl group and aryl group of $R_{201}$ and $R_{202}$ in the structure represented by the general formula (P).

Specific examples of the aralkyl group of $Rb_1$, $Rb_2$, and $Rb_3$ include an aralkyl group preferably having 7 to 12 carbon atoms, such as a benzyl group, a phenethyl group, a naphthylmethyl group, a naphthylethyl group, and a naphthylbutyl group.

Each of $Rb_1$, $Rb_2$, and $Rb_3$ is preferably a linear or branched alkyl group, a cycloalkyl group, or an aryl group, more preferably a linear or branched alkyl group, or a cycloalkyl group.

The ring formed by the mutual bonding of two members out of $Rb_1$ to $Rb_3$ is preferably a cycloalkyl group (monocyclic or polycyclic), more specifically, a monocyclic cycloalkyl group such as cyclopentyl group, and a cyclohexyl group, or a polycyclic cycloalkyl group such as norbornyl group, tetracyclodecanyl group, tetracyclododecanyl group and adamantyl group. A monocyclic alkyl group having 5 to 6 carbon atoms is more preferred.

$Rb_1$, $Rb_2$, and $Rb_3$ may further have a substituent, and examples of the substituent include a halogen atom (for example, fluorine atom), a hydroxyl group, a nitro group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), an aminoacyl group (preferably having 2 to 10 carbon atoms), and a group having a silicon atom (specific examples are the same as those described in the compound (G-1)). As for the cyclic structure in the aryl group, a cycloalkyl group and the like, examples of the substituent further include an alkyl group (preferably having 1 to 10 carbon atoms). As for the aminoacyl group, examples of the substituent further include an alkyl group (preferably having 1 to 10 carbon atoms).

In the case where both two members out of $Rb_1$, $Rb_2$, and $Rb_3$ are a hydrogen atom, the remaining one member is preferably an aryl group. Examples of this aryl group include a phenyl group and a naphthyl group.

The compound (G-2) may also be configured by substituting at least one group connected to the nitrogen atom of the compound (G-1) with the group represented by the general formula (P).

The compound (G-2) is not particularly limited, but its especially preferred embodiment includes a compound represented by the following general formula (1) having a group represented by the general formula (P). The compound represented by the following general formula (1) has at least one of a fluorine atom and a silicon atom in the portion except for the group represented by the general formula (P) (a protective group constituting the carbamate group) and therefore, a compound (a compound increased in basicity) obtained by causing an acid to act on the compound represented by the general formula (1) is allowed to still contain at least one of a fluorine atom and a silicon atom. Due to this configuration, the compound increased in basicity comes to exist at the desired position without diffusing to the inside direction of the resist even at the later-described post-exposure baking step (PEB), so that "trapping of excess acid generated in the surface layer of the exposed area" can be more reliably performed and the acid concentration distribution in the thickness direction in the exposed area of the resist film can be more unfailingly made uniform.

(1)

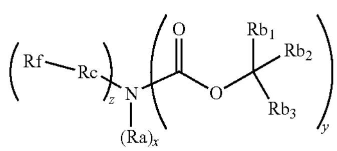

In the general formula (I), Ra, $Rb_1$, $Rb_2$, and $Rb_3$ each independently represent a hydrogen atom, an alkyl group, a cycloalkyl group, an aryl group or an aralkyl group, and two members out of $Rb_1$ to $Rb_3$ may be bonded to each other to form a ring, provided that all of $Rb_1$ to $Rb_3$ are not a hydrogen atom at the same time.

Rc represents a single bond or a divalent linking group.

Rf represents an organic group.

x represents 0 or 1, y represents 1 or 2, z represents 1 or 2, and x+y+z=3.

When x=z=1, Ra and Rc may be bonded to each other to form a nitrogen-containing heterocyclic ring.

When z=1, the organic group as Rf contains a fluorine atom or a silicon atom.

When z=2, at least one of two Rf's contains a fluorine atom or a silicon atom.

In addition, when z=2, two Rc's and two Rf's may be the same as or different from each other, and two Rc's may be bonded to each other to form a ring.

When y=2, two $Rb_1$'s, two $Rb_2$ and two $Rb_3$'s may be the same as or different from each other.

Specific examples of the alkyl group, a cycloalkyl group, an aryl group and aralkyl group as Ra, $Rb_1$, $Rb_2$, and $Rb_3$ are the same as specific examples of the alkyl group, a cycloalkyl group, an aryl group and aralkyl group as $Rb_1$, $Rb_2$, and $Rb_3$ in the general formula (P).

Rc is preferably a divalent linking group having 2 to 12 carbon atoms (more preferably 2 to 6 carbon atoms, and still more preferably 2 to 4 carbon atoms), and examples thereof include an alkylene group, a phenylene group, an ether group, an ester group, an amide group, and a group formed by the mutual bonding of two or more thereof.

The organic group as Rf is preferably an alkyl group, a cycloalkyl group, an aryl group, or a heteroaryl group.

Specific examples of the alkyl group, a cycloalkyl group, an aryl group and heteroaryl group as Rf are the same as specific examples of the cycloalkyl group, an aryl group, and heteroaryl group as $R_{201}$ and $R_{202}$ in the general formula (A).

Each of Ra, $Rb_1$, $Rb_2$, $Rb_3$, Rc, and Rf may further have a substituent, and specific examples of the substituent are the same as specific examples of the substituent which $Rb_1$, $Rb_2$, and $Rb_3$ in the general formula (P) may further have.

In the case where the organic group as Rf contains a fluorine atom or a silicon atom, Rf is preferably a group where one or more hydrogen atoms in the organic group are substituted with a fluorine atom or a group having a silicon atom. Here, specific examples of the group having a silicon atom are the same as specific examples of the group having a silicon atom described in the compound (G-1).

In the case where the organic group as Rf contains a fluorine atom or a silicon atom, Rf is more preferably, for example, an alkyl group in which from 30 to 100% by number of hydrogen atoms are substituted with a fluorine atom, and examples thereof include a perfluoroalkyl group such as a perfluoromethyl group, a perfluoroethyl group, a perfluoropropyl group, and a perfluorobutyl group.

The nitrogen-containing heterocyclic ring formed by the bonding of Ra and Rc or by the mutual bonding combining Rc's includes an aromatic or non-aromatic nitrogen-containing heterocyclic ring (preferably having 3 to 20 carbon atoms). Examples of the nitrogen-containing heterocyclic ring include rings corresponding to heterocyclic compounds such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane. These rings may further have one or more kinds of substituents or one or more substituents, and specific examples of the substituent are the same as specific examples of the substituent which $Rb_1$, $Rb_2$, and $Rb_3$ in the general formula (P) may further have.

The ring formed by the mutual bonding of two members out of $Rb_1$ to $Rb_3$ is preferably a monocyclic cycloalkyl group such as cyclopentyl group, and a cyclohexyl group, or a polycyclic cycloalkyl group such as a norbornyl group, a tetracyclodecanyl group, a tetracyclododecanyl group, and an adamantyl group, and particularly preferably a monocyclic cycloalkyl group having 5 to 6 carbon atoms.

The compound (G) may be either a low molecular compound or a resin (a polymer compound).

In the case where the compound (G) is a low molecular compound, the molecular weight thereof is usually 500 or less, preferably from 150 to 500, and more preferably from 250 to 500.

Furthermore, the compound (G-2) can be synthesized, for example, from an amine by the method described in Protective Groups in Organic Synthesis, $4^{th}$ edition, and the like. For example, the compound represented by the general formula (1) is preferably obtained by a method of, as in the scheme shown below, causing a dicarbonic acid ester or a haloformic acid ester to act on an amine. In the formulae, X represents a halogen atom, and Ra, $Rb_1$, $Rb_2$, $Rb_3$, Rc, and Rf have the same meanings as Ra, $Rb_1$, $Rb_2$, $Rb_3$, Rc, and Rf in the general formula (1).

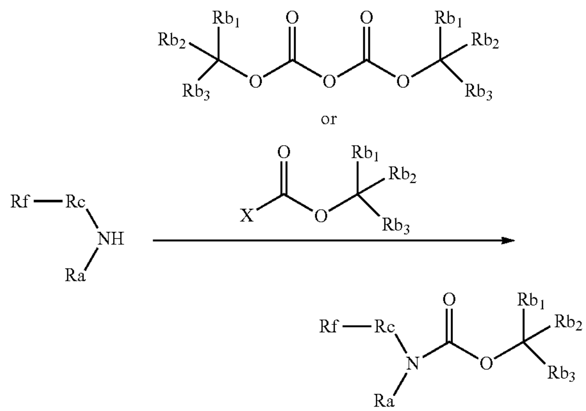
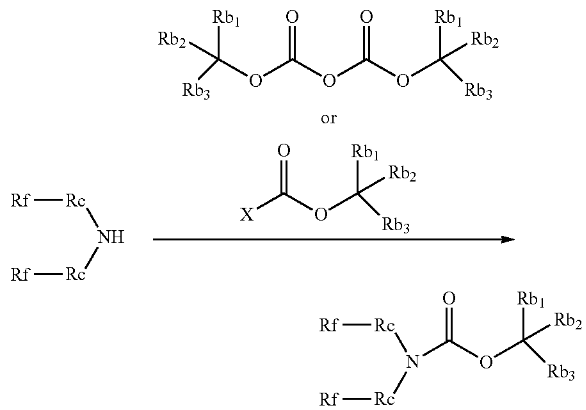
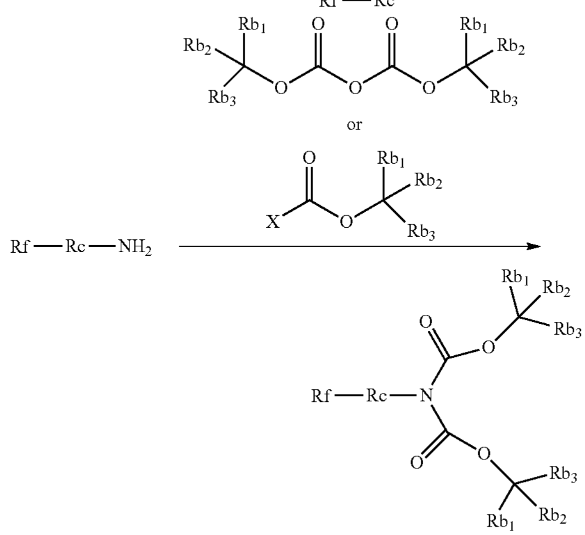
Specific examples of the compounds (G-1) and (G-2) which are low molecular compounds are shown below, but the invention is not limited thereto.
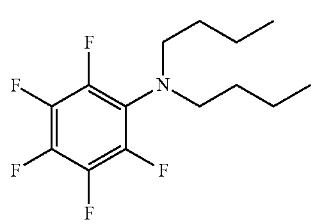
-continued
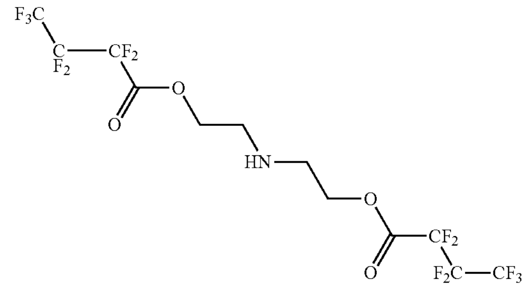
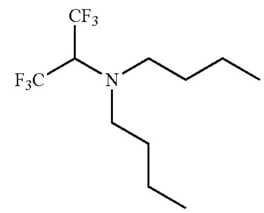
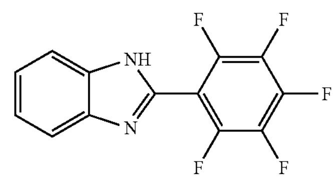
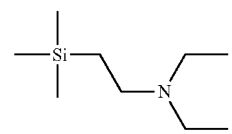
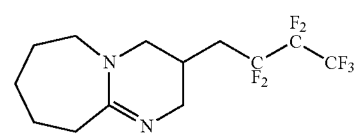
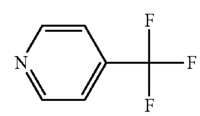
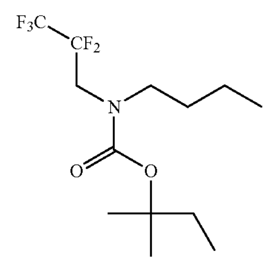
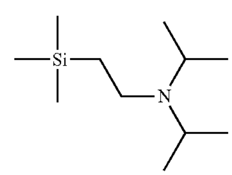
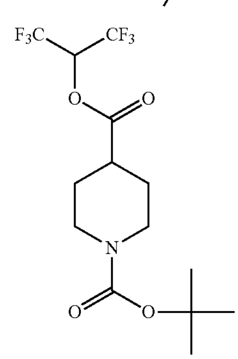
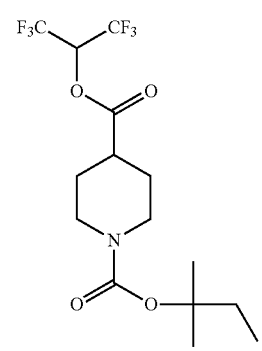

-continued

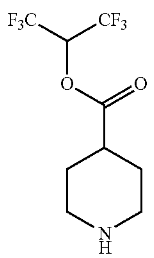

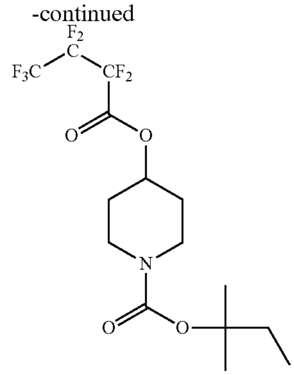

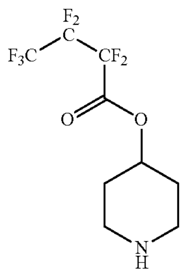

In the case where the compound (G) is a resin (hereinafter, such a resin is sometimes referred to as a "resin (G)"), at least one of a fluorine atom and a silicon atom may be contained in the main chain of the resin or may be contained in the side chain.

The resin (G) has the same function as the later-described hydrophobic resin (E) and is considered to be effective in reducing a development defect attributable to immersion exposure.

In the case where the resin (G) contains a fluorine atom, the resin preferably contains, as the fluorine atom-containing partial structure, a fluorine atom-containing alkyl group, a fluorine atom-containing cycloalkyl group, or a fluorine atom-containing aryl group.

The fluorine atom-containing alkyl group, preferably having 1 to 10 carbon atoms, and more preferably 1 to 4 carbon atoms, is a linear or branched alkyl group with at least one hydrogen atom substituted with a fluorine atom and may further have a substituent other than the fluorine atom.

The fluorine atom-containing cycloalkyl group is a monocyclic or polycyclic cycloalkyl group with at least one hydrogen atom substituted with a fluorine atom, and may further have a substituent other than the fluorine atom.

The fluorine atom-containing aryl group is an aryl group, such as a phenyl group and a naphthyl group, which has at least one hydrogen atom substituted with a fluorine atom and may further have a substituent other than the fluorine atom.

Preferred examples of the fluorine atom-containing alkyl group, the fluorine atom-containing cycloalkyl group, and the fluorine atom-containing aryl group include the groups represented by the following general formulae (F2) to (F4).

(F2)

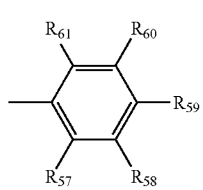

-continued (F3)

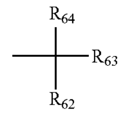

(F4)

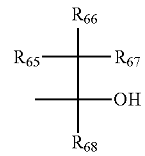

In the general formulae (F2) to (F4), $R_{57}$ to $R_{68}$ each independently represent a hydrogen atom, a fluorine atom, or an alkyl group, provided that at least one of $R_{57}$ to $R_{61}$, at least one of $R_{62}$ to $R_{64}$, and at least one of $R_{65}$ to $R_{68}$ each independently represent a fluorine atom or an alkyl group with at least one hydrogen atom substituted with a fluorine atom. At least one of $R_{62}$ to $R_{64}$ is a fluorine atom, or an alkyl group with at least one hydrogen atom substituted with a fluorine atom. These alkyl groups preferably have 1 to 4 carbon atoms.

It is preferable that all of $R_{57}$ to $R_{61}$ and $R_{65}$ to $R_{67}$ be fluorine atoms.

$R_{62}$, $R_{63}$, and $R_{68}$ are each preferably an alkyl group with at least one hydrogen atom substituted with a fluorine atom, and more preferably a perfluoroalkyl group having 1 to 4 carbon atoms. Further, $R_{62}$ and $R_{63}$ may be linked to each other to form a ring.

Examples of the group represented by the general formula (F2) include a p-fluorophenyl group, a pentafluorophenyl group, and a 3,5-di(trifluoromethyl)phenyl group.

Examples of the group represented by the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Among these, a hexafluoroisopropyl group, a heptafluoroisopropyl group, a hexafluoro(2-methyl)isopropyl group, an octafluoroisobutyl group, a nonafluoro-t-butyl group, and a perfluoroisopentyl group are preferred, and a hexafluoroisopropyl group and a heptafluoroisopropyl group are more preferred.

Specific examples of the group represented by the general formula (F4) include —$C(CF_3)_2OH$, —$C(C_2F_5)_2OH$, —$C(CF_3)(CH_3)OH$, and —$CH(CF_3)OH$, and among these, —$C(CF_3)_2OH$ is preferred.

Specific examples of the repeating unit containing a fluorine atom are shown below.

In specific examples, $X_1$ represents a hydrogen atom, —$CH_3$, —F, or —$CF_3$, and $X_2$ represents —F or —$CF_3$.

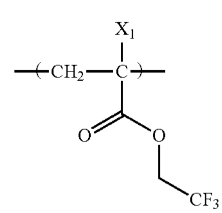

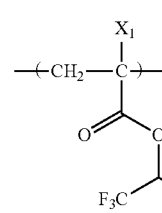

-continued
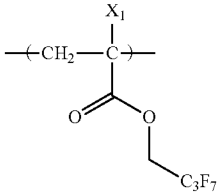
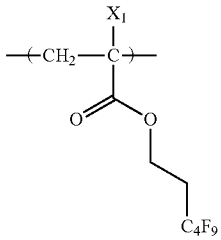
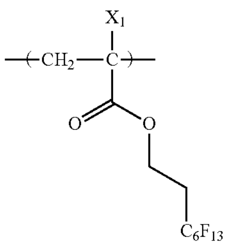
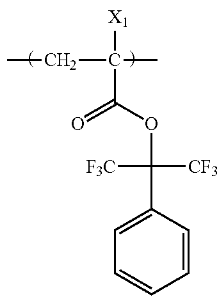
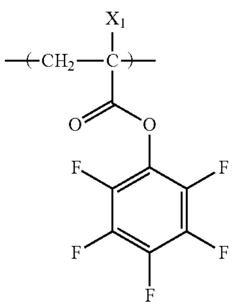
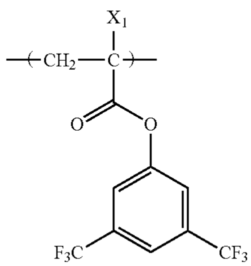
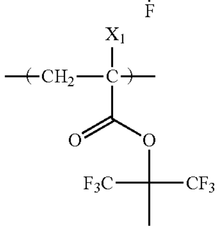
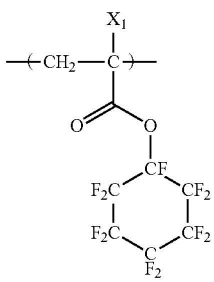
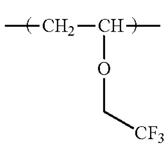
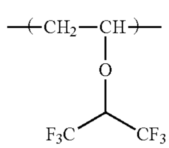
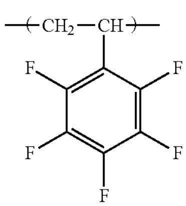
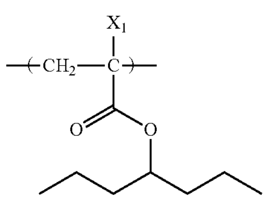
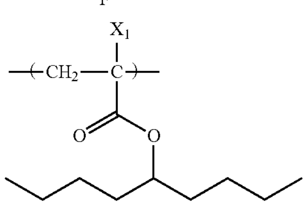
-continued
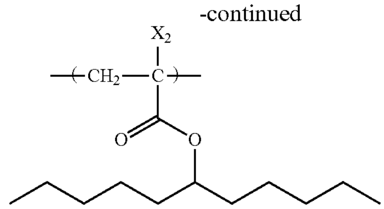
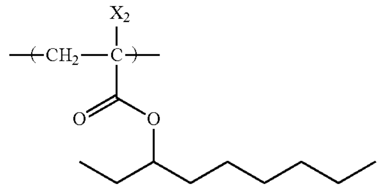
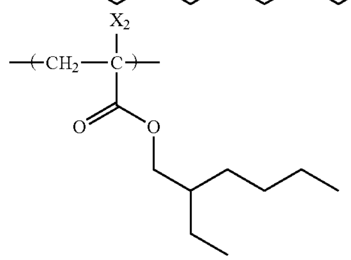
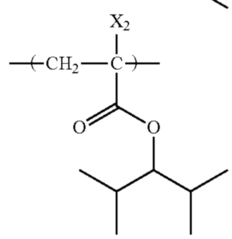
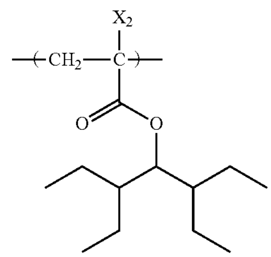
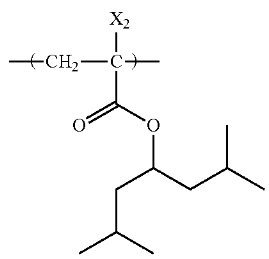
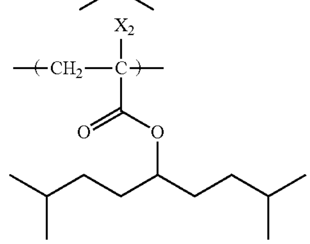
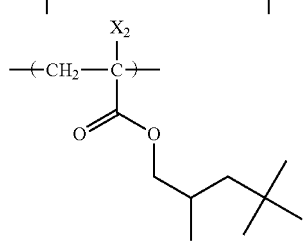
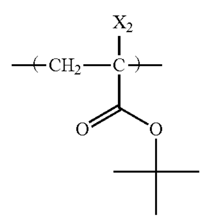
In the case where the resin (G) contains a silicon atom, the resin (G) preferably contains an alkylsilyl structure or a cyclic siloxane structure, as the silicon atom-containing partial structure. The alkylsilyl structure is preferably a trialkylsilyl group-containing structure.

Preferred examples of the alkylsilyl structure and cyclic siloxane structure include the groups represented by the following general formulae (CS-1) to (CS-3).

(CS-1)

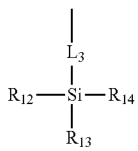

(CS-2)

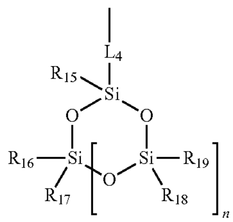

(CS-3)

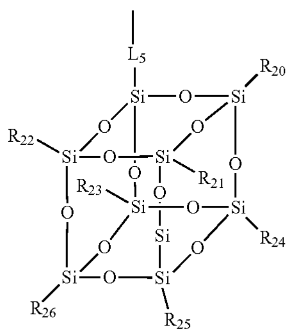

In the general formulae (CS-1) to (CS-3), each of $R_{12}$ to $R_{26}$ independently represent a linear or branched alkyl group or a cycloalkyl group. The alkyl group preferably has 1 to 20 carbon atoms. The cycloalkyl group preferably has 3 to 20 carbon atoms.

Each of $L_3$ to $L_5$ represents a single bond or a divalent linking group. Examples of the divalent linking group include an alkylene group, a phenylene group, an ether bond, a thioether group, a carbonyl group, an ester bond, an amide bond, a urethane bond, a urea bond, and a combination thereof.

n represents an integer of 1 to 5. n is preferably an integer of 2 to 4.

Specific examples of the repeating unit having a group represented by the general formulae (CS-1) to (CS-3) are shown below. In specific examples, $X_1$ represents a hydrogen atom, —$CH_3$, —F, or —$CF_3$.

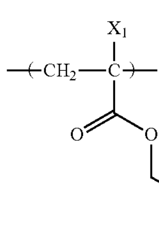

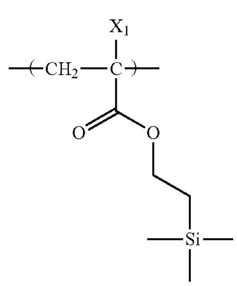

-continued

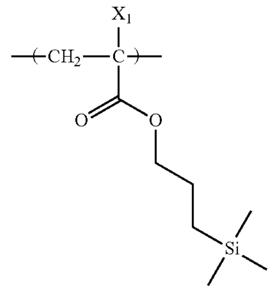

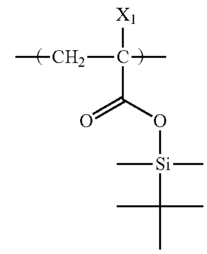

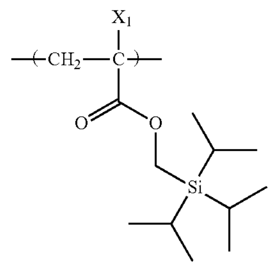

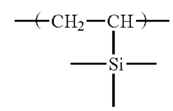

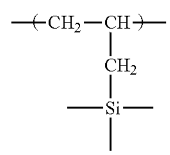

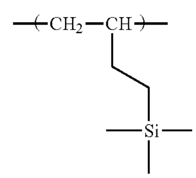

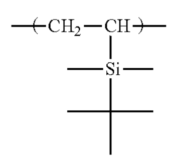

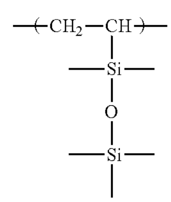

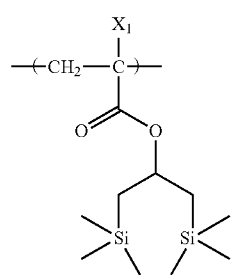

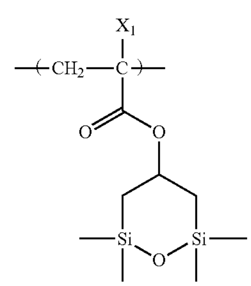

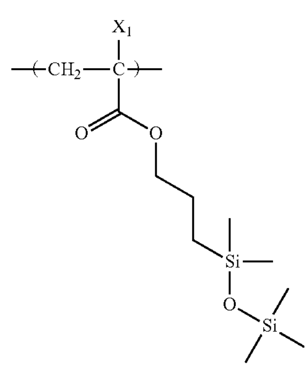

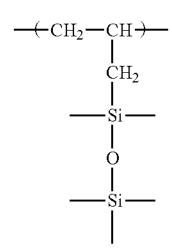

-continued

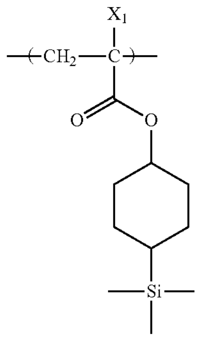

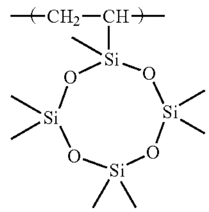

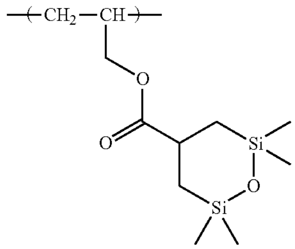

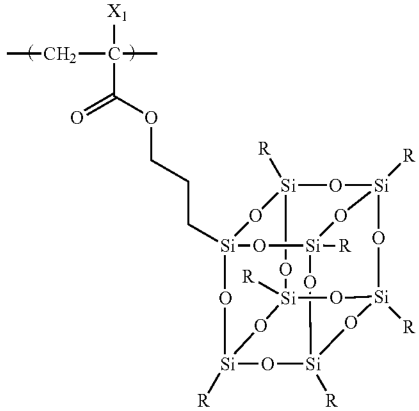

R = $CH_3$, $C_2H_5$, $C_3H_7$, $C_4H_9$

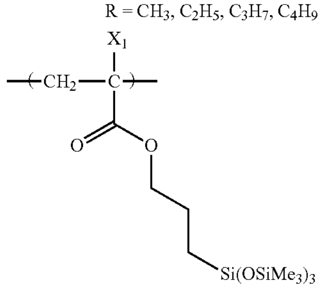

Suitable examples of the resin (G) include a resin (G-a) having a repeating unit having at least one of a fluorine atom and a silicon atom and a repeating unit having a basic group or a group capable of increasing the basicity by the action of an acid; and a resin (G-b) having at least one of a fluorine atom and a silicon atom, having a repeating unit having a basic group or a group capable of increasing the basicity by the action of an acid.

In the resin (G-a), specific examples of the repeating unit having at least either a fluorine atom or a silicon atom include those described above.

In the resin (G-a), the repeating unit having a basic group or a group capable of increasing the basicity by the action of an acid is preferably a repeating unit represented by the following formula (B-I).

(B-I)

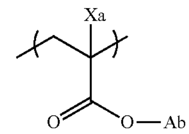

In the general formula (B-I), Xa represents a hydrogen atom, a methyl group which may have a substituent, or a group represented by —$CH_2$—$R_9$. $R_9$ represents a hydroxyl group or a monovalent organic group. Examples of the monovalent organic group include an alkyl group having 5 or less carbon atoms and an acyl group having 5 or less carbon atoms. Among these, an alkyl group having 3 or less carbon atoms is preferred, and a methyl group is more preferred. Xa is preferably a hydrogen atom, a methyl group, a trifluoromethyl group or a hydroxymethyl group, more preferably a hydrogen atom, a methyl group or a hydroxymethyl group.

Ab represents a group containing a basic group, or a group containing a group capable of increasing the basicity by the action of an acid.

In Ab, both the group having basicity and the group capable of increasing the basicity by the action of an acid preferably contain a nitrogen atom.

The basic group-containing group as Ab is preferably a group having any of the structures represented by the general formulae (A) to (E), and specific examples thereof include a monovalent group formed by removing one arbitrary hydrogen from a basic compound (low molecular compound) having any of the structures represented by the general formulae (A) to (E) (in this case, the basic compound may or may not have at least one of a fluorine atom and a silicon atom).

The basic group-containing group as Ab is more preferably a group represented by the following formula (B-I'):

-L-Ac (B-I')

In the general formula (B-I'), L represents a single bond or a divalent linking group, and Ac represents a structure represented by the general formula (A) (the bond from the nitrogen atom of the general formula (A) is connected to L).

The divalent linking group as L includes an alkylene group, a cycloalkylene group, an ether group, a phenylene group, and a group formed by the mutual bonding of two or more of these groups, and is preferably an alkylene group or a cycloalkylene group, more preferably an alkylene group. The total carbon number of the divalent linking group as L is preferably from 0 to 10, more preferably from 1 to 6, and still more preferably 2 or 3.

The "carbamate group having a protective group" described in the compound (G-2) may be preferably mentioned as the "group capable of increasing the basicity by the action of an acid" in the group as Ab containing a group capable of increasing the basicity by the action of an acid.

The group as Ab containing a group capable of increasing the basicity by the action of an acid is preferably a group represented by the following formula (B-II).

(B-II)

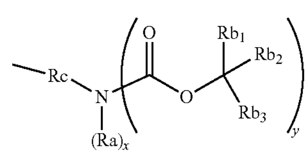

In the general formula (B-II), Ra, $Rb_1$, $Rb_2$, and $Rb_3$ each independently represent a hydrogen atom, an alkyl group, a cycloalkyl group, an aryl group, or an aralkyl group, and two members out of $Rb_1$ to $Rb_3$ may be bonded to each other to form a ring, provided that all of $Rb_1$ to $Rb_3$ are not a hydrogen atom at the same time;

Rc represents a single bond or a divalent linking group; and x represents 0 or 1, y represents 1 or 2, and x+y=2.

When x=1, Ra and Rc may be bonded to each other to form a nitrogen-containing heterocyclic ring.

When y=2, two $Rb_1$'s, two $Rb_2$'s, and two $Rb_3$'s may be the same as or different from each other.

In the general formula (B-II), specific examples of the groups in Ra, $Rb_1$, $Rb_2$, $Rb_3$, and Rc, the ring which may be formed by the mutual bonding of two members out of $Rb_1$ to $Rb_3$, and the nitrogen-containing heterocyclic ring which may be formed by the mutual bonding of Ra and Rc with each other, are the same as those described in the general formula (1).

In the general formula (G-b), the repeating unit containing at least one of a fluorine atom and a silicon atom and a basic group or a group capable of increasing the basicity by the action of an acid includes a repeating unit which is a repeating unit represented by the general formula (B-1) and satisfies any of the following conditions: (i) Xa is a methyl group having at least one of a fluorine atom and a silicon atom (for example, a trifluoromethyl group), (ii) Ab is a group containing a basic group or a group capable of increasing the basicity by the action of an acid and further containing at least one of a fluorine atom and a silicon atom, and (iii) both (i) and (ii) above apply.

As regards (ii), the group Ab containing a basic group and further containing at least one of a fluorine atom and a silicon atom includes, for example, a monovalent group formed by removing one arbitrary hydrogen from a basic compound (low molecular compound) having any of the structures represented by the general formulae (A) to (E) (in this case, the basic compound has at least one of a fluorine atom and a silicon atom).

Furthermore, as regards (ii), the group Ab containing a group capable of increasing the basicity by the action of an acid and further containing at least one of a fluorine atom and a silicon atom includes, for example, a monovalent group formed by removing one arbitrary hydrogen from any of Ra, Rc and Rf in the compound represented by the general formula (1).

Specific examples of the repeating unit containing a basic group or a group capable of increasing the basicity by the action of an acid, in the resin (G), are shown below, but the invention is not limited thereto. In specific examples, X represents a hydrogen atom, —$CH_3$, —$CH_2OH$, —F, or —$CF_3$.

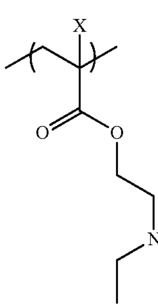

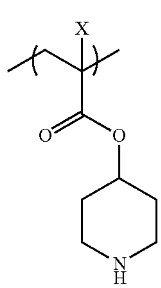

-continued

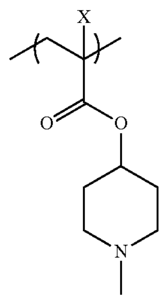

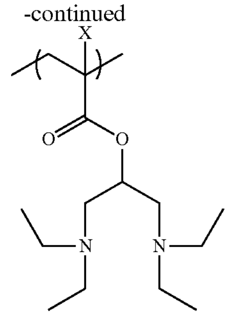

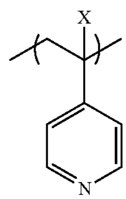

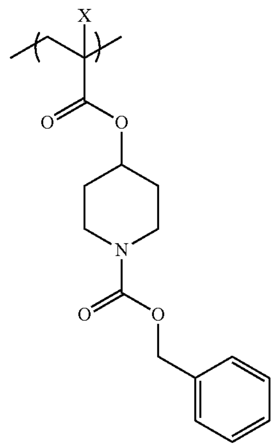

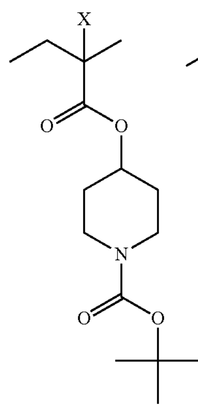

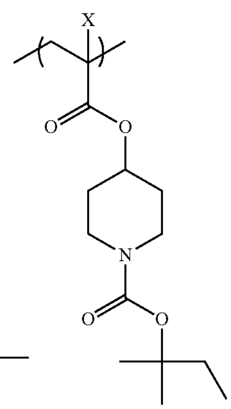

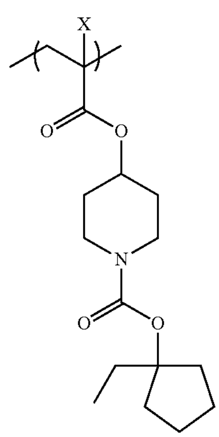

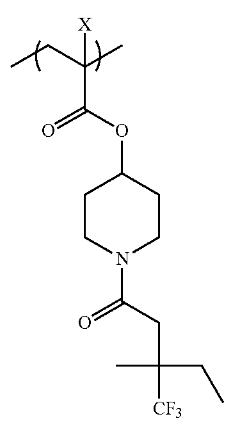

-continued

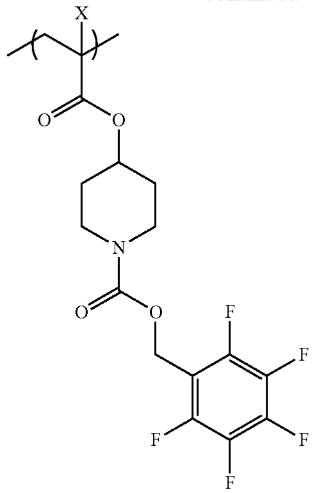

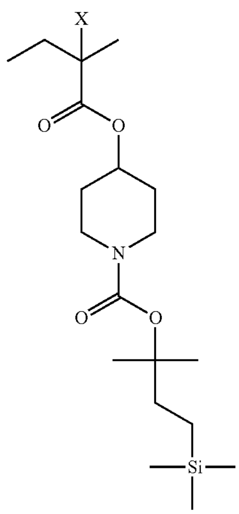

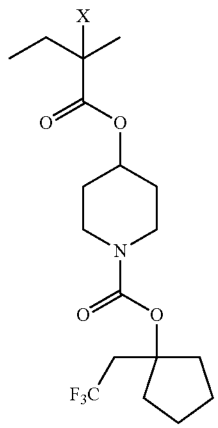

The resin (G) may further contain a repeating unit represented by the following formula (III').

(III')

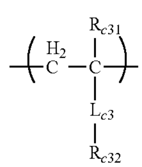

$Rc_{31}$ represents a hydrogen atom, an alkyl group (which may be substituted with a fluorine atom or the like), a cyano group or a —$CH_2$—O-$Rac_2$ group, wherein $Rac_2$ represents a hydrogen atom, an alkyl group, or an acyl group.

$Rc_{31}$ is preferably a hydrogen atom, a methyl group, or a trifluoromethyl group, and more preferably a hydrogen atom or a methyl group.

$Rc_{32}$ represents a group containing an alkyl group, a cycloalkyl group, an alkenyl group, a cycloalkenyl group, or an aryl group. These groups may be substituted with a silicon atom-containing group, a fluorine atom, or the like.

$Lc_3$ represents a single bond or a divalent linking group.

The alkyl group of $Rc_{32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

$Rc_{32}$ is preferably an unsubstituted alkyl group or an alkyl group with at least one hydrogen atom being substituted for by a fluorine atom.

$Lc_3$ represents a single bond or a divalent linking group. The divalent linking group here includes an ester bond, an alkylene group (preferably having 1 to 5 carbon atoms), an oxy group, a phenylene group, an ester bond (a group represented by —COO—), or a group formed by the mutual bonding of two or more of these groups, and a linking group having a total carbon number of 1 to 12 is preferred.

The resin (G) may further contain a repeating unit represented by the following formula (CII-AB).

(CII-AB)

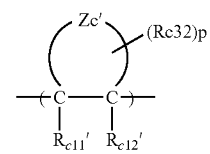

In the formula (CII-AB), $Rc_{11}'$ and $Rc_{12}'$ each independently represent a hydrogen atom, a cyano group, a halogen atom, or an alkyl group. $Z_c'$ represents an atomic group necessary for forming an alicyclic structure together with two carbon atoms (C—C) to which $Rc_{11}'$ and $Rc_{12}'$ are bonded.

$Rc_{32}$ is a substituent on the alicyclic structure, and the definition thereof is the same as $Rc_{32}$ in the general formula (III').

p represents an integer of 0 to 3, and is preferably 0 or 1.

Specific examples of the repeating units represented by the general formulae (III') and (CII-AB) are shown below. In specific examples, Ra represents H, $CH_3$, $CH_2OH$, $CF_3$, or CN.

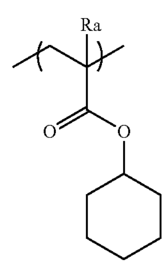

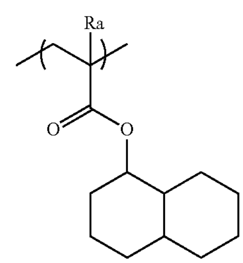

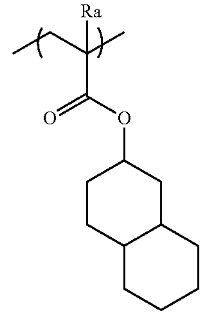

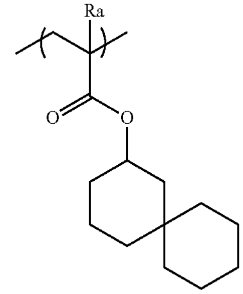

-continued
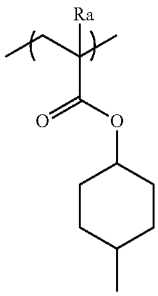
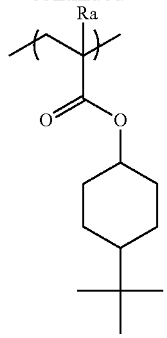
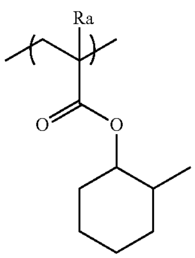
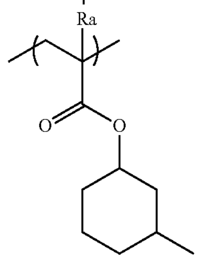
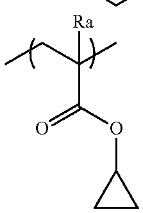
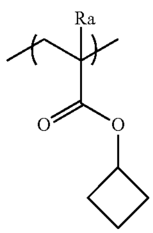
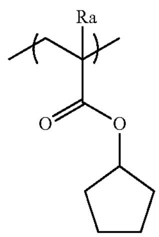
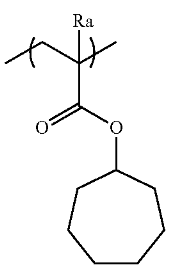
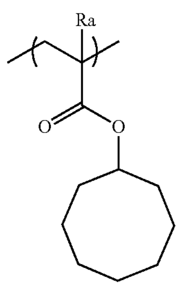
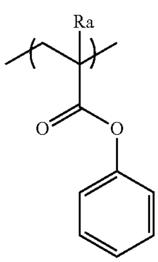
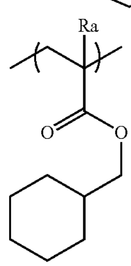
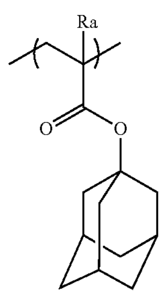
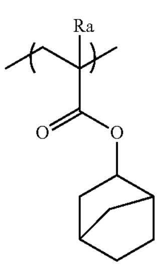
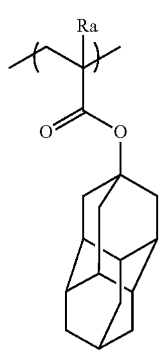
-continued
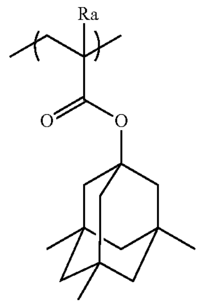
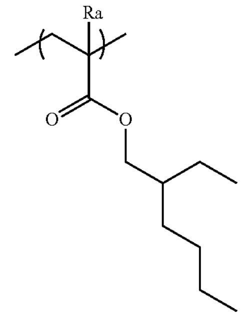
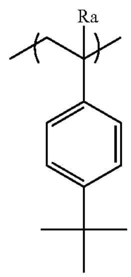
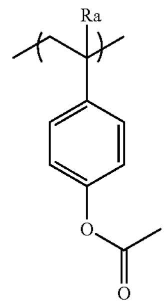
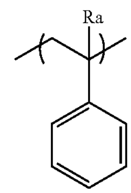
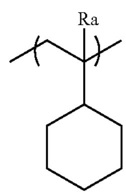
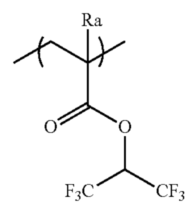
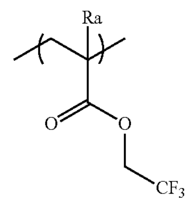
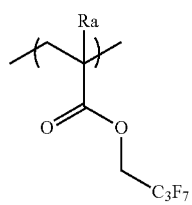
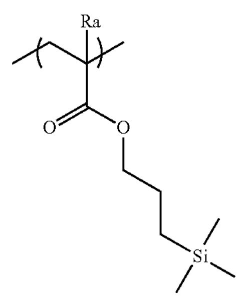
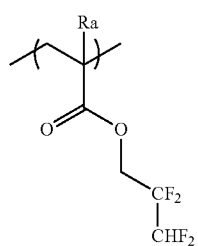
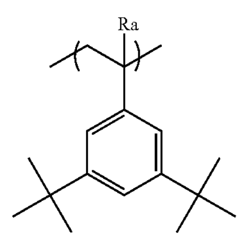
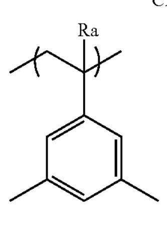
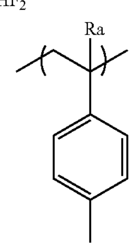

-continued
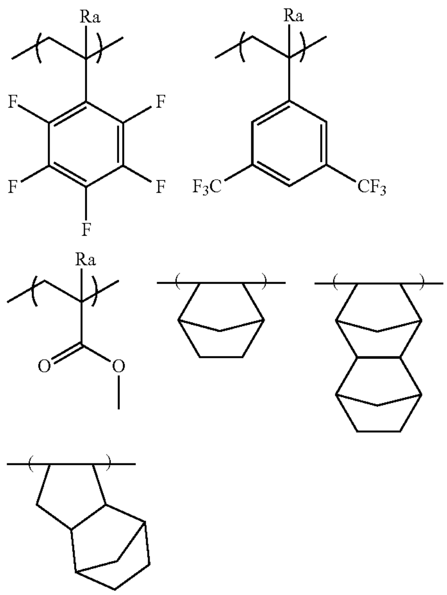
Specific examples of the resin (G) are shown below, but the invention is not limited thereto.
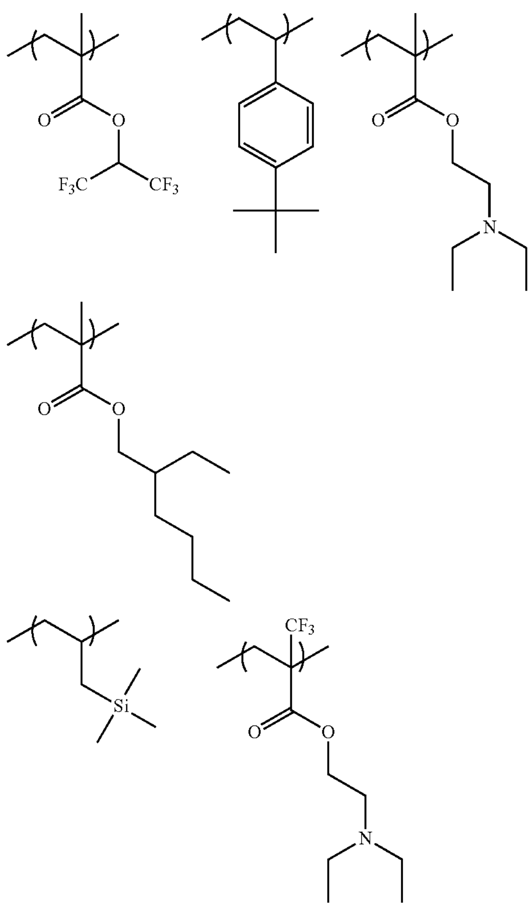
-continued
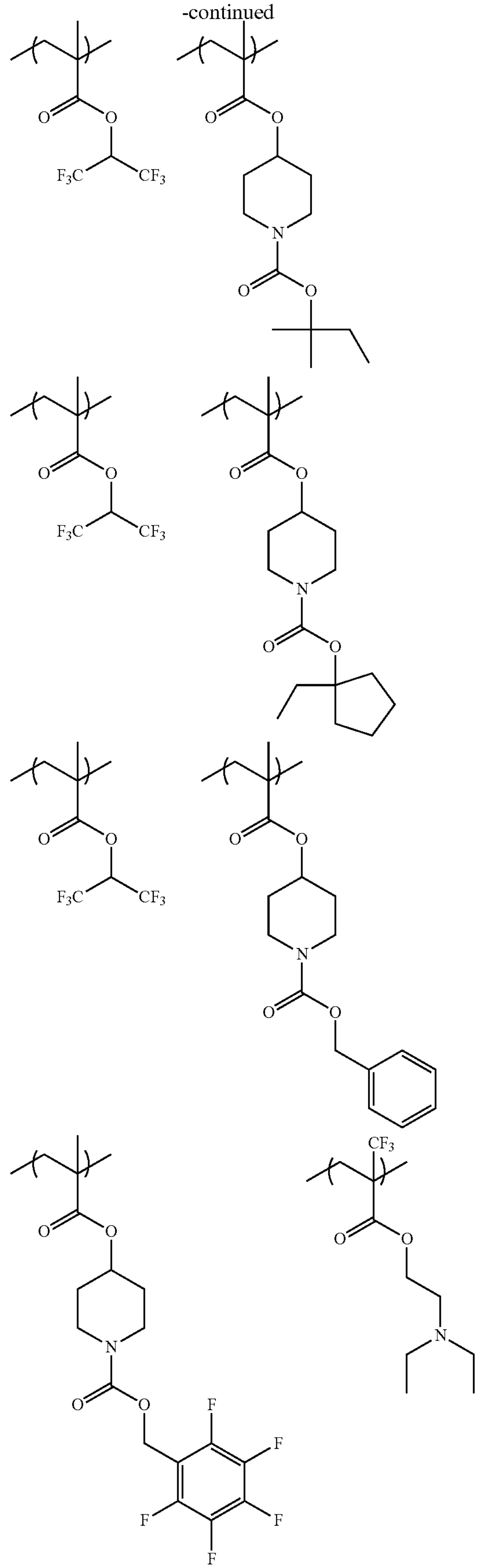

In the case where the compound (G) (including the resin (G)) contains a fluorine atom, the fluorine atom content is preferably from 5 to 80% by mass, more preferably from 10 to 80% by mass, based on the molecular weight of the compound (G). In the case where the compound (G) is the resin (G), the content of the repeating unit containing a fluorine atom is preferably from 10 to 100% by mass, and more preferably from 30 to 100% by mass, based on all the repeating units in the resin (G).

In the case where the resin (G) (including the resin (G)) contains a silicon atom, the silicon atom content is preferably from 2 to 50% by mass, and more preferably from 2 to 30% by mass, based on the molecular weight of the compound (G). In the case where the compound (G) is the resin (G), the content of the silicon atom-containing repeating unit is preferably from 10 to 100% by mass, and more preferably from 20 to 100% by mass, based on all the repeating units in the resin (G).

When the content of the fluorine atoms or silicon atoms in terms of the molecular weight of the compound (G) is within the above-described ranges, a sufficient amount of fluorine atoms or silicon atoms are contained in the compound (G), and thus, the surface free energy of the compound (G) can be sufficiently reduced. Therefore, the compound (G) is more unfailingly unevenly distributed in the outermost portion of the resist film. By this, excessive acids in the surface layer of the exposed area can be captured more unfailingly, and the acid concentration distribution can be more unfailingly uniform in the thickness direction of the exposed area of the resist film. Accordingly, it is thought that the above-described problems of the reversely tapered shape or the T-top shape can be inhibited more unfailingly.

The content of the "repeating unit having at least one of a fluorine atom and a silicon atom" in the resin (G-a) is preferably from 20 to 80 mol %, more preferably 25 to 70 mol %, and particularly preferably 30 to 60 mol %, based on all the repeating units constituting the resin (G).

The content of the "repeating unit having basicity or being capable of increasing the basicity by the action of an acid" in the resin (G-a) is preferably from 20 to 80 mol %, more preferably 25 to 70 mol %, and particularly preferably 30 to 60 mol %, based on all the repeating units constituting the resin (G).

The content of the "repeating unit having at least one of a fluorine atom and a silicon atom, and having basicity or being capable of increasing the basicity by the action of an acid" in the resin (G-b) is preferably from 20 to 80 mol %, more preferably 25 to 70 mol %, and particularly preferably 30 to 60 mol %, based on all the repeating units constituting the resin (G).

The content of the repeating unit represented by formula (III') or (CII-AB) in the resin (G) is preferably from 20 to 80 mol %, more preferably 25 to 70 mol %, and particularly preferably 30 to 60 mol %, based on all the repeating units constituting the resin (G).

The weight average molecular weight of the resin (G) is preferably from 1,000 to 100,000, more preferably from 1,000 to 50,000, and still more preferably from 2,000 to 15,000, in terms of polystyrene as measured by a GPC method.

The dispersity of the resin (G) is preferably from 1 to 5, more preferably from 1 to 3, and still more preferably from 1 to 2. Within this range, superior resolution, pattern profile, and roughness characteristics can be achieved.

As for the compound (G) (including the resin (G)), one kind of a compound may be used singly or in combination of two or more kinds thereof.

The content of the compound (G) (including the resin (G)) is preferably from 0.01 to 10 mol %, more preferably from 0.05 to 8 mol %, and still more preferably from 0.1 to 5 mol %, based on the entire solid content of the composition.

As for the compound (G) (including the resin (G)), a commercially available product may be used or a compound synthesized by a conventional method may be used. Examples of the general synthesis method of the resin (G) include the same methods as those described above for the resin (P).

In the resin (G) (oligomer or polymer compound), it is of course preferred that the content of impurities such as metals be small, and in addition, the residual amount of monomers is also preferably from 0 to 10 mol %, more preferably from 0 to 5 mol %, and still more preferably from 0 to 1 mol %. When these conditions are satisfied, the amount of extraneous substances in liquid and the change with aging of sensitivity or the like can be reduced.

[4-1] Basic Compound or Ammonium Salt Compound Capable of Decreasing Basicity Upon Irradiation with Actinic Rays or Radiation (C)

The actinic ray-sensitive or radiation-sensitive resin composition in the invention preferably contains a basic compound or ammonium salt compound capable of decreasing the basicity upon irradiation with actinic rays or radiation (hereinafter also referred to as a "compound (C)").

The compound (C) is preferably a compound (C-1) having a basic functional group or a group capable of generating an acid group upon irradiation with actinic rays or radiation together ammonium. That is, the compound (C) is preferably a basic compound having a basic functional group and a group capable of generating an acidic functional group upon irradiation with actinic rays or radiation, or an ammonium salt compound having a group capable of generating an acid group upon irradiation with actinic rays or radiation together ammonium.

Specific examples of the compound include compounds in which an anion resulting from elimination of a proton from an acidic functional group of a compound having a basic functional group or an ammonium group is combined with an onium cation to form a salt.

Here, examples of the basic functional group include atomic groups including a structure such as a crown ether structure, a primary to tertiary amine structure, and a nitrogen-containing heterocyclic structure (for example, pyridine, imidazole, and pyrazine). Further, as the basic functional group, a functional group containing a nitrogen atom is preferred, and a structure having a primary to tertiary amine group or a nitrogen-containing heterocyclic structure is more preferred. In these structures, it is preferable that all the atoms adjacent to the nitrogen atom contained in the structure be carbon atoms or hydrogen atoms, from the viewpoint of improvement of basicity. In addition, it is preferable that an electron-withdrawing functional group (for example, a carbonyl group, a sulfonyl group, a cyano group, and a halogen atom) be not directly bonded to the nitrogen atom, from the viewpoint of improvement of basicity.

Examples of the acidic functional group include a carboxyl acid group, a sulfonic acid group, and a group having an —X—NH—X— (X=CO or $SO_2$).

Examples of the onium cation include a sulfonium cation and an iodonium cation, more specifically those described as the cation portions of the general formulae (ZI) and (ZII) of the (B) acid generator.

The compound which is generated due to decomposition of the compound (C) or (C-1) upon irradiation with actinic rays or radiation and decreased in basicity includes compounds represented by the following general formulae (PA-I), (PA- II), and (PA-III), and from the viewpoint that excellent effects can be attained in a high level in terms of both LWR and local pattern dimensional uniformity and (DOF), compounds represented by the general formulae (PA-II) and (PA-III) are preferred.

First, the compound represented by the general formula (PA-I) will be described.

$$\text{Q-A1-(X)}_n\text{—B—R} \quad \text{(PA-I)}$$

In the general formula (PA-I), $A_1$ represents a single bond or a divalent linking group;

Q represents $—SO_3H$ or $—CO_2H$;

Q corresponds to an acidic functional group that is generated upon irradiation with actinic rays or radiation;

X represents $—SO_2—$ or —CO—;

n represents 0 or 1;

B represents a single bond, an oxygen atom, or —N(Rx)-;

Rx represents a hydrogen atom or a monovalent organic group; and

R represents a monovalent organic group having a basic functional group, or a monovalent organic group having an ammonium group.

The divalent linking group of $A_1$ is preferably a divalent linking group having 2 to 12 carbon atoms, and examples thereof include an alkylene group and a phenylene group. An alkylene group having at least one fluorine atom is more preferred, and it preferably 2 to 6 carbon atoms, and more preferably 2 to 4 carbon atoms. The alkylene chain may contain a linking group such as an oxygen atom and a sulfur atom. The alkylene group is preferably an alkylene group where from 30 to 100% by number of the hydrogen atom is substituted with a fluorine atom, more preferably an alkylene group where the carbon atom bonded to the Q site has a fluorine atom, still more preferably a perfluoroalkylene group, and even still more preferably a perfluoroethylene group, a perfluoropropylene group, or a perfluorobutylene group.

The monovalent organic group in Rx is preferably a monovalent organic group having 4 to 30 carbon atoms, and examples thereof include an alkyl group, a cycloalkyl group, an aryl group, an aralkyl group, and an alkenyl group.

The alkyl group in Rx may have a substituent and is preferably a linear or branched alkyl group having 1 to 20 carbon atoms, and the alkyl chain may contain an oxygen atom, a sulfur atom, or a nitrogen atom.

Here, the alkyl group having a substituent includes a group where a cycloalkyl group is substituted particularly on a linear or branched alkyl group (for example, an adamantylmethyl group, an adamantylethyl group, a cyclohexylethyl group, and a camphor residue).

The cycloalkyl group in Rx may have a substituent and is preferably a cycloalkyl group having 3 to 20 carbon atoms, and the cycloalkyl group may contain an oxygen atom in the ring.

The aryl group in Rx may have a substituent and is preferably an aryl group having 6 to 14 carbon atoms.

The aralkyl group in Rx may have a substituent and is preferably an aralkyl group having 7 to 20 carbon atoms.

The alkenyl group in Rx may have a substituent and includes, for example, a group having a double bond at an arbitrary position of the alkyl group described as Rx.

Preferred examples of the partial structure of the basic functional group include a crown ether structure, a primary to tertiary amine structure, and a nitrogen-containing heterocyclic structure (for example, pyridine, imidazole, pyrazine).

Preferred examples of the partial structure of the ammonium group include a primary to tertiary ammonium structure, a pyridinium structure, an imidazolinium structure and a pyrazinium structure.

The basic functional group is preferably a functional group having a nitrogen atom, more preferably a structure having a primary to tertiary amino group or a nitrogen-containing heterocyclic structure. In these structures, from the viewpoint of enhancing the basicity, it is preferred that all atoms adjacent to a nitrogen atom contained in the structure are a carbon atom or a hydrogen atom. Further, in view of enhancing the basicity, an electron-withdrawing functional group (for example, carbonyl group, sulfonyl group, cyano group, halogen atom) is preferably not bonded directly to the nitrogen atom.

The monovalent organic group in the monovalent organic group (group R) containing such a structure is preferably an organic group having 4 to 30 carbon atoms, and examples thereof include an alkyl group, a cycloalkyl group, an aryl group, an aralkyl group and an alkenyl group. These groups each may have a substituent.

The alkyl group, cycloalkyl group, aryl group, aralkyl group and alkenyl group in the basic functional group- or ammonium group-containing alkyl, cycloalkyl, aryl, aralkyl and alkenyl groups of R are the same as the alkyl group, the cycloalkyl group, the aryl group, the aralkyl group, and the alkenyl group described for Rx.

Examples of the substituent which the respective groups above may have include a halogen atom, a hydroxyl group, a nitro group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms). As for the cyclic structure in the aryl group, the cycloalkyl group, and the like, the substituent further includes an alkyl group (preferably having 1 to 20 carbon atoms). As for the aminoacyl group, the substituent further includes one or two alkyl groups (preferably having 1 to 20 carbon atoms).

In the case where B is —N(Rx)-, R and Rx preferably are bonded to each other to form a ring. By virtue of forming a ring structure, the stability is enhanced and the composition using this compound is also enhanced in the storage stability. The number of carbons constituting the ring is preferably from 4 to 20, and the ring may be monocyclic or polycyclic and may contain an oxygen atom, a sulfur atom, or a nitrogen atom in the ring.

Examples of the monocyclic structure include a 4- to 8-membered ring containing a nitrogen atom. Examples of the polycyclic structure include a structure composed of a combination of two monocyclic structures or three or more monocyclic structures. The monocyclic structure and polycyclic structure may have a substituent, and preferred examples of the substituent include a halogen atom, a hydroxyl group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 15 carbon atoms), an acyloxy group (preferably having 2 to 15 carbon atoms), an alkoxycarbonyl group (preferably having 2 to 15 carbon atoms), and an aminoacyl group (preferably having 2 to 20 carbon atoms). As for the cyclic structure in the aryl group, cycloalkyl group and the like, the substituent further includes an alkyl group (preferably having 1 to 15 carbon atoms). As for the aminoacyl group, the substituent includes one or two alkyl groups (preferably having 1 to 15 carbon atoms).

Out of the compounds represented by the general formula (PA-I), a compound where the Q site is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through reaction with an amine compound.

Next, the compound represented by the general formula (PA-II) is described.

$$Q_1\text{-}X_1\text{—NH—}X_2\text{-}Q_2 \qquad \text{(PA-II)}$$

In the general formula (PA-II)

$Q_1$ and $Q_2$ each independently represent a monovalent organic group, provided that either one of $Q_1$ and $Q_2$ has a basic functional group, and it also possible that $Q_1$ and $Q_2$ are bonded to each other to form a ring and the ring formed has a basic functional group; and $X_1$ and $X_2$ each independently represent —CO— or —$SO_2$—.

Here, —NH— corresponds to the acidic functional group generated upon irradiation with actinic rays or radiation.

The monovalent organic group as $Q_1$ and $Q_2$ in the general formula (PA-II) is preferably a monovalent organic group having 1 to 40 carbon atoms, and examples thereof include an alkyl group, a cycloalkyl group, an aryl group, an aralkyl group, and an alkenyl group.

The alkyl group in $Q_1$ and $Q_2$ may have a substituent and is preferably a linear or branched alkyl group having 1 to 30 carbon atoms, and the alkyl chain may contain an oxygen atom, a sulfur atom, or a nitrogen atom.

The cycloalkyl group in $Q_1$ and $Q_2$ may have a substituent and is preferably a cycloalkyl group having 3 to 20 carbon atoms, and the ring may contain an oxygen atom or a nitrogen atom.

The aryl group in $Q_1$ and $Q_2$ may have a substituent and is preferably an aryl group having 6 to 14 carbon atoms.

The aralkyl group in $Q_1$ and $Q_2$ may have a substituent and is preferably an aralkyl group having 7 to 20 carbon atoms.

The alkenyl group in $Q_1$ and $Q_2$ may have a substituent and includes a group having a double bond at an arbitrary position of the alkyl group above.

Examples of the substituent which each of these groups may have include a halogen atom, a hydroxyl group, a nitro group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 10 carbon atoms). As for the cyclic structure in the aryl group, cycloalkyl group and the like, examples of the substituent further include an alkyl group (preferably having 1 to 10 carbon atoms). As for the aminoacyl group, examples of the substituent further include an alkyl group (preferably having 1 to 10 carbon atoms). Examples of the alkyl group having a substituent include a perfluoroalkyl group such as a perfluoromethyl group, a perfluoroethyl group, a perfluoropropyl group, and a perfluorobutyl group.

Preferred examples of the partial structure of the basic functional group which at least either $Q_1$ and $Q_2$ has are the same as those of the basic functional group in R of the general formula (PA-I).

In the case where $Q_1$ and $Q_2$ are bonded to each other to form a ring and the ring formed has a basic functional group, examples of the structure thereof include a structure where the organic group of $Q_1$ or $Q_2$ is further bonded with an alkylene group, an oxy group, an imino group, or the like.

In the general formula (PA-II), at least one of $X_1$ and $X_2$ is preferably —$SO_2$—.

Next, the compound represented by the general formula (PA-III) will be described.

$$Q_1\text{-}X_1\text{—NH—}X_2\text{-}A_2\text{-}(X_3)_m\text{—B-}Q_3 \qquad \text{(PA-III)}$$

In the general formula (PA-III), $Q_1$ and $Q_3$ each independently represent a monovalent organic group, provided that either one of $Q_1$ and $Q_3$ has a basic functional group. It is also possible that $Q_1$ and $Q_3$ are bonded to each other to form a ring and the ring formed has a basic functional group;

$X_1$, $X_2$, and $X_3$ each independently represent —CO— or —$SO_2^-$;

$A_2$ represents a divalent linking group;

B represents a single bond, an oxygen atom or —N(Qx)-; and

Qx represents a hydrogen atom or a monovalent organic group.

In the case where B is —N(Qx)-, $Q_3$ and Qx may are bonded to each other to form a ring.

m represents 0 or 1.

Here, —NH— corresponds to the acidic functional group generated upon irradiation with actinic rays or radiation.

$Q_1$ has the same meaning as $Q_1$ in the general formula (PA-II).

Examples of the organic group of $Q_3$ are the same as those of the organic group of $Q_1$ and $Q_2$ in the general formula (PA-II).

Incidentally, in the case where $Q_1$ and $Q_3$ are bonded to each other to form a ring and the ring formed has a basic functional group, examples of the structure thereof include a structure where the organic group of $Q_1$ and $Q_3$ is further bonded with an alkylene group, an oxy group, an imino group or the like.

The divalent linking group in $A_2$ is preferably a divalent linking group having 1 to 8 carbon atoms and containing a fluorine atom, and examples thereof include a fluorine atom-containing alkylene group having 1 to 8 carbon atoms, and a fluorine atom-containing phenylene group. A fluorine atom-containing alkylene group is more preferred, and the carbon number thereof is preferably from 2 to 6, more preferably from 2 to 4. The alkylene chain may contain a linking group such as an oxygen atom and a sulfur atom. The alkylene group is preferably an alkylene group where from 30 to 100% by number of the hydrogen atom is substituted with a fluorine atom, more preferably a perfluoroethylene group, and still more preferably a perfluoroethylene group having 2 to 4 carbon atoms.

The monovalent organic group in Qx is preferably an organic group having 4 to 30 carbon atoms, and examples thereof include an alkyl group, a cycloalkyl group, an aryl group, an aralkyl group and an alkenyl group. Examples of the alkyl group, the cycloalkyl group, the aryl group, the aralkyl group, and the alkenyl group are the same as those for Rx in the general formula (PA-I).

In the general formula (PA-III), each of $X_1$, $X_2$, and $X_3$ is preferably —$SO_2$—.

The compound (C) is preferably a sulfonium salt compound of the compound represented by the general formula (PA-I), (PA-II), or (PA-III), or an iodonium salt compound of the compound represented by the general formula (PA-I), (PA-II), or (PA-III), and more preferably a compound represented by the following formula (PA1) or (PA2).

(PA1)

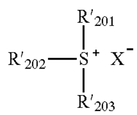

(PA2)

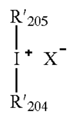

In the general formula (PA1), $R'_{201}$, $R'_{202}$, and $R'_{203}$ each independently represent an organic group, and specific examples thereof are the same as those for $R'_{201}$, $R'_{202}$, and $R'_{203}$ of the general formula ZI in the component (B).

$X^-$ represents a sulfonate or carboxylate anion resulting from elimination of a hydrogen atom in the $-SO_3H$ moiety or —COOH moiety of the compound represented by the general formula (PA-I), or an anion resulting from elimination of a hydrogen atom in the —NH— moiety of the compound represented by the general formula (PA-II) or (PA-III).

In the general formula (PA2), $R'_{204}$ and $R'_{205}$ each independently represent an aryl group, an alkyl group, or a cycloalkyl group, and specific examples thereof are the same as those for $R_{204}$ and $R_{205}$ of the formula ZIT in the component (B).

$X^-$ represents a sulfonate or carboxylate anion resulting from elimination of a hydrogen atom in the —$SO_3H$ moiety or —COOH moiety of the compound represented by the general formula (PA-I), or an anion resulting from elimination of a hydrogen atom in the —NH— moiety of the compound represented by the general formula (PA-II) or (PA-III).

The compound (C) decomposes upon irradiation with actinic rays or radiation to generate, for example, a compound represented by the general formula (PA-I), (PA-II), or (PA-III).

The compound represented by the general formula (PA-I) is a compound having a sulfonic or carboxylic acid group together with a basic functional group or an ammonium group and thereby being reduced in or deprived of basicity or changed from basic to acidic as compared with the compound (C).

The compound represented by the general formula (PA-II) or (PA-III) is a compound having an organic sulfonylimino or organic carbonylimino group together with a basic functional group and thereby being reduced in or deprived of basicity or changed from basic to acidic as compared with the compound (C).

In the invention, the expression "reduced in basicity upon irradiation with actinic rays or radiation" means that the acceptor property for a proton (an acid generated upon irradiation with actinic rays or radiation) of the compound (C) is decreased upon irradiation with actinic rays or radiation. The expression "the acceptor property is decreased" means that when an equilibrium reaction of producing a non-covalent bond complex as a proton adduct from a basic functional group-containing compound and a proton takes place or when an equilibrium reaction of causing the counter cation of the ammonium group-containing compound to be exchanged with a proton takes place, the equilibrium constant in the chemical equilibrium decreases.

In this way, a compound (C) capable of decreasing the basicity upon irradiation with actinic rays or radiation is contained in the resist film, so that in the unexposed area, the acceptor property of the compound (C) is sufficiently brought out and an unintended reaction between an acid diffused from the exposed area or the like and the resin (P) can be inhibited, whereas in the exposed area, the acceptor property of the compound (C) decreases and the intended reaction of an acid with the resin (P) unfailingly occurs. Such an operation mechanism is considered to contribute to obtaining a pattern excellent in terms of line width variation (LWR), focus latitude (DOF), and pattern profile.

Incidentally, the basicity can be confirmed by measuring the pH, or a calculated value can be computed using commercially available software.

Specific examples of the compound (C) capable of generating a compound represented by the general formula (PA-I) upon irradiation with actinic rays or radiation are illustrated below, but the invention is not limited thereto.

(PA-1)

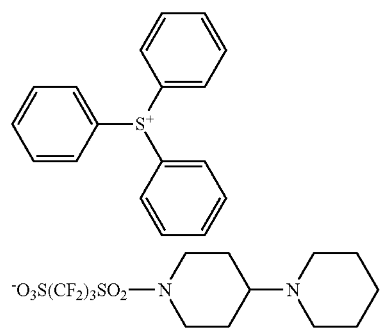

(PA-2)

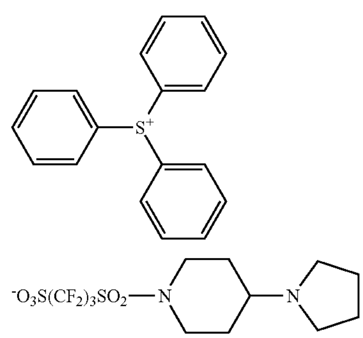

(PA-3)

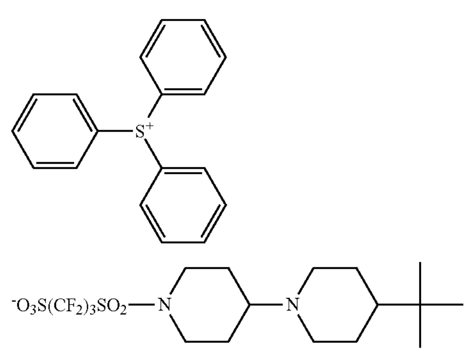

-continued
(PA-4)
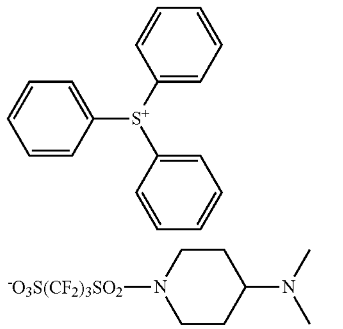
(PA-5)
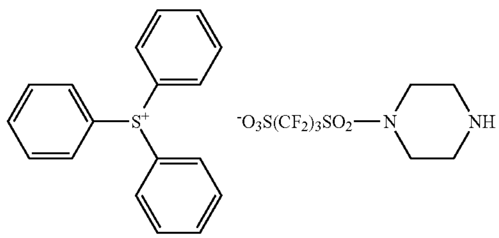
(PA-6)
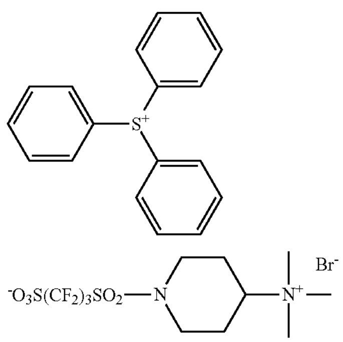
(PA-7)
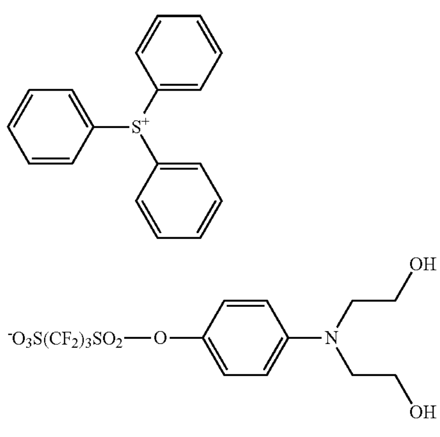
(PA-8)
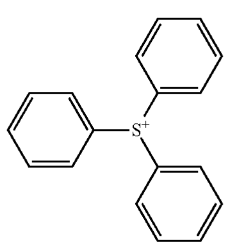
-continued
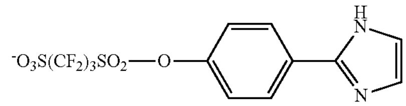
(PA-9)
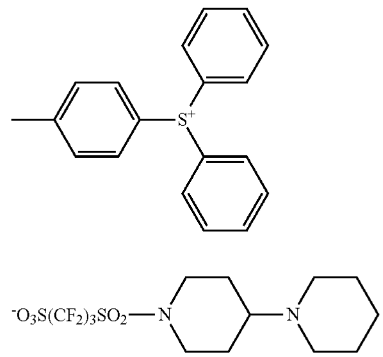
(PA-10)
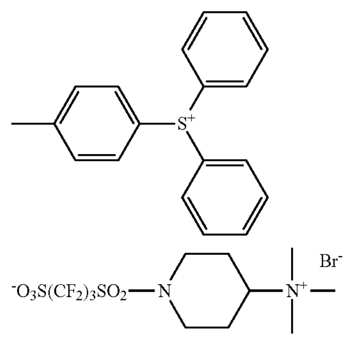
(PA-11)
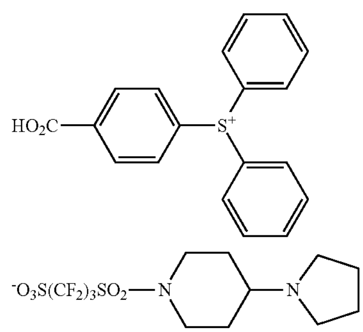
(PA-12)
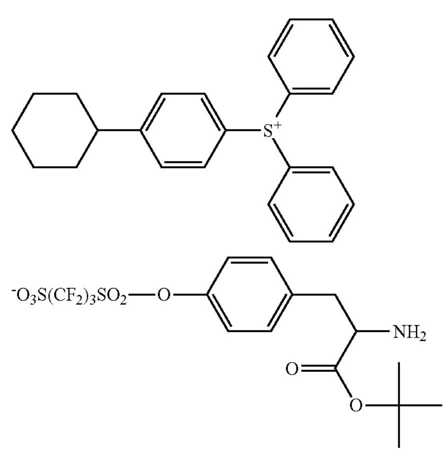

-continued
(PA-13)
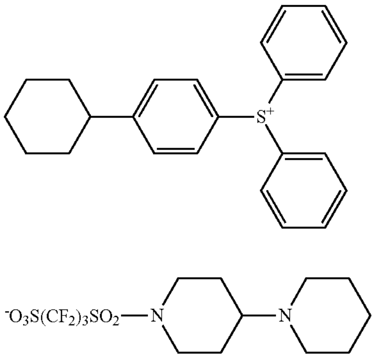
(PA-14)
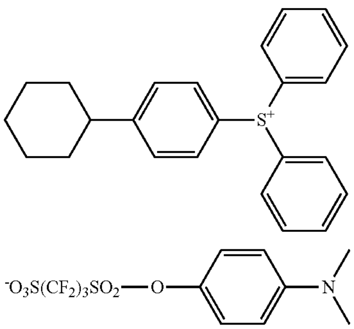
(PA-15)
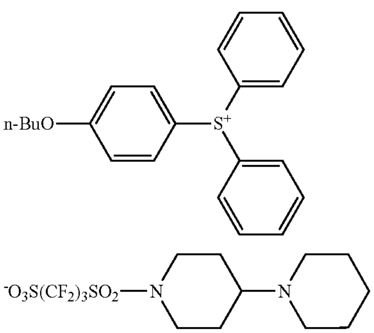
(PA-16)
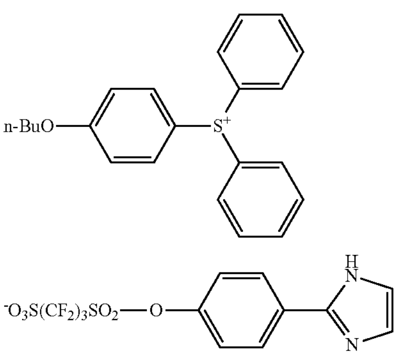
(PA-17)
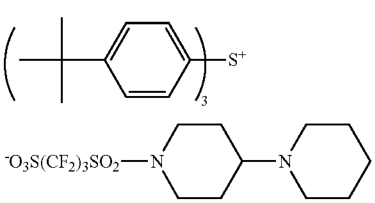
-continued
(PA-18)
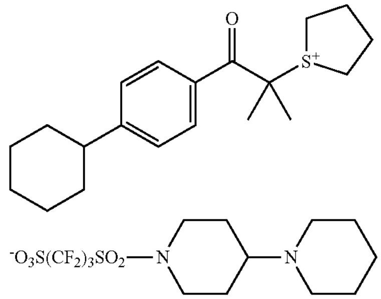
(PA-19)
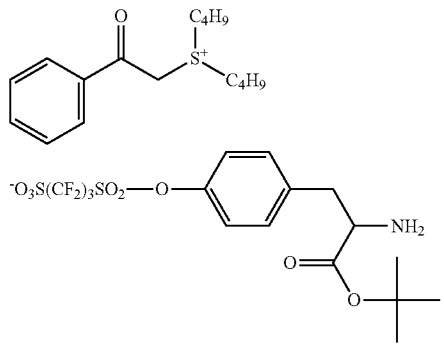
(PA-20)
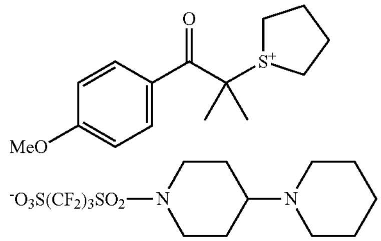
(PA-21)
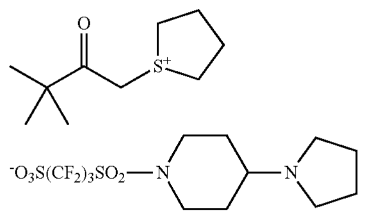
(PA-22)
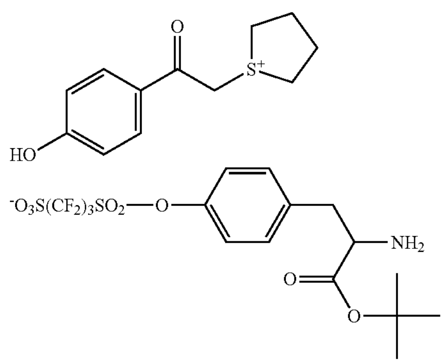
(PA-23)
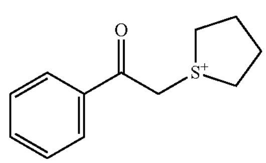

-continued
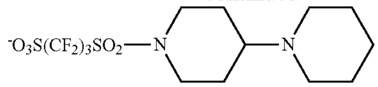
(PA-24)
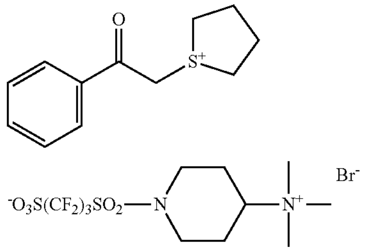
(PA-25)
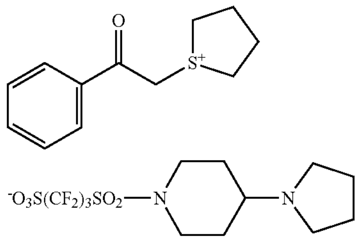
(PA-26)
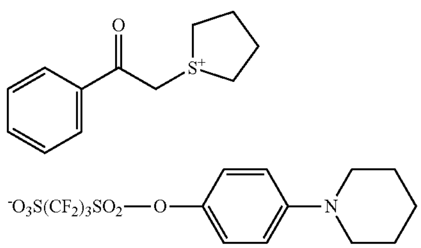
(PA-27)
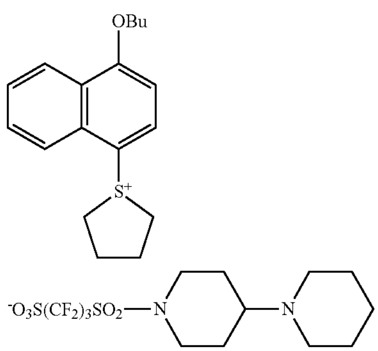
(PA-28)
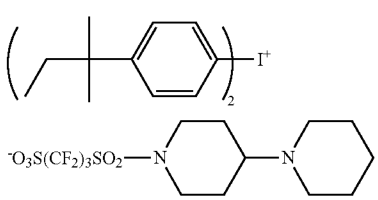
(PA-29)
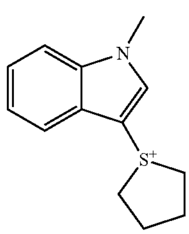
-continued
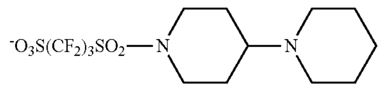
(PA-30)
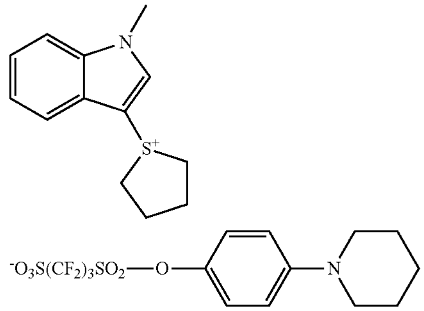
(PA-31)
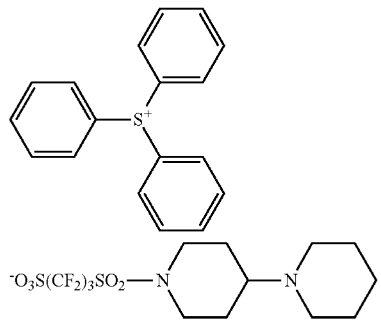
(PA-32)
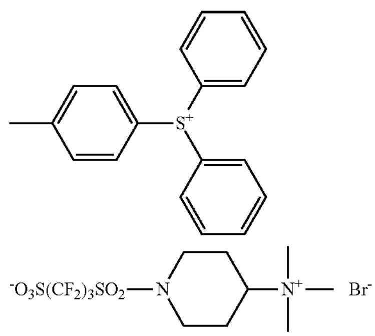
(PA-33)
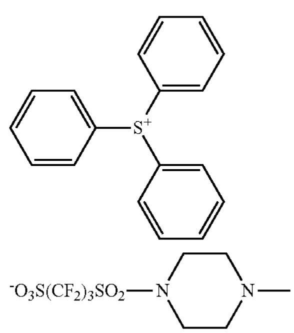
(PA-34)
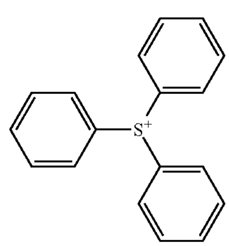

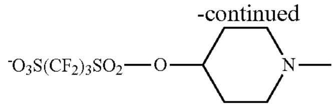
(PA-35)
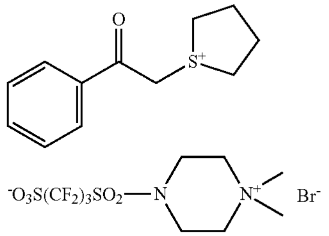
(PA-36)
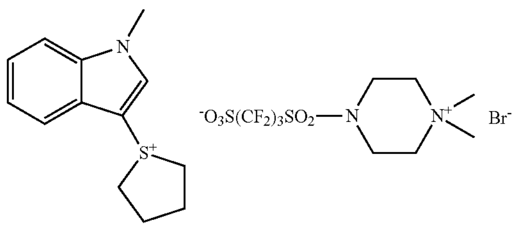
(PA-37)
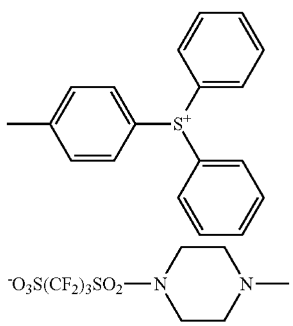
(PA-38)
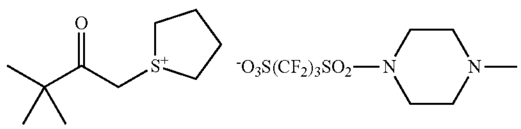
(PA-39)
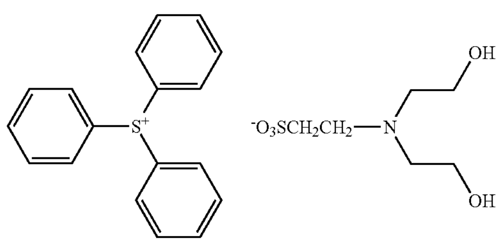
(PA-40)
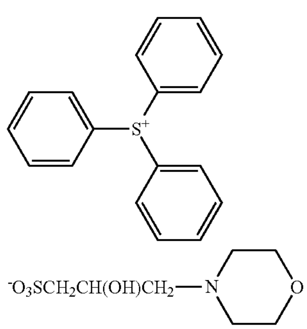
(PA-41)
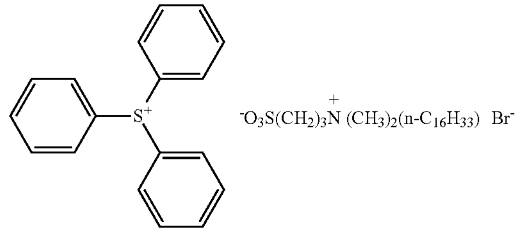
(PA-42)
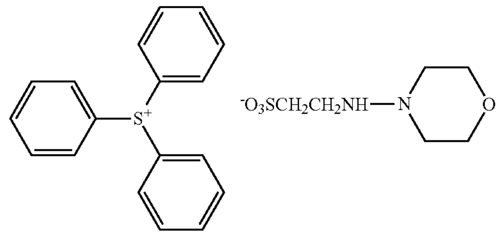
(PA-43)
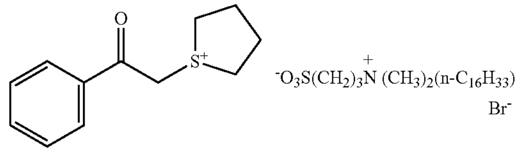
(PA-44)
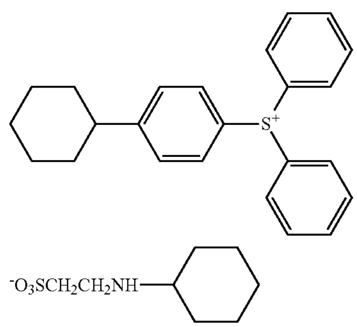
(PA-45)
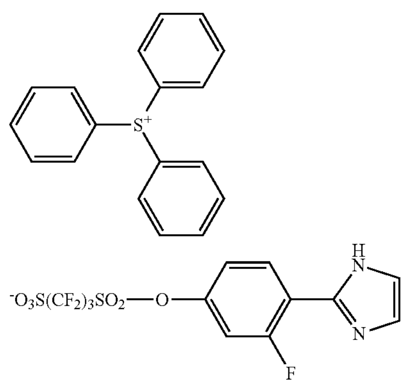
(PA-46)
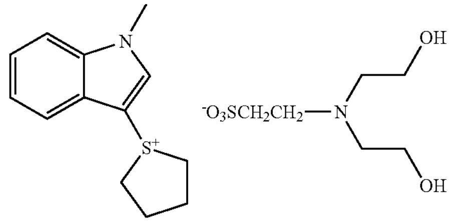

-continued
(PA-47)
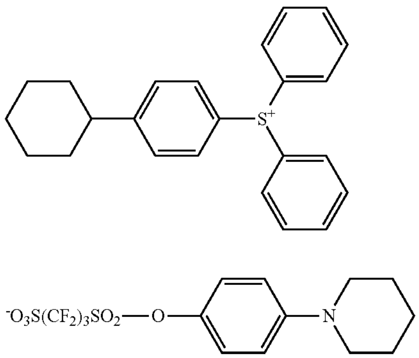
(PA-48)
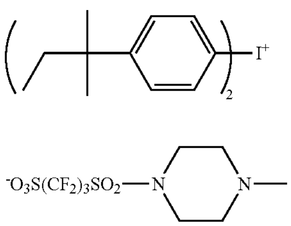
(PA-49)
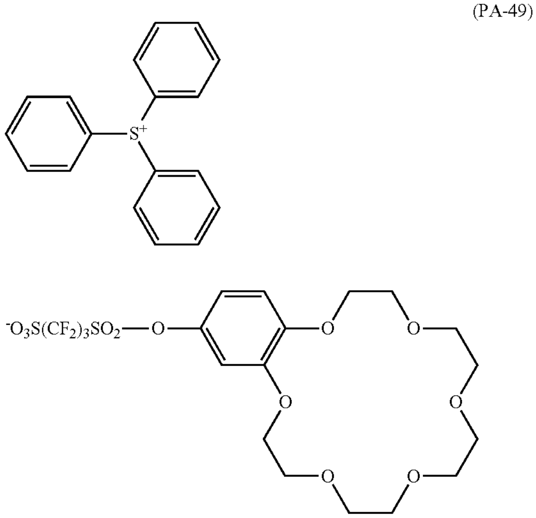
(PA-50)
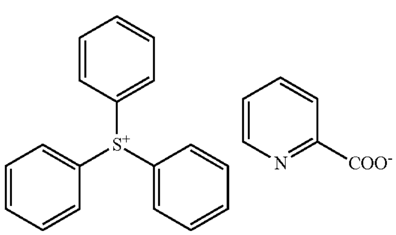
(PA-51)
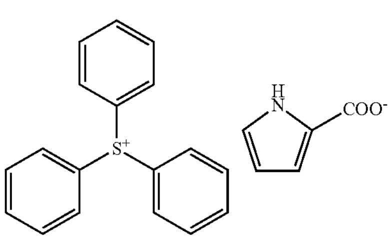
-continued
(PA-52)
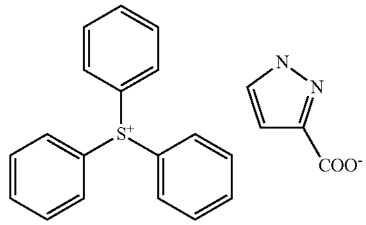
(PA-53)
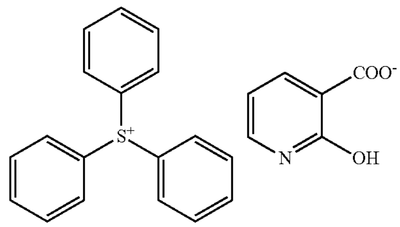
(PA-54)
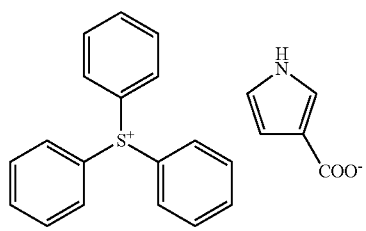
PA-55)
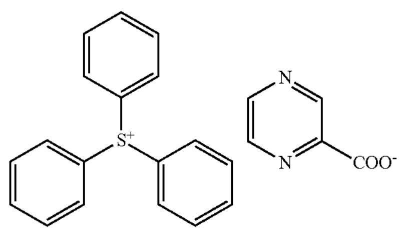
(PA-56)
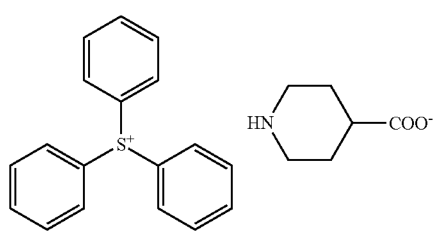
(PA-57)
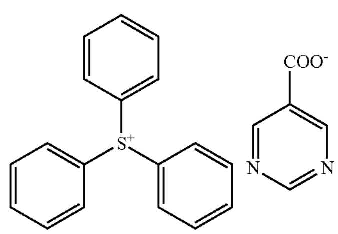
(PA-58)
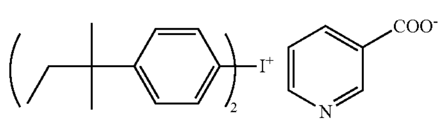

-continued (PA-59)

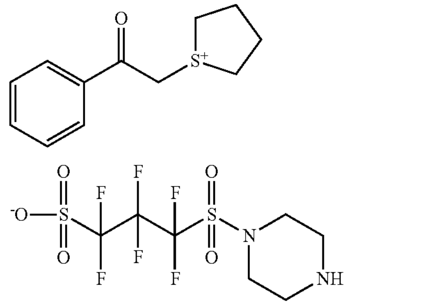

(PA-60)

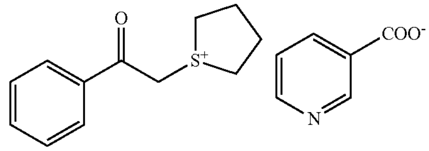

These compounds can be easily synthesized from a compound represented by the general formula (PA-I) or a lithium, sodium or potassium salt thereof and a hydroxide, bromide, chloride or the like of iodonium or sulfonium, by utilizing the salt exchange method described in JP1998-501909T (JP-H11-501909T) or JP2003-246786A. The synthesis may also be performed in accordance with the synthesis method described in JP1994-333851A (JP-H07-333851A).

Specific examples of the compound (C) capable of generating a compound represented by the general formula (PA-II) or (PA-III) upon irradiation with actinic rays or radiation are illustrated below, but the invention is not limited thereto.

(PA-61)

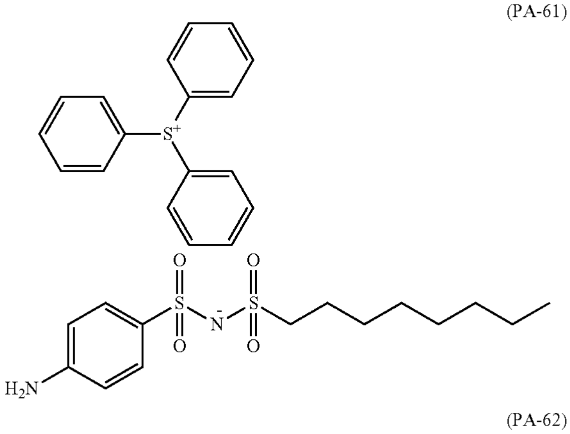

(PA-62)

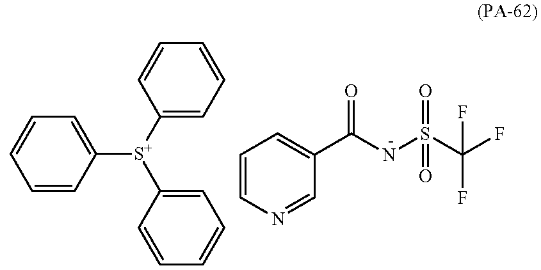

-continued (PA-63)

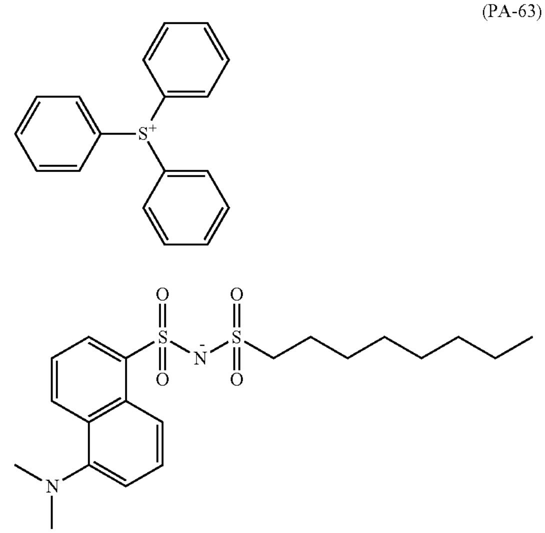

(PA-64)

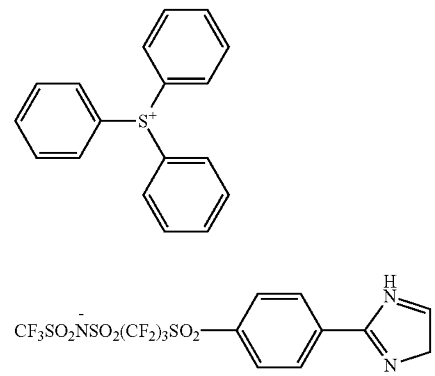

(PA-65)

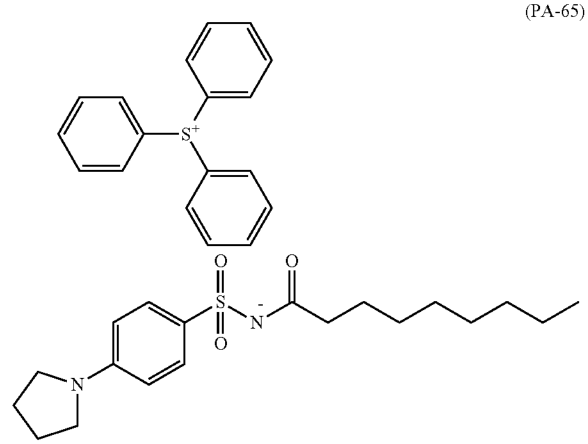

(PA-66)

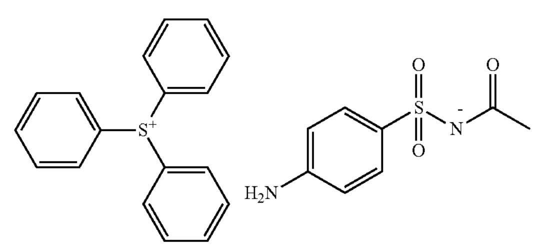

(PA-67)
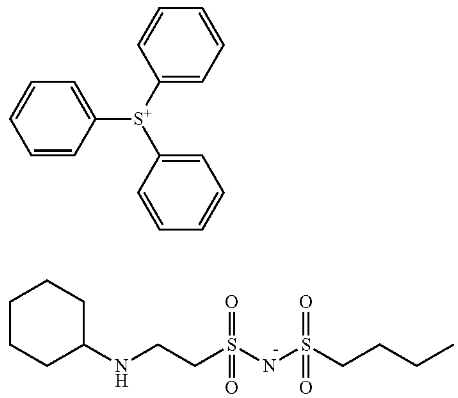
(PA-68)
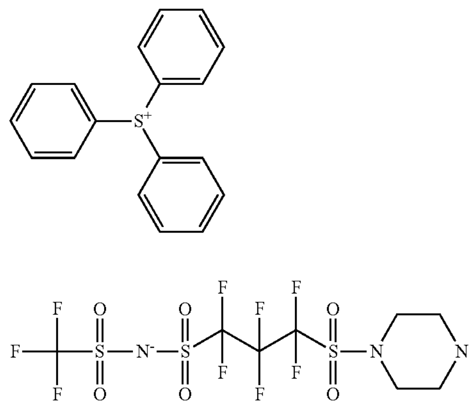
(PA-69)
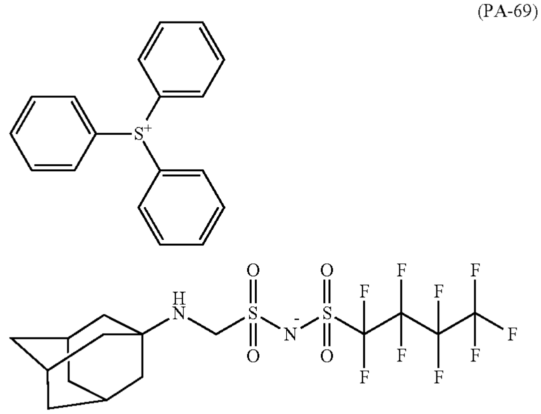
(PA-70)
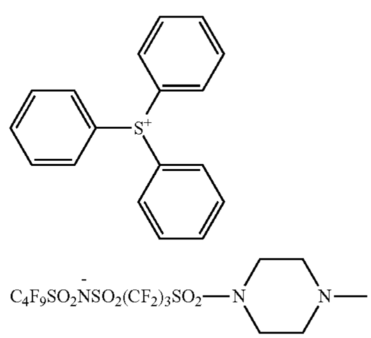
(PA-71)
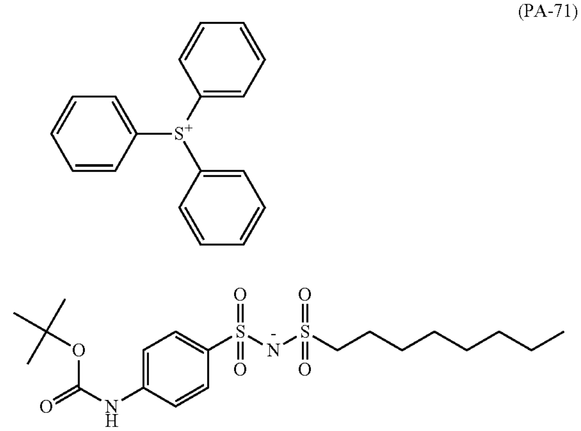
(PA-72)
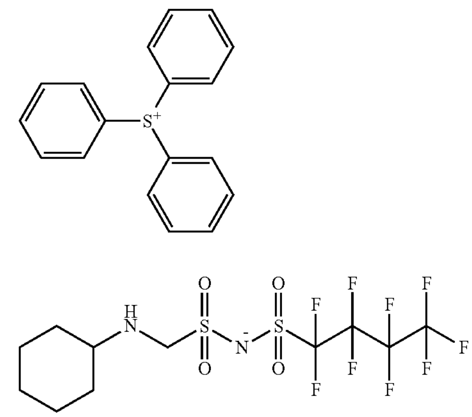
(PA-73)
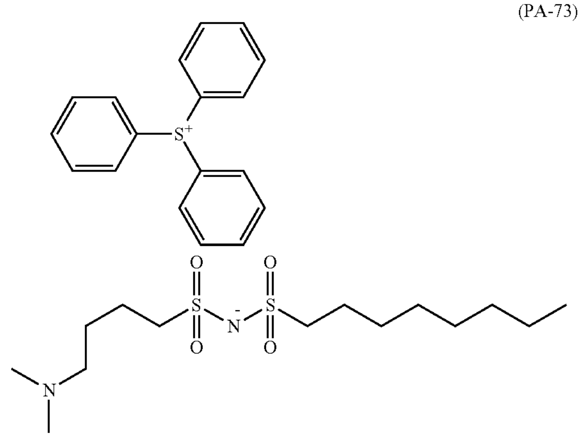
(PA-74)
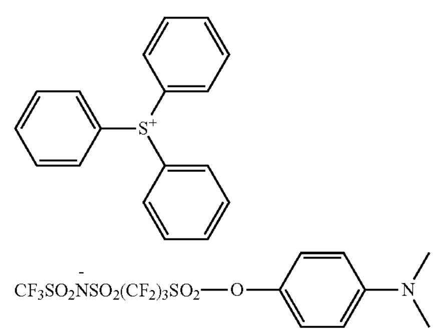

-continued
(PA-75)
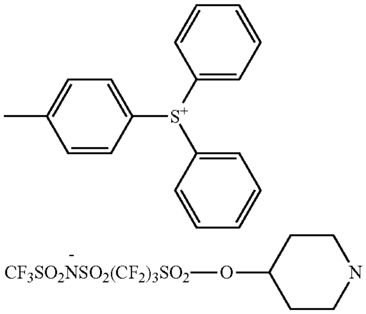
(PA-76)
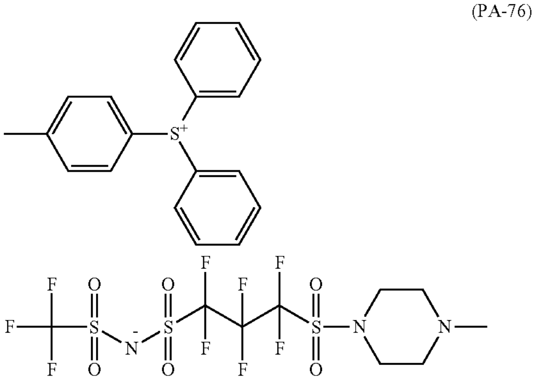
(PA-77)
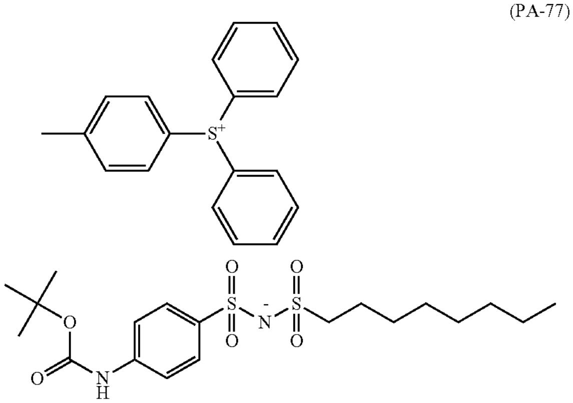
(PA-78)
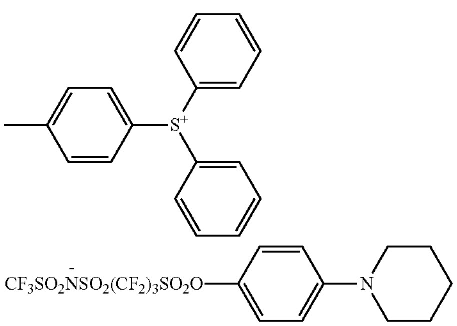
(PA-79)
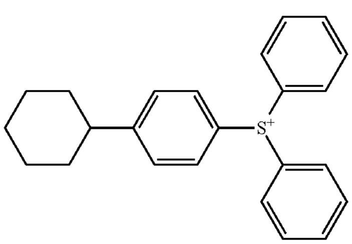
-continued
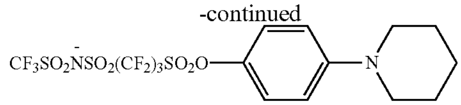
(PA-80)
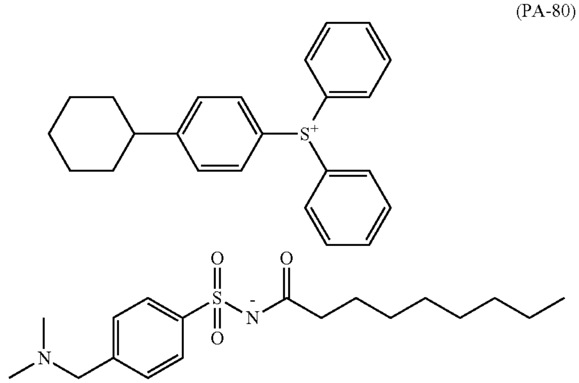
(PA-81)
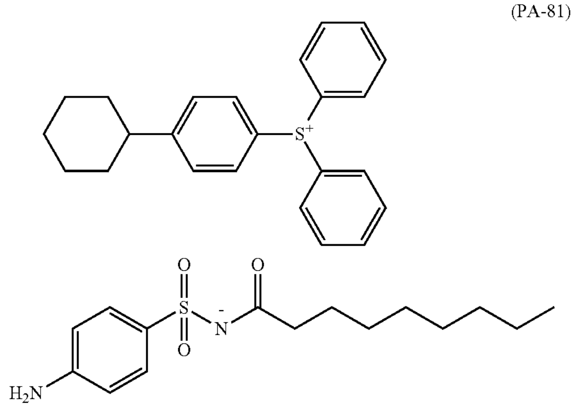
(PA-82)
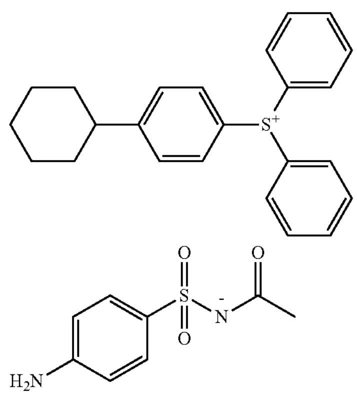
(PA-83)
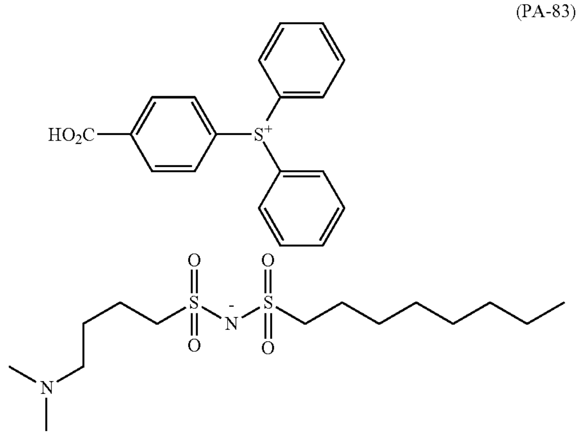

(PA-84)
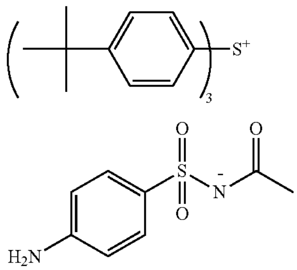
(PA-85)
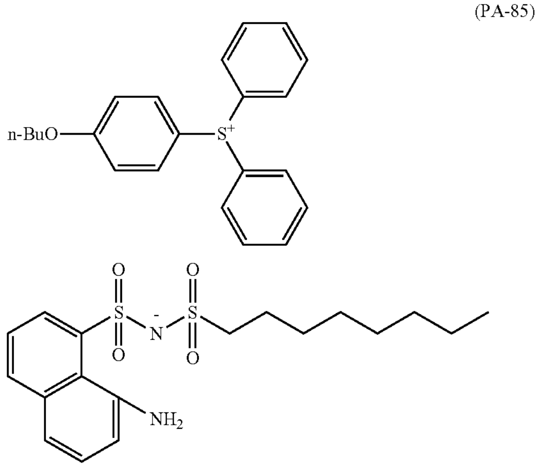
(PA-86)
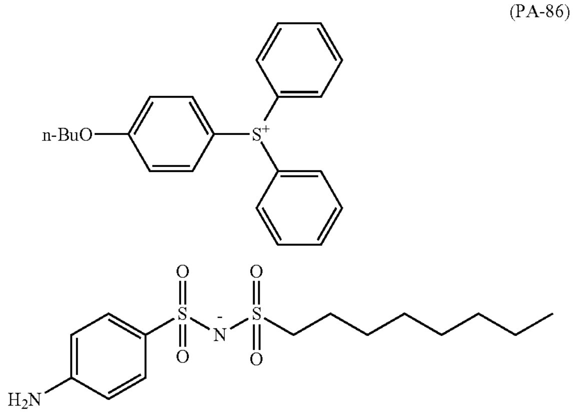
(PA-87)
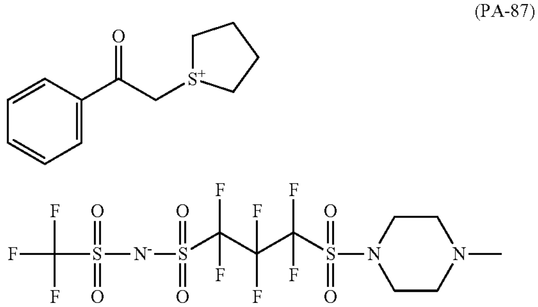
(PA-88)
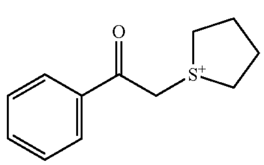
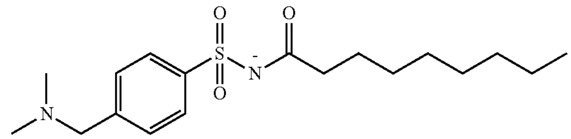
(PA-89)
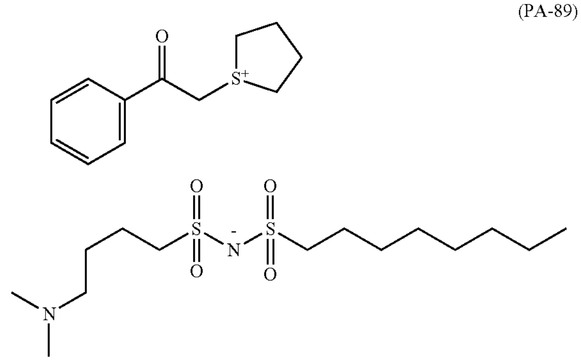
(PA-90)
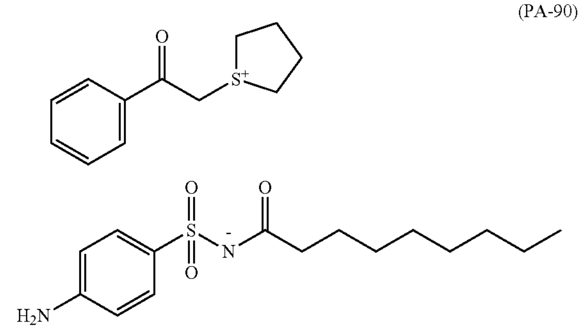
(PA-91)
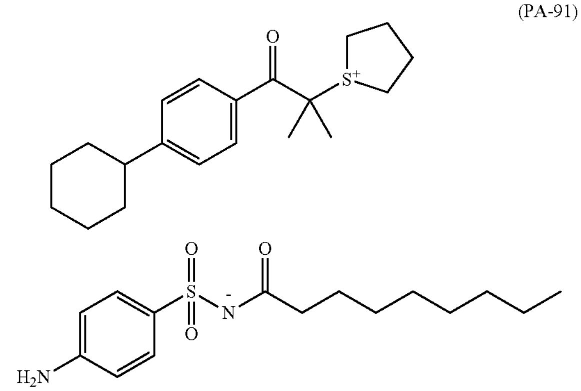
(PA-92)
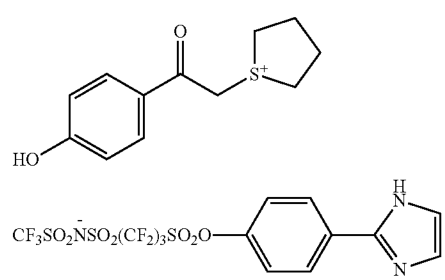
(PA-93)
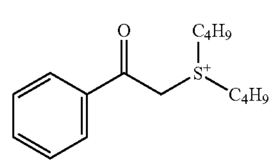

-continued
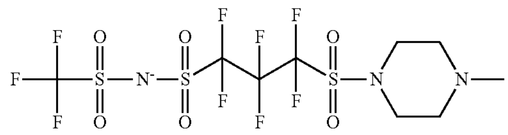
(PA-94)
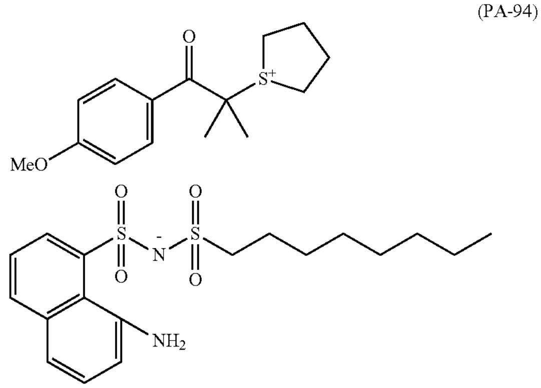
(PA-95)
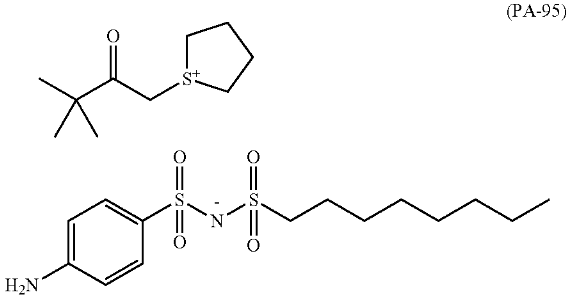
(PA-96)
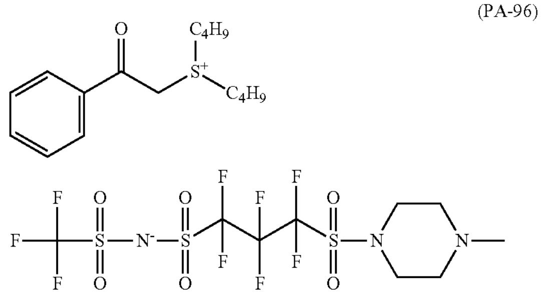
(PA-97)
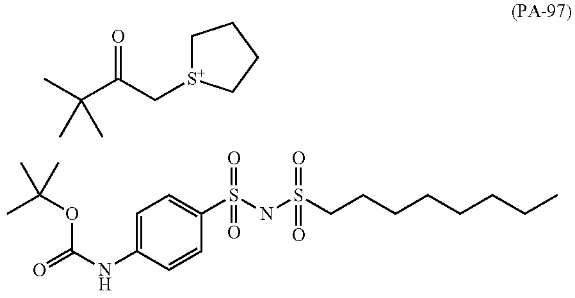
(PA-98)
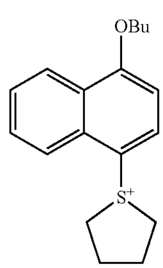
-continued
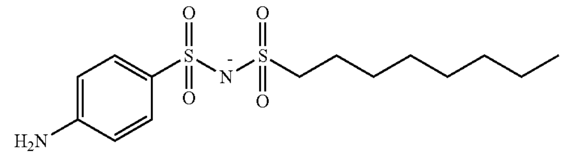
(PA-99)
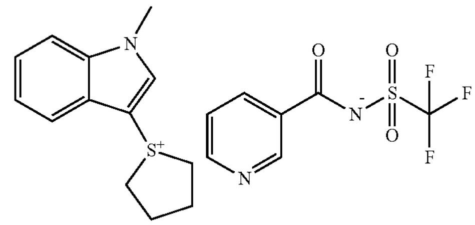
(PA-100)
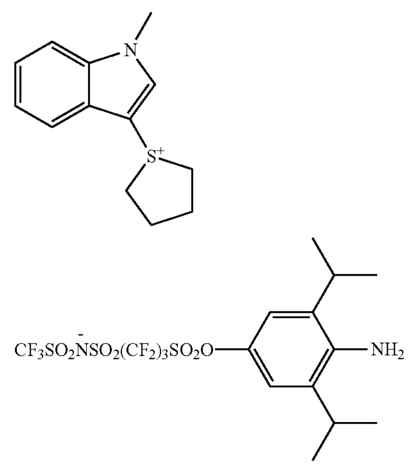
(PA-101)
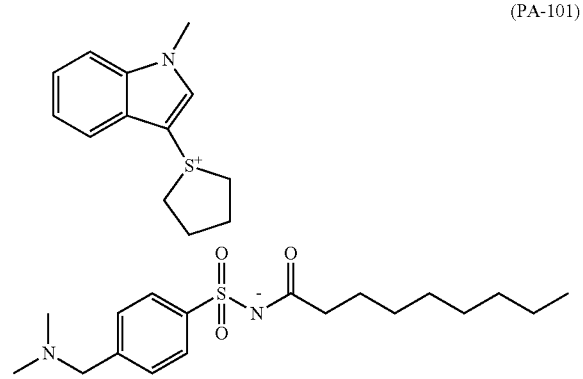
(PA-102)
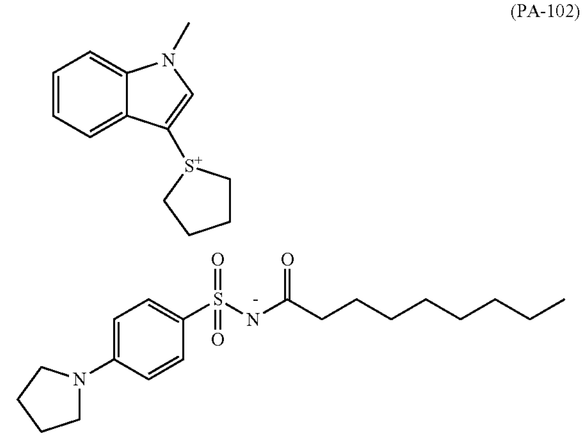

-continued
(PA-103)
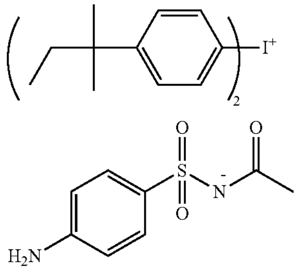
(PA-104)
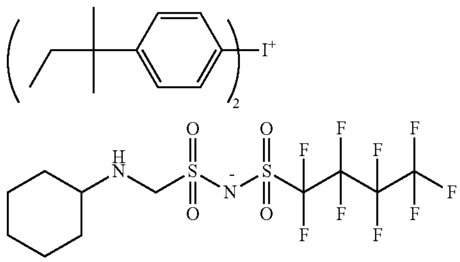
(PA-105)
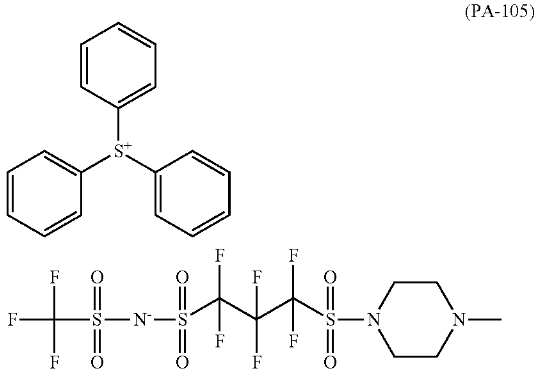
(PA-106)
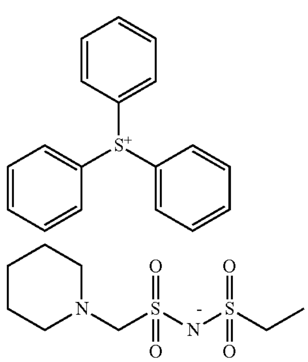
(PA-107)
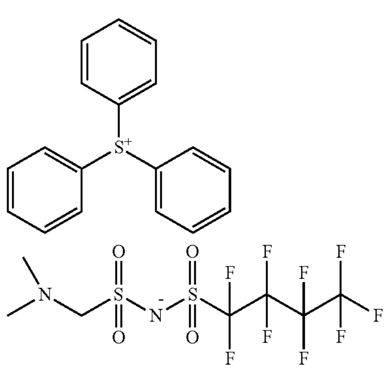
-continued
(PA-108)
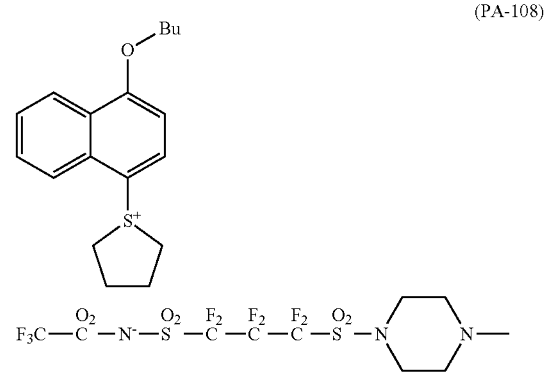
(PA-109)
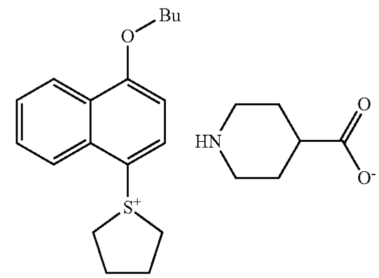
(PA-110)
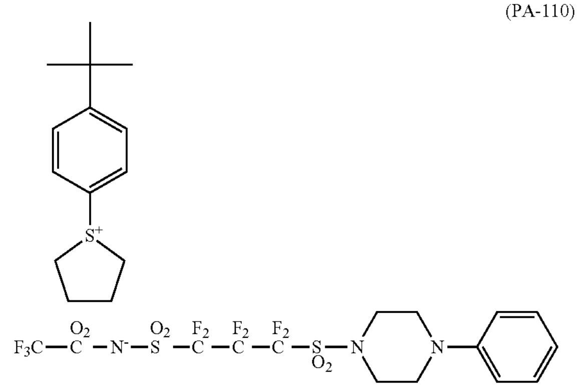
(PA-111)
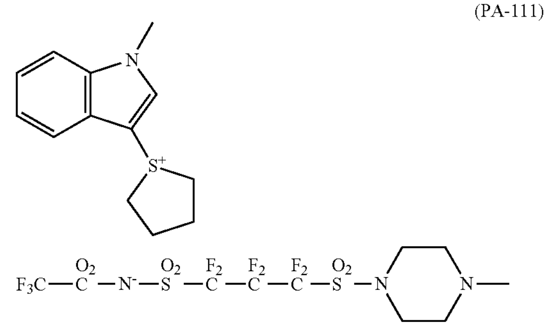
(PA-112)
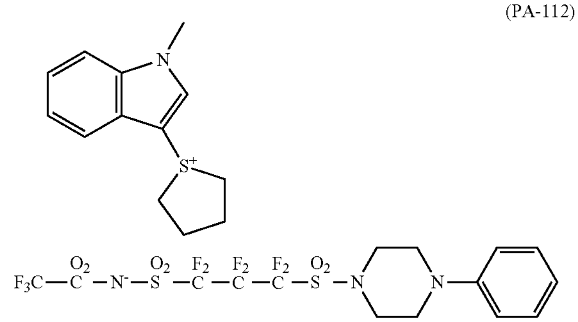

(PA-113)
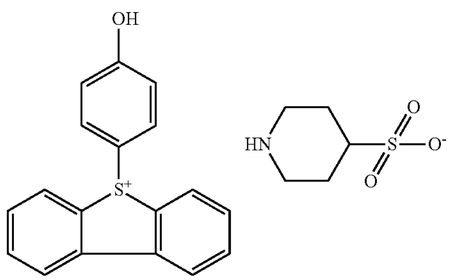
(PA-114)
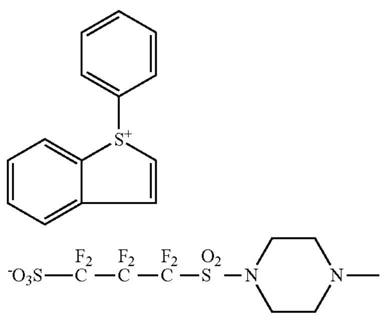
(PA-115)
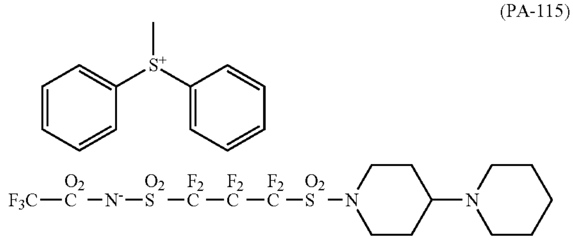
(PA-116)
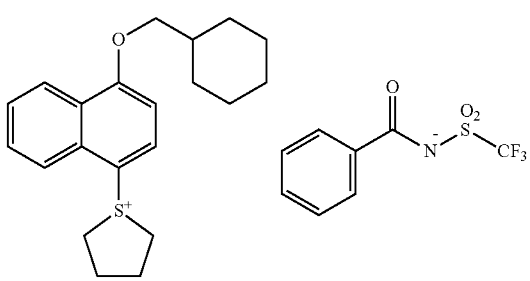
(PA-117)
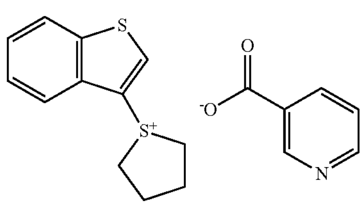
(PA-118)
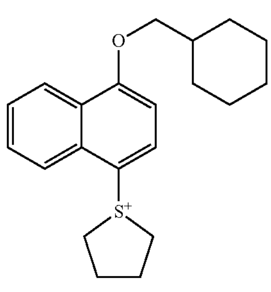
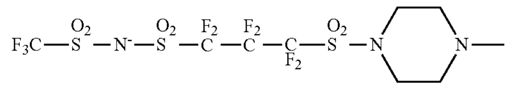
(PA-119)
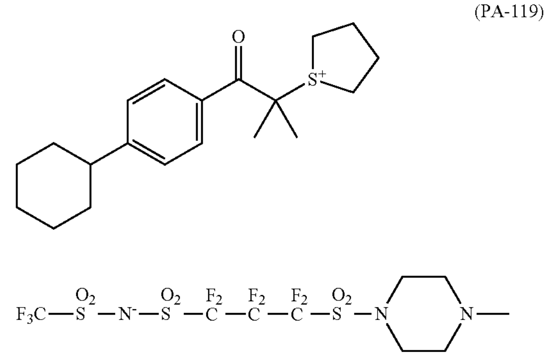
(PA-120)
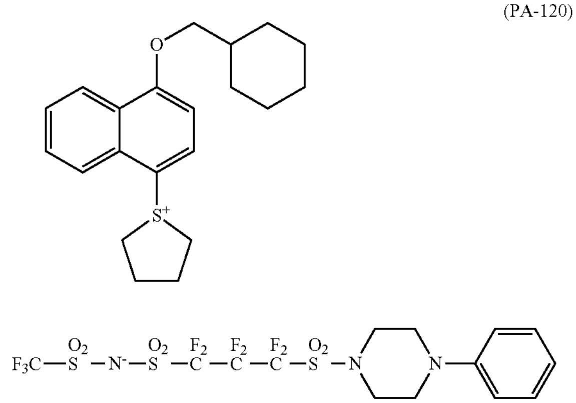
(PA-121)
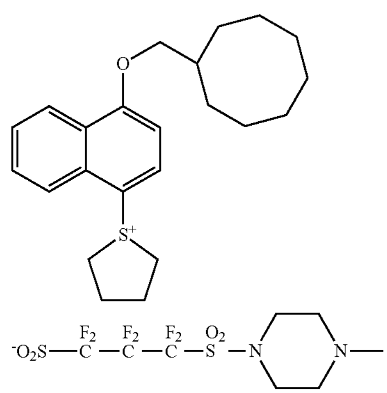
(PA-122)
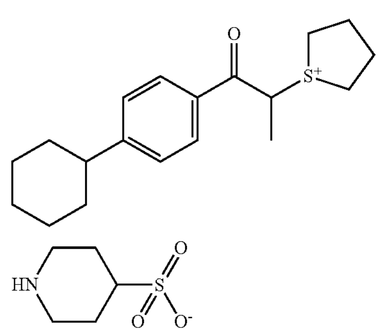

-continued
(PA-123)
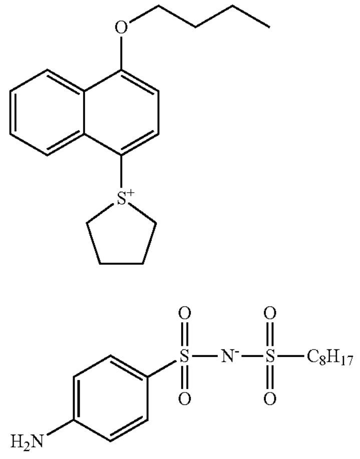
(PA-124)
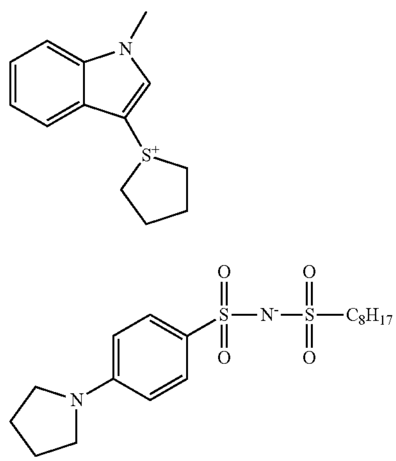
(PA-125)
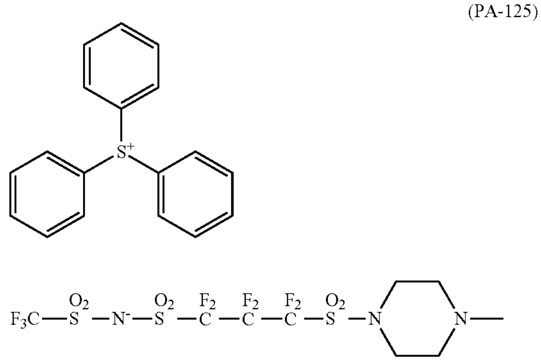
(PA-126)
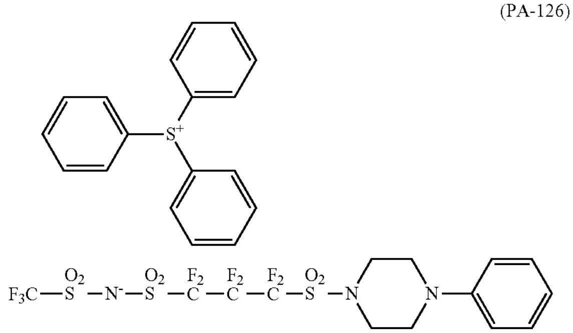
-continued
(PA-127)
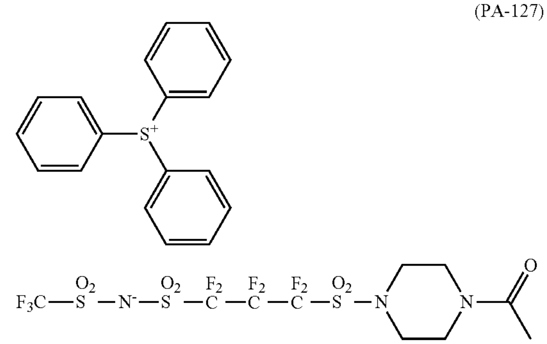
(PA-128)
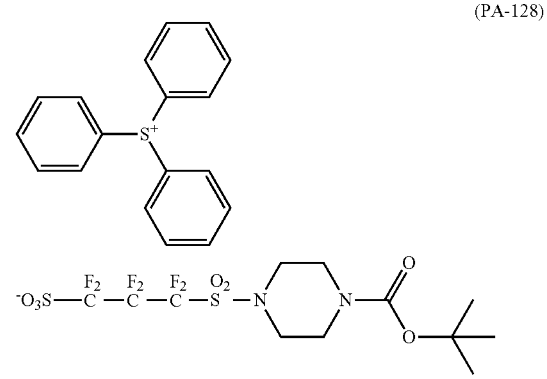
(PA-129)
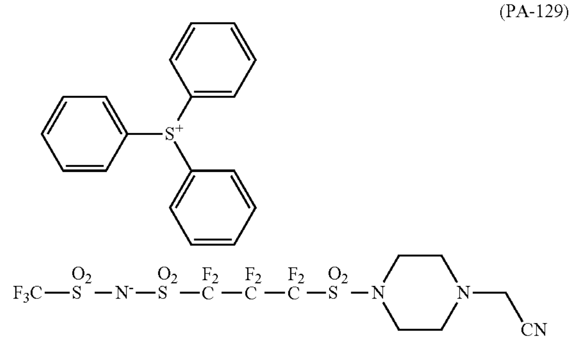
(PA-130)
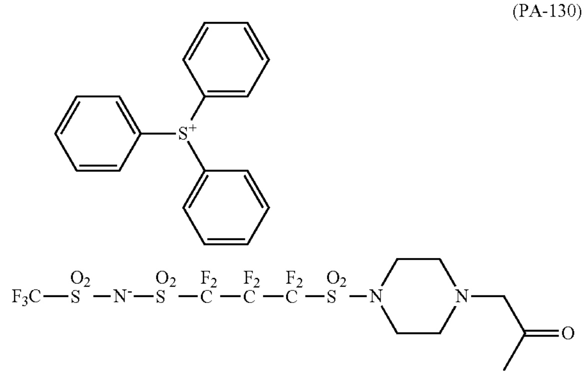
(PA-131)
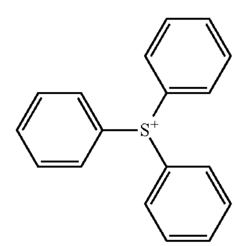

-continued
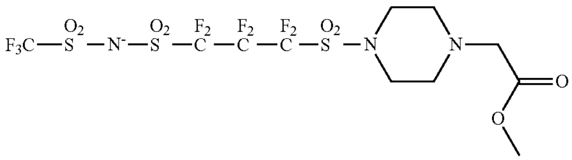
(PA-132)
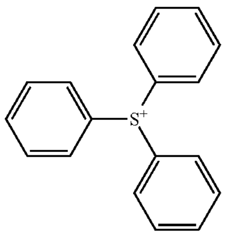
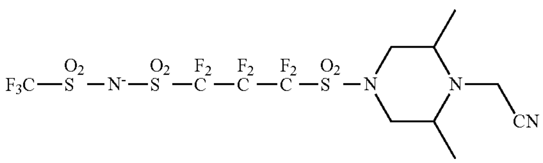
(PA-133)
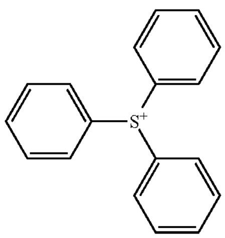
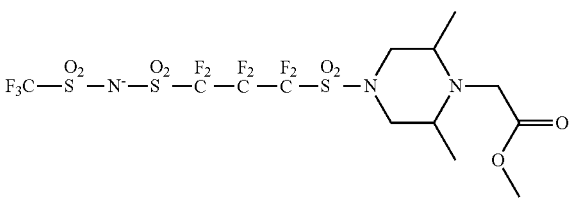
(PA-134)
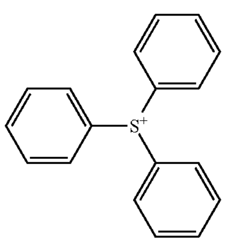
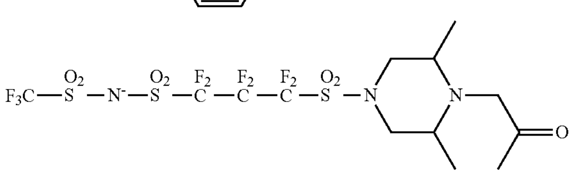
(PA-135)
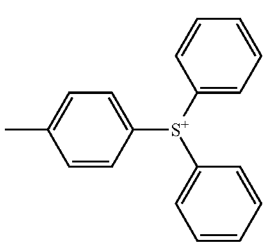
-continued
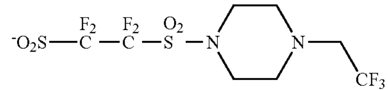
(PA-136)
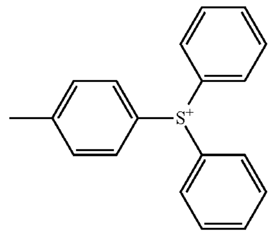
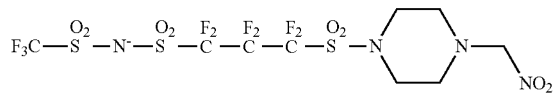
(PA-137)
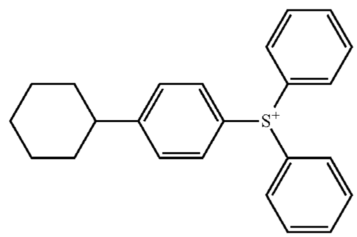
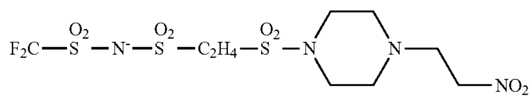
(PA-138)
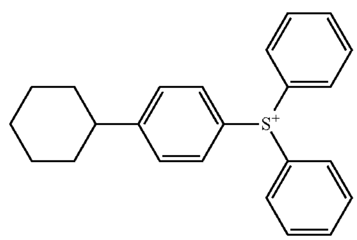
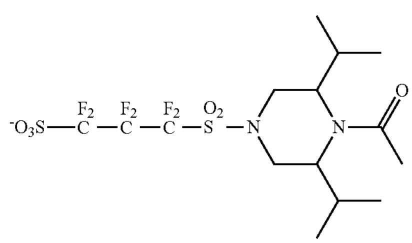
(PA-139)
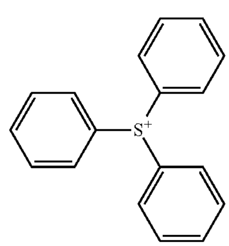

-continued

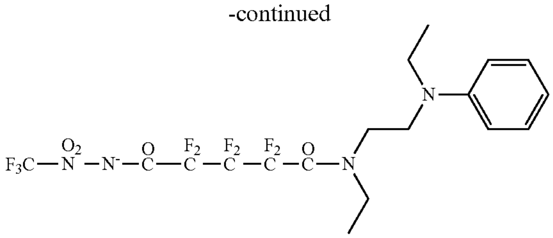

(PA-140)

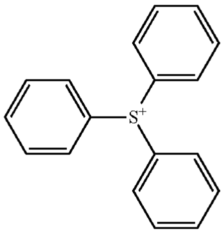

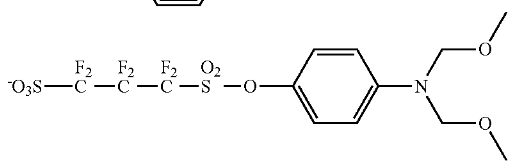

(PA-141)

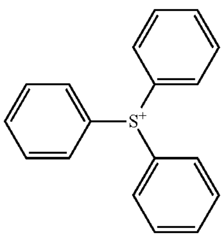

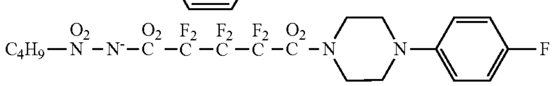

(PA-142)

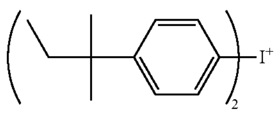

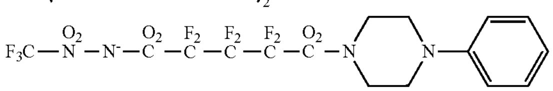

(PA-143)

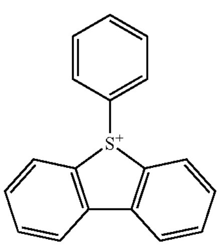

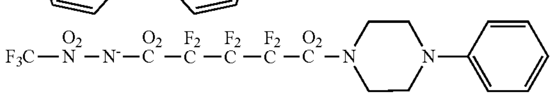

(PA-144)

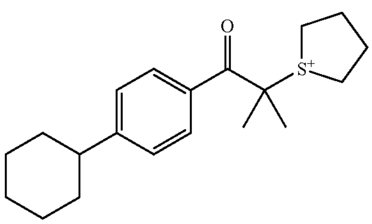

-continued

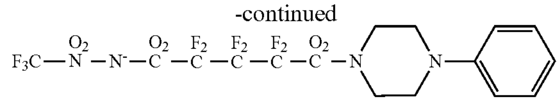

(PA-145)

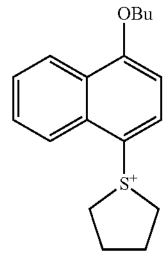

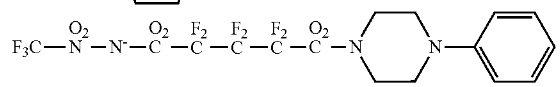

(PA-146)

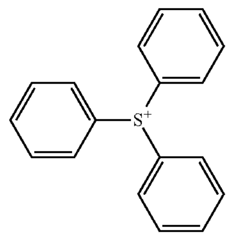

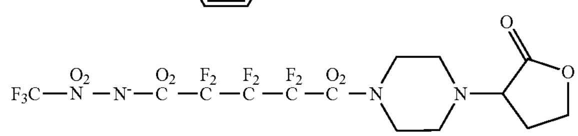

(PA-147)

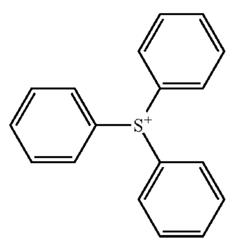

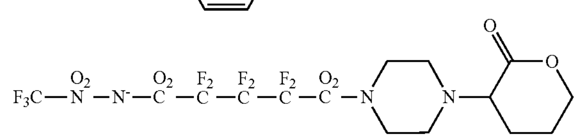

(PA-148)

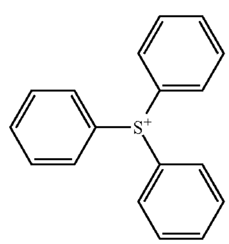

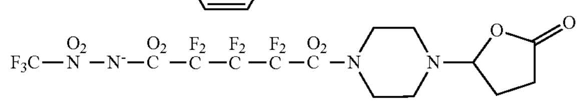

These compounds can be easily synthesized using a general sulfonic acid esterification reaction or sulfonamidation reaction. For example, the compound may be obtained by a method of selectively reacting one sulfonyl halide moiety of a bis-sulfonyl halide compound with an amine, alcohol or the like containing a partial structure represented by the general formula (PA-II) or (PA-III) to form a sulfonamide bond or a sulfonic acid ester bond and then hydrolyzing the other sulfonyl halide moiety, or a method of ring-opening a cyclic sulfonic anhydride by an amine or alcohol containing a partial structure represented by the general formula (PA-II). The amine or alcohol containing a partial structure represented by the general formula (PA-II) or (PA-III) can be synthesized by reacting an amine or an alcohol with an anhydride (for example, $(R'O_2C)_2O$ or $(R'SO_2)_2O$) or an acid chloride compound (for example, $R'O_2CCl$ or $R'\ SO_2Cl$) (R' is, for example, a methyl group, an n-octyl group or a trifluoromethyl group) under basic conditions. In particular, the synthesis may be performed in accordance with synthesis examples and the like in JP2006-330098A.

The molecular weight of the compound (C) is preferably from 500 to 1000.

The actinic ray-sensitive or radiation-sensitive resin composition in the invention may or may not contain the compound (C), but in the case where the composition contains the compound (C), the content thereof is preferably from 0.1 to 20% by mass, and more preferably from 0.1 to 10% by mass, based on the solid content of the actinic ray-sensitive or radiation-sensitive resin composition.

[4-2] Basic Compound (C')

The actinic ray-sensitive or radiation-sensitive resin composition in the invention may contain a basic compound (C') in order to reduce the change in performance with aging from exposure to heating. Here, the basic compound (C') is a basic compound other than the compound (G) (that is, having neither a fluorine atom nor a silicon atom), and other than the compound (C).

Preferred examples of the basic compound (C') include compounds having structures represented by the following formulae (A) to (E).

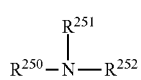

(A)

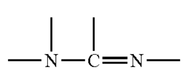

(B)

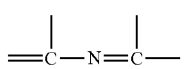

(C)

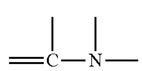

(D)

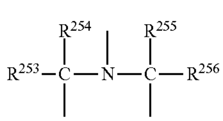

(E)

In the general formulae (A) and (E), $R^{250}$, $R^{251}$, and $R^{252}$ each independently represent a hydrogen atom, an alkyl group, a cycloalkyl group, an aryl group, or a heteroaryl group.

$R^{253}$, $R^{254}$, $R^{255}$, and $R^{256}$ each independently represent an alkyl group or a cycloalkyl group.

In the structure represented by the general formula (A), $R^{251}$ and $R^{252}$ may be bonded with each other to form a ring.

In the structures represented by the general formulae (B) to (D), two or more out of the bonds from the carbon atom and the bonds from the nitrogen atom may be bonded with each other to form a ring.

In the structure represented by the general formula (E), two or more out of $R^{253}$, $R^{254}$, $R^{255}$, and $R^{256}$, the bonds from the carbon atom and the bonds from the nitrogen atom may be bonded with each other to form a ring.

Specific examples of $R^{251}$ and $R^{252}$ in the general formula (A) are the same as the definition and specific examples of $R^{201}$ and $R^{202}$ in the structure represented by the general formula (A) described above for the compound (G-1).

Specific examples of $R^{253}$, $R^{254}$, $R^{255}$, and $R^{256}$ in the general formula (E) are the same as specific examples of $R^{203}$, $R^{204}$, $R^{205}$, and $R^{206}$ in the structure represented by the general formula (A) described above for the compound (G-1).

In the structures represented by the general formulae (A) to (E), specific examples of the ring which may be formed by two or more members out of the groups and bonds are the same as those described in the compound (G-1).

Furthermore, in the structures represented by the general formulae (A) to (E), the groups and the rings which may be formed by the mutual bonding of two or more members out of the groups and bonds may further have a substituent, and specific examples of the substituent are the same as specific examples of the substituent which $R^{201}$ and $R^{202}$ may further have, described for the structure represented by the general formula (A) of the compound (G-1).

The alkyl having a substituent or the cycloalkyl group having a substituent as $R^{250}$ to $R^{256}$ is preferably an aminoalkyl group having 1 to 20 carbon atoms, an aminocycloalkyl group having 3 to 20 carbon atoms, a hydroxyalkyl group having 1 to 20 carbon atoms, or a hydroxycycloalkyl group having 3 to 20 carbon atoms.

Incidentally, these groups may contain an oxygen atom, a sulfur atom, or a nitrogen atom in the alkyl chain.

Preferred examples of the basic compound (C') include guanidine, aminopyrrolidine, pyrazole, pyrazoline, piperazine, aminomorpholine, aminoalkylmorpholine and piperidine, and these may have a substituent. More preferred examples of the compound include a compound having an imidazole structure, a diazabicyclo structure, an onium hydroxide structure (particularly preferably a tetraalkylammonium hydroxide such as tetrabutylammonium hydroxide), an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Furthermore, the compound may be at least one kind of a nitrogen-containing compound selected from the group consisting of a phenoxy group-containing amine compound, a phenoxy group-containing ammonium salt compound, a sulfonic acid ester group-containing amine compound and a sulfonic acid ester group-containing ammonium salt compound. Examples of these compounds include, but are not limited to, Compounds (C1-1) to (C3-3) illustrated in paragraph [0066] in the specification of US Patent App. No. 2007/0224539.

The compound capable of increasing the basicity by the action of an acid includes, for example, a compound represented by the following general formula (F). Incidentally, the compound represented by the following general formula (F) exhibits an effective basicity in the system as a result of elimination of the group which eliminates by the action of an acid.

(F)

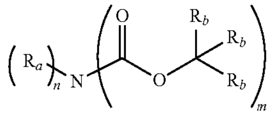

In the general formula (F), Ra's each independently represent a hydrogen atom, an alkyl group, a cycloalkyl group, an aryl group, or an aralkyl group, and when n=2, two Ra's may be the same or different, and two Ra's may be bonded with each other to form a divalent heterocyclic hydrocarbon group (preferably having 20 or less carbon atoms) or a derivative thereof;

Rb's each independently represent a hydrogen atom, an alkyl group, a cycloalkyl group, an aryl group, or an aralkyl group, and at least two Rb's may be bonded to each other to form an alicyclic hydrocarbon group, an aromatic hydrocarbon group, a heterocyclic hydrocarbon group, or a derivative thereof; and n represents an integer of 0 to 2, m represents an integer of 1 to 3, and n+m=3.

In the general formula (F), each of the alkyl group, the cycloalkyl group, the aryl group, and the aralkyl group represented by Ra and Rb may be substituted with a functional group such as a hydroxyl group, a cyano group, an amino group, a pyrrolidino group, a piperidino group, a morpholino group, and an oxo group, an alkoxy group, or a halogen atom.

Examples of the alkyl group, the cycloalkyl group, the aryl group, and the aralkyl group (each of these alkyl, cycloalkyl, aryl and aralkyl groups may be substituted with the above-described functional group, an alkoxy group or a halogen atom) of Ra and Rb include:

a group derived from a linear or branched alkane such as methane, ethane, propane, butane, pentane, hexane, heptane, octane, nonane, decane, undecane, and dodecane, or a group where the group derived from such an alkane is substituted with one or more kinds of or one or more groups of cycloalkyl groups such as a cyclobutyl group, a cyclopentyl group, and a cyclohexyl group;

a group derived from a cycloalkane such as cyclobutane, cyclopentane, cyclohexane, cycloheptane, cyclooctane, norbornane, adamantane and noradamantane, or a group where the group derived from such a cycloalkane is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group;

a group derived from an aromatic compound such as benzene, naphthalene and anthracene, or a group where the group derived from such an aromatic compound is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from such a heterocyclic compound is substituted with one or more kinds of or one or more groups of linear or branched alkyl groups or aromatic compound-derived groups; a group where the group derived from a linear or branched alkane or the group derived from a cycloalkane is substituted with one or more kinds of or one or more groups of aromatic compound-derived groups such as phenyl group, a naphthyl group, and an anthracenyl group; and a group where the substituent above is substituted with a functional group such as a hydroxyl group, a cyano group, an amino group, a pyrrolidino group, a piperidino group, a morpholino group, and an oxo group.

Furthermore, examples of the divalent heterocyclic hydrocarbon group (preferably having 1 to 20 carbon atoms) formed by the mutual bonding of Ra's or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline, and 1,5,9-triazacyclododecane, and a group where the group derived from such a heterocyclic compound is substituted with one or more kinds of or one or more groups of linear or branched alkane-derived groups, cycloalkane-derived groups, aromatic compound-derived groups, heterocyclic compound-derived groups and functional groups such as a hydroxyl group, a cyano group, an amino group, a pyrrolidino group, a piperidino group, a morpholino group, and an oxo group.

Particularly preferred specific examples of the nitrogen-containing organic compound having a group which eliminates by the action of an acid in the invention are shown below, but the invention is not limited thereto.

(D-1)

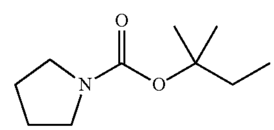

(D-2)

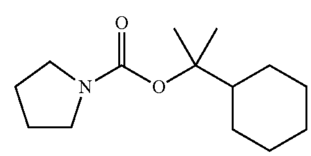

(D-3)

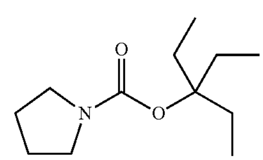

(D-4)

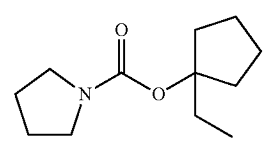

(D-5)

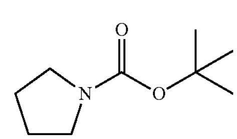

-continued
(D-6)
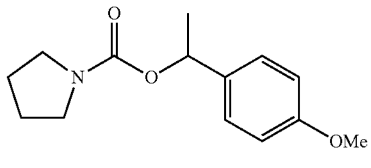
(D-7)
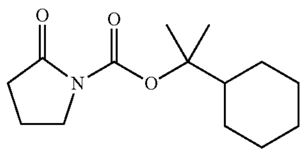
(D-8)
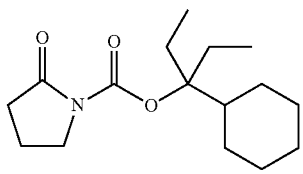
(D-9)
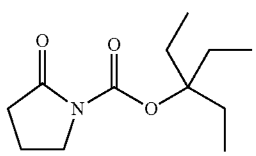
(D-10)
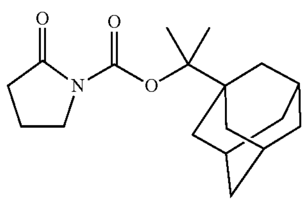
(D-11)
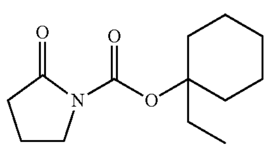
(D-12)
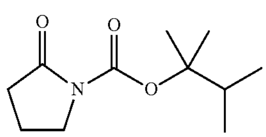
(D-13)
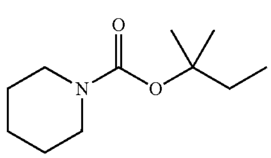
(D-14)
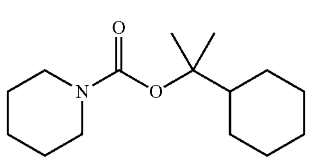
-continued
(D-15)
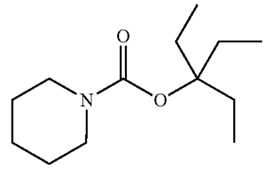
(D-16)
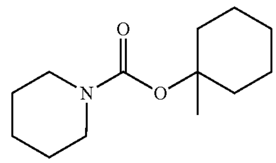
(D-17)
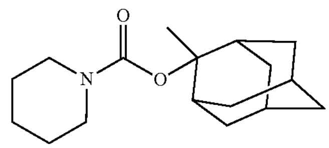
(D-18)
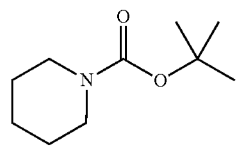
(D-19)
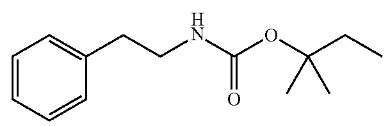
(D-20)
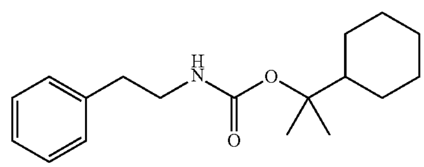
(D-21)
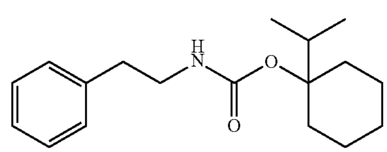
(D-22)
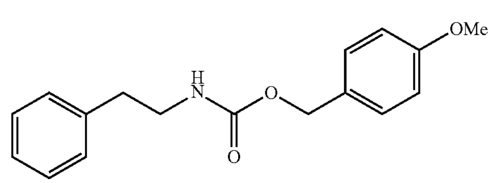
(D-23)
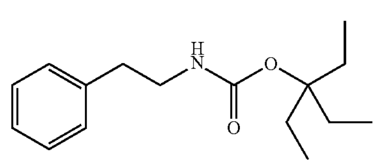

-continued
(D-24)
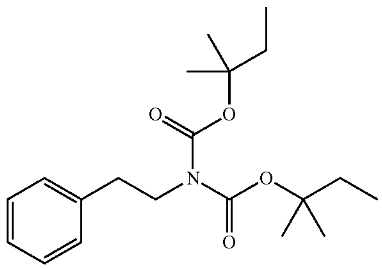
(D-25)
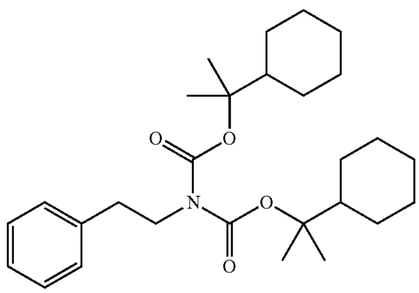
(D-26)
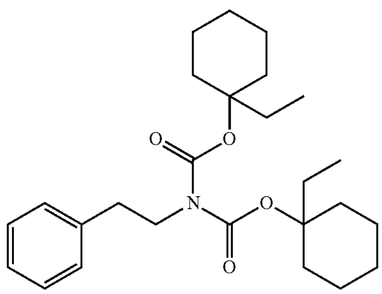
(D-27)
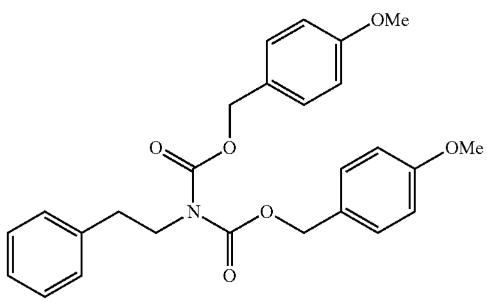
(D-28)
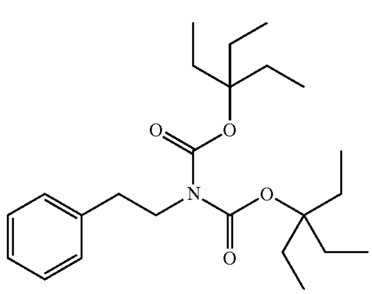
-continued
(D-29)
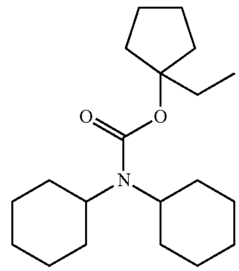
(D-30)
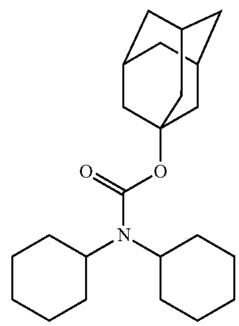
(D-31)
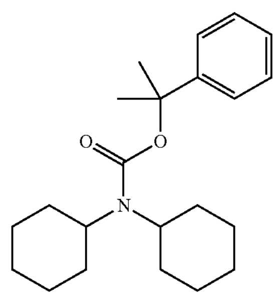
(D-32)
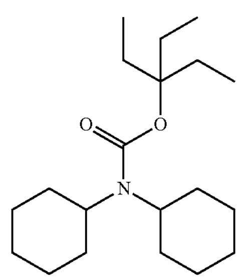
(D-33)
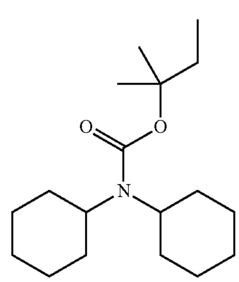

(D-34)
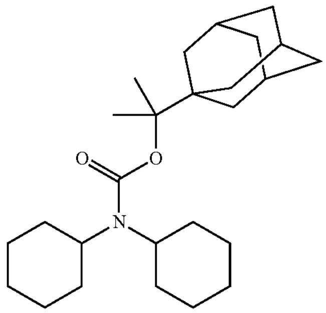
(D-35)
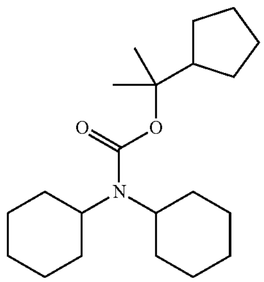
(D-36)
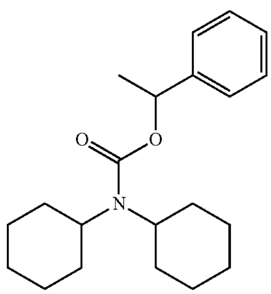
(D-37)
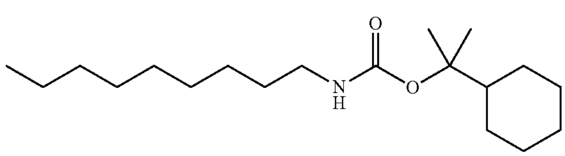
(D-38)
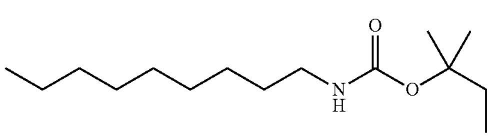
(D-39)
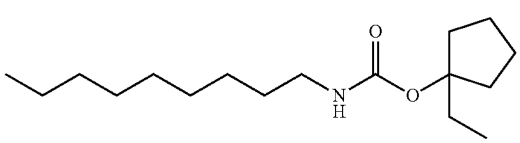
(D-40)
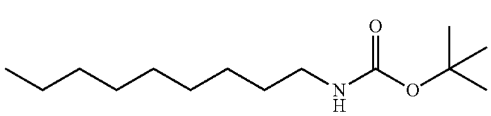
(D-41)
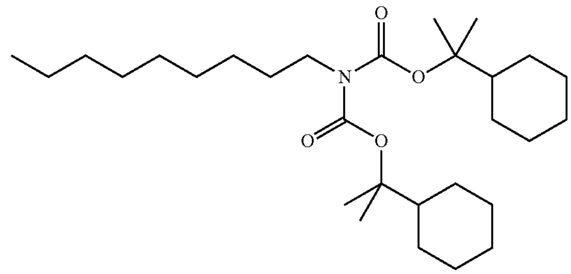
(D-42)
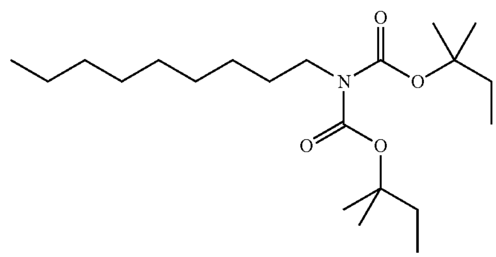
(D-43)
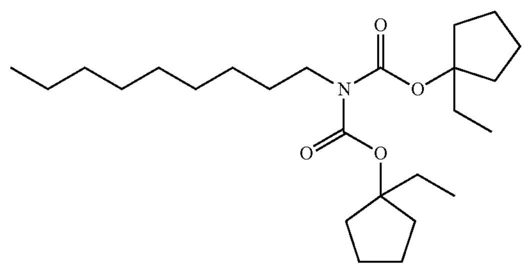
(D-44)
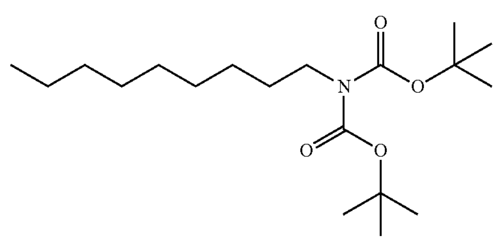
(D-45)
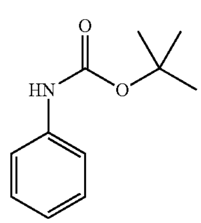
(D-46)
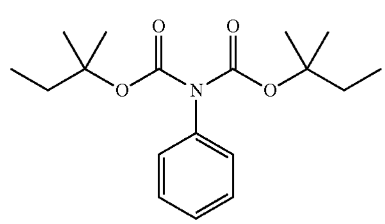

-continued (D-47)

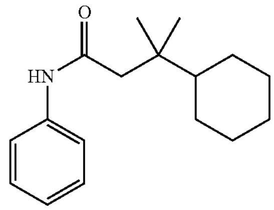

(D-48)

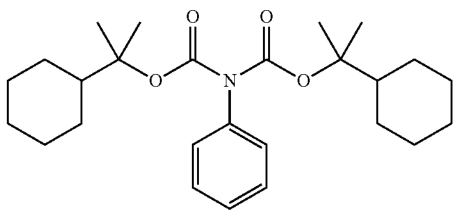

(D-49)

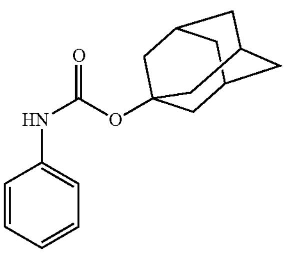

(D-50)

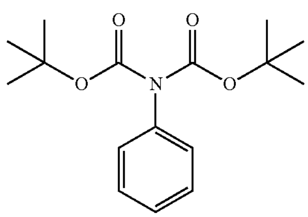

(D-51)

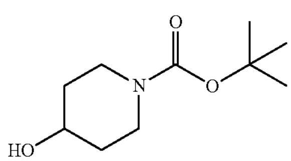

(D-52)

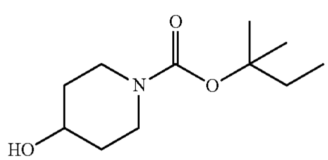

(D-53)

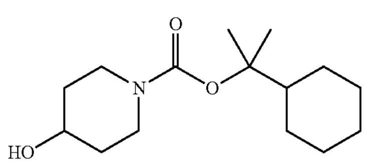

(D-54)

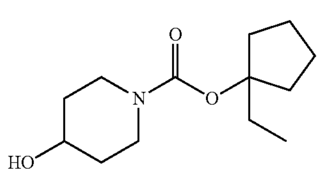

-continued (D-55)

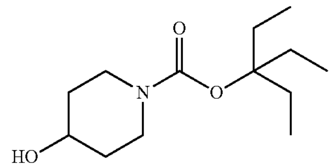

The compound represented by the general formula (F) can be synthesized, for example, from an amine by the method described in Protective Groups in Organic Synthesis, $4^{th}$ edition, and the like. In particular, it can also be synthesized in accordance with, for example, a method described in JP2009-199021A that is a general method.

The molecular weight of the basic compound (C') other than the compound (G) is preferably from 250 to 2000, and more preferably from 400 to 1000. From the viewpoints of reduction of LWR and the local pattern dimensional uniformity, the molecular weight of the basic compound (C') is preferably 400 or more, more preferably 500 or more, and still more preferably 600 or more.

The basic compound (C') may be used in combination with the compound (C), or may be used singly or in combination of two or more kinds thereof.

The actinic ray-sensitive or radiation-sensitive resin composition in the invention may or may not contain the basic compound (C'), but in the case of containing the basic compound (C'), the amount of the basic compound (C') used is usually from 0.001 to 10% by mass, and preferably from 0.01 to 5% by mass, based on the solid content of the actinic ray-sensitive or radiation-sensitive resin composition.

The ratio between the acid generator and the basic compound used in the composition is preferably a ratio of acid generator/basic compound (molar ratio)=2.5 to 300. That is, the molar ratio is preferably 2.5 or more from the viewpoint of sensitivity and resolution, and preferably 300 or less from the viewpoint of suppressing the reduction in resolution due to thickening of the resist pattern with aging after exposure until heat treatment. The acid generator/basic compound (molar ratio) is more preferably from 5.0 to 200, and still more preferably from 7.0 to 150.

Furthermore, the ratio between the compound (G) and the basic compound is preferably a ratio of compound (G)/basic compound (molar ratio)=0.25 to 300, and more preferably 0.5 to 150.

[5] Solvent (D)

Examples of the solvent which can be used at the time of preparing the actinic ray-sensitive or radiation-sensitive resin composition in the invention include an organic solvent such as alkylene glycol monoalkyl ether carboxylate, alkylene glycol monoalkyl ether, alkyl lactate, alkyl alkoxypropionate, cyclic lactone (preferably having 4 to 10 carbon atoms), monoketone compound (preferably having 4 to 10 carbon atoms) which may contain a ring, alkylene carbonate, alkyl alkoxyacetate, and alkyl pyruvate.

Specific examples of these solvents are the same as those described in paragraphs [0441] to [0455] of US Patent App. No. 2008/0187860.

In the invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably, for example, an alkylene glycol monoalkyl ether or an alkyl lactate, more preferably propylene glycol monomethyl ether (PGME, alternative name, 1-methoxy-2-propanol), or ethyl lactate. Further, the solvent not containing a hydroxyl group is preferably, for example, an alkylene glycol monoalkyl ether acetate, an alkyl alkoxypropionate, a monoketone compound which may contain a ring, a cyclic lactone or an alkyl acetate, more preferably propylene glycol monomethyl ether acetate (PGME, alternative name, 1-methoxy-2-propanol), ethyl ethoxy propionate, 2-heptanone, γ-butyrolactone, cyclohexanone, or butyl acetate, and most preferably propylene glycol monomethyl ether acetate, ethyl ethoxypropionate or 2-heptanone.

The mixing ratio (by mass) of the solvent containing a hydroxyl group to the solvent not containing a hydroxyl group is from 1/99 to 99/1, preferably from 10/90 to 90/10, and more preferably from 20/80 to 60/40. A mixed solvent in which the solvent not containing a hydroxyl group is contained in an amount of 50% by mass or more is particularly preferred in view of coating uniformity.

The solvent is preferably a mixed solvent of two or more kinds of solvents containing propylene glycol monomethyl ether acetate, and more preferably a solvent of propylene glycol mono methyl ether acetate alone, or a mixed solvent of two or more kinds, containing propylene glycol mono methyl ether acetate.

[6] Hydrophobic Resin (E)

The actinic ray-sensitive or radiation-sensitive resin composition in the invention may contain a hydrophobic resin containing at least one of a fluorine atom and a silicon atom (hereinafter also referred to as a "hydrophobic resin (E)" or simply a "resin (E)"), particularly when the composition is applied to immersion exposure (provided that the resin (E) is not equivalent to the resin (G)). By this, the hydrophobic resin (E) is unevenly distributed to the surface layer of the film and when the immersion medium is water, the static/dynamic contact angle on the resist film surface for water as well as the followability of liquid for liquid immersion can be enhanced.

The hydrophobic resin (E) is, as described above, unevenly distributed to the interface but unlike a surfactant, need not have necessarily a hydrophilic group in the molecule and may not contribute to uniform mixing of polar/nonpolar substances.

The hydrophobic resin (E) typically contains a fluorine atom and/or a silicon atom. Such a fluorine atom and/or a silicon atom in the hydrophobic resin (E) may be contained in the main chain of the resin or contained in the side chain.

In the case where the hydrophobic resin (E) contains a fluorine atom, the resin preferably contains, as the fluorine atom-containing partial structure, a fluorine atom-containing alkyl group, a fluorine atom-containing cycloalkyl group or a fluorine atom-containing aryl group.

The fluorine atom-containing alkyl group is a linear or branched alkyl group with at least one hydrogen atom being substituted for by a fluorine atom. This alkyl group preferably has 1 to 10 carbon atoms, and more preferably 1 to 4 carbon atoms. The fluorine atom-containing alkyl group may further have a substituent other than fluorine atom.

The fluorine atom-containing cycloalkyl group is a monocyclic or polycyclic cycloalkyl group with at least one hydrogen atom being substituted for by a fluorine atom. This fluorine atom-containing cycloalkyl group may further have a substituent other than fluorine atom.

The fluorine atom-containing aryl group is an aryl group with at least one hydrogen atom being substituted for by a fluorine atom. Examples of this aryl group include a phenyl group and a naphthyl group. The fluorine atom-containing aryl group may further have a substituent other than fluorine atom.

Preferred examples of the fluorine atom-containing alkyl group, fluorine atom-containing cycloalkyl group and fluorine atom-containing aryl group include the groups represented by the general formulae (F2) to (F4) described in the resin (G) above.

Specific examples of the repeating unit containing a fluorine atom are the same as those exemplified in the resin (G) above.

In the case where the hydrophobic resin (E) contains a silicon atom, the resin (E) preferably contains an alkylsilyl structure or a cyclic siloxane structure, as the silicon atom-containing partial structure. The alkylsilyl structure is preferably a trialkylsilyl group-containing structure.

Preferred examples of the alkylsilyl structure and cyclic siloxane structure include the groups represented by the general formulae (CS-1) to (CS-3) described in the resin (G) above.

Specific examples of the repeating unit having a group represented by the general formulae (CS-1) to (CS-3) are the same as those exemplified in the resin (G).

The hydrophobic resin (E) may further contain at least one group selected from the group consisting of the following (x) to (z):

(x) an acid group, (y) a group having a lactone structure or a sultone structure, an acid anhydride, or an acid imide group, and (z) a group capable of decomposing by the action of an acid.

Examples of the acid group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred acid groups include a fluorinated alcohol group (preferably a hexafluoroisopropanol group), a sulfonimide group, and a bis(alkylsulfonyl)methylene group.

Examples of the repeating unit having the acid group (x) include a repeating unit in which an acid group is directly bonded to the main chain of the resin, such as a repeating unit by an acrylic acid or a methacrylic acid, and a repeating unit in which an acid group is bonded to the main chain of the resin through a linking group. Alternatively, in this repeating unit, an acid group is preferably introduced into the terminal of the resin by using a polymerization initiator having acid group or a chain transfer agent at the polymerization. The repeating unit having the acid group (x) may have at least one of a fluorine atom and a silicon atom.

The content of the repeating unit having the acid group (x) is preferably from 1 to 50 mol %, more preferably from 3 to 35 mol %, still more preferably from 5 to 20 mol %, based on all the repeating units in the hydrophobic resin (E).

Specific examples of the repeating unit having an acid group (x) are shown below. In the formulae, Rx represents a hydrogen atom, $CH_3$, $CF_3$, or $CH_2OH$.

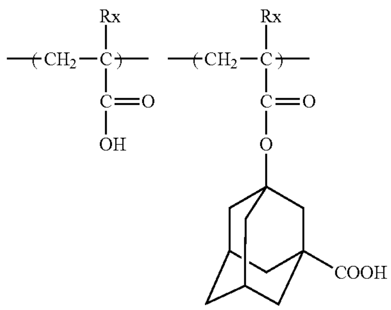
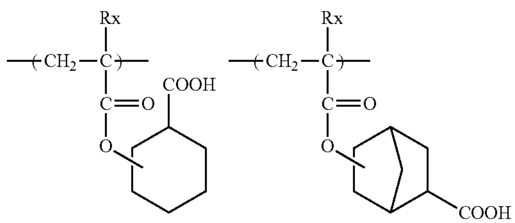
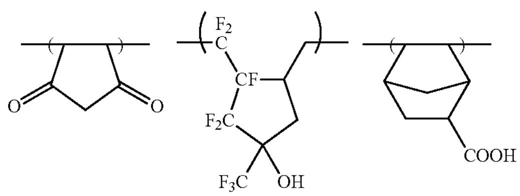
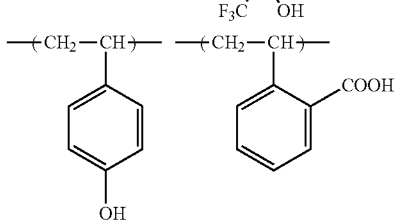
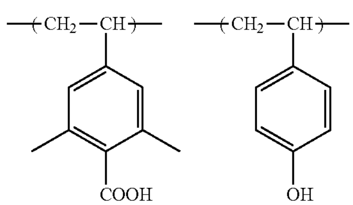
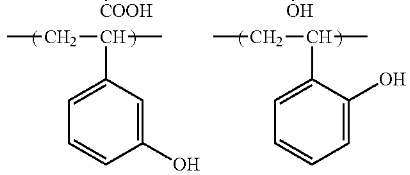
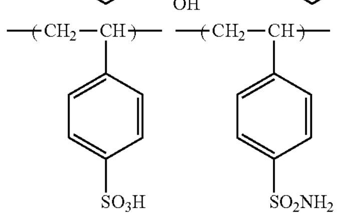
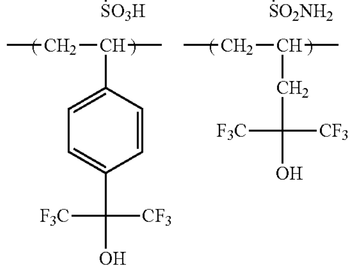
-continued
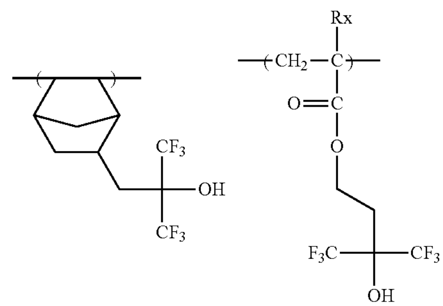
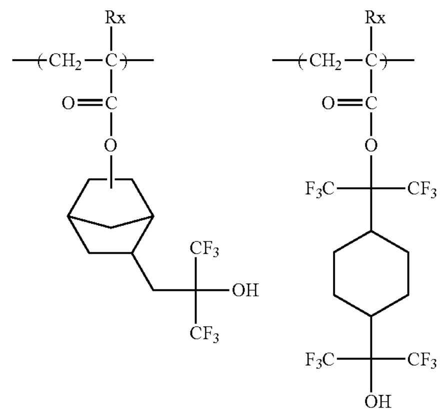
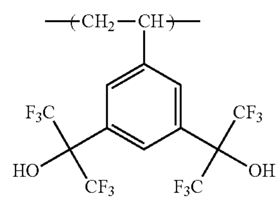
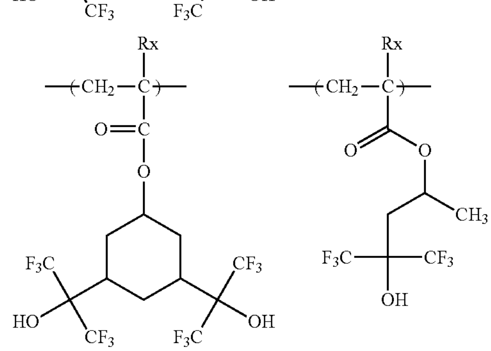
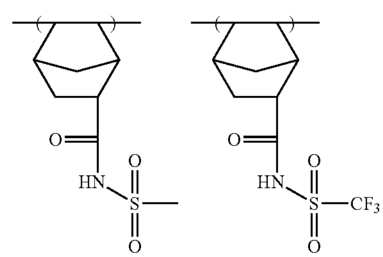
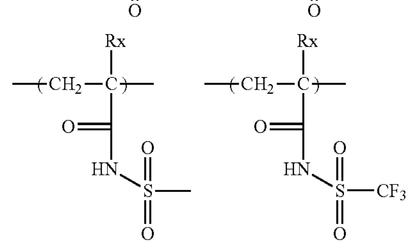

-continued

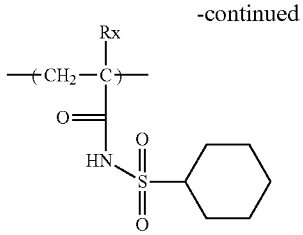

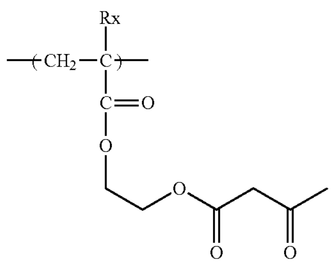

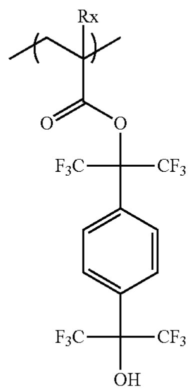

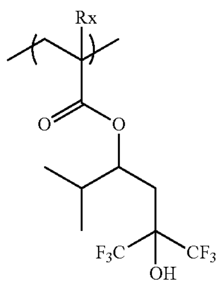

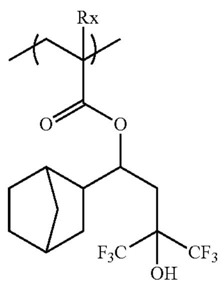

As the group having a lactone structure or a sultone structure, a group having a lactone structure or a sultone structure is particularly preferred as the acid anhydride group or the acid imide group (y).

The repeating unit having such a group is a repeating unit in which the group is directly bonded to the main chain of the resin, such as a repeating unit by an acrylic acid ester or a methacrylic acid ester. This repeating unit may also be a repeating unit in which the group is bonded to the main chain of the resin through a linking group. Alternatively, in this repeating unit, the group may be introduced into the terminal of the resin by using a polymerization initiator or chain transfer agent containing the group at the polymerization.

Examples of the repeating unit having a group having a lactone structure or a sultone structure are the same as those of the repeating unit having a lactone structure or a sultone structure described above in the paragraph of the acid-decomposable resin (P).

The content of the repeating unit having a group having a lactone structure or a sultone structure, an acid group, or an acid imide group is preferably from 1 to 100 mol %, more preferably from 3 to 98 mol %, and still more preferably from 5 to 95 mol %, based on all the repeating units in the hydrophobic resin.

In the hydrophobic resin (E), examples of the repeating unit having a group capable of decomposing by the action of an acid (z) include those described above for the repeating unit having an acid-decomposable group in the resin (P). The repeating unit having a group capable of decomposing by the action of an acid (z) may have at least one of a fluorine atom and a silicon atom. In the hydrophobic resin (E), the content of the repeating unit having a group capable of decomposing by the action of an acid (z) is preferably from 1 to 80 mol %, more preferably from 10 to 80 mol %, and still more preferably from 20 to 60 mol %, based on all the repeating units in the resin (E).

The hydrophobic resin (E) may also contain the repeating unit represented by the general formula (III') or (CII-AB) described in the resin (G).

Specific examples of the repeating unit represented by the general formula (III') or (CII-AB) include those exemplified in the resin (G).

In the case where the hydrophobic resin (E) contains the repeating unit represented by the general formula (III') or (CII-AB), the amount of the repeating unit is preferably from 1 to 100 mol %, more preferably from 10 to 90 mol %, and still more preferably from 30 to 70 mol %, based on all the repeating resins constituting the hydrophobic resin (E).

In the case where the hydrophobic resin (E) contains a fluorine atom, the content of the fluorine atoms is preferably from 5 to 80% by mass, and more preferably from 10 to 80% by mass, based on the weight average molecular weight of the hydrophobic resin (E). Further, the fluorine atom-containing repeating unit preferably occupies from 10 to 100 mol %, and more preferably from 30 to 100 mol %, based on all the repeating units contained in the hydrophobic resin (E).

In the case where the hydrophobic resin (E) contains a silicon atom, the content of the silicon atoms is preferably from 2 to 50% by mass, and more preferably from 2 to 30% by mass, based on the weight average molecular weight of the hydrophobic resin (E). Further, the silicon atom-containing repeating unit preferably occupies from 10 to 100 mol %, and more preferably from 20 to 100 mol %, based on all the repeating units in the hydrophobic resin (E).

The standard polystyrene-equivalent weight average molecular of the hydrophobic resin (E) is preferably from 1,000 to 100,000, more preferably from 1,000 to 50,000, and still more preferably from 2,000 to 15,000.

Furthermore, the hydrophobic resin (E) may be used singly or in combination of plural kinds thereof.

The content of the hydrophobic resin (E) in the composition is preferably from 0.01 to 10% by mass, more preferably from 0.05 to 8% by mass, and still more preferably from 0.1 to 5% by mass, based on the total solid contents of the composition of the invention.

In the hydrophobic resin (E), similarly to the resin (P), it is of course preferred that the content of impurities such as metals is small, but also, the content of residual monomers or oligomer components is preferably from 0.01 to 5% by mass, more preferably from 0.01 to 3% by mass, and still more preferably from 0.05 to 1% by mass. When these conditions are satisfied, an actinic ray-sensitive or radiation-sensitive resin composition free of extraneous substances in liquid or change with aging of sensitivity or the like can be obtained. Furthermore, from the viewpoint of resolution, resist profile, the side wall of a resist pattern, roughness, and the like, the molecular weight distribution (Mw/Mn, also referred to as "dispersity") is preferably in the range of 1 to 5, more preferably 1 to 3, and still more preferably 1 to 2.

As for the hydrophobic resin (E), various commercially available products may be used or the resin may be synthesized by an ordinary method (for example, radical polymerization). Examples of the general synthetic method include a batch polymerization method in which a monomer species and an initiator are dissolved in a solvent and heated so as to accomplish polymerization and a dropping polymerization method in which a solution of monomer species and initiator is added by dropwise addition to a heated solvent over a period of 1 to 10 hours. The dropping polymerization method is preferred.

The reaction solvent, the polymerization initiator, the reaction conditions (for example, temperature and concentration), and the purification method after reaction are the same as those described for the resin (P), but the concentration for the reaction is preferably from 30 to 50% by mass in the synthesis of the hydrophobic resin (E).

Specific examples of the hydrophobic resin (E) are shown below. Further, the molar ratio of the repeating units (corresponding to the respective repeating units starting from the left), the weight average molecular weight, and the dispersity (Mw/Mn) in the respective resins are shown in Table below.

(HR-1)

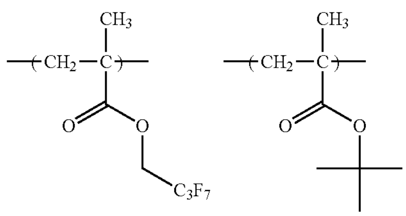

(HR-2)

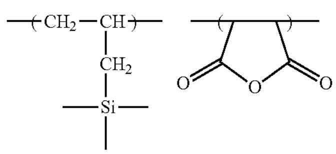

(HR-3)

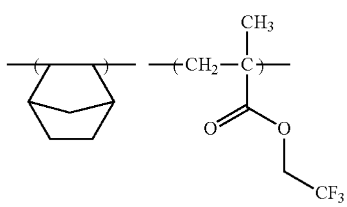

(HR-4)

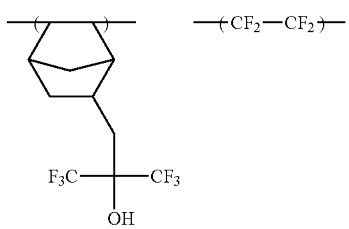

(HR-5)

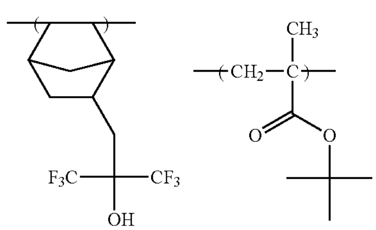

(HR-6)

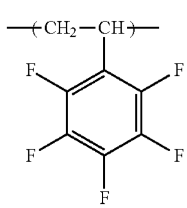

-continued (HR-7)

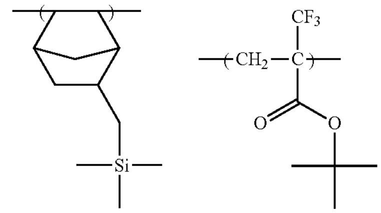

(HR-8)

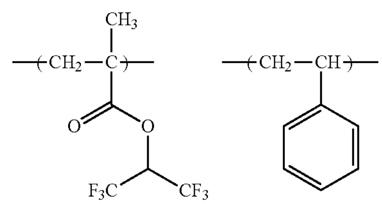

(HR-9)

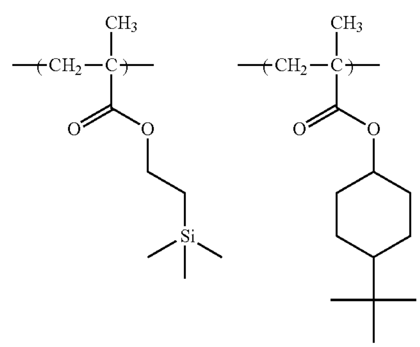

(HR-10)

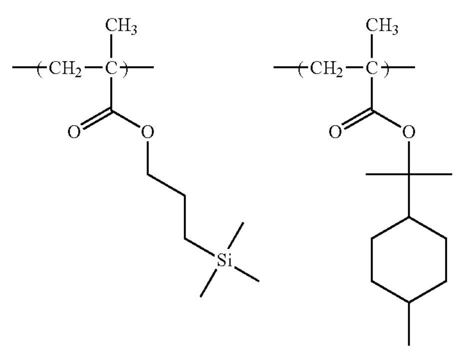

(HR-11)

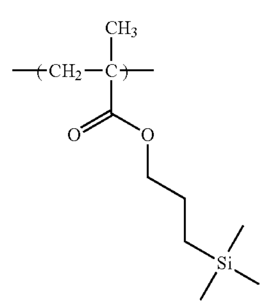

-continued
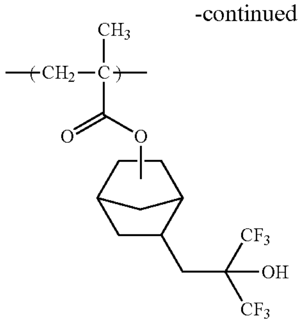
(HR-12)
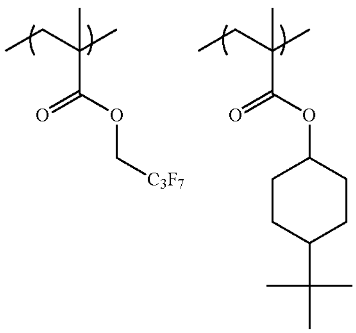
(HR-13)
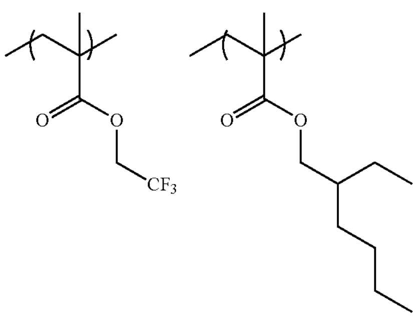
(HR-14)
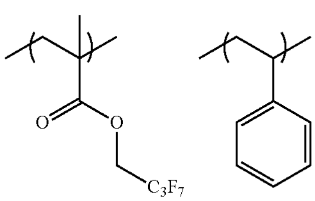
(HR-15)
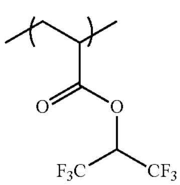
(HR-16)
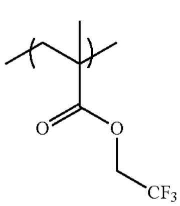
-continued
(HR-17)
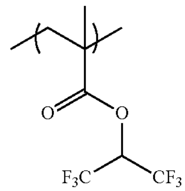
(HR-18)
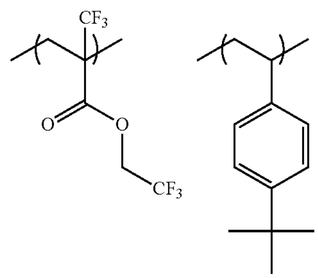
(HR-19)
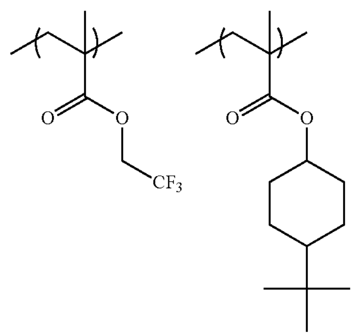
(HR-20)
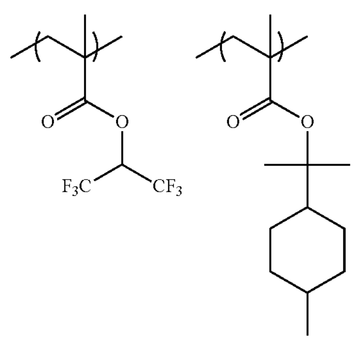
(HR-21)
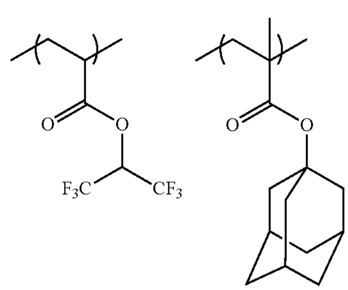
(HR-22)
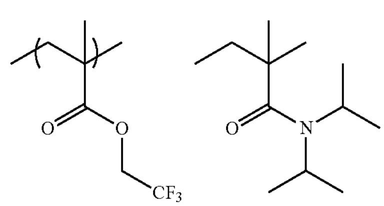

-continued
(HR-23)
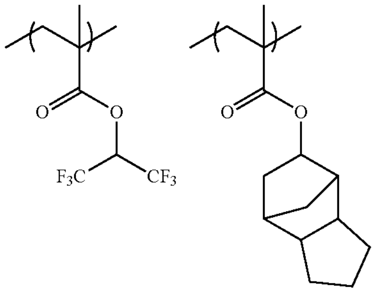
(HR-24)
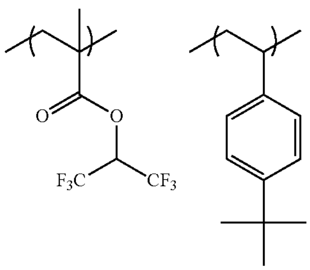
(HR-25)
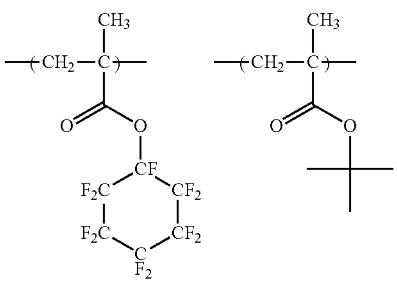
(HR-26)
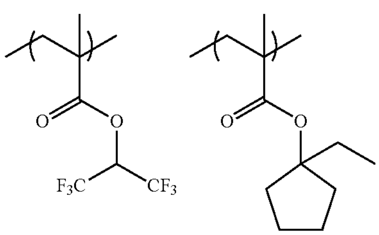
(HR-27)
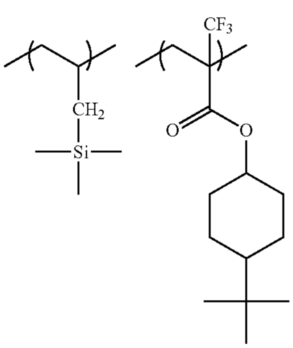
(HR-28)
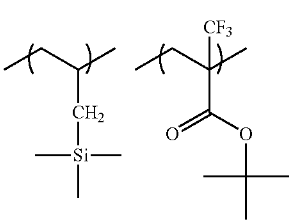
-continued
(HR-29)
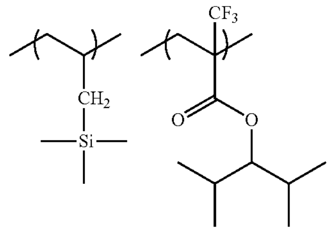
(HR-30)
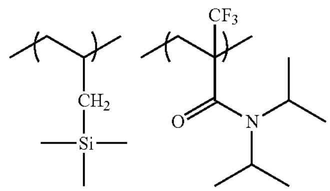
(HR-31)
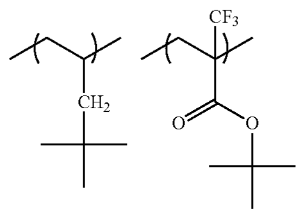
(HR-32)
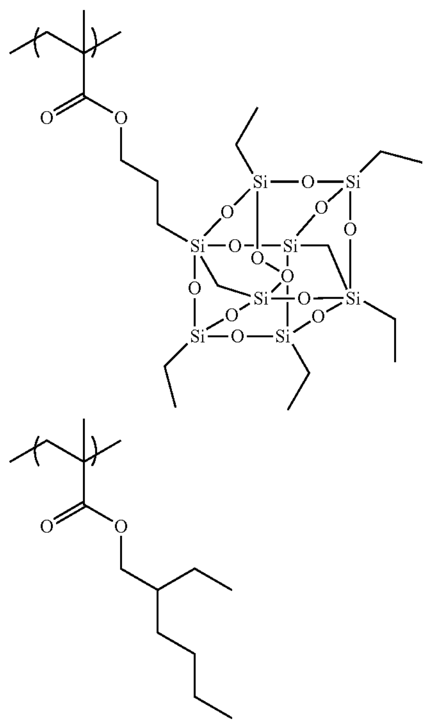
(HR-33)
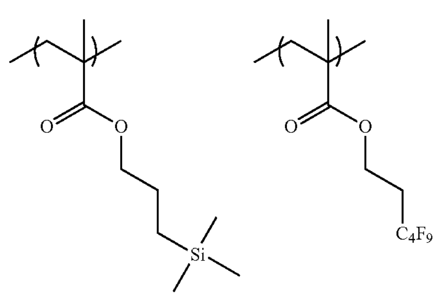

-continued
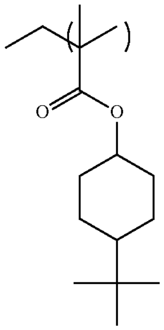
(HR-34)
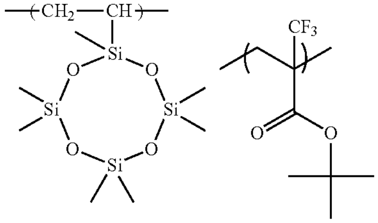
(HR-35)
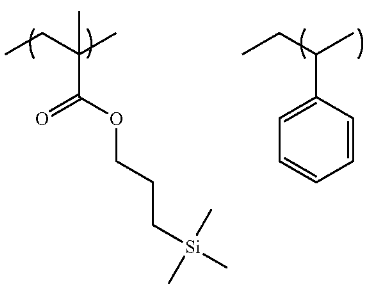
(HR-36)
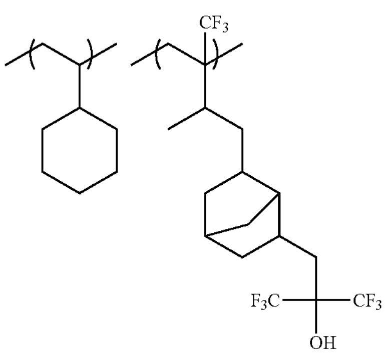
(HR-37)
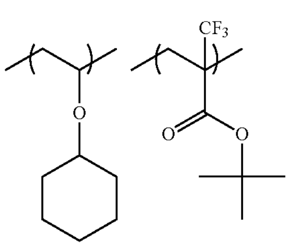
-continued
(HR-38)
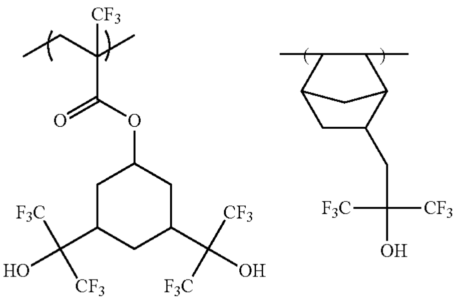
(HR-39)
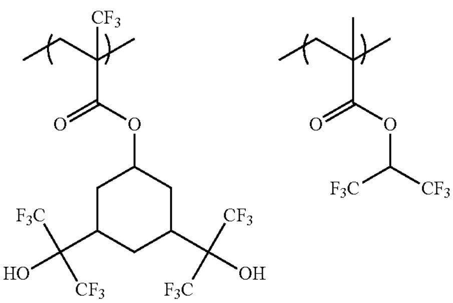
(HR-40)
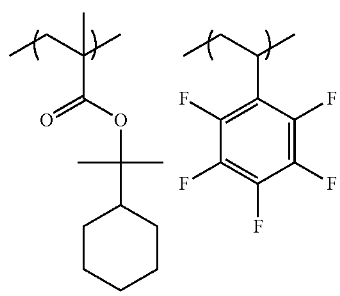
(HR-41)
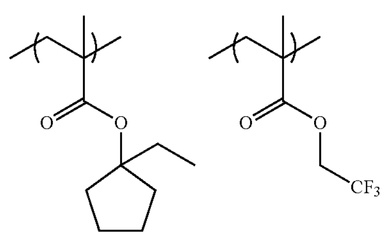
(HR-42)
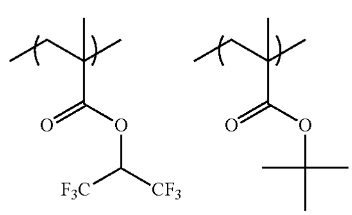

-continued
(HR-43)
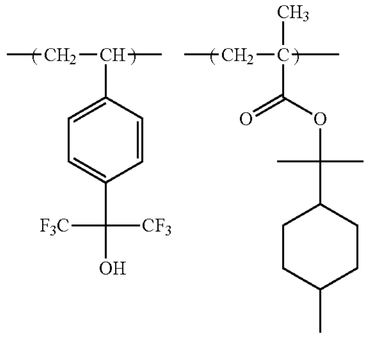
(HR-44)
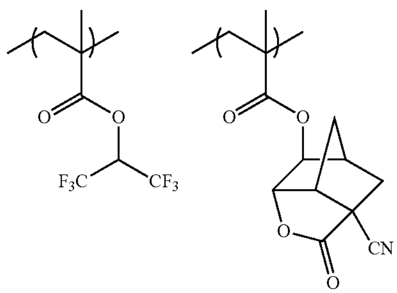
(HR-45)
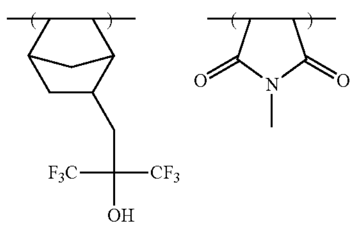
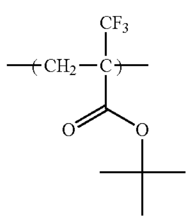
(HR-46)
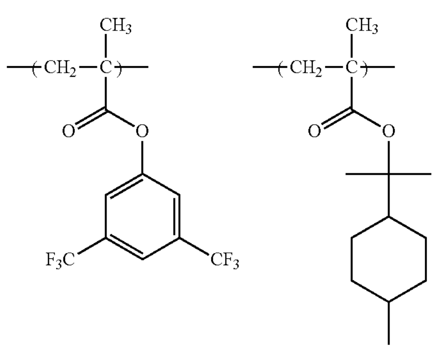
-continued
(HR-47)
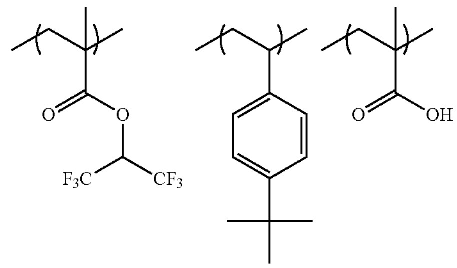
(HR-48)
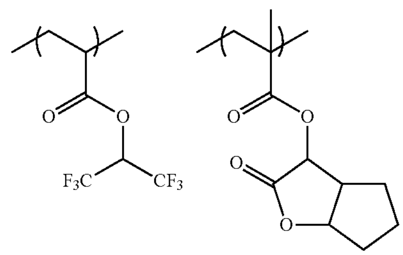
(HR-49)
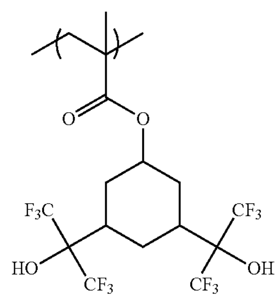
(HR-50)
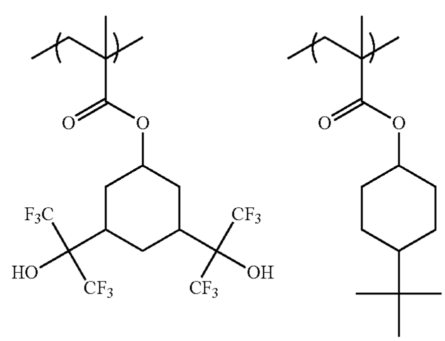
(HR-51)
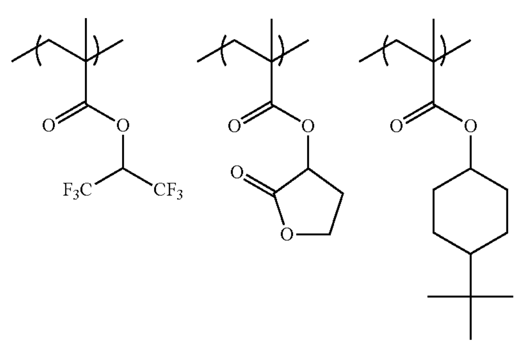

-continued
(HR-52)
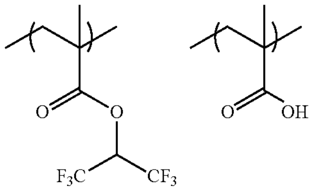
(HR-53)
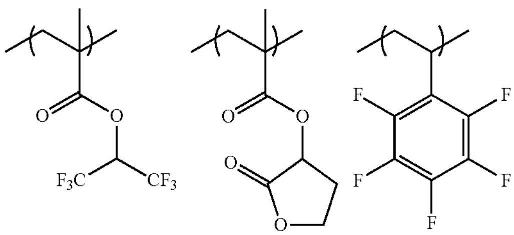
(HR-54)
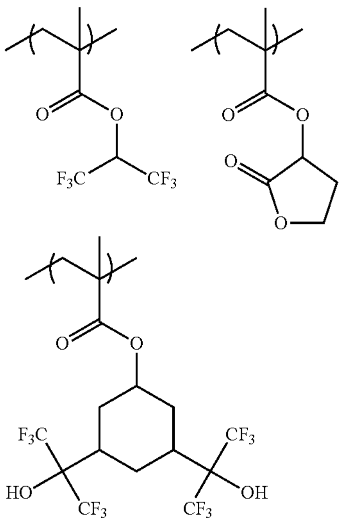
(HR-55)
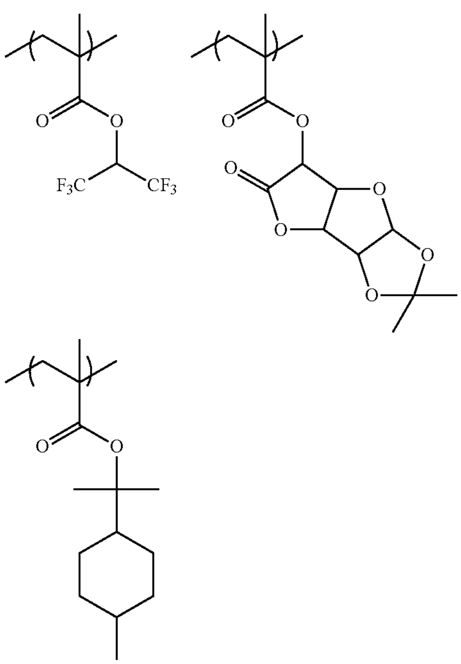
-continued
(HR-56)
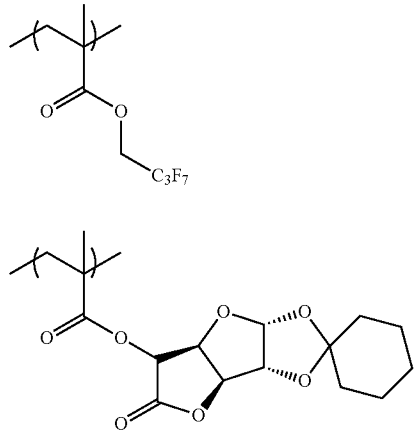
(HR-57)
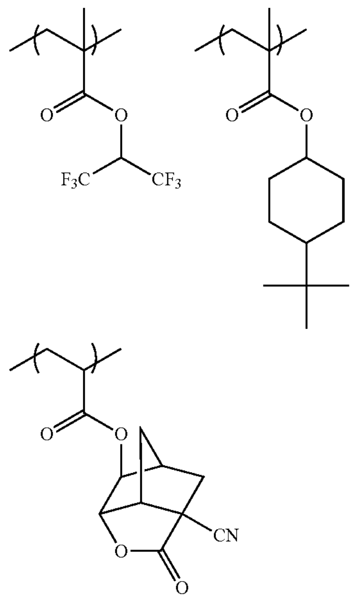
(HR-58)
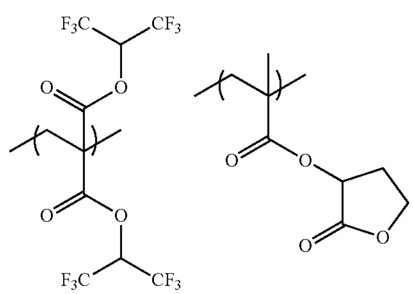
(HR-59)
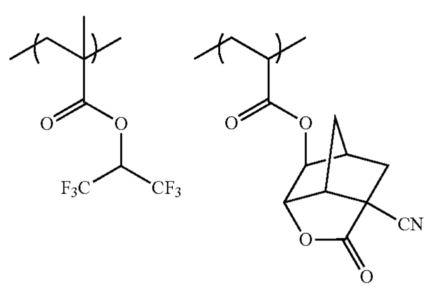

-continued
(HR-60)
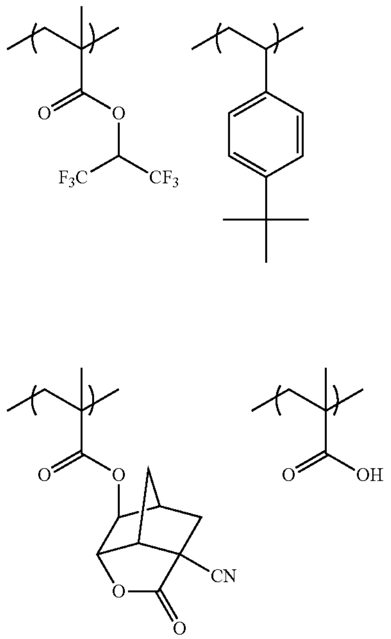
(HR-61)
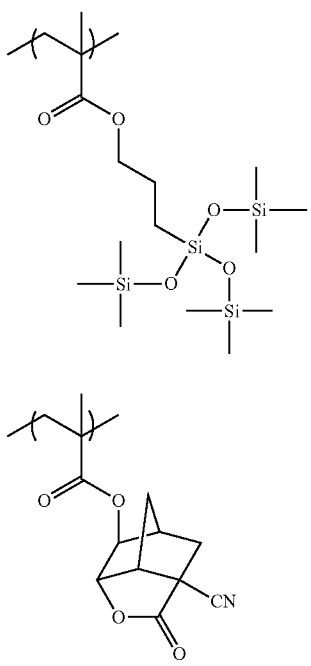
(HR-62)
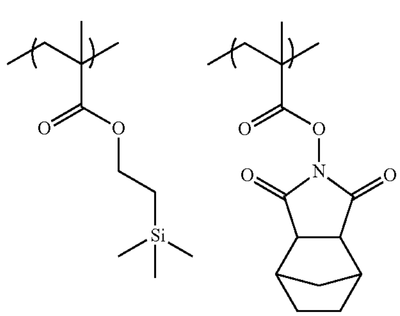
-continued
(HR-63)
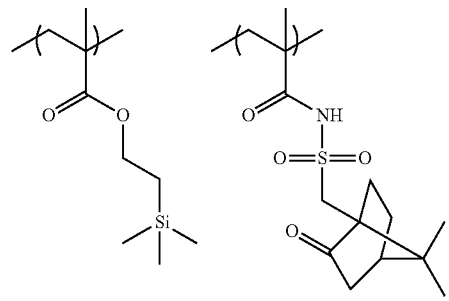
(HR-64)
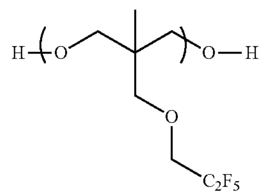
(HR-65)
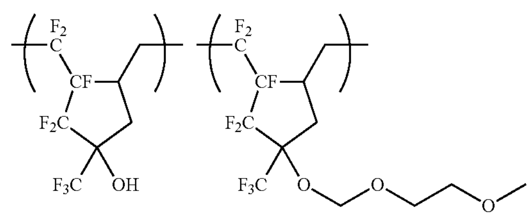
(HR-66)
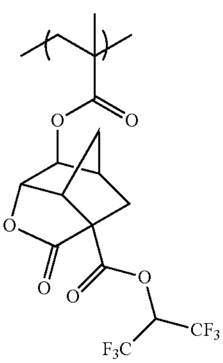
(HR-67)
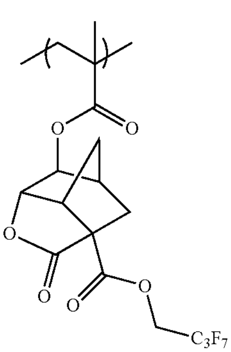

-continued
(HR-68)
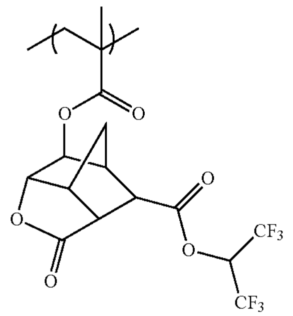
(HR-69)
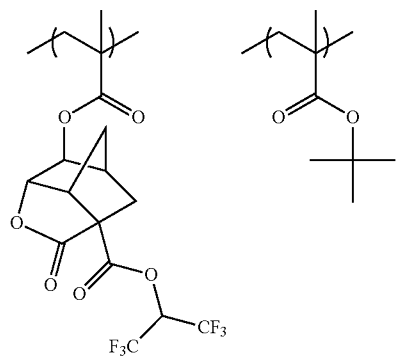
(HR-70)
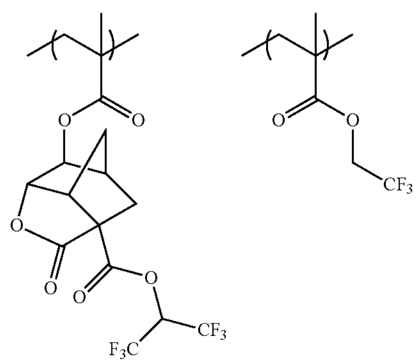
(HR-71)
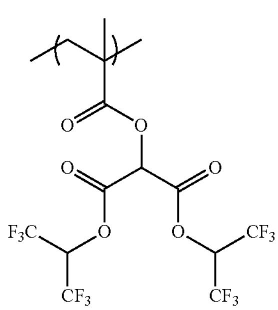
-continued
(HR-72)
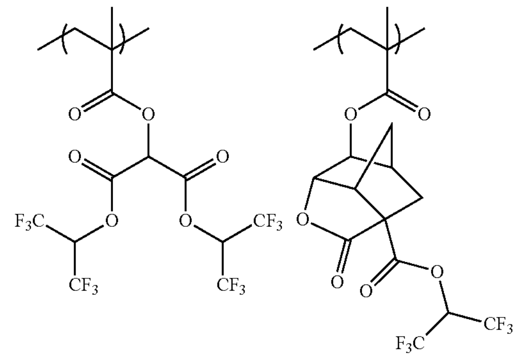
(HR-73)
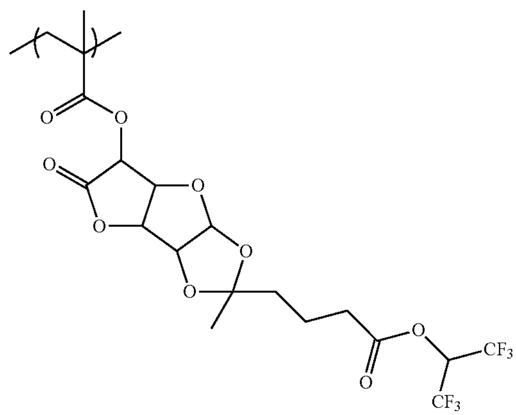
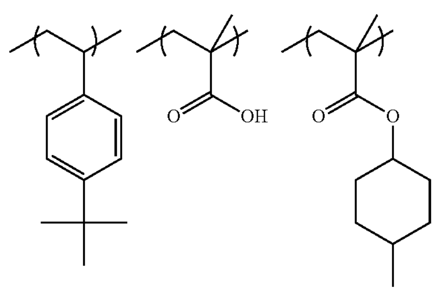
(HR-74)
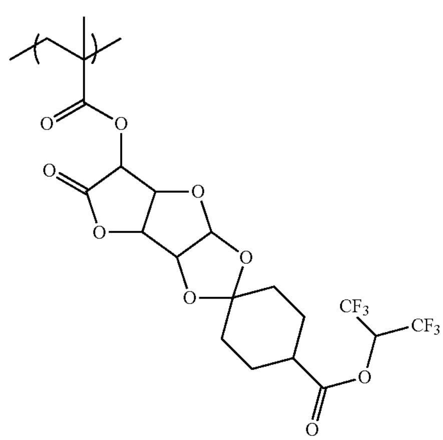

-continued
(HR-75)
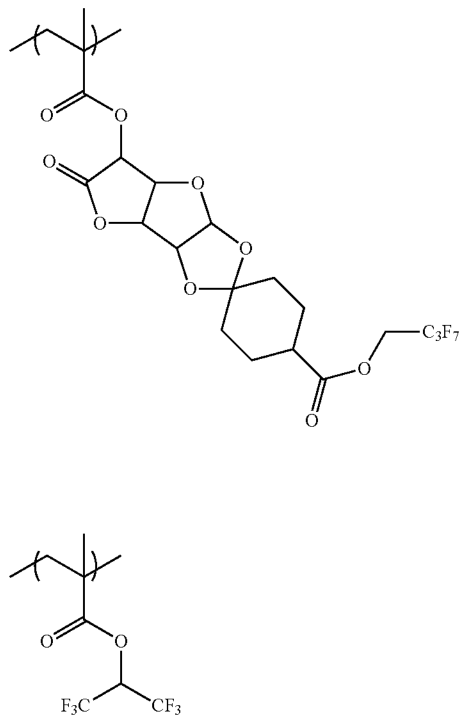
(HR-76)
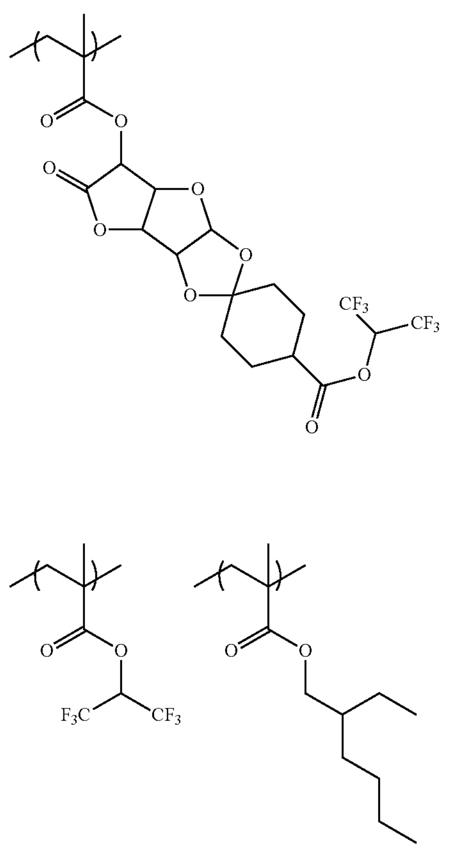
-continued
(HR-77)
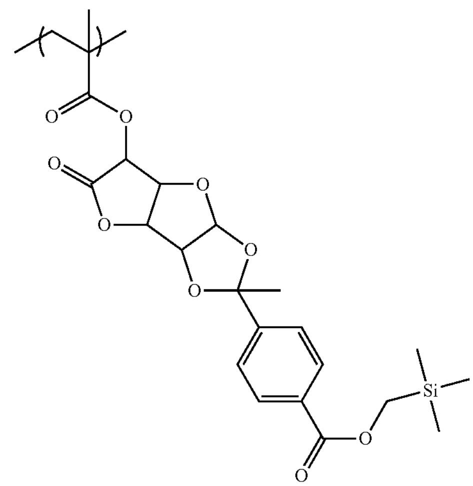
(HR-78)
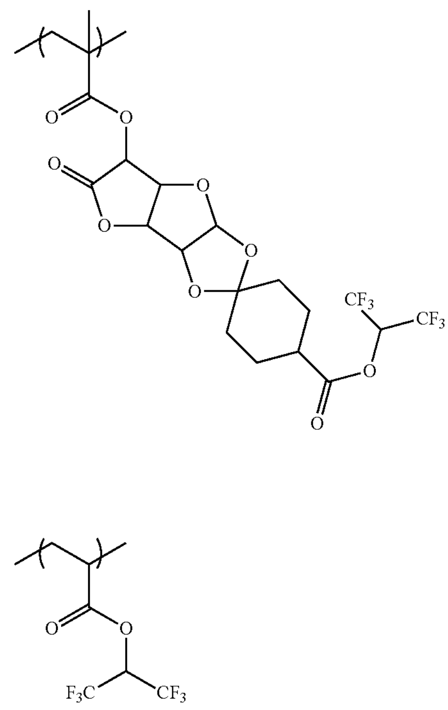
(HR-79)
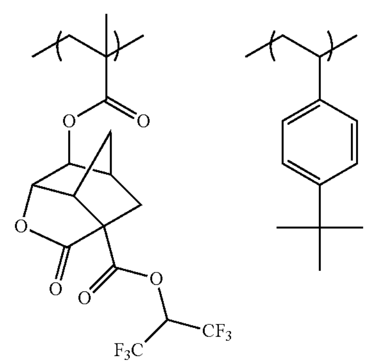

-continued
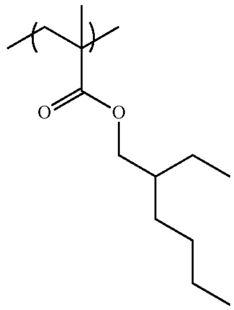
(HR-80)
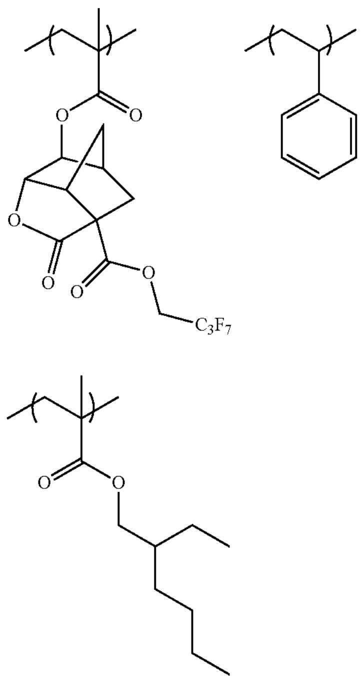
(HR-81)
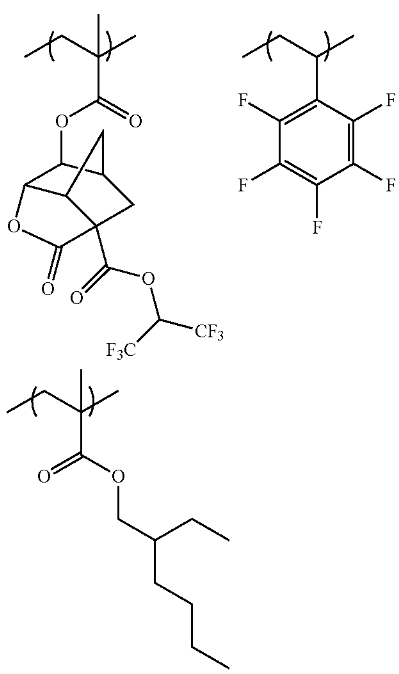
-continued
(HR-82)
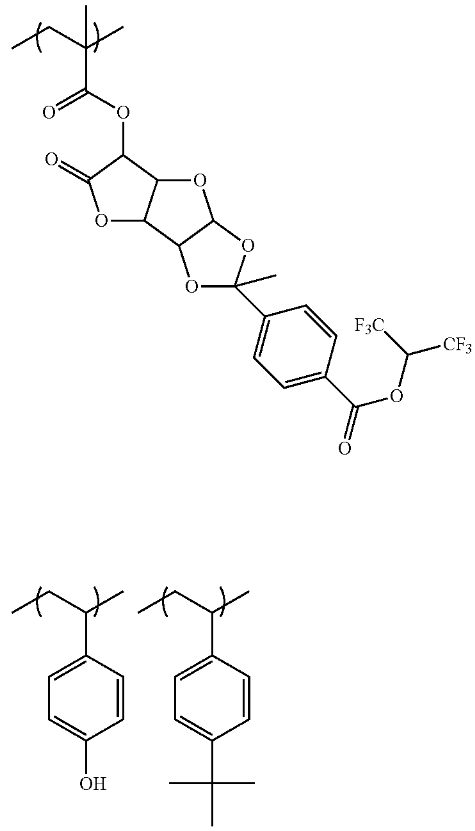
(HR-83)
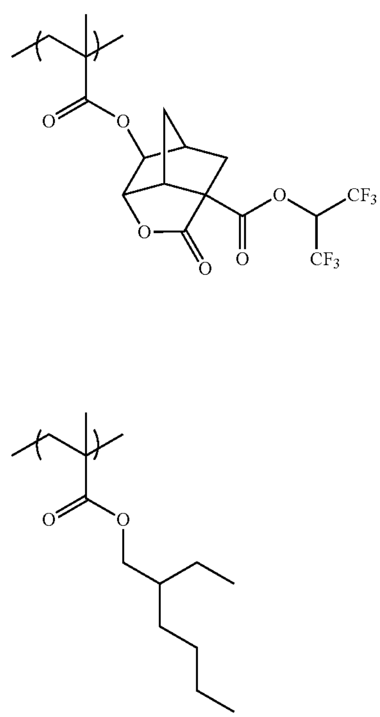

-continued
(HR-84)
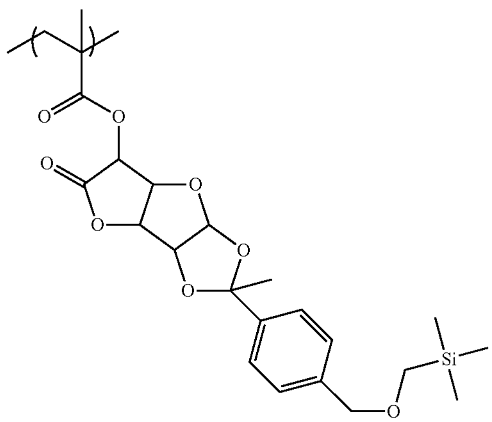
(HR-85)
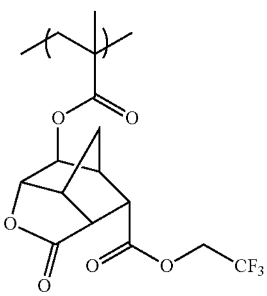
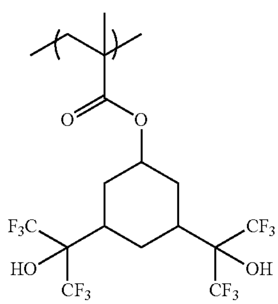
(HR-86)
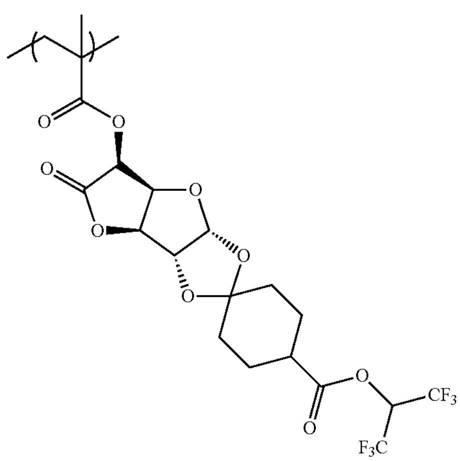
-continued
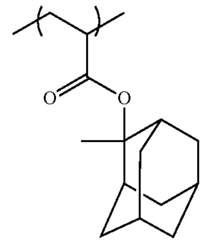
(HR-87)
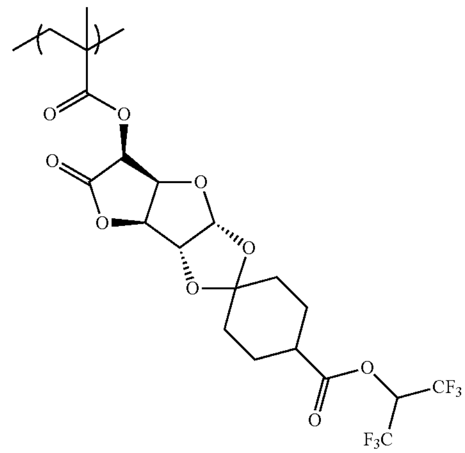
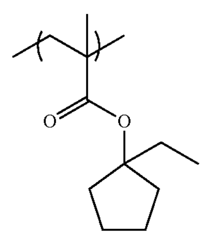
(HR-88)
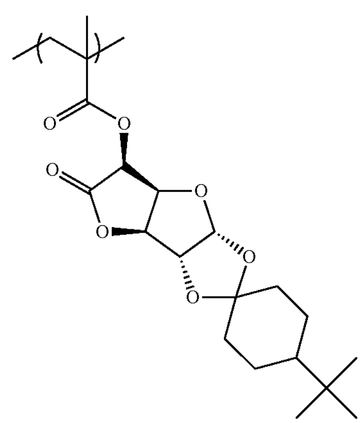

-continued (HR-89)

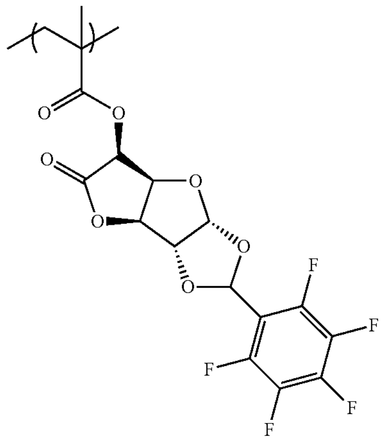

(HR-90)

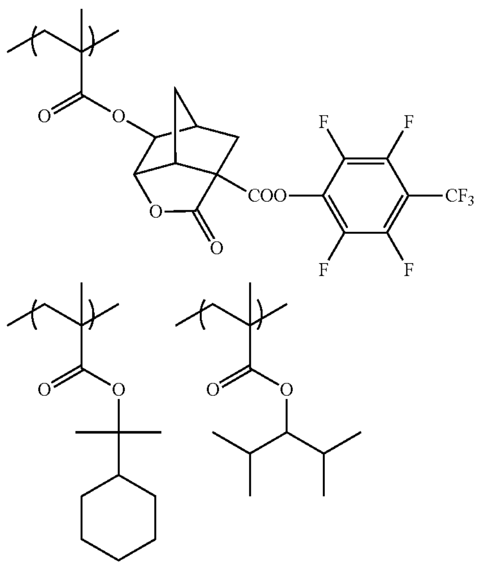

TABLE 1

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |

TABLE 1-continued

| Resin | Composition | Mw | Mw/Mn |
|---|---|---|---|
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

[7] Surfactant (F)

The actinic ray-sensitive or radiation-sensitive resin composition in the invention may or may not further contain a surfactant, and in the case where it contains a surfactant, it is preferable to include any one fluorine-based and/or silicon-based surfactant (a fluorine-based surfactant, a silicon-based surfactant or a surfactant containing both a fluorine atom and a silicon atom) or two or more kinds thereof.

When the actinic ray-sensitive or radiation-sensitive resin composition in the invention contains the surfactant, a resist pattern with good sensitivity, resolution and adherence as well as few development defects can be obtained in using an exposure light source of 250 nm or less, and in particular, 220 nm or less.

Examples of the fluorine-based and/or silicon-based surfactant include the surfactants described in paragraph [0276] in the specification of US Patent App. No. 2008/0248425, such as EFtop EF301 and EF303 (manufactured by Shin-Akita Kasei K. K.); Florad FC430, 431, and 4430 (manufactured by Sumitomo 3M Inc.); Megaface F171, F173, F176, F189, F113, F110, F177, F120, and R08 (manufactured by DIC Corporation.); Surflon S-382, SC101, 102, 103, 104, 105, and 106, and KH-20 (manufactured by Asahi Glass Co., Ltd.); Troysol S-366 (manufactured by Troy Chemical); GF-300, and GF-150 (manufactured by Toagosei Chemical Industry Co., Ltd.); Surflon S-393 (manufactured by Seimi Chemical Co., Ltd.); EFtop EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA); and FTX-204G 208G 218G 230G, 204D, 208D, 212D, 218D, and 222D (manufactured by NEOS Co., Ltd.). In addition, a polysiloxane polymer KP-341 (manufactured by Shin-Etsu Chemical Co., Ltd.) may also be used as the silicon-based surfactant.

Other than those known surfactants, a surfactant using a polymer having a fluoro-aliphatic group derived from a fluoro-aliphatic compound which is produced by a telomerization method (also called a telomer method) or an oligomerization method (also called an oligomer method), may also be used. The fluoro-aliphatic compound can be synthesized by the method described in JP2002-90991A.

Examples of the above-described type of surfactant include Megaface F178, F-470, F-473, F-475, F-476, and F-472 (manufactured by DIC Corporation.), a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene))acrylate (or methacrylate), and a (poly(oxypropylene))acrylate (or methacrylate).

Moreover, in the invention, a surfactant other than the fluorine-based and/or silicon-based surfactant, described in paragraph [0280] in the specification of US Patent App. No. 2008/0248425, may also be used.

The surfactants may be used singly or in combination of several kinds thereof.

In the case where the actinic ray-sensitive or radiation-sensitive resin composition contains the surfactant, the amount of the surfactant used is preferably from 0.0001 to 2% by mass, and more preferably from 0.0005 to 1% by mass, based on the total amount of the actinic ray-sensitive or radiation-sensitive resin composition (excluding the solvent).

On the other hand, by setting the addition amount of the surfactant to 10 ppm or less based on the total amount of the actinic ray-sensitive or radiation-sensitive resin composition (excluding the solvent), the hydrophobic resin is more unevenly distributed to the surface, so that the resist film surface can be made more hydrophobic and the followability of water at the immersion exposure can be enhanced.

[8] Other Additives

The actinic ray-sensitive or radiation-sensitive resin composition in the invention may or may not contain onium carboxylate. Examples of the onium carboxylate include those described in paragraphs [0605] to [0606] in the specification of US Patent App. No. 2008/0187860.

The onium carboxylate can be synthesized by reacting sulfonium hydroxide, iodonium hydroxide, ammonium hydroxide, and carboxylic acid with silver oxide in a suitable solvent.

In the case where the actinic ray-sensitive or radiation-sensitive resin composition contains onium carboxylate, the content of the onium carboxylate is generally from 0.1 to 20% by mass, preferably 0.5 to 10% by mass, and still more preferably 1 to 7% by mass, based on the total solid contents of the composition.

The actinic ray-sensitive or radiation-sensitive resin composition of the invention may further contain, for example, a dye, a plasticizer, a photosensitizer, a light absorber, an alkali-soluble resin, an a dissolution inhibitor, a compound for accelerating dissolution in a developer (for example, a phenol compound having a molecular weight of 1000 or less, or a carboxyl group-containing alicyclic or aliphatic compound), or the like, if desired.

The phenol compound having a molecular weight of 1000 or less can be easily synthesized by referring to the methods described, for example, in JP1991-122938A (JP-H04-122938A), JP1989-28531A (JP-H02-28531A), U.S. Pat. No. 4,916,210B, EP219294B, and the like.

Examples of the carboxyl group-containing alicyclic or aliphatic compound include a carboxylic acid derivative having a steroid structure, such as cholic acid, deoxycholic acid, and lithocholic acid, an adamantanecarboxylic acid derivative, adamantanedicarboxylic acid, cyclohexanecarboxylic acid, and cyclohexanedicarboxylic acid.

The actinic ray-sensitive or radiation-sensitive resin composition in the invention is preferably used in a film thickness of 30 to 250 nm, and more preferably from 30 to 200 nm, from the viewpoint of enhancing the resolving power. Such a film thickness can be obtained by setting the solid concentration in the actinic ray-sensitive or radiation-sensitive resin composition to an appropriate range, thereby imparting an appropriate viscosity and enhancing the coatability and the film-forming property.

The solid content concentration of the actinic ray-sensitive or radiation-sensitive resin composition for use in the invention is usually from 1.0 to 10% by mass, preferably from 2.0 to 5.7% by mass, and more preferably from 2.0 to 5.3% by mass. When the solid content concentration is in this range, the resist solution can be uniformly applied on a substrate (hereinafter also referred to as a "wafer"), and in addition, a resist pattern with excellent performance in terms of line edge roughness (LWR) can be formed. The reasons therefor are not clearly know, but it is considered that by setting the solid content concentration to 10% by mass or less, and preferably 5.7% by mass or less, the materials, particularly the photo-acid generator, in the resist solution are prevented from aggregation, and as a result, a uniform resist film can be formed.

The solid content concentration is a mass percentage of the mass of the resist components excluding the solvents, based on the total mass of the actinic ray-sensitive or radiation-sensitive resin composition.

The actinic ray-sensitive or radiation-sensitive resin composition of the invention is used, for example, after the above components are dissolved in a predetermined organic solvent, filtered using a filter, and then applied onto a predetermined support (substrate). The filter is preferably made of polytetrafluoroethylene, polyethylene, or nylon having a pore size of 0.1 μm or less, more preferably 0.05 μm or less, and still more preferably 0.03 μm or less. In the filtration using a filter, for example, cyclic filtration may be carried out as described in JP2002-62667A or filtration with serial or parallel connection of plural kinds of filters may be carried out. Further, the composition may be filtered plural times. In addition to the filtration using a filter, the composition may be subjected to a deaeration treatment or the like.

[9] Pattern Forming Method

The invention relates to a resist film formed with the above-described actinic ray-sensitive or radiation-sensitive resin composition of the invention. The resist film can be formed by a generally known method, but it is preferably formed by, for example, coating the actinic ray-sensitive or radiation-sensitive resin composition.

The pattern forming method of the invention (negative type pattern forming method) includes at least exposing the resist film (exposure), and developing with a developer (development).

The exposing method in the exposure step may be a liquid-immersion exposure method.

The pattern fainting method of the invention preferably includes heating after the exposure.

Furthermore, the pattern forming method of the invention may include development using an alkali developer.

Furthermore, the pattern forming method of the invention may further include washing with a rinsing liquid including an organic solvent.

The pattern forming method of the invention may include exposure plural times.

The pattern forming method of the invention may include heating plural times.

The exposure and the development of the pattern forming method in the invention may be carried out by a generally known method.

After preparing the film and before the exposure step, a prebake process (PB; Prebake) is also preferably included.

In addition, after the exposure step and before the development step, a heating step (PEB; Post Exposure Bake) is also preferably included.

Regarding the heating temperature, heating of any of PB and PEB is preferably at a temperature of 70 to 130° C., and more preferably at a temperature of 80 to 120° C.

The heating time is preferably 30 to 300 seconds, more preferably 30 to 180 seconds, and still more preferably 30 to 90 seconds.

Heating may be carried out by a unit included in an exposure/development apparatus, and may also be carried out using a hot plate or the like.

By the baking, the reaction of the exposed portion is accelerated and the sensitivity or pattern profile is improved.

The light source wavelength used in the exposure apparatus in the invention is not limited, but examples thereof infrared radiation, visible light, ultraviolet rays, far ultraviolet rays, X rays, and an electron beam. Far ultraviolet rays having a wavelength of preferably 250 nm or shorter, more preferably 220 nm or less, and particularly preferably 1 to 200 nm, specifically, a KrF excimer laser (248 nm), an ArF excimer laser (193 nm), an $F_2$ excimer laser (157 nm), X rays, EUV radiation (13 nm), and an electron beam, with a KrF excimer laser, an ArF excimer laser, EUV radiation, or an electron beam being preferred, and an ArF excimer laser being more preferred.

Moreover, in the exposure of the resist film in the pattern forming method of In the invention, a liquid-immersion exposure method may be applied.

The liquid-immersion exposure method is a technique for improving the resolution, in which a high refractive-index liquid (hereinafter also referred to as a "liquid for liquid immersion") is filled between a projection lens and a sample to carry out exposure.

The effect of the liquid immersion is as follows. Taking $\lambda_0$ as the wavelength of exposure light in air, n as the refractive index of the liquid for liquid immersion to air and θ as the convergent half angle of the light beam, where $NA_0=\sin\theta$, the above-mentioned resolving power and focal depth in the event of liquid immersion can be expressed by the following formulae. Here, $k_1$ and $k_2$ are coefficients involved in the process.

$$(\text{Resolving power})=k_1\cdot(\lambda_0/n)/NA_0$$

$$(\text{Focal depth})=\pm k_2\cdot(\lambda_0/n)/NA_0^2$$

That is, the effect of the liquid immersion is equivalent to the use of an exposure wavelength of 1/n. In other words, in projection optical systems of identical NA, liquid immersion enables the focal depth to be n-fold. This is effective in all pattern configurations. Further, this can be combined with a super-resolution technology, such as a phase shift method or a modified illumination method, now under study.

In the case of carrying out liquid-immersion exposure, washing the surface of a film with an aqueous chemical liquid is preferably included. The point of the time for the washing is not particularly limited, but the washing of the surface of a film with an aqueous chemical liquid is preferably carried out (1) after forming a film on a substrate, and further, exposing the film through a liquid for liquid immersion, and/or (2) after exposing a film through a liquid for liquid immersion and before heating the film.

The liquid for liquid immersion is preferably a liquid which is transparent in exposure wavelength whose temperature coefficient of a refractive index is as low as possible so as to ensure minimization of any distortion of an optical image projected on the film. Particularly, in the use of an ArF excimer laser (wavelength: 193 nm) as an exposure light source, however, it is more preferable to use water from the viewpoints of easiness of availability and easiness of handling in addition to the above-described viewpoints.

In the case of using water, a slight proportion of an additive (liquid) that does not dissolve the resist film on a wafer and would have negligible influence on an optical coat for an under surface of lens element may be added in order to not only decrease the surface tension of water but also increase a surface activating power.

The additive is preferably an aliphatic alcohol with a refractive index approximately equal to that of water, and specific examples thereof include methyl alcohol, ethyl alcohol, and isopropyl alcohol. The addition of an alcohol with a refractive index approximately equal to that of water is advantageous in that even when the alcohol component is evaporated from water, thereby causing a change in the concentration, the change in the refractive index of the liquid as a whole can be minimized.

On the other hand, when a substance being opaque in light at 193 nm or an impurity whose refractive index is greatly different from that of water is mixed therein, the mixing would invite a distortion of optical image projected on the resist. Accordingly, distilled water is preferred as the water used. Furthermore, pure water that has been filtered through an ion exchange filter or the like may be used.

For the water, the electric resistivity is preferably 18.3 MQcm or more and the TOC (total organic matter concentration) is preferably 20 ppb or less. Also, the water is preferably subjected to a deaeration treatment.

Furthermore, by increasing the refractive index of the liquid for liquid immersion, it is possible to enhance lithography performance. From such viewpoints, an additive capable of increasing a refractive index may be added to the water, or heavy water ($D_2O$) may be used in place of the water.

In the case where a film formed by using the composition of the invention is exposed through a liquid immersion medium, the above-described hydrophobic resin (E) may be added, if desired. By adding the hydrophobic resin (E), the receding contact angle of the surface is improved. The receding contact angle is preferably from 60° to 90°, and more preferably from 70° or more.

In the liquid immersion exposure step, the liquid for liquid immersion needs to move on a wafer following the movement of an exposure head that is scanning the wafer at a high speed and forming an exposure pattern. Therefore, the contact angle of the liquid for liquid immersion with the resist film in a dynamic state is important, and the resist is required to have a performance of allowing liquid droplets to follow the high-speed scanning of an exposure head without leaving any liquid droplet.

In order to prevent the film from directly contacting with the liquid for liquid immersion, a film sparingly soluble in a liquid for liquid immersion (hereinafter also referred to as a "top coat") may be provided between the film formed using the composition of the invention and the liquid for liquid immersion. The functions required of the top coat are suitability for coating on the resist, transparency to radiation, particularly, radiation having a wavelength of 193 nm, and sparing solubility in the liquid for liquid immersion. The top coat is preferably unmixable with the resist and uniformly coatable on the resist.

In view of transparency to light at 193 nm, the top coat is preferably an aromatic-free polymer.

Specific examples of the polymer include a hydrocarbon polymer, an acrylic acid ester polymer, a polymethacrylic acid, a polyacrylic acid, a polyvinyl ether, a silicon-containing polymer, and a fluorine-containing polymer. The above-described hydrophobic resin (E) is suitable also as the top coat. If impurities are dissolved out into the liquid for liquid immersion from the top coat, the optical lens is contaminated, and therefore, it is preferable that little residual monomer components of the polymer be contained in the top coat.

On peeling off the top coat, a developer may be used or a release agent may be separately used. The release agent is preferably a solvent permeating the film to a lower extent. From the viewpoint that the peeling step may be carried out simultaneously with the development step of the film, the top coat is preferably peelable with an alkaline developer. From the viewpoint of peeling with an alkaline developer, the top coat is preferably acidic, but from the viewpoint of non-intermixing with the film, the top coat may be neutral or alkaline.

The difference in the refractive index between the top coat and the liquid for liquid immersion is preferably zero or small. In this case, the resolution can be enhanced. In the case where the exposure light source is an ArF excimer laser (wavelength: 193 nm), water is preferably used as the liquid for liquid immersion and therefore, the top coat for ArF immersion exposure preferably has a refractive index close to the refractive index (1.44) of water. Also, from the viewpoints of transparency and a refractive index, the top coat is preferably a thin film.

The top coat is preferably unmixable with the film and further unmixable with the liquid for liquid immersion. From this point of view, when the liquid for liquid immersion is water, the solvent used for the top coat is preferably a medium that is sparingly soluble in the solvent used for the composition of the invention and is insoluble in water. Furthermore, when the liquid for liquid immersion is an organic solvent, the top coat may be either water-soluble or water-insoluble.

In the invention, the substrate on which the film is formed is not particularly limited, and a substrate generally used for lithography in the production of a semiconductor device, such as IC, a liquid crystal device or a circuit board such as a thermal head and further in other photofabrication processes, such as an inorganic substrate, for example, silicon, SiN, $SiO_2$, and SiN and a coating-type inorganic substrate, for example, SOG, can be used. Further, if necessary, an organic antireflection film may be formed between the film and the substrate.

In the case where the pattern forming method of the invention further includes development using an alkali developer, examples of the alkali developer include alkaline aqueous solutions of inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide and tetraethylammonium hydroxide, and cyclic amines such as pyrrole and piperidine.

Further, an alcohol and a surfactant may be each added in an appropriate amount to the alkaline aqueous solution.

The alkali concentration of the alkali developer is usually from 0.1 to 20% by mass.

The pH of the alkali developer is usually from 10.0 to 15.0. In particular, a 2.38%-by-mass aqueous tetramethylammonium hydroxide solution is preferred.

As for a rinsing liquid in the rinsing carried out using the rinsing liquid after the development using an alkali developer, pure water is used, and the pure water may be used after adding thereto a surfactant in an appropriate amount.

Further, after the development or rinsing, a treatment of removing the developer or rinsing liquid adhering on the pattern by a supercritical fluid may be carried out.

As the developer in the development with a developer including an organic solvent in the pattern forming method of In the invention developer, a polar solvent such as a ketone-based solvent, an ester-based solvent, an alcohol-based solvent, an amide-based solvent, and an ether-based solvent, or a hydrocarbon-based solvent may be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, methyl amyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; glycol-based solvents such as ethylene glycol, diethylene glycol, and triethylene glycol; and glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include, in addition to the glycol ether-based solvents above, anisole, dioxane, and tetrahydrofuran.

Examples of the amide-based solvent include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include aromatic hydrocarbon-based solvents such as toluene and xylene, and aliphatic hydrocarbon-based solvents such as pentane, hexane, octane, and decane.

A plurality of these solvents may be mixed, or the solvent may be used by mixing with a solvent other than those described above or water. However, in order to sufficiently bring out the effects of the invention, the water content of the entire developer is preferably less than 10% by mass, and it is more preferred to include substantially no water.

That is, the content of the organic solvent in the organic developer is preferably from 90% by mass to 100% by mass, and more preferably from 95% by mass to 100% by mass, based on the total amount of the developer.

In particular, the organic developer is preferably a developer containing at least one organic solvent selected from a group consisting of a ketone-based solvent, an ester-based solvent, an alcohol-based solvent, an amide-based solvent, and an ether-based solvent.

The vapor pressure at 20° C. of the organic developer is preferably 5 kPa or less, more preferably 3 kPa or less, and particularly preferably 2 kPa or less. By setting the vapor pressure of the developer to 5 kPa or less, evaporation of the developer on a substrate or in a development cup is inhibited and the temperature uniformity in the wafer plane is enhanced, as a result, the dimensional uniformity in the wafer plane is improved.

Specific examples of the solvent having a vapor pressure of 5 kPa or less include ketone-based solvents such as 1-octanone, 2-octanone, 1-nonanone, 2-nonanone, 2-heptanone (methyl amyl ketone), 4-heptanone, 2-hexanone, diisobutyl ketone, cyclohexanone, methylcyclohexanone, phenylacetone, and methyl isobutyl ketone; ester-based solvents such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate, and propyl lactate; alcohol-based solvents such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, diethylene glycol, and triethylene glycol; glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethylbutanol; ether-based solvents such as tetrahydrofuran; amide-based solvents such as N-methyl-2-pyrrolidone, N,N-dimethylacetamide, and N,N-dimethylformamide; aromatic hydrocarbon-based solvents such as toluene and xylene; and aliphatic hydrocarbon-based solvents such as octane and decane.

Specific examples of the solvent having a vapor pressure of 2 kPa or less include ketone-based solvents such as 1-octanone, 2-octanone, 1-nonanone, 2-nonanone, 4-heptanone, 2-hexanone, diisobutyl ketone, cyclohexanone, methylcyclohexanone, and phenylacetone; ester-based solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate(ethyl 3-ethoxypropionate), 3-methoxybutyl acetate, 3-methyl-3-methoxybutyl acetate, ethyl lactate, butyl lactate, and propyl lactate; alcohol-based solvents such as n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, diethylene glycol, and triethylene glycol; glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethylbutanol; amide-based solvents such as N-methyl-2-pyrrolidone, N,N-dimethylacetamide, and N,N-dimethylformamide; aromatic hydrocarbon-based solvents such as xylene; and aliphatic hydrocarbon-based solvents such as octane and decane.

An appropriate amount of the organic developer may be added to the organic developer, if necessary.

The surfactant is not particularly limited but, for example, an ionic or nonionic fluorine-based and/or silicon-based surfactant can be used. Examples of such a fluorine-based and/or silicon-based surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. No. 5,405,720B, U.S. Pat. No. 5,360,692B, U.S. Pat. No. 5,529,881B, U.S. Pat. No. 5,296,330B, U.S. Pat. No. 5,436,098B, U.S. Pat. No. 5,576,143B, and U.S. Pat. No. 5,294,511B. A nonionic surfactant is preferred. The nonionic surfactant is not particularly limited, but use of a fluorine-based surfactant or a silicon-based surfactant is more preferred.

The amount of the surfactant used is usually from 0.001 to 5% by mass, preferably from 0.005 to 2% by mass, and more preferably from 0.01 to 0.5% by mass, based on the total amount of the developer.

Regarding the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on a substrate surface (spraying method), a method of continuously discharging the developer on the substrate spinning at a constant speed while scanning the developer discharging nozzle at a constant rate (dynamic dispense method), or the like may be applied.

In the case where the above-described various developing methods include a step of discharging the developer toward the resist film from a development nozzle of a developing apparatus, the discharge pressure of the developer discharged (the flow velocity per unit area of the developer discharged) is preferably 2 mL/sec/mm$^2$ or less, more preferably 1.5 mL/sec/mm$^2$ or less, and still more preferably 1 mL/sec/mm$^2$ or less. The flow velocity is not particularly limited in the lower limit, but from the viewpoint of throughput, is preferably 0.2 mL/sec/mm$^2$ or more.

By setting the discharge pressure of the discharged developer to the range above, pattern defects attributable to the resist residue after development can be greatly reduced.

Details of this mechanism are not clearly known, but it is possibly considered that due to the discharge pressure in the above-described range, the pressure imposed on the resist film by the developer is small and the resist film or resist pattern is kept from inadvertent chipping or collapse.

Here, the discharge pressure (mL/sec/mm$^2$) of the developer is a value at the outlet of a development nozzle in a developing apparatus.

Examples of the method for adjusting the discharge pressure of the developer include a method of adjusting the discharge pressure by a pump or the like, and a method of supplying the developer from a pressurized tank and adjusting the pressure to change the discharge pressure.

Further, after the development using developer including an organic solvent, stopping of the development by replacement with another solvent may be carried out.

After the development using developer including an organic solvent, washing using a rinsing liquid may be carried out.

The rinsing liquid used in the washing with a rinsing liquid including an organic solvent after the development using developer including an organic solvent is not particularly limited as long as it does not dissolve the resist pattern, and a solution containing a general organic solvent may be used. As the rinsing liquid, a rinsing liquid containing at least one organic solvent selected from a group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent, which are each used as a rinsing liquid, include those described above as the organic solvent used in the developer including an organic solvent.

After the development using a developer including an organic solvent, more preferably, washing using a rinsing liquid containing at least one organic solvent selected from the group consisting of a ketone-based solvent, an ester-based solvent, an alcohol-based solvent, and an amide-based solvent is carried out; still more preferably, washing using a rinsing liquid containing an alcohol-based solvent or an ester-based solvent is carried out after the development; even still more preferably, washing using a rinsing liquid containing a monohydric alcohol is carried out; and even yet still more preferably, washing using a rinsing liquid containing a monohydric alcohol having 5 or more carbon atoms is carried out.

Here, the monohydric alcohol used in the rinsing includes linear, branched, and cyclic monohydric alcohols, and specifically 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, or the like may be used. As the particularly preferred monohydric alcohol having 5 or more carbon atoms, 1-hexanol, 2-hexanol, 4-methyl-2-pentanol, 1-pentanol, 3-methyl-1-butanol, or the like may be used.

A plurality of these respective components may be mixed or the solvent may be used by mixing it with an organic solvent other than those described above.

The water content in the rinsing liquid is preferably 10% by mass or less, more preferably 5% by mass or less, and particularly preferably 3% by mass or less. By setting the water content to 10% by mass or less, good development characteristics can be obtained.

The vapor pressure at 20° C. of the rinsing liquid used after the development using a developer including an organic solvent is preferably from 0.05 kPa to 5 kPa, more preferably from 0.1 kPa to 5 kPa, and most preferably from 0.12 kPa to 3 kPa. By setting the vapor pressure of the rinsing liquid to a value ranging from 0.05 kPa to 5 kPa, the temperature uniformity in the wafer plane is enhanced and moreover, swelling due to permeation of the rinsing liquid is inhibited, as a result, the dimensional uniformity in the wafer plane is improved.

The rinsing liquid may also be used after adding thereto a surfactant in an appropriate amount.

In the rinsing, the wafer that has been subjected to development using a developer including an organic solvent is washed using the above-described rinsing liquid including an organic solvent. The method for the washing treatment is not particularly limited, but examples of the method which can be applied include a method of continuously discharging the rinsing liquid on the substrate spinning at a fixed speed (spin coating method), a method of dipping the substrate in a bath filled with the rinsing liquid for a fixed time (dipping method), and a method of spraying the rinsing liquid on the substrate surface (spraying method). Above all, it is preferable to perform the washing treatment by the spin coating method and after the washing, remove the rinsing liquid from the substrate surface by spinning the substrate at a rotational speed of 2000 rpm to 4000 rpm. Further, it is also preferable to include heating (Post Bake) after the rinsing. The developer and the rinsing liquid remaining between the patterns and inside the patterns are removed by the baking. The heating after the rinsing is carried out at usually from 40 to 160° C., and preferably from 70 to 95° C., and for usually from 10 seconds to 3 minutes, and preferably from 30 seconds to 90 seconds.

In addition, the invention relates to a method for preparing an electronic device, including the pattern forming method of the invention as described above, and an electronic device prepared by the preparation method.

The electronic device of the invention is suitably mounted on an electric/electronic device (domestic appliances, OA•medium-related devices, optical devices, communication devices, and the like).

EXAMPLES

Hereinbelow, the invention will be described in detail with reference to Examples, but the content of the invention is not limited thereto.

Synthesis Example

Synthesis of Resin P-1

83.1 parts by mass of cyclohexanone was heated to 80° C. under a nitrogen air flow. A mixed solution of 11.1 parts by mass of monomers represented by the following structural formula A, 5.9 parts by mass of monomers represented by the following structural formula B, 24.9 parts by mass of monomers represented by the following structural formula C, 154.4 parts by mass of cyclohexanone, and 2.30 parts by mass of dimethyl 2,2'-azobisisobutyrate [V-601, manufactured by Wako Pure Chemical Industries, Ltd.] was added dropwise thereto over 4 hours while stirring the solution. After completion of dropwise addition, the solution was further stirred at 80° C. for 2 hours. After leaving the reaction liquid to be cooled, the reaction liquid was re-precipitated with a large amount of hexane/ethyl acetate (mass ratio 8:2), and filtered, and the obtained solid was dried under vacuum to obtain 35.8 parts by mass of a resin (P-1) of the invention.

A

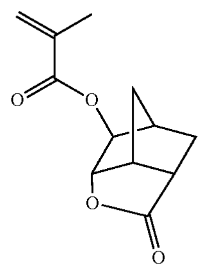

B

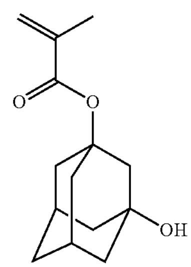

C

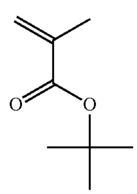

P-1

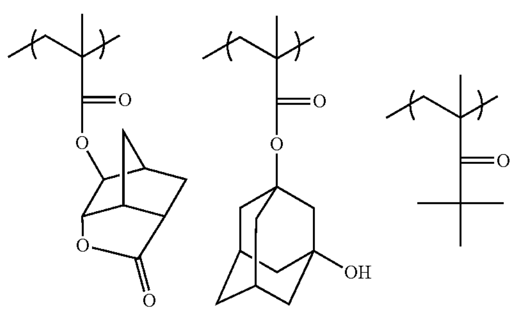

The weight average molecular weight (Mw: in terms of polystyrene) of the obtained resin determined by means of GPC (carrier: tetrahydrofuran (THF)) was as follows: Mw=10500 and dispersity, Mw/Mn=1.65. The compositional ratio measured by means of $^{13}C$-NMR was 20/10/70.

<Acid-Decomposable Resin>

Hereinbelow, in the similar manner, the resins P-2 to P-30 and RP-1 to RP-4 were synthesized. The synthesized polymer structures are described below.

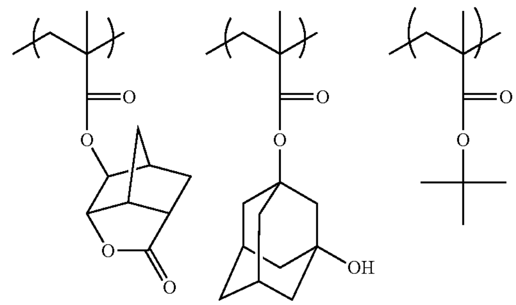

P-1

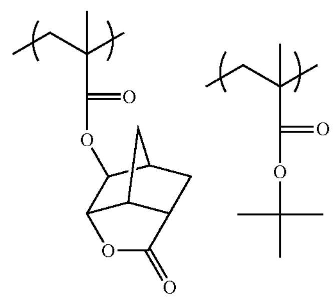

P-2 P-3 P-4 P-5

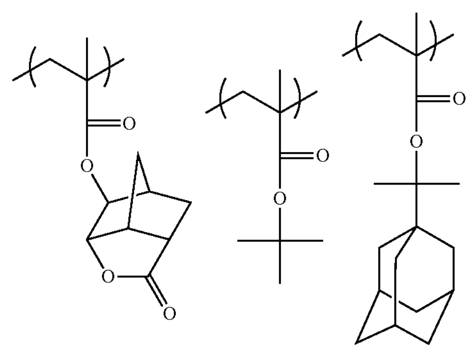

P-6

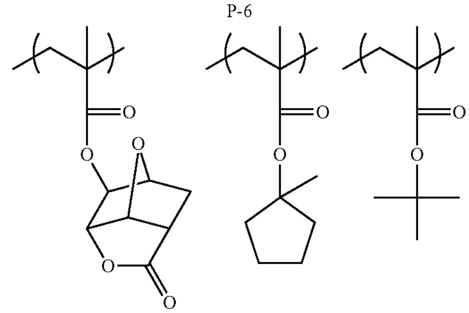

P-7

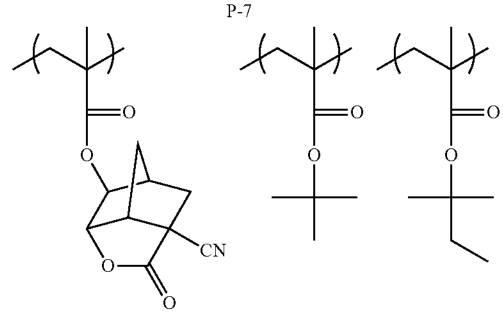

P-8

-continued
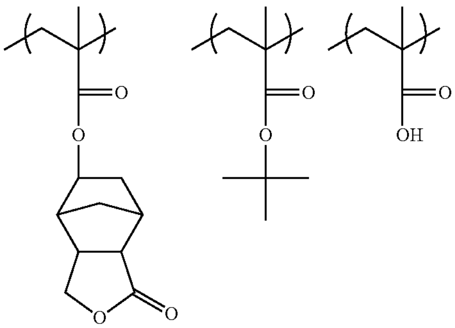
P-9
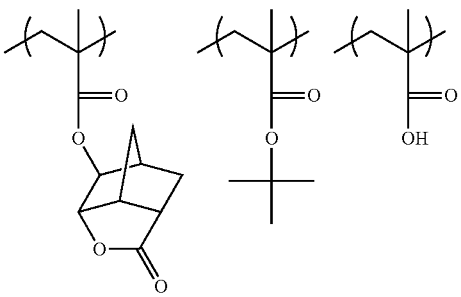
P-10
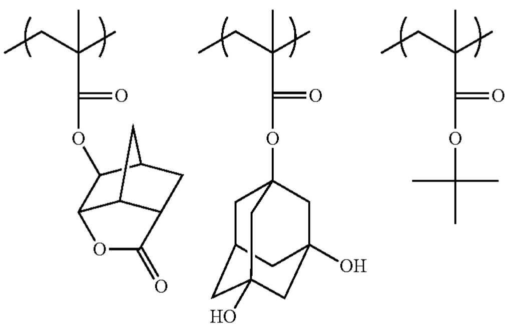
P-11
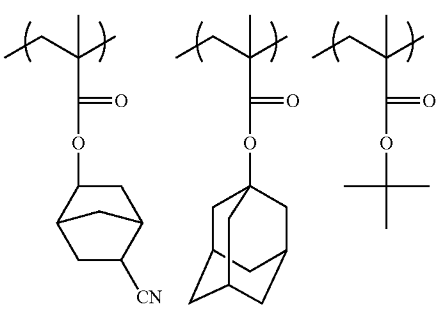
P-12
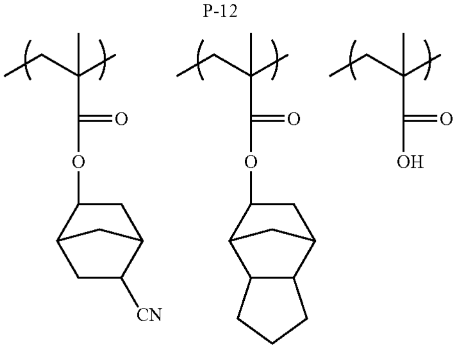
-continued
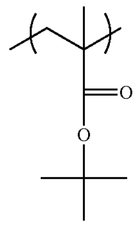
P-13
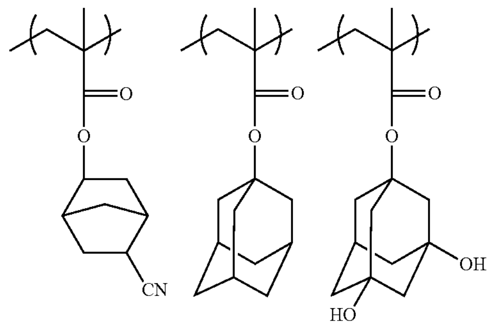
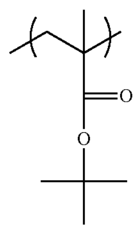
P-14
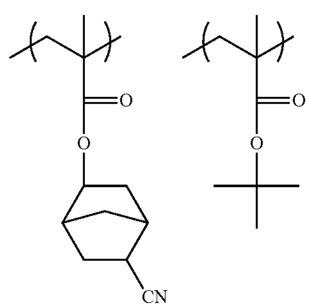
P-15
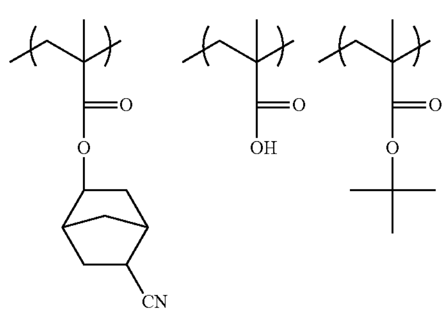
P-16

-continued
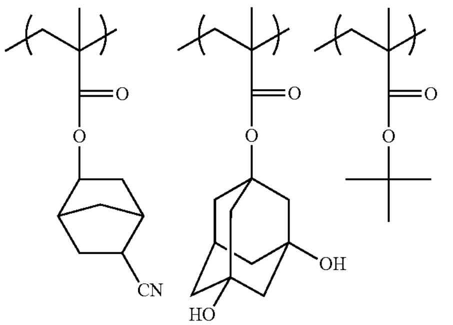
P-17
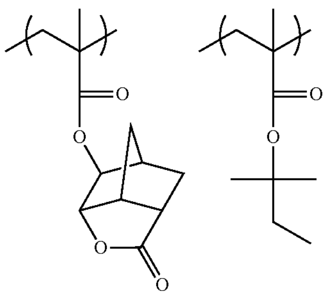
P-18
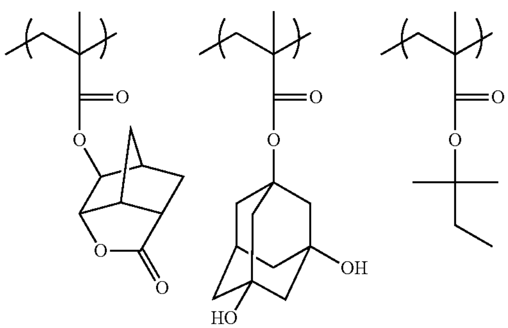
P-19
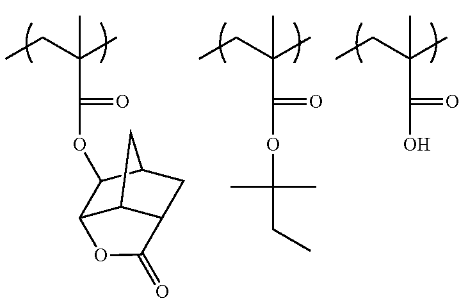
P-20
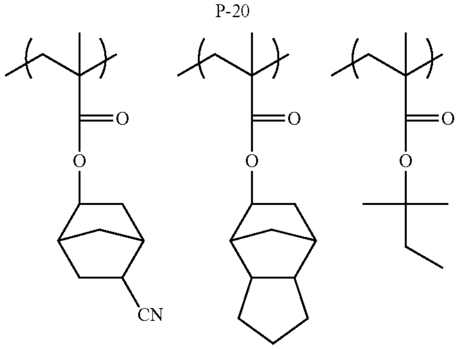
P-21
-continued
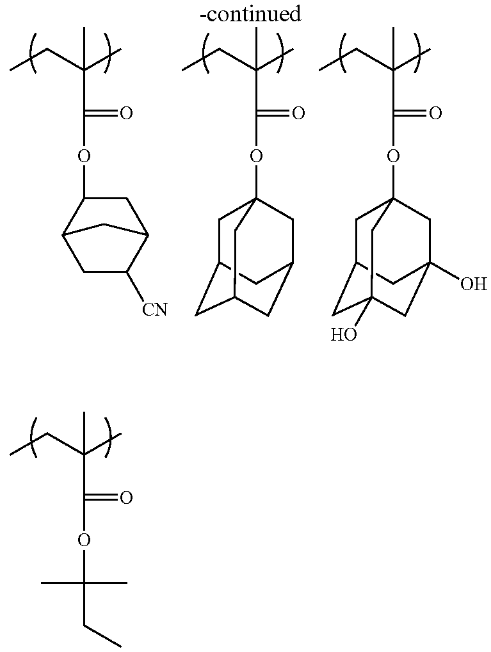
P-22
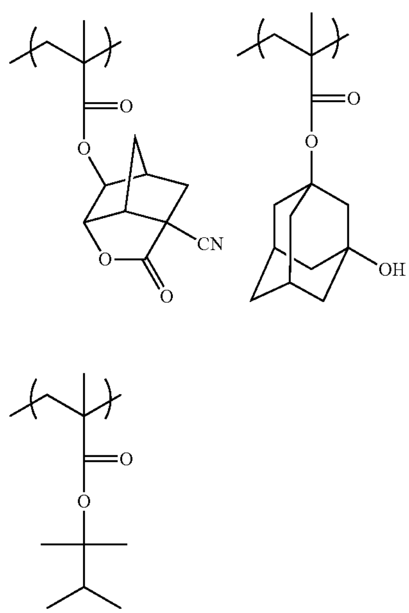
P-23
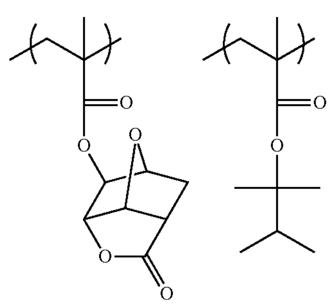
P-24

-continued
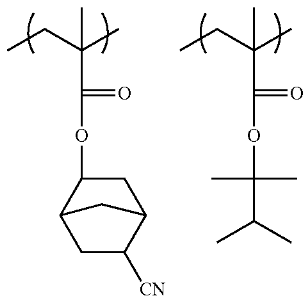
P-25
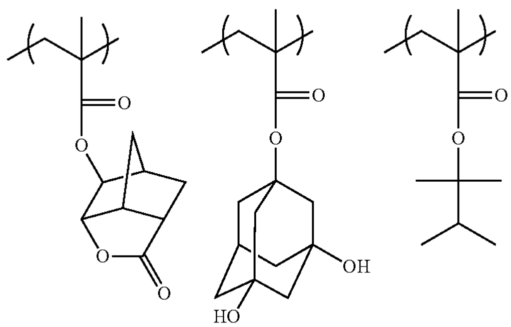
P-26
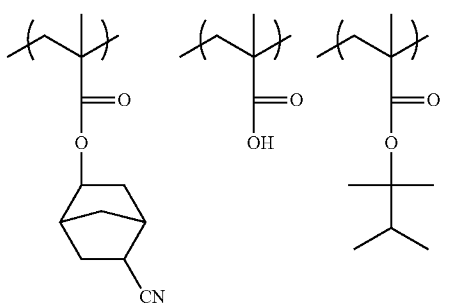
P-27
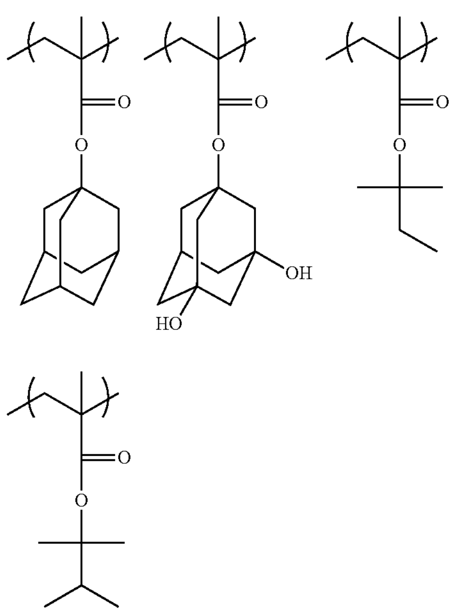
P-28
-continued
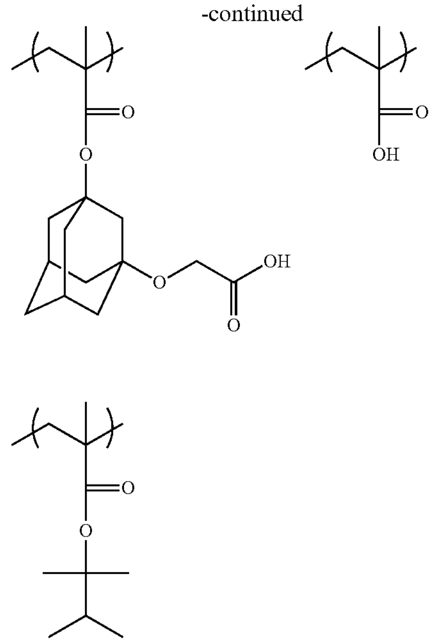
P-29
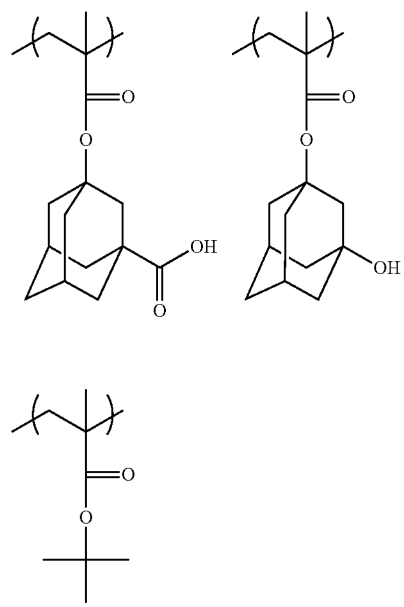
P-30
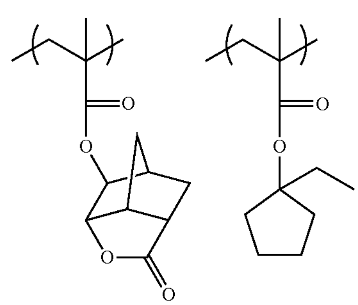
RP-1

-continued

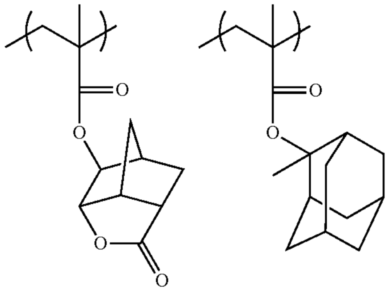

RP-2

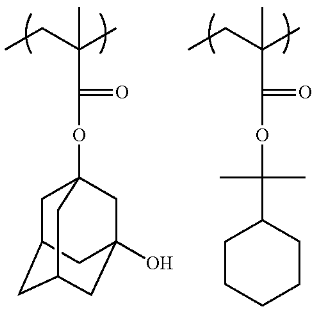

RP-3

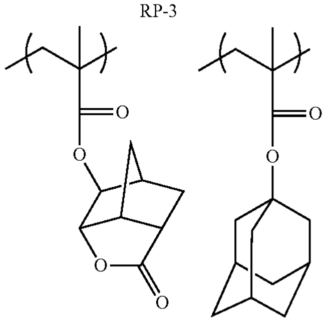

RP-2

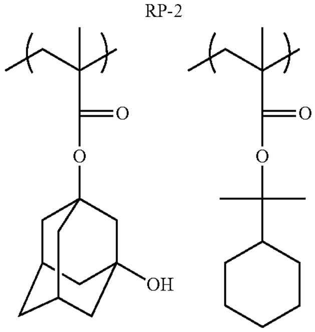

RP-3

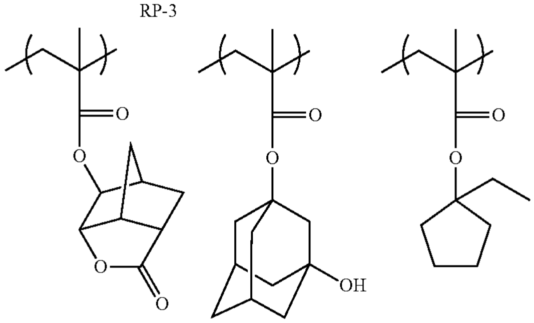

RP-4

Furthermore, the compositional ratios (molar ratios; (corresponding to the respective repeating units starting from the left) of the respective repeating units, the weight average molecular weight, and the dispersity are shown below.

TABLE 3

| No. | Composition ratio (mol %) | | | | Mw | Mw/Mn |
|---|---|---|---|---|---|---|
| P-1 | 20 | 10 | 70 | — | 10500 | 1.65 |
| P-2 | 60 | 40 | — | — | 11000 | 1.63 |
| P-3 | 45 | 55 | — | — | 10200 | 1.61 |
| P-4 | 40 | 60 | — | — | 11300 | 1.69 |
| P-5 | 35 | 65 | — | — | 29800 | 1.84 |
| P-6 | 40 | 50 | 10 | — | 10600 | 1.64 |
| P-7 | 40 | 10 | 50 | — | 10400 | 1.67 |
| P-8 | 40 | 30 | 30 | — | 20300 | 1.72 |
| P-9 | 30 | 55 | 15 | — | 10100 | 1.66 |
| P-10 | 35 | 55 | 10 | — | 10600 | 1.65 |
| P-11 | 30 | 10 | 60 | — | 19700 | 1.71 |
| P-12 | 30 | 15 | 55 | — | 20100 | 1.73 |
| P-13 | 25 | 15 | 5 | 55 | 10800 | 1.62 |
| P-14 | 25 | 10 | 5 | 60 | 10500 | 1.68 |
| P-15 | 45 | 55 | — | — | 20700 | 1.75 |
| P-16 | 35 | 10 | 55 | — | 10100 | 1.63 |
| P-17 | 30 | 10 | 60 | — | 11100 | 1.66 |
| P-18 | 40 | 60 | — | — | 20200 | 1.74 |
| P-19 | 25 | 5 | 70 | — | 10500 | 1.67 |
| P-20 | 35 | 55 | 10 | — | 10300 | 1.63 |
| P-21 | 25 | 20 | 55 | — | 30400 | 1.82 |
| P-22 | 20 | 5 | 15 | 60 | 10600 | 1.64 |
| P-23 | 25 | 10 | 65 | — | 10500 | 1.61 |
| P-24 | 35 | 65 | — | — | 10300 | 1.63 |
| P-25 | 40 | 60 | — | — | 30200 | 1.65 |
| P-26 | 20 | 15 | 65 | — | 10800 | 1.66 |
| P-27 | 30 | 10 | 60 | — | 10500 | 1.62 |
| P-28 | 15 | 15 | 35 | 35 | 21000 | 1.74 |
| P-29 | 40 | 30 | 30 | — | 10900 | 1.66 |
| P-30 | 45 | 25 | 30 | — | 11010 | 1.69 |
| PR-1 | 40 | 60 | — | — | 10400 | 1.65 |
| PR-2 | 50 | 50 | — | — | 10300 | 1.64 |
| PR-3 | 30 | 70 | — | — | 10600 | 1.63 |
| PR-4 | 10 | 20 | 70 | — | 10800 | 1.62 |

<Acid Generator (B)>

As the acid generator, the following compounds were used.

PAG-1

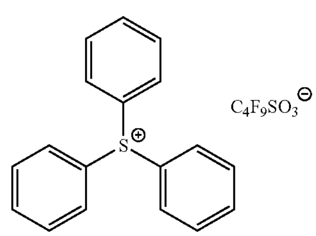

PAG-2

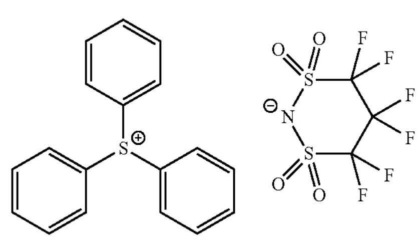

-continued
PAG-3
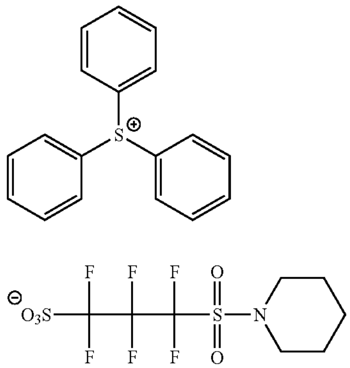
PAG-4
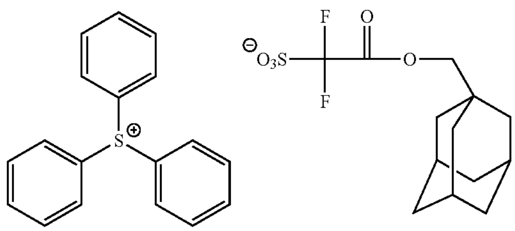
PAG-5
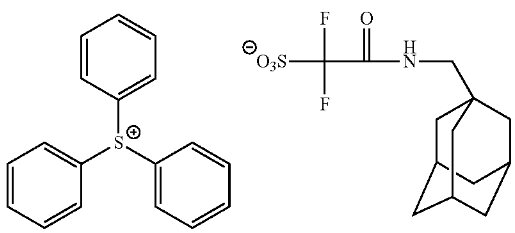
PAG-6
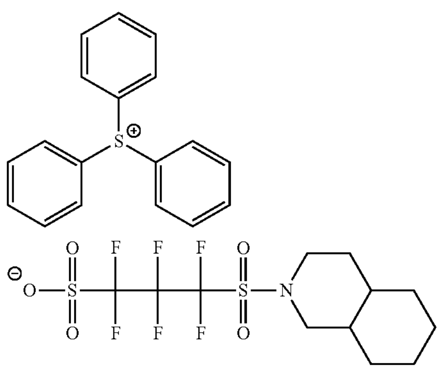
PAG-7
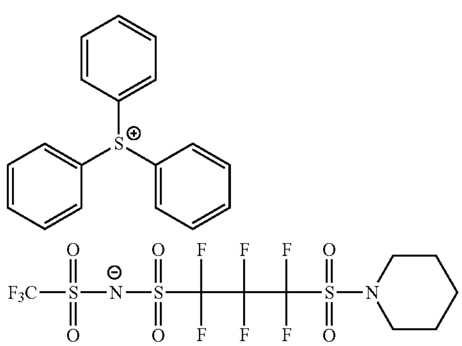
-continued
PAG-8
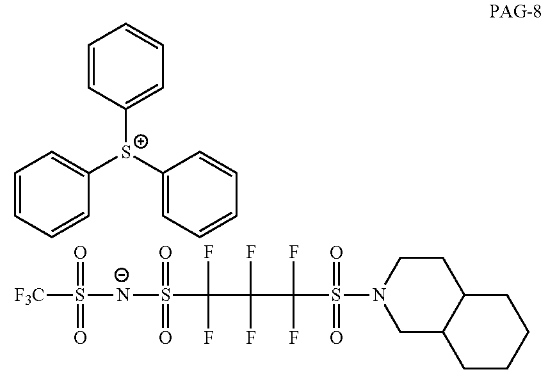
PAG-9
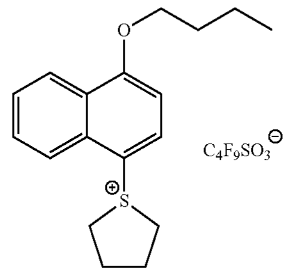
PAG-10
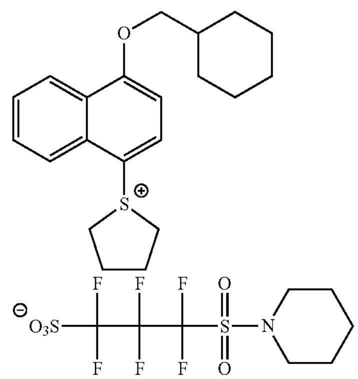
PAG-11
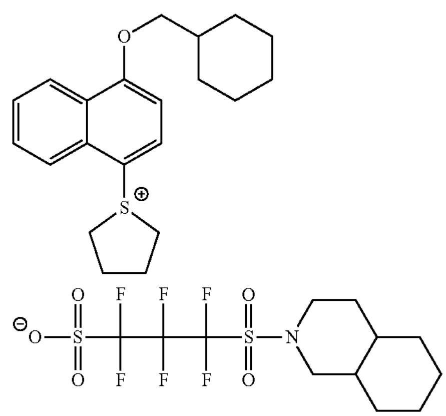
PAG-12
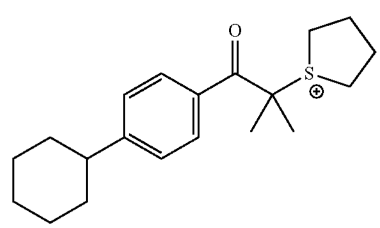

-continued
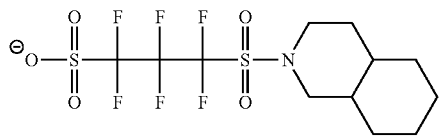
<Basic Compound Capable of Decreasing Basicity Upon Irradiation with Actinic Rays or Radiation (C), and Basic Compound (C')>
As the basic compound capable of decreasing the basicity upon irradiation with actinic rays or radiation, or the basic compound, the following compounds were used.
N-1
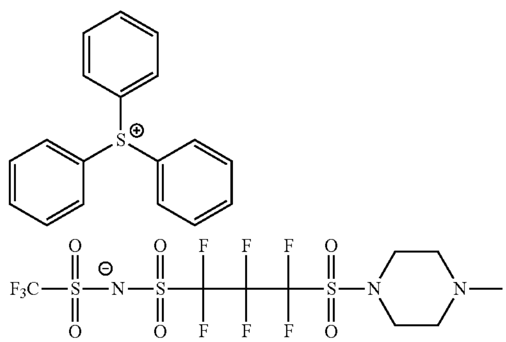
N-2
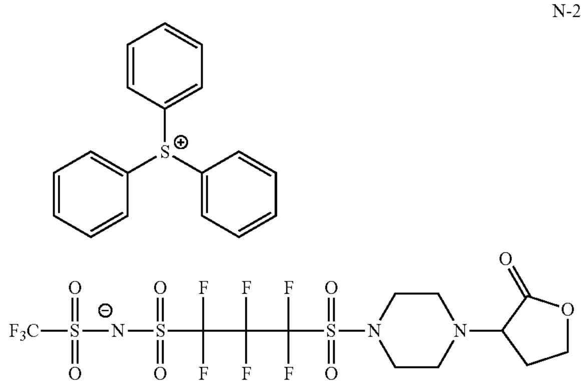
N-3
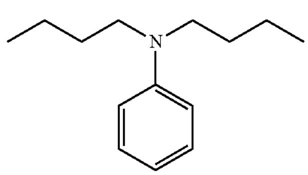
N-4
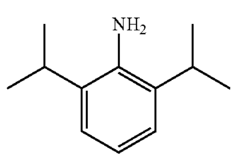
N-5
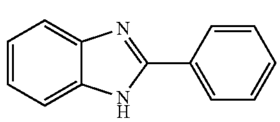
-continued
N-6
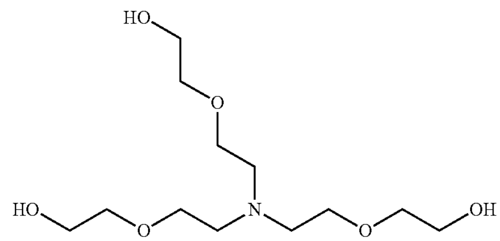
N-7
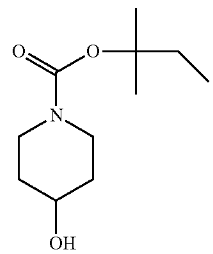
N-8
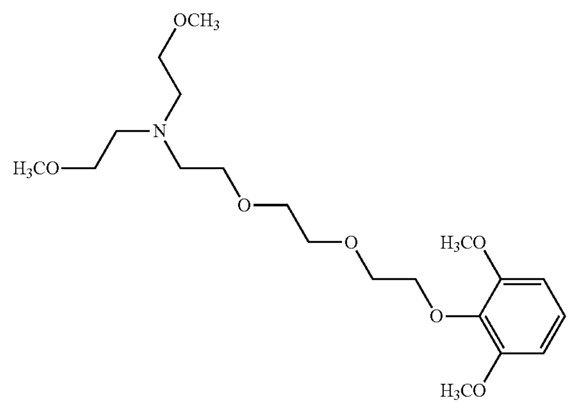
N-9
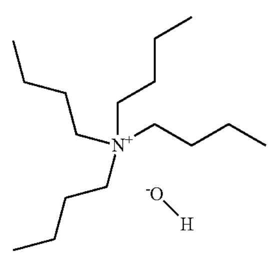
N-10
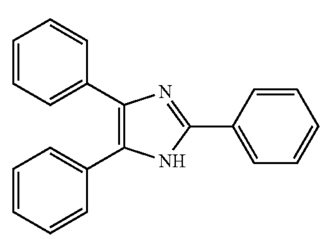
N-11
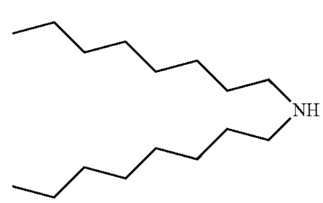

<Non-Photosensitive Compound Having at Least One of Fluorine Atom and Silicon Atom, and Further Having Basicity or being Capable of Increasing Basicity by Action of Acid (G)>

As the non-photosensitive compound having at least one of a fluorine atom and a silicon atom, and further having basicity or being capable of increasing the basicity by the action of an acid (G), the following compounds were used.

G-1

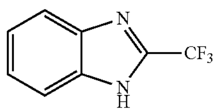

G-2

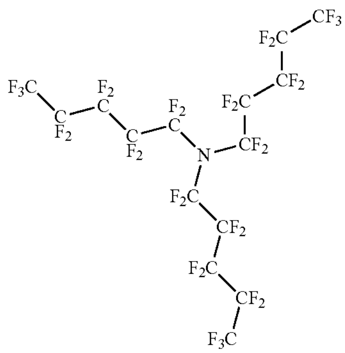

G-3

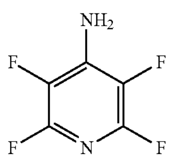

G-4

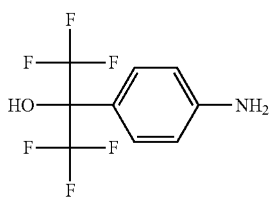

G-5

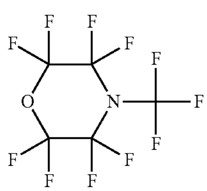

G-6

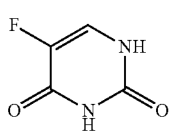

G-7

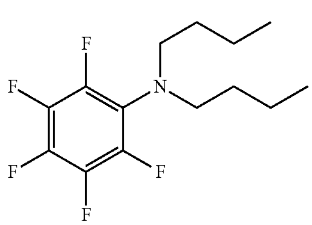

-continued

G-8

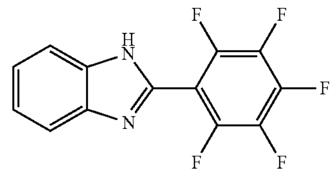

G-9

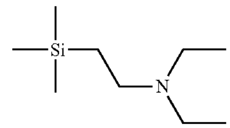

G-10

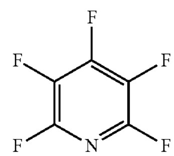

G-11

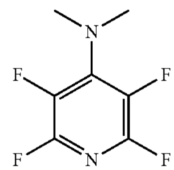

G-12

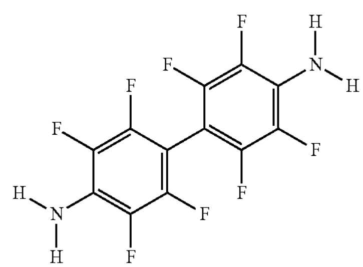

G-13

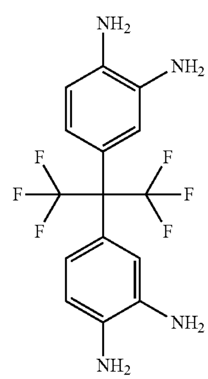

G-14

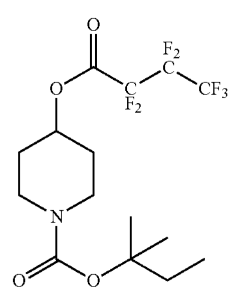

-continued
G-15
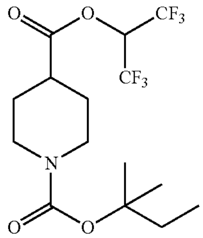
G-16
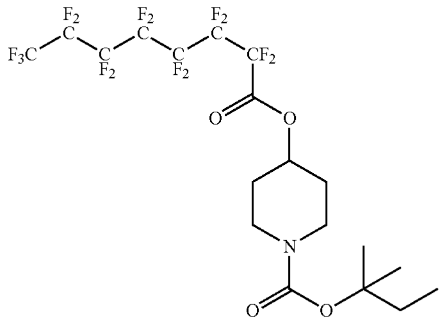
G-17
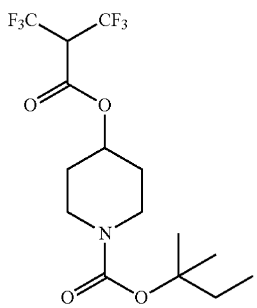
G-18
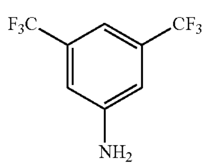
G-19
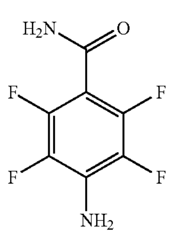
G-20
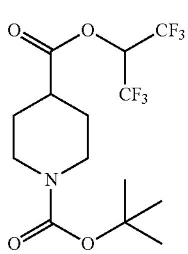
-continued
G-21
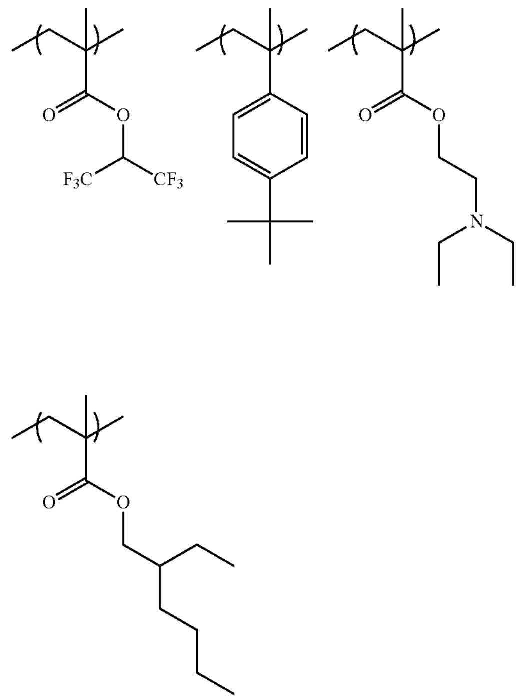
G-22
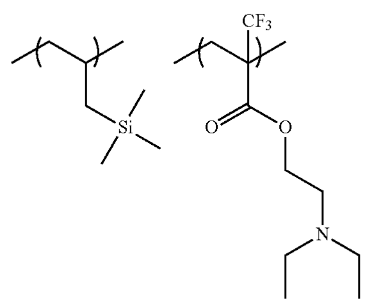
G-23
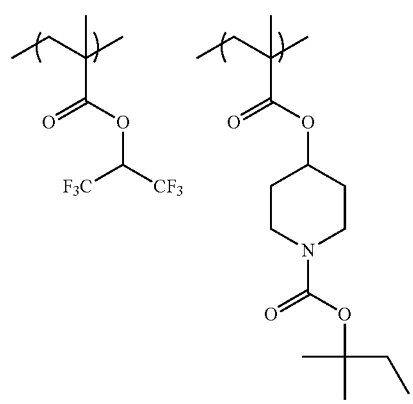

-continued

G-24

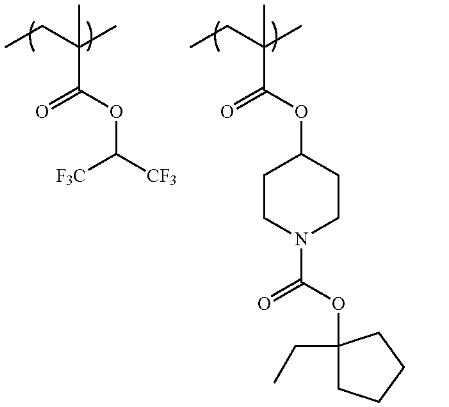

G-25

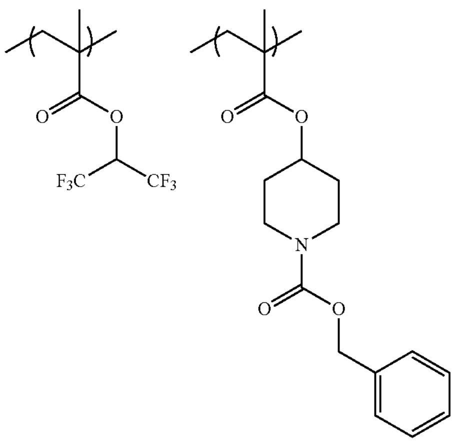

G-26

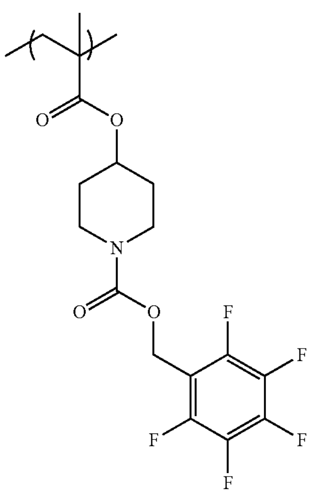

G-27

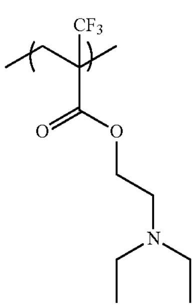

Hereinbelow, the compositional ratios (molar ratios), the weight average molecular weights, and the dispersity of the resins G-21 to G-27 are shown in Table below.

TABLE 4

| Resin | Composition (molar ratio) | Mw | Mw/Mn |
|---|---|---|---|
| G-21 | 39/49/10/2 | 4300 | 1.5 |
| G-22 | 50/50 | 6200 | 1.6 |
| G-23 | 50/50 | 5700 | 1.6 |
| G-24 | 50/50 | 3600 | 1.8 |
| G-25 | 50/50 | 4300 | 1.5 |
| G-26 | 100 | 6100 | 1.6 |
| G-27 | 100 | 5300 | 1.6 |

The compound G-20 and the resin G-21 were synthesized in accordance with the following synthesis method, and the other compounds were synthesized in the same manner.

Synthesis Example

Synthesis of Compound G-20

50 ml of tetrahydrofuran (THF) was added to 2.3 g of 1-(tert-butoxycarbonyl)isonipecotic acid, and 3.4 g of 1,1,1,3,3,3-hexafluoroisopropyl alcohol and 1.7 g of 4-dimethylaminopyridine were further added thereto, followed by stirring. To the obtained solution, 3.5 g of 1-ethyl-3-(3-dimethylaminopropyl)carbodiimide hydrochloride was added, and the mixture was stirred for 3 hours. The obtained reaction solution was added to 30 ml of 1 N HCl to stop the reaction, and the organic layer was washed further with 1 N HCl, and then washed with water. The obtained organic layer was concentrated to obtain 3.2 g of Compound (G-20) (yield: 83%).

$^{1}$H-NMR (400 MHz in $(CD_3)_2CO$): σ (ppm)=1.45 (9H), 1.60-1.75 (2H), 1.90-2.00 (2H), 2.70 (1H), 2.85-3.00 (2H), 3.95-4.10 (2H), 5.75 (1H)

Synthesis Example

Synthesis of Resin G-21

A preparation of the monomers corresponding to the above repeating units in a ratio of 39/49/10/2 (molar ratio) were dissolved in PGMEA to prepare 450 g of a solution having a solid content concentration of 15% by mass. To this solution, 1 mol % of a polymerization initiator, V-601 manufactured by Wako Pure Chemical Industries, Ltd., was added, and under a nitrogen atmosphere, the mixture was added dropwise over 6 hours to 50 g of PGMEA that had been heated to 100° C. After the completion of dropwise addition, the reaction liquid was stirred for 2 hours. After the reaction was completed, the reaction solution was cooled to room temperature and crystallized from 5 L of methanol, and the precipitated white powder was filtered to collect a desired Resin G-21.

The compositional ratio of the polymer determined by means of NMR was 39/49/10/2. Further, the weight average molecular weight in terms of standard polystyrene as determined by the GPC measurement was 4300 and the dispersity was 1.5.

<Hydrophobic Resin (E)>

A hydrophobic resin appropriately selected from the resins (HR-1) to (HR-90) was used.

Further, the hydrophobic resin (HR-69), (HR-72), (HR-80), (HR-81), and the like were synthesized in accordance with the descriptions of US Patent App. Nos. 2010/0152400, WO 2010/067905, WO 2010/067898, and the like.

<Surfactant (F)>

As the surfactant, the following were prepared.

W-1: Megafac F176 (manufactured by DIC Corporation; fluorine-based)

W-2: Megafac R08 (manufactured by DIC Corporation; fluorine- and silicone-based)

W-3: Polysiloxane Polymer KP-341 (manufactured by Shin-Etsu Chemical Co., Ltd.; silicone-based)

W-4: Troysol S-366 (manufactured by Troy Chemical Co., Ltd.)

W-5: KH-20 (manufactured by Asahi Glass Co., Ltd.)

W-6: PolyFox PF-6320 (manufactured by OMNOVA Solutions Inc.; fluorine-based)

<Solvent (D)>

As the solvent, the following were prepared.

(Group a)

SL-1: Propylene glycol mono methyl ether acetate (PGMEA)

SL-2: Propylene glycol mono methyl ether propionate

SL-3: 2-Heptanone (Group b)

SL-4: Ethyl lactate

SL-5: Propylene glycol mono methyl ether (PGME)

SL-6: Cyclohexanone (Group c)

SL-7: γ-Butyrolactone

SL-8: Propylene carbonate

<Developer>

As the developer, the following were prepared.

SG-1: Butyl acetate

SG-2: Methyl amyl ketone

SG-3: Ethyl-3-ethoxypropionate

SG-4: Pentyl acetate

SG-5: Isopentyl acetate

SG-6: Propylene glycol mono methyl ether acetate (PGMEA)

SG-7: Cyclohexanone

<Rinsing Liquid>

As the rinsing liquid, the following ones were prepared.

SR-1: 4-Methyl-2-pentanol

SR-2: 1-Hexanol

SR-3: Butyl acetate

SR-4: Methyl amyl ketone

SR-5: Ethyl-3-ethoxypropionate

<ArF Liquid-Immersion Exposure>

(Preparation of Resist and Formation of Hole Pattern)

The components shown in the table below were dissolved in a solvent in a solid content of 3.8% by mass, and each filtered through a polyethylene filter having a pore size of 0.03 μm to prepare an actinic ray-sensitive or radiation-sensitive resin composition (resist composition). ARC29SR (manufactured by Nissan Chemical Industries, Ltd.) for an organic antireflection film was coated on a silicon wafer, and baked at 205° C. for 60 seconds to form an antireflection film having a film thickness of 95 nm. The actinic ray-sensitive or radiation-sensitive resin composition was coated thereon and baked (PB: Prebake) at 100° C. for 60 seconds to form a resist film having a film thickness of 100 nm.

The silicon wafer on which the resist film had been formed was subjected to pattern exposure through a square-array halftone mask with a hole portion of 60 nm and a pitch between patterns of 90 nm, using an ArF excimer laser liquid-immersion scanner (manufactured by ASML, XT1700i, NA1.20, C-Quad, outer sigma 0.900, inner sigma 0.812, and XY deflection) (wherein the portion corresponding to the hole is light-shielded for forming a negative image). As the liquid for liquid immersion, ultrapure water was used. Thereafter, the resist film was heated at 105° C. for 60 seconds.

Subsequently, developing was performed by paddling the developer (organic solvent-based developer) described in the table below for 30 seconds. In Examples where the rinsing liquid is mentioned in the table below, the rinsing liquid was supplied to the wafer for 24 seconds while rotating the wafer at a rotation speed of 1000 rpm, and thereafter, the wafer was rotated at a rotation speed of 2000 rpm for 20 seconds to detach the chemical solution on the wafer. In Examples where the rinsing liquid is not mentioned in the table below, after paddling with the organic solvent-based developer, the wafer was rotated at a rotation speed of 2000 rpm for 20 seconds to detach the chemical solution on the wafer. Thus, a hole pattern having a pore diameter of 45 nm was obtained.

[Local Pattern Dimensional Uniformity (Local CDU, nm)]

The hole size was observed by a critical dimension scanning electron microscope (SEM, S-9380II manufactured by Hitachi Ltd.), and the optimal exposure dose ($E_{opt}$) (mJ/cm$^2$) was determined when a hole pattern with the hole portion of an average size of 45 nm was resolved.

With this optimal exposure dose ($E_{opt}$), in twenty 1 μm-square areas within a range that has been exposed in one shot, the hole size of an arbitrary 25 holes (that is, 500 holes in total) in each area was measured, and the standard deviation thereof was determined to calculate 3σ. When the value is smaller, the variation in the dimension is smaller, indicating good performance.

[Cross-Sectional Shape]

The cross-sectional shape of each of 10 hole patterns in the optimal exposure dose ($E_{opt}$) was observed by scanning electron microscope (S-4800 manufactured by Hitachi, Ltd.). For the portion having the resist remaining portion thereon in the hole pattern, the average size value (CD1) of the top of the hole patterns and the average size value (CD2) of the bottom of the hole patterns were determined. Further, the proportion (%) of the rectangular shape defined by the following formula was calculated. The cross-sectional shape of each hole pattern tends to be a T-top shape when the value of the proportion of the rectangular shape is above 100% and moves away from 100%, while the cross-sectional shape of each hole pattern tends to be reversely tapered shape when the value of the proportion of the rectangular shape is below 100% and moves away from 100%, wherein the value of the ratio of the cross-sectional shape closer to 100% indicates rectangular cross-sectional shape, which is favorable.

$$[\text{Proportion of Rectangular Shape}(\%)]=[1+(CD1-CD2)/CD2]\times 100$$

The evaluation criteria are as follows.

A: The [proportion of the rectangular shape] is from 90% to 120%.

B: The [proportion of the rectangular shape] is more than 120% and 150% or less.

C: The [proportion of the rectangular shape] is less than 90% or more than 150%.

These evaluation results are shown in Table below.

TABLE 5

| | Resin (P) | (g) | Compound (B) | (g) | Compound (C) or basic compound (C') | (g) | Compound (G) | (g) | Hydrophobic Resin (E) |
|---|---|---|---|---|---|---|---|---|---|
| Ex. 1 | P-1 | 10 | PAG-1 | 1.24 | N-1 | 1.02 | G-1 | 0.09 | HR-1 |
| Ex. 2 | P-2 | 10 | PAG-2 | 1.35 | N-2 | 1.04 | G-2 | 0.10 | HR-5 |
| Ex. 3 | P-3 | 10 | PAG-3 | 2.02 | N-3 | 0.32 | G-3 | 0.08 | HR-9 |
| Ex. 4 | P-4 | 10 | PAG-4 | 1.98 | N-4 | 0.28 | G-4 | 0.07 | HR-13 |
| Ex. 5 | P-5 | 10 | PAG-5 | 2.03 | N-5 | 0.36 | G-5 | 0.09 | HR-17 |
| Ex. 6 | P-6 | 10 | PAG-6 | 1.97 | N-6 | 0.37 | G-6 | 0.08 | HR-21 |
| Ex. 7 | P-1/P-7 | 5/5 | PAG-7 | 2.00 | N-7 | 0.29 | G-7 | 0.07 | HR-25 |
| Ex. 8 | P-8 | 10 | PAG-8 | 2.01 | N-8 | 0.27 | G-8 | 0.09 | HR-29 |
| Ex. 9 | P-9 | 10 | PAG-9 | 2.03 | N-9 | 0.31 | G-9 | 0.10 | HR-33 |
| Ex. 10 | P-10 | 10 | PAG-10 | 1.97 | N-10 | 0.26 | G-10 | 0.11 | HR-37 |
| Ex. 11 | P-11 | 10 | PAG-11 | 1.95 | N-11 | 0.36 | G-11 | 0.13 | HR-41 |
| Ex. 12 | P-12 | 10 | PAG-12 | 1.06 | N-1 | 1.01 | G-12 | 0.15 | HR-45 |
| Ex. 13 | P-13 | 10 | PAG-2/PAG-4 | 0.51/0.52 | N-2 | 1.03 | G-13 | 0.17 | HR-49 |
| Ex. 14 | P-14 | 10 | PAG-2/PAG-5 | 1.03/1.08 | N-3 | 0.29 | G-14 | 0.20 | HR-53 |
| Ex. 15 | P-15 | 10 | PAG-2/PAG-6 | 0.98/1.07 | N-4 | 0.27 | G-15 | 0.23 | HR-57 |
| Ex. 16 | P-16 | 10 | PAG-6/PAG-7 | 0.95/1.10 | N-5 | 0.32 | G-16 | 0.09 | HR-61 |
| Ex. 17 | P-17 | 10 | PAG-6/PAG-9 | 1.01/1.03 | N-6 | 0.28 | G-17 | 0.08 | HR-65 |
| Ex. 18 | P-18 | 10 | PAG-5/PAG-11 | 1.04/0.96 | N-7 | 0.36 | G-18 | 0.09 | HR-69 |
| Ex. 19 | P-19 | 10 | PAG-5/PAG-12 | 1.05/0.97 | N-8 | 0.37 | G-19 | 0.07 | HR-73 |
| Ex. 20 | P-20 | 10 | PAG-11/PAG-12 | 1.01/1.01 | N-9 | 0.29 | G-20 | 0.11 | HR-77 |
| Ex. 21 | P-21 | 10 | PAG-12 | 2.01 | N-10 | 0.27 | G-21 | 0.15 | HR-81 |
| Ex. 22 | P-22 | 10 | PAG-11 | 1.97 | N-11 | 0.36 | G-22 | 0.20 | HR-85 |
| Ex. 23 | P-23 | 10 | PAG-10 | 1.05 | N-1 | 1.05 | G-23 | 0.17 | HR-89 |
| Ex. 24 | P-24 | 10 | PAG-9 | 1.04 | N-2 | 1.06 | G-24 | 0.20 | HR-88 |
| Ex. 25 | P-25 | 10 | PAG-8 | 1.77 | N-3 | 0.37 | G-25 | 0.23 | HR-86 |
| Ex. 26 | P-26 | 10 | PAG-7 | 1.86 | N-4/N-5 | 0.16/0.13 | G-26 | 0.09 | HR-84 |
| Ex. 27 | P-27 | 10 | PAG-6 | 1.89 | N-5 | 0.27 | G-27 | 0.08 | HR-82 |
| Ex. 28 | P-28 | 10 | PAG-5 | 1.92 | N-6 | 0.37 | G-2 | 0.09 | HR-80 |
| Ex. 29 | P-1 | 10 | PAG-4 | 1.93 | N-7 | 0.29 | G-3 | 0.07 | HR-78 |
| Ex. 30 | P-8 | 10 | PAG-3 | 1.95 | N-8 | 0.29 | G-4/G-6 | 0.035/0.035 | HR-76 |
| Ex. 31 | P-18 | 10 | PAG-2 | 1.88 | N-9 | 0.27 | G-5 | 0.09 | HR-74 |
| Ex. 32 | P-24 | 10 | PAG-1 | 1.99 | N-10 | 0.31 | G-6 | 0.08 | HR-72 |
| Ex. 33 | P-29 | 10 | PAG-8 | 1.77 | N-3 | 0.37 | G-25 | 0.23 | HR-86 |
| Ex. 34 | P-30 | 10 | PAG-7 | 1.86 | N-4 | 0.29 | G-26 | 0.09 | HR-84 |
| Comp. Ex. 1 | RP-1 | 10 | PAG-6 | 1.01 | N-7 | 0.26 | G-7 | 0.07 | HR-70 |
| Comp. Ex. 2 | RP-2 | 10 | PAG-7 | 0.98 | N-8 | 0.36 | G-8 | 0.09 | HR-68 |
| Comp. Ex. 3 | RP-3 | 10 | PAG-8 | 0.95 | N-9 | 0.27 | G-9 | 0.10 | HR-66 |
| Comp. Ex. 4 | RP-4 | 10 | PAG-9 | 0.94 | N-10 | 0.37 | — | — | HR-64 |

| | (g) | Surfactant (F) | (g) | Solvent (D) | Mass ratio | Developer | Mass ratio | Rinsing liquid | Mass ratio | Local CDU | Shape |
|---|---|---|---|---|---|---|---|---|---|---|---|
| Ex. 1 | 0.090 | W-1 | 0.100 | SL-1/SL-2 | 60/40 | SG-1 | 100 | SR-1 | 100 | 3.8 | A |
| Ex. 2 | 0.095 | W-2 | 0.092 | SL-1/SL-3 | 70/30 | SG-2 | 100 | SR-2 | 100 | 4.0 | A |
| Ex. 3 | 0.092 | W-3 | 0.085 | SL-1/SL-4 | 80/20 | SG-1/SG-3 | 50/50 | SR-3 | 100 | 4.2 | A |
| Ex. 4 | 0.085 | W-4 | 0.086 | SL-1/SL-5 | 65/35 | SG-4 | 100 | SR-4 | 100 | 3.8 | A |
| Ex. 5 | 0.086 | W-5 | 0.074 | SL-1 | 100 | SG-5 | 100 | SR-5 | 100 | 3.9 | A |
| Ex. 6 | 0.074 | W-6 | 0.090 | SL-1/SL-7 | 75/25 | SG-6 | 100 | SR-1 | 100 | 4.1 | A |
| Ex. 7 | 0.100 | W-1 | 0.086 | SL-1/SL-8 | 85/15 | SG-7 | 100 | SR-2 | 100 | 3.8 | A |
| Ex. 8 | 0.130 | W-2 | 0.074 | SL-1/SL-2 | 95/5 | SG-1 | 100 | SR-3 | 100 | 4.2 | A |
| Ex. 9 | 0.120 | W-3 | 0.090 | SL-1/SL-2 | 85/15 | SG-2 | 100 | SR-4 | 100 | 3.7 | A |
| Ex. 10 | 0.110 | — | — | SL-1/SL-2 | 95/5 | SG-3 | 100 | SR-5 | 100 | 3.9 | A |
| Ex. 11 | 0.099 | W-5 | 0.099 | SL-1/SL-3 | 65/35 | SG-1/SG-4 | 70/30 | SR-1 | 100 | 4.0 | A |
| Ex. 12 | 0.092 | W-6 | 0.100 | SL-1/SL-3 | 75/25 | SG-5 | 100 | SR-1/SR-2 | 50/50 | 3.7 | A |
| Ex. 13 | 0.086 | W-1 | 0.130 | SL-1/SL-3 | 85/15 | SG-6 | 100 | SR-3 | 100 | 3.9 | A |
| Ex. 14 | 0.074 | W-2 | 0.074 | SL-1/SL-4 | 80/20 | SG-7 | 100 | SR-4 | 100 | 3.8 | A |
| Ex. 15 | 0.110 | W-3 | 0.110 | SL-1/SL-4 | 75/25 | SG-1 | 100 | SR-5 | 100 | 4.0 | A |
| Ex. 16 | 0.099 | W-4 | 0.099 | SL-1/SL-4 | 85/15 | SG-2 | 100 | SR-1 | 100 | 4.2 | A |
| Ex. 17 | 0.100 | W-5 | 0.100 | SL-1/SL-5 | 85/15 | SG-3 | 100 | SR-2 | 100 | 3.7 | A |
| Ex. 18 | 0.130 | W-6 | 0.092 | SL-1/SL-5 | 60/40 | SG-4 | 100 | SR-3 | 100 | 3.9 | A |
| Ex. 19 | 0.074 | W-1 | 0.085 | SL-1/SL-5 | 80/20 | SG-5 | 100 | SR-4 | 100 | 4.1 | A |
| Ex. 20 | 0.110 | W-2 | 0.100 | SL-1/SL-6 | 80/20 | SG-6 | 100 | SR-5 | 100 | 3.8 | A |
| Ex. 21 | 0.099 | W-3 | 0.130 | SL-1/SL-6 | 75/25 | SG-7 | 100 | SR-1 | 100 | 4.2 | A |
| Ex. 22 | 0.100 | W-4 | 0.120 | SL-1/SL-6 | 85/15 | SG-1 | 100 | SR-2 | 100 | 4.1 | A |
| Ex. 23 | 0.092 | W-5 | 0.110 | SL-1/SL-7 | 85/15 | SG-2 | 100 | SR-1/SR-3 | 80/20 | 4.1 | A |
| Ex. 24 | 0.085 | W-6 | 0.099 | SL-1/SL-7 | 60/40 | SG-3 | 100 | SR-4 | 100 | 4.0 | A |
| Ex. 25 | 0.086 | W-1/W-2 | 0.06/0.06 | SL-1/SL-7 | 80/20 | SG-4 | 100 | SR-5 | 100 | 3.7 | A |
| Ex. 26 | 0.074 | W-2 | 0.086 | SL-1/SL-8 | 80/20 | SG-5 | 100 | SR-1 | 100 | 3.9 | A |
| Ex. 27 | 0.090 | W-3 | 0.074 | SL-1/SL-8 | 75/25 | SG-6 | 100 | SR-2 | 100 | 4.2 | A |
| Ex. 28 | 0.086 | W-4 | 0.110 | SL-1/SL-8 | 85/15 | SG-7 | 100 | SR-3 | 100 | 3.7 | A |

TABLE 5-continued

| | | | | | | | | | | | |
|---|---|---|---|---|---|---|---|---|---|---|---|
| Ex. 29 | 0.074 | W-5 | 0.099 | SL-1/SL-2 | 85/15 | SG-1 | 100 | SR-4 | 100 | 4.1 | A |
| Ex. 30 | 0.090 | W-6 | 0.100 | SL-1/SL-2 | 60/40 | SG-2 | 100 | SR-5 | 100 | 4.0 | A |
| Ex. 31 | 0.100 | W-1 | 0.130 | SL-1/SL-2 | 80/20 | SG-3 | 100 | SR-1 | 100 | 3.7 | A |
| Ex. 32 | 0.092 | W-2 | 0.086 | SL-1/SL-2 | 80/20 | SG-4 | 100 | SR-2 | 100 | 3.9 | A |
| Ex. 33 | 0.086 | W-1 | 0.092 | SL-1/SL-7 | 80/20 | SG-4 | 100 | — | — | 3.7 | A |
| Ex. 34 | 0.074 | W-2 | 0.086 | SL-1/SL-8 | 80/20 | SG-5 | 100 | — | — | 3.9 | A |
| Comp. Ex. 1 | 0.085 | W-3 | 0.074 | SL-1/SL-2 | 80/20 | SG-5 | 100 | SR-3 | 100 | 7.8 | B |
| Comp. Ex. 2 | 0.086 | W-4 | 0.090 | SL-1/SL-2 | 80/20 | SG-6 | 100 | SR-4 | 100 | 8.5 | B |
| Comp. Ex. 3 | 0.074 | W-5 | 0.100 | SL-1/SL-2 | 85/15 | SG-7 | 100 | SR-5 | 100 | 9.6 | B |
| Comp. Ex. 4 | 0.110 | W-6 | 0.092 | SL-1/SL-2 | 75/25 | SG-3 | 100 | SR-5 | 100 | 7.9 | C |

As clearly seen from the results shown in the table, as compared with Comparative Examples 1 to 4, in which the acid-decomposable resin having the repeating unit (a) represented by the general formula (I) was not used, in Examples 1 to 34, the local pattern dimensional uniformity of the hole pattern was superior.

Furthermore, as compared with Comparative Example 4, in which the non-photosensitive compound having at least one of a fluorine atom and a silicon atom, and further having basicity or being capable of increasing the basicity by the action of an acid (G) was not included, in Examples 1 to 34, superior results for the cross-sectional shape of the hole pattern was obtained.

This application claims priority under 35 U.S.C. §119 of Japanese Patent application JP 2011-207016, filed on Sep. 22, 2011, the entire contents of which are hereby incorporated by reference.

What is claimed is:

1. An actinic ray-sensitive or radiation-sensitive resin composition comprising:

(P) a resin containing 30 mol % or more of a repeating unit (a) represented by the following general formula (I) based on all the repeating units;

(B) a compound capable of generating an acid upon irradiation of actinic rays or radiation;

(G) a non-photosensitive compound having at least one of a fluorine atom and a silicon atom, and further having basicity or being capable of increasing the basicity by an action of an acid;

(I)

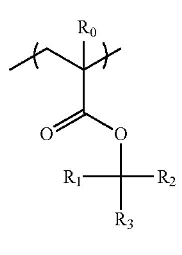

(in the general formula (I), $R_0$ represents a hydrogen atom or a methyl group; and each of $R_1$, $R_2$, and $R_3$ independently represents a linear or branched alkyl group); and (E) a hydrophobic resin containing at least one of a fluorine atom and a silicon atom.

2. The actinic ray-sensitive or radiation-sensitive resin composition according to claim 1, wherein the linear or branched alkyl group for $R_1$, $R_2$, and $R_3$ is an alkyl group having 1 to 4 carbon atoms.

3. The actinic ray-sensitive or radiation-sensitive resin composition according to claim 1, wherein the compound (B) is a compound capable of generating an acid represented by the following general formula (II) or (III):

(II)

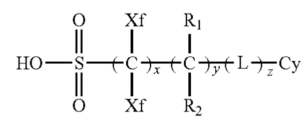

(III)

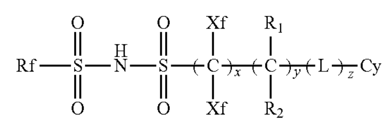

(in the general formulae, each of Xf's independently represents a fluorine atom, or an alkyl group substituted with at least one fluorine atom;

each of $R_1$ and $R_2$ independently represents a hydrogen atom, a fluorine atom, or an alkyl group, and in the case of $y \geq 2$, each of $R_1$'s and $R_2$'s independently represents a hydrogen atom, a fluorine atom, or an alkyl group;

L represents a divalent linking group, and in the case of $z \geq 2$, each of L's independently represents a divalent linking group;

Cy represents a cyclic organic group;

Rf represents a group containing a fluorine atom;

x represents an integer of 1 to 20;

y represents an integer of 0 to 10; and z represents an integer of 0 to 10).

4. The actinic ray-sensitive or radiation-sensitive resin composition according to claim 3, wherein the compound (B) is a compound capable of generating an acid represented by the following general formula (II):

(II)

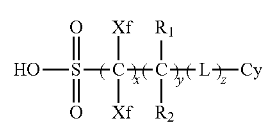

(in the general formula, each of Xf's independently represents a fluorine atom, or an alkyl group substituted with at least one fluorine atom;

each of $R_1$ and $R_2$ independently represents a hydrogen atom, a fluorine atom, or an alkyl group, and in the case of $y \geq 2$, each of $R_1$'s and $R_2$'s independently represents a hydrogen atom, a fluorine atom, or an alkyl group;

L represents a divalent linking group, and in the case of $z \geq 2$, each of L's independently represents a divalent linking group;

Cy represents a cyclic organic group;

x represents an integer of 1 to 20;

y represents an integer of 0 to 10; and z represents an integer of 0 to 10).

5. The actinic ray-sensitive or radiation-sensitive resin composition according to claim 1, further comprising a basic compound or ammonium salt compound (C) capable of decreasing the basicity upon irradiation with actinic rays or radiation.

6. The actinic ray-sensitive or radiation-sensitive resin composition according to claim 1, wherein the compound (G) is a nitrogen-containing compound.

7. The actinic ray-sensitive or radiation-sensitive resin composition according to claim 1, wherein the content of the compound (G) is from 0.01 to 10% by mass based on the total solid content of the actinic ray-sensitive or radiation-sensitive resin composition.

8. A resist film formed by the actinic ray-sensitive or radiation-sensitive resin composition according to claim 1.

9. A pattern forming method comprising:

exposing the resist film according to claim 8; and developing the resist film after the exposure by using a developer including an organic solvent, to form a negative type pattern.

10. The pattern forming method according to claim 9, wherein the content of the organic solvent in the developer including the organic solvent is from 90% by mass to 100% by mass based on the total mass of the developer.

11. The pattern forming method according to claim 9, wherein the developer is a developer containing at least one organic solvent selected from a group consisting of a ketone-based solvent, an ester-based solvent, an alcohol-based solvent, an amide-based solvent, and an ether-based solvent.

12. The pattern forming method according to claim 9, further comprising washing with a rinsing liquid including an organic solvent.

13. A method for preparing an electronic device, comprising the pattern forming method according to claim 9.

14. An electronic device prepared by the method for preparing an electronic device according to claim 13.

15. The actinic ray-sensitive or radiation-sensitive resin composition according to claim 1, wherein said (P) is a resin containing 50 mol % or more of a repeating unit (a) represented by said general formula (I) based on all the repeating units.

16. An actinic ray-sensitive or radiation-sensitive resin composition comprising:

(P) a resin containing 30 mol % or more of a repeating unit (a) represented by the following general formula (I) based on all the repeating units and 5 mol % or less of a repeating unit having a fluorine atom;

(B) a compound capable of generating an acid upon irradiation of actinic rays or radiation; and (G) a non-photosensitive compound having at least one of a fluorine atom and a silicon atom, and further having basicity or being capable of increasing the basicity by an action of an acid,

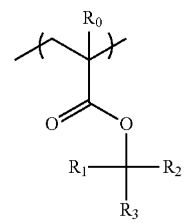

(I)

(in the general formula (I), $R_0$ represents a hydrogen atom or a methyl group; and each of $R_1$, $R_2$, and $R_3$ independently represents a linear or branched alkyl group).

17. The actinic ray-sensitive or radiation-sensitive resin composition according to claim 16, wherein said (P) is a resin containing no repeating unit having a fluorine atom.

18. The actinic ray-sensitive or radiation-sensitive resin composition according to claim 16, wherein said (P) is a resin containing 40 mol % or more of a repeating unit (a) represented by the general formula (I) based on all the repeating units.

19. The actinic ray-sensitive or radiation-sensitive resin composition according to claim 16, wherein said (P) is a resin containing 50 mol % or more of a repeating unit (a) represented by the general formula (I) based on all the repeating units.

* * * * *